US011887535B2

(12) United States Patent
Kimura et al.

(10) Patent No.: US 11,887,535 B2
(45) Date of Patent: Jan. 30, 2024

(54) ELECTRONIC DEVICE, DISPLAY DEVICE, AND SEMICONDUCTOR DEVICE AND METHOD FOR DRIVING THE SAME

(71) Applicant: SEMICONDUCTOR ENERGY LABORATORY CO., LTD., Atsugi (JP)

(72) Inventors: Hajime Kimura, Kanagawa (JP); Tomoko Yamada, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 262 days.

(21) Appl. No.: 17/515,658

(22) Filed: Nov. 1, 2021

(65) Prior Publication Data

US 2022/0051626 A1   Feb. 17, 2022

Related U.S. Application Data

(63) Continuation of application No. 16/752,766, filed on Jan. 27, 2020, now abandoned, which is a
(Continued)

(30) Foreign Application Priority Data

Oct. 26, 2006   (JP) ................................. 2006-291147

(51) Int. Cl.
*G09G 3/3233*   (2016.01)
*G09G 3/20*     (2006.01)
(Continued)

(52) U.S. Cl.
CPC ......... *G09G 3/3233* (2013.01); *G09G 3/2022* (2013.01); *G09G 2300/0426* (2013.01);
(Continued)

(58) Field of Classification Search
CPC ......... G09G 3/3233; G09G 2300/0439; G09G 3/30–3291
(Continued)

(56) References Cited

U.S. PATENT DOCUMENTS 4,829,305 A * 5/1989 LaBudde ................ G01S 13/32
                                              342/127
5,684,365 A * 11/1997 Tang ...................... H10K 59/12
                                              313/506
(Continued)

FOREIGN PATENT DOCUMENTS

CN    001303022 A    7/2001
CN    001707588 A    12/2005
(Continued)

OTHER PUBLICATIONS

US 8,587,500 B2, 11/2013, Kimura (withdrawn)
(Continued)

*Primary Examiner* — Patrick F Marinelli
(74) *Attorney, Agent, or Firm* — Fish & Richardson P.C.

(57) ABSTRACT

A pixel having a transistor which controls a current value supplied to a load, a first storage capacitor, a second storage capacitor, and first to fourth switches is included. After the threshold voltage of the transistor is held in the second storage capacitor, a potential in accordance with a video signal is input to the pixel. Voltage obtained by adding a potential in which the potential in accordance with the video signal and the first storage capacitor are capacitively divided to the threshold voltage is held in the second storage capacitor in this manner, so that variation of a current value caused by variations in the threshold voltage of the transistor is suppressed. Thus, desired current can be supplied to the load such as a light-emitting element. In addition, a display
(Continued)

device with little deviation from luminance specified by the video signal can be provided.

13 Claims, 65 Drawing Sheets

Related U.S. Application Data continuation of application No. 15/351,688, filed on Nov. 15, 2016, now Pat. No. 10,546,529, which is a continuation of application No. 14/454,763, filed on Aug. 8, 2014, now abandoned, which is a continuation of application No. 11/877,325, filed on Oct. 23, 2007, now Pat. No. 8,803,768.

(51) Int. Cl.
  *H10K 59/12* (2023.01)
  *H01L 27/12* (2006.01)

(52) U.S. Cl.
  CPC ........... *G09G 2300/0439* (2013.01); *G09G 2300/0465* (2013.01); *G09G 2300/0819* (2013.01); *G09G 2300/0852* (2013.01); *G09G 2300/0861* (2013.01); *G09G 2310/0251* (2013.01); *G09G 2310/0262* (2013.01); *G09G 2320/0233* (2013.01); *G09G 2320/043* (2013.01); *G09G 2320/045* (2013.01); *G09G 2330/021* (2013.01); *H01L 27/1225* (2013.01); *H10K 59/12* (2023.02)

(58) Field of Classification Search
  USPC ........ 345/76–86, 204–211, 76–83, 204–215, 345/690–699; 315/169.1–169.4
  See application file for complete search history.

(56) References Cited

U.S. PATENT DOCUMENTS

| | | | | |
|---|---|---|---|---|
| 5,956,011 A * | 9/1999 | Koyama | ............... | G09G 3/3648 345/212 |
| 6,037,924 A * | 3/2000 | Koyama | ............... | G09G 3/3648 345/212 |
| 6,185,544 B1 * | 2/2001 | Sakamoto | ............ | G06Q 20/102 705/40 |
| 6,310,598 B1 * | 10/2001 | Koyama | ............... | G09G 3/3648 345/212 |
| 6,375,572 B1 * | 4/2002 | Masuyama | ............. | A63F 13/92 463/31 |
| 6,476,792 B2 | 11/2002 | Hattori et al. | | |
| 6,518,945 B1 * | 2/2003 | Pinkham | ............... | G09G 3/3659 345/98 |
| 6,548,960 B2 * | 4/2003 | Inukai | .................. | G09G 3/3233 345/204 |
| 6,608,613 B2 * | 8/2003 | Koyama | ............... | G09G 3/3648 345/212 |
| 6,611,108 B2 * | 8/2003 | Kimura | ................ | G09G 3/3233 345/63 |
| 6,661,180 B2 * | 12/2003 | Koyama | ............... | G09G 3/3225 345/82 |
| 6,709,901 B1 * | 3/2004 | Yamazaki | ............. | H01L 29/786 438/149 |
| 6,753,654 B2 * | 6/2004 | Koyama | ............... | G09G 3/3266 315/169.3 |
| 6,768,348 B2 * | 7/2004 | Shionoiri | ............ | G11C 11/4091 327/51 |
| 6,781,153 B2 | 8/2004 | Anzai | | |
| 6,784,454 B2 | 8/2004 | Anzai | | |
| 6,798,148 B2 * | 9/2004 | Inukai | .................... | G09G 3/325 345/84 |
| 6,798,405 B2 | 9/2004 | Anzai | | |
| 6,809,482 B2 * | 10/2004 | Koyama | ............... | G09G 3/3275 257/E27.111 |
| 6,858,989 B2 * | 2/2005 | Howard | ............... | G09G 3/3233 315/169.3 |
| 6,873,116 B2 * | 3/2005 | Kimura | ................ | G09G 3/3258 315/169.3 |
| 6,876,346 B2 | 4/2005 | Anzai et al. | | |
| 6,876,350 B2 * | 4/2005 | Koyama | ............... | G09G 3/3241 345/204 |
| 6,909,242 B2 * | 6/2005 | Kimura | ................ | H01L 27/088 315/169.3 |
| 6,911,688 B2 | 6/2005 | Yamazaki et al. | | |
| 6,914,390 B2 * | 7/2005 | Koyama | ............... | G09G 3/3225 345/82 |
| 6,958,750 B2 * | 10/2005 | Azami | ................. | G09G 3/3266 345/204 |
| 6,963,336 B2 * | 11/2005 | Kimura | ................. | G09G 3/325 345/82 |
| 7,015,884 B2 * | 3/2006 | Kwon | .................... | G09G 3/3233 257/E27.111 |
| 7,030,847 B2 * | 4/2006 | Kimura | ................ | G09G 3/3696 345/82 |
| 7,042,162 B2 * | 5/2006 | Yamazaki | ............. | G09G 3/3275 345/82 |
| 7,046,240 B2 * | 5/2006 | Kimura | ................ | G09G 3/3283 345/82 |
| 7,053,890 B2 * | 5/2006 | Inukai | .................. | G09G 3/3275 345/80 |
| 7,057,588 B2 | 6/2006 | Asano et al. | | |
| 7,068,246 B2 * | 6/2006 | Yamazaki | ............. | G09G 3/3275 345/82 |
| 7,091,750 B2 * | 8/2006 | Shionoiri | ............ | G11C 11/4091 327/51 |
| 7,102,163 B2 | 9/2006 | Anzai | | |
| 7,106,006 B2 * | 9/2006 | Koyama | ............... | G09G 3/3275 345/82 |
| 7,129,917 B2 * | 10/2006 | Yamazaki | ............ | H01L 29/7866 313/500 |
| 7,148,510 B2 | 12/2006 | Yamazaki et al. | | |
| 7,173,590 B2 * | 2/2007 | Uchino | ................. | G02B 6/4214 345/82 |
| 7,180,485 B2 * | 2/2007 | Kimura | ................ | G09G 3/3266 315/169.3 |
| 7,180,486 B2 | 2/2007 | Jeong | | |
| 7,202,849 B2 | 4/2007 | Hattori et al. | | |
| 7,218,294 B2 * | 5/2007 | Koyama | ............... | G09G 3/3233 313/504 |
| 7,224,118 B2 * | 5/2007 | Yamazaki | .............. | H10K 19/10 313/506 |
| 7,230,592 B2 | 6/2007 | Sato et al. | | |
| 7,242,376 B2 | 7/2007 | Yamashita et al. | | |
| 7,253,665 B2 * | 8/2007 | Kimura | ..................... | G09G 3/32 326/85 |
| 7,259,735 B2 | 8/2007 | Kasai | | |
| 7,268,498 B2 * | 9/2007 | Miyagawa | ............ | H01L 27/124 315/169.3 |
| 7,319,443 B2 * | 1/2008 | Kimura | ................. | G09G 3/325 345/82 |
| 7,336,251 B2 * | 2/2008 | Osada | .................. | G09G 3/3241 345/82 |
| 7,345,657 B2 * | 3/2008 | Kimura | .................. | G09G 3/325 345/76 |
| 7,348,825 B2 * | 3/2008 | Kimura | ................. | G09G 3/3225 345/204 |
| 7,362,289 B2 * | 4/2008 | Yamazaki | ............. | G09G 3/3275 345/82 |
| 7,375,376 B2 | 5/2008 | Yamazaki et al. | | |
| 7,378,739 B2 * | 5/2008 | Kwak | ..................... | H01L 28/40 257/532 |
| 7,423,638 B2 * | 9/2008 | Kwon | ................... | G09G 3/3233 345/206 |
| 7,445,946 B2 | 11/2008 | Yamazaki et al. | | |
| 7,456,810 B2 * | 11/2008 | Kimura | ................ | G09G 3/3233 345/82 |
| 7,462,897 B2 * | 12/2008 | Endo | ..................... | G09G 3/3233 438/57 |

(56) References Cited

U.S. PATENT DOCUMENTS

| | | | |
|---|---|---|---|
| 7,508,361 B2 | 3/2009 | Uchino et al. | |
| 7,518,580 B2* | 4/2009 | Kwon | G09G 3/325 |
| | | | 345/82 |
| 7,583,032 B2 | 9/2009 | Kimura | |
| 7,649,515 B2 | 1/2010 | Ozawa et al. | |
| 7,667,674 B2 | 2/2010 | Sato et al. | |
| 7,671,368 B2 | 3/2010 | Kwak et al. | |
| 7,671,826 B2* | 3/2010 | Kimura | H01L 27/15 |
| | | | 315/169.3 |
| 7,679,587 B2* | 3/2010 | Kwak | G09G 3/325 |
| | | | 345/82 |
| 7,710,366 B2 | 5/2010 | Lee et al. | |
| 7,710,368 B2* | 5/2010 | Chung | G09G 3/3266 |
| | | | 345/82 |
| 7,714,813 B2 | 5/2010 | Uchino et al. | |
| 7,724,245 B2* | 5/2010 | Miyazawa | H05B 45/60 |
| | | | 345/82 |
| 7,737,923 B2* | 6/2010 | Shishido | G09G 3/3241 |
| | | | 345/80 |
| 7,843,442 B2* | 11/2010 | Choi | G09G 3/3275 |
| | | | 345/204 |
| 7,872,259 B2 | 1/2011 | Den et al. | |
| 7,915,830 B2 | 3/2011 | Kimura | |
| 7,948,171 B2 | 5/2011 | Sakakura et al. | |
| 7,948,456 B2* | 5/2011 | Yamashita | G09G 5/10 |
| | | | 345/82 |
| 7,964,874 B2 | 6/2011 | Yamazaki et al. | |
| 7,999,770 B2 | 8/2011 | Kasai | |
| 8,059,068 B2 | 11/2011 | Kimura | |
| 8,101,439 B2 | 1/2012 | Yamazaki et al. | |
| 8,115,210 B2 | 2/2012 | Yamazaki et al. | |
| 8,134,524 B2 | 3/2012 | Sato et al. | |
| 8,149,185 B2 | 4/2012 | Uchino et al. | |
| 8,159,420 B2* | 4/2012 | Takahashi | G09G 3/3233 |
| | | | 345/83 |
| 8,207,024 B2 | 6/2012 | Yamazaki et al. | |
| 8,212,252 B2 | 7/2012 | Den et al. | |
| 8,242,986 B2 | 8/2012 | Kimura | |
| 8,264,430 B2* | 9/2012 | Kimura | G09G 3/3233 |
| | | | 315/169.3 |
| 8,373,696 B2 | 2/2013 | Miyazawa | |
| 8,378,578 B2 | 2/2013 | Kimura | |
| 8,395,161 B2 | 3/2013 | Yamazaki et al. | |
| 8,426,866 B2* | 4/2013 | Kimura | G09G 3/3233 |
| | | | 257/296 |
| 8,441,416 B2 | 5/2013 | Kang et al. | |
| 8,446,347 B2 | 5/2013 | Sato et al. | |
| 8,502,241 B2 | 8/2013 | Yamazaki et al. | |
| 8,508,443 B2 | 8/2013 | Kimura | |
| 8,558,453 B2 | 10/2013 | Sakakura et al. | |
| 8,564,508 B2* | 10/2013 | Uchino | G09G 3/3266 |
| | | | 345/82 |
| 8,604,704 B2 | 12/2013 | Kimura | |
| 8,643,021 B2 | 2/2014 | Yamazaki et al. | |
| 8,704,234 B2 | 4/2014 | Kubota et al. | |
| 8,803,768 B2* | 8/2014 | Kimura | G09G 3/3233 |
| | | | 345/82 |
| 8,895,984 B2 | 11/2014 | Kwak | |
| 8,902,134 B2 | 12/2014 | Yamashita et al. | |
| 8,907,875 B1 | 12/2014 | Yamashita et al. | |
| 9,006,757 B2 | 4/2015 | Yamazaki et al. | |
| 9,093,655 B2 | 7/2015 | Yamazaki et al. | |
| 9,825,068 B2 | 11/2017 | Kimura | |
| 2001/0043168 A1* | 11/2001 | Koyama | H10K 59/131 |
| | | | 345/52 |
| 2002/0000576 A1* | 1/2002 | Inukai | G09G 3/3266 |
| | | | 257/E27.111 |
| 2002/0019989 A1* | 2/2002 | Enomoto | H04N 21/4312 |
| | | | 725/139 |
| 2003/0062845 A1 | 4/2003 | Yamazaki et al. | |
| 2003/0103022 A1* | 6/2003 | Noguchi | G09G 3/3233 |
| | | | 345/77 |
| 2003/0112208 A1* | 6/2003 | Okabe | G09G 3/3233 |
| | | | 345/82 |
| 2003/0117352 A1* | 6/2003 | Kimura | H10K 59/1213 |
| | | | 345/98 |
| 2003/0132931 A1* | 7/2003 | Kimura | G09G 3/2022 |
| | | | 345/212 |
| 2003/0137503 A1* | 7/2003 | Kimura | G09G 3/3648 |
| | | | 345/212 |
| 2004/0070557 A1* | 4/2004 | Asano | G09G 3/3233 |
| | | | 345/76 |
| 2004/0080474 A1* | 4/2004 | Kimura | G09G 3/3233 |
| | | | 257/E27.113 |
| 2004/0145547 A1 | 7/2004 | Oh | |
| 2004/0150595 A1 | 8/2004 | Kasai | |
| 2004/0174349 A1* | 9/2004 | Libsch | H01L 27/12 |
| | | | 257/E27.111 |
| 2004/0174354 A1* | 9/2004 | Ono | G09G 3/3233 |
| | | | 345/204 |
| 2004/0207614 A1* | 10/2004 | Yamashita | G09G 3/3258 |
| | | | 345/211 |
| 2004/0257353 A1* | 12/2004 | Imamura | G09G 3/3241 |
| | | | 345/204 |
| 2005/0007361 A1 | 1/2005 | Fujikura et al. | |
| 2005/0057459 A1* | 3/2005 | Miyazawa | G09G 3/3233 |
| | | | 345/76 |
| 2005/0083270 A1* | 4/2005 | Miyazawa | G09G 3/3291 |
| | | | 345/76 |
| 2005/0093804 A1* | 5/2005 | Yamazaki | G09G 3/3233 |
| | | | 315/169.1 |
| 2005/0104814 A1* | 5/2005 | Choi | G09G 3/3233 |
| | | | 257/E27.113 |
| 2005/0140600 A1* | 6/2005 | Kim | G09G 3/3233 |
| | | | 345/76 |
| 2005/0200618 A1* | 9/2005 | Kim | G09G 3/3233 |
| | | | 345/204 |
| 2005/0206593 A1* | 9/2005 | Kwon | G09G 3/325 |
| | | | 345/76 |
| 2005/0237273 A1* | 10/2005 | Ozawa | G09G 3/3233 |
| | | | 345/82 |
| 2005/0259051 A1* | 11/2005 | Lee | G09G 3/3233 |
| | | | 345/76 |
| 2005/0269959 A1* | 12/2005 | Uchino | G02B 6/4268 |
| | | | 315/169.3 |
| 2005/0270254 A1 | 12/2005 | Ozaki | |
| 2005/0275038 A1* | 12/2005 | Shih | H01L 29/78648 |
| | | | 257/382 |
| 2005/0280614 A1 | 12/2005 | Goh | |
| 2005/0285826 A1* | 12/2005 | Park | G09G 3/3233 |
| | | | 345/76 |
| 2006/0022305 A1 | 2/2006 | Yamashita | |
| 2006/0022605 A1* | 2/2006 | Ha | G09G 3/3233 |
| | | | 315/169.3 |
| 2006/0066530 A1* | 3/2006 | Azami | G09G 3/3266 |
| | | | 345/76 |
| 2006/0066532 A1* | 3/2006 | Jeong | G09G 3/3233 |
| | | | 345/76 |
| 2006/0125807 A1* | 6/2006 | Park | G09G 3/3233 |
| | | | 345/204 |
| 2006/0156121 A1* | 7/2006 | Chung | G09G 3/3233 |
| | | | 714/726 |
| 2006/0170628 A1* | 8/2006 | Yamashita | G09G 3/3233 |
| | | | 345/76 |
| 2006/0221005 A1* | 10/2006 | Omata | G09G 3/3241 |
| | | | 345/76 |
| 2006/0232601 A1* | 10/2006 | Kimura | G09G 3/32 |
| | | | 345/605 |
| 2006/0232678 A1* | 10/2006 | Choi | G09G 3/3233 |
| | | | 348/207.11 |
| 2006/0238461 A1* | 10/2006 | Goh | G09G 3/3233 |
| | | | 345/76 |
| 2006/0255837 A1* | 11/2006 | Shionoiri | H03F 3/45179 |
| | | | 327/51 |
| 2006/0256046 A1* | 11/2006 | Kimura | H01L 29/4908 |
| | | | 257/E29.151 |
| 2006/0267885 A1* | 11/2006 | Kwak | G09G 3/3233 |
| | | | 345/76 |

(56) References Cited

U.S. PATENT DOCUMENTS

| | | | | |
|---|---|---|---|---|
| 2006/0279499 | A1* | 12/2006 | Park | H10K 59/131 345/92 |
| 2007/0001958 | A1* | 1/2007 | Lee | G09G 3/325 345/92 |
| 2007/0002084 | A1* | 1/2007 | Kimura | H10K 59/352 345/694 |
| 2007/0040772 | A1* | 2/2007 | Kim | G09G 3/3233 345/76 |
| 2007/0052634 | A1* | 3/2007 | Yamazaki | G09G 3/3233 345/76 |
| 2007/0063993 | A1* | 3/2007 | Shishido | H01L 27/1225 257/85 |
| 2007/0064469 | A1* | 3/2007 | Umezaki | H01L 27/1225 365/154 |
| 2007/0069995 | A1* | 3/2007 | Shin | H10K 59/12 345/76 |
| 2007/0085847 | A1* | 4/2007 | Shishido | G09G 3/3291 345/39 |
| 2007/0103419 | A1* | 5/2007 | Uchino | G09G 3/3233 345/92 |
| 2007/0120785 | A1* | 5/2007 | Kimura | G09G 3/3233 345/82 |
| 2007/0120795 | A1* | 5/2007 | Uchino | G09G 3/3233 345/92 |
| 2007/0126664 | A1* | 6/2007 | Kimura | H01L 29/78669 345/76 |
| 2007/0126665 | A1* | 6/2007 | Kimura | G09G 3/3233 257/E27.113 |
| 2007/0176888 | A1 | 8/2007 | Hattori et al. | |
| 2007/0200793 | A1* | 8/2007 | Kwon | G09G 3/325 345/204 |
| 2007/0222745 | A1* | 9/2007 | Kawai | G09G 3/2074 345/107 |
| 2007/0247399 | A1 | 10/2007 | Yamashita et al. | |
| 2007/0257867 | A1 | 11/2007 | Kasai | |
| 2007/0279343 | A1* | 12/2007 | Kim | G09G 3/3258 345/77 |
| 2008/0036704 | A1* | 2/2008 | Kim | G09G 3/3233 345/76 |
| 2008/0225061 | A1* | 9/2008 | Kimura | G09G 3/3233 345/690 |
| 2009/0051674 | A1* | 2/2009 | Kimura | G09G 3/3291 345/204 |
| 2009/0069916 | A1* | 3/2009 | Homburg | G06F 3/0487 700/94 |
| 2010/0079357 | A1* | 4/2010 | Ozawa | G09G 3/3233 345/82 |
| 2010/0149160 | A1* | 6/2010 | Kimura | G09G 3/3233 345/211 |
| 2011/0207255 | A1 | 8/2011 | Sakakura et al. | |
| 2012/0104401 | A1 | 5/2012 | Kubota et al. | |
| 2012/0169794 | A1 | 7/2012 | Uchino et al. | |
| 2013/0214276 | A1 | 8/2013 | Kubota et al. | |
| 2013/0240863 | A1 | 9/2013 | Sato et al. | |
| 2014/0346506 | A1* | 11/2014 | Kimura | G09G 3/3233 257/43 |
| 2015/0138255 | A1 | 5/2015 | Yamashita et al. | |
| 2015/0215999 | A1 | 7/2015 | Yamazaki et al. | |
| 2015/0302809 | A1* | 10/2015 | Suyama | G09G 3/3614 345/212 |
| 2015/0325633 | A1 | 11/2015 | Yamazaki et al. | |
| 2016/0259447 | A1* | 9/2016 | Lin | G06F 3/0446 |
| 2017/0062483 | A1* | 3/2017 | Kimura | G09G 3/3233 |
| 2018/0138215 | A1 | 5/2018 | Kimura | |

FOREIGN PATENT DOCUMENTS

| | | |
|---|---|---|
| CN | 001799081 A | 7/2006 |
| EP | 0717446 A | 6/1996 |
| EP | 1113412 A | 7/2001 |
| EP | 1193676 A | 4/2002 |
| EP | 1220191 A | 7/2002 |
| EP | 1229510 A | 8/2002 |
| EP | 1296310 A | 3/2003 |
| EP | 1310937 A | 5/2003 |
| EP | 1429312 A | 6/2004 |
| EP | 1607935 A | 12/2005 |
| EP | 1612765 A | 1/2006 |
| EP | 1628283 A | 2/2006 |
| EP | 1630870 A | 3/2006 |
| EP | 1632930 A | 3/2006 |
| EP | 1793425 A | 6/2007 |
| EP | 1870875 A | 12/2007 |
| EP | 2270867 A | 1/2011 |
| EP | 2290642 A | 3/2011 |
| EP | 2302614 A | 3/2011 |
| EP | 2309479 A | 4/2011 |
| JP | 08-234683 A | 9/1996 |
| JP | 2002-175029 A | 6/2002 |
| JP | 2002-215096 A | 7/2002 |
| JP | 2003-091245 A | 3/2003 |
| JP | 2003-167533 A | 6/2003 |
| JP | 2003-216110 A | 7/2003 |
| JP | 2003-308027 A | 10/2003 |
| JP | 2003-323154 A | 11/2003 |
| JP | 2003-332072 A | 11/2003 |
| JP | 2004-054200 A | 2/2004 |
| JP | 2004-093777 A | 3/2004 |
| JP | 2004-110015 A | 4/2004 |
| JP | 2004-133240 A | 4/2004 |
| JP | 2004-191752 A | 7/2004 |
| JP | 2004-280059 A | 10/2004 |
| JP | 2004-295131 A | 10/2004 |
| JP | 2004-361640 A | 12/2004 |
| JP | 2005-031534 A | 2/2005 |
| JP | 2005-099714 A | 4/2005 |
| JP | 2005-134838 A | 5/2005 |
| JP | 2005-189381 A | 7/2005 |
| JP | 2005-189387 A | 7/2005 |
| JP | 2005-189643 A | 7/2005 |
| JP | 2005-227562 A | 8/2005 |
| JP | 2005-227625 A | 8/2005 |
| JP | 2005-309150 A | 11/2005 |
| JP | 2005-326754 A | 11/2005 |
| JP | 2005-331959 A | 12/2005 |
| JP | 2005-340772 A | 12/2005 |
| JP | 2005-352398 A | 12/2005 |
| JP | 2006-011429 A | 1/2006 |
| JP | 2006-023402 A | 1/2006 |
| JP | 2006-065282 A | 3/2006 |
| JP | 2006-065322 A | 3/2006 |
| JP | 2006-098437 A | 4/2006 |
| JP | 2006-184888 A | 7/2006 |
| JP | 2006-186319 A | 7/2006 |
| JP | 2006-215213 A | 8/2006 |
| JP | 2006-215275 A | 8/2006 |
| JP | 2006-235609 A | 9/2006 |
| JP | 2006-243526 A | 9/2006 |
| JP | 2006-261109 A | 9/2006 |
| JP | 2007-148216 A | 6/2007 |
| JP | 2008-107785 A | 5/2008 |
| KR | 2006-0073695 A | 6/2006 |
| TW | 200424994 | 11/2004 |
| TW | 200504648 | 2/2005 |
| TW | 200509048 | 3/2005 |
| WO | WO-2004/021326 | 3/2004 |
| WO | WO-2006/051994 | 5/2006 |
| WO | WO-2006/059737 | 6/2006 |

OTHER PUBLICATIONS

Jung.J et al., "A 14.1 inch Full color AMOLED Display With Top Emission Structure and a-Si TFT Backplane", SID Digest '05 : SID International Symposium Digest of Technical Papers, 2005, vol. 36, pp. 1538-1541.

European Search Report (Application No. 07020230.4) dated Aug. 3, 2010.

Chinese Office Action (Application No. 200710167938.2) dated Aug. 25, 2010.

(56) References Cited

OTHER PUBLICATIONS

Taiwanese Office Action (Application No. 96138032) dated Oct. 29, 2013.
Chinese Office Action (Application No. 201110463024.7) dated Dec. 23, 2013.
Chinese Office Action (Application No. 201110463024.7) dated Dec. 29, 2014.

* cited by examiner

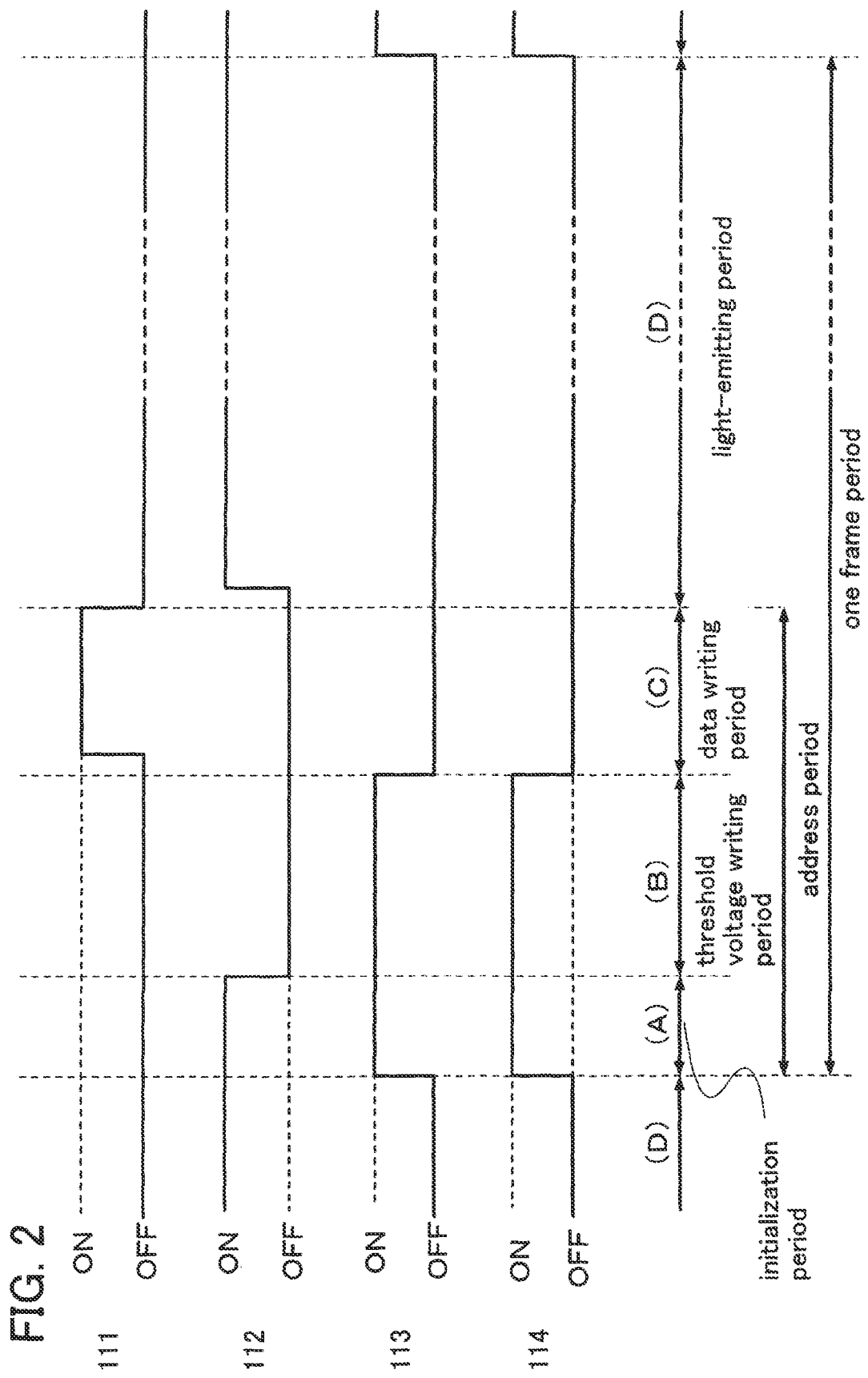

Initialization

Threshold voltage writing

Deta writing

Light-emitting

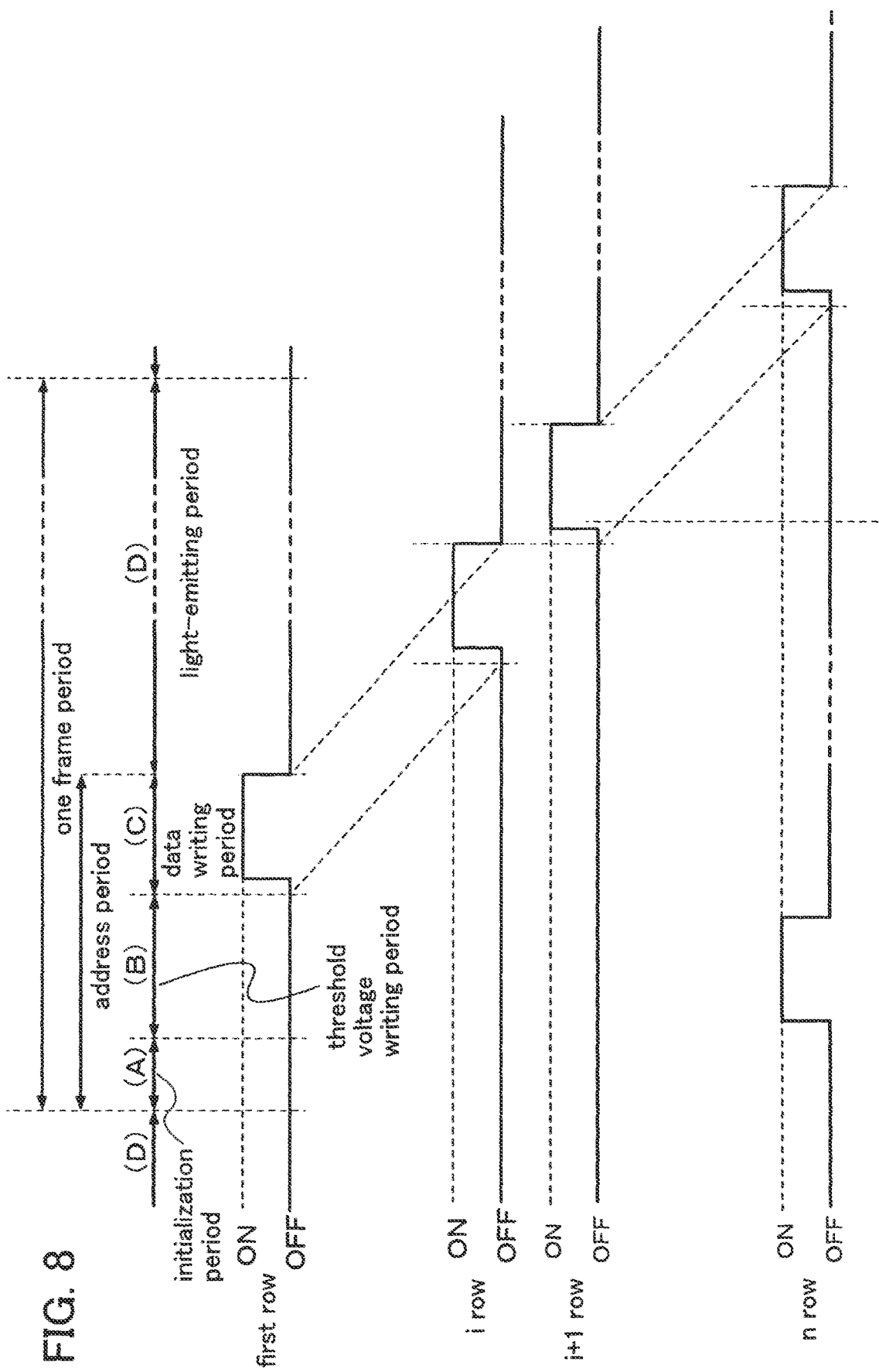

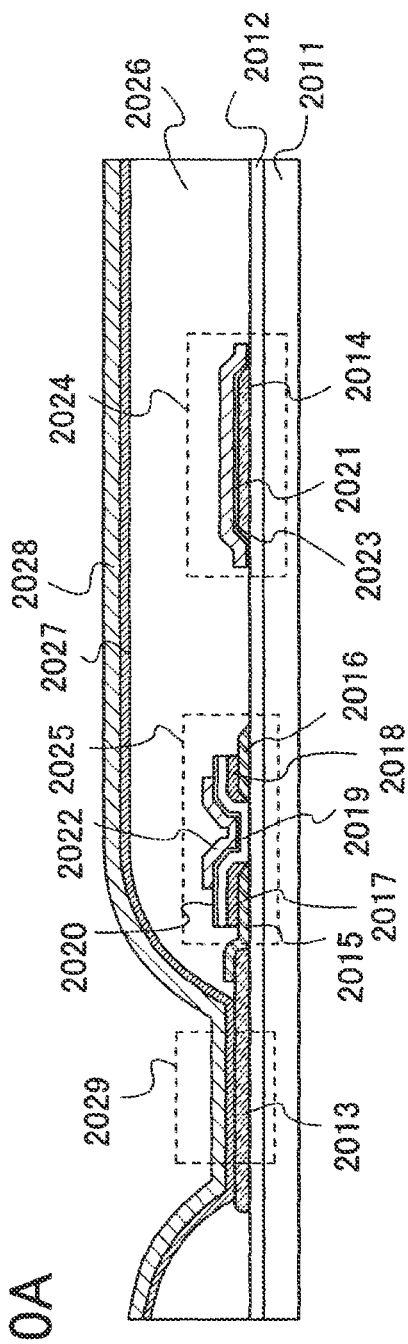

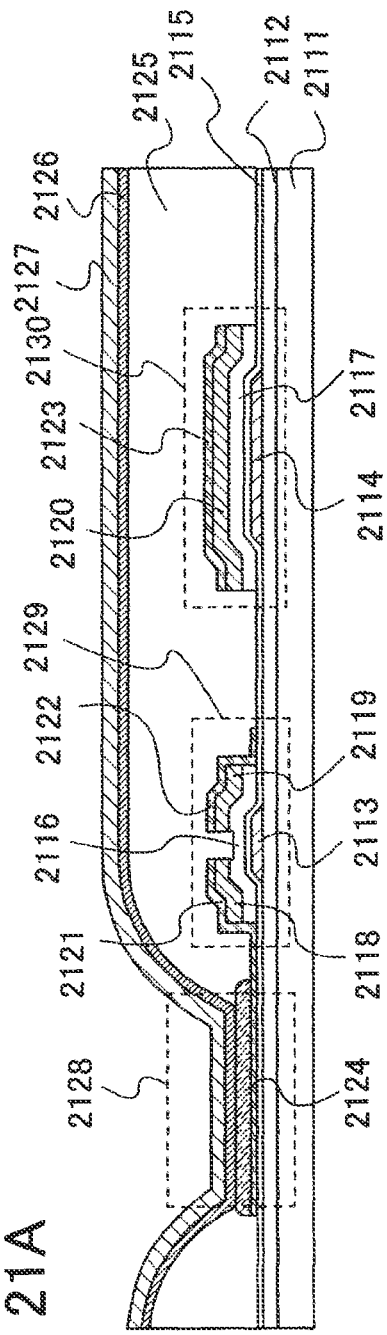

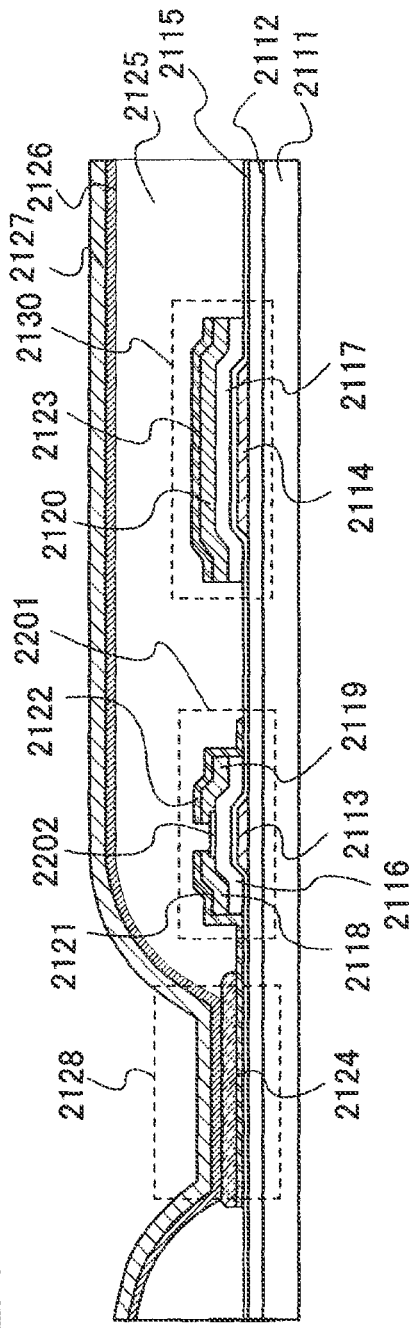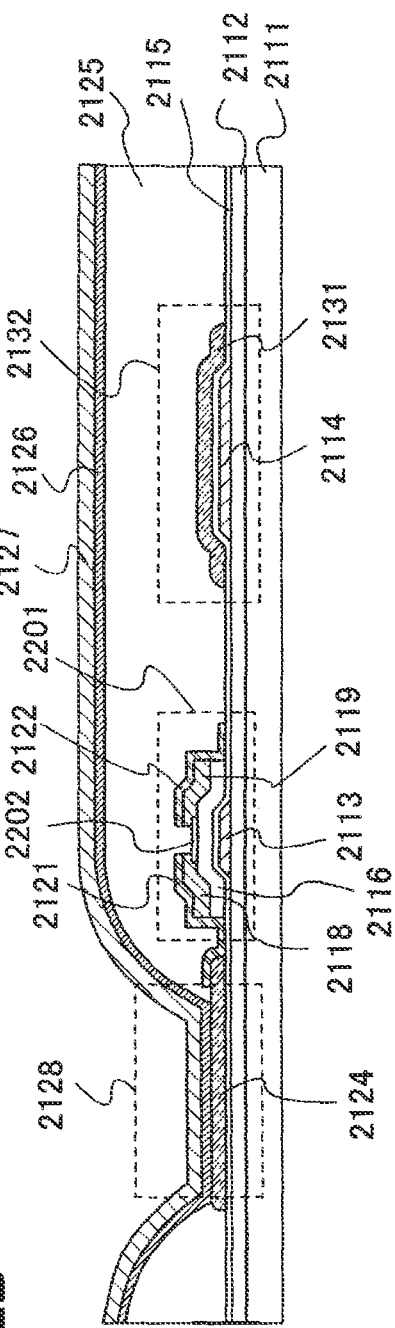

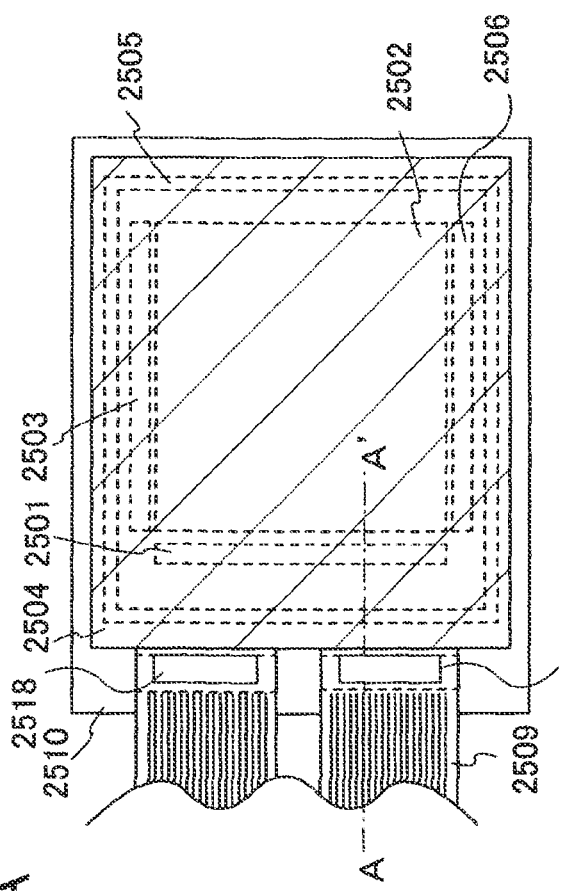
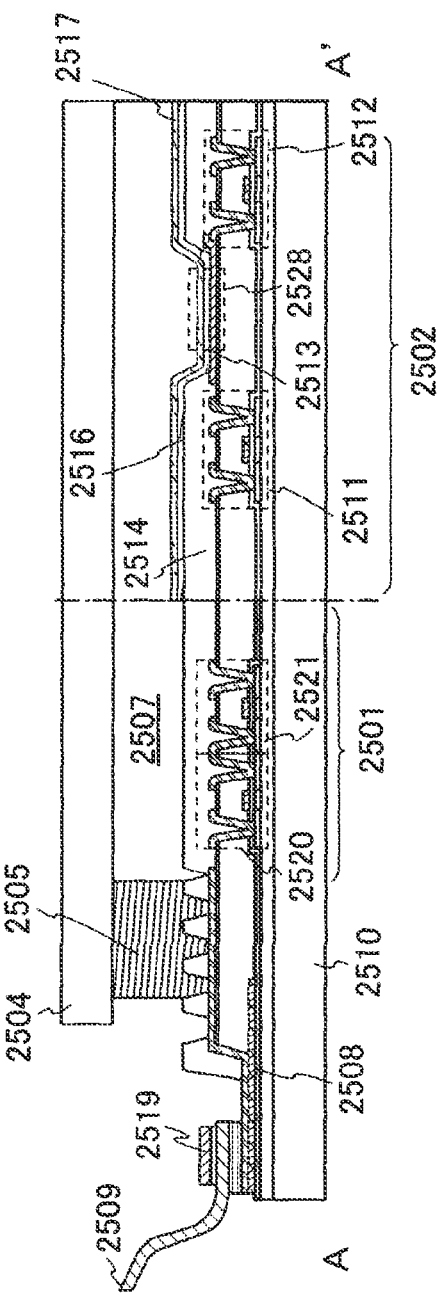
FIG. 25A
FIG. 25B

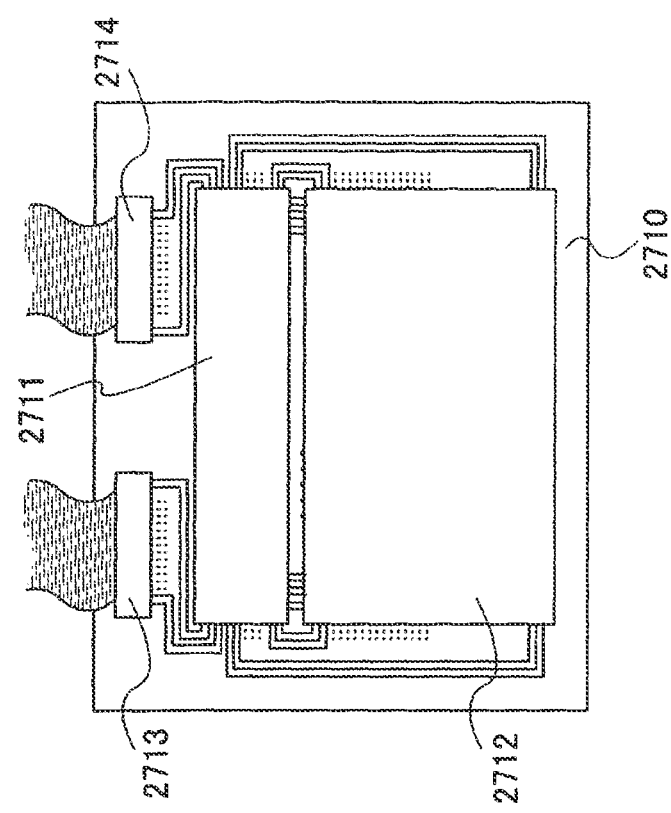
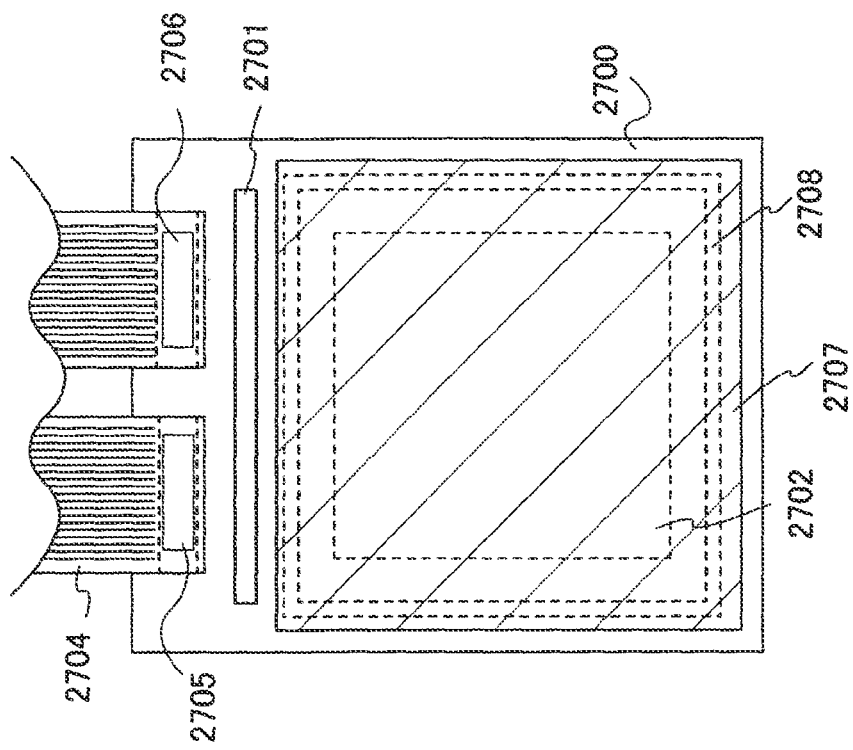
FIG. 27A
FIG. 27B

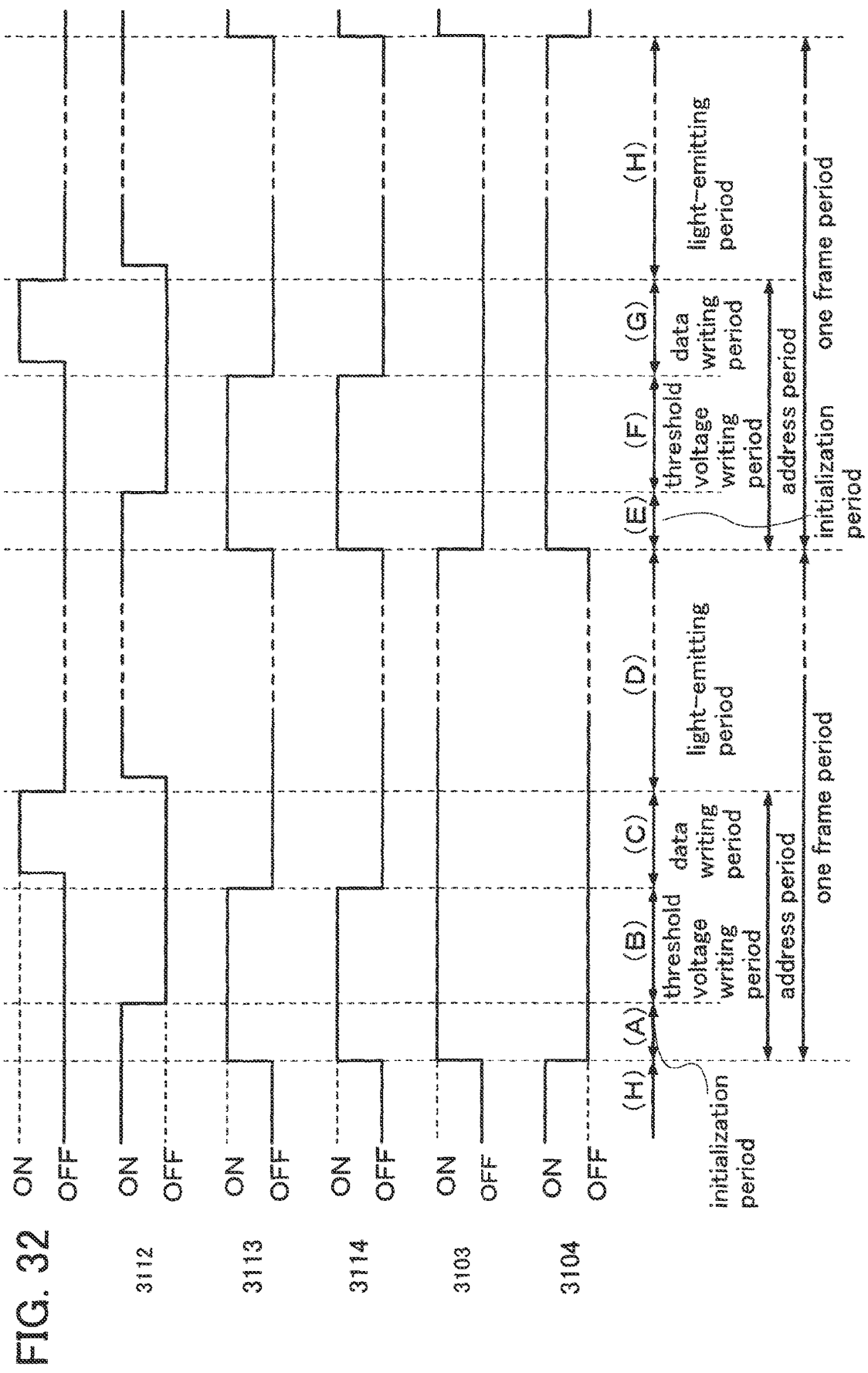

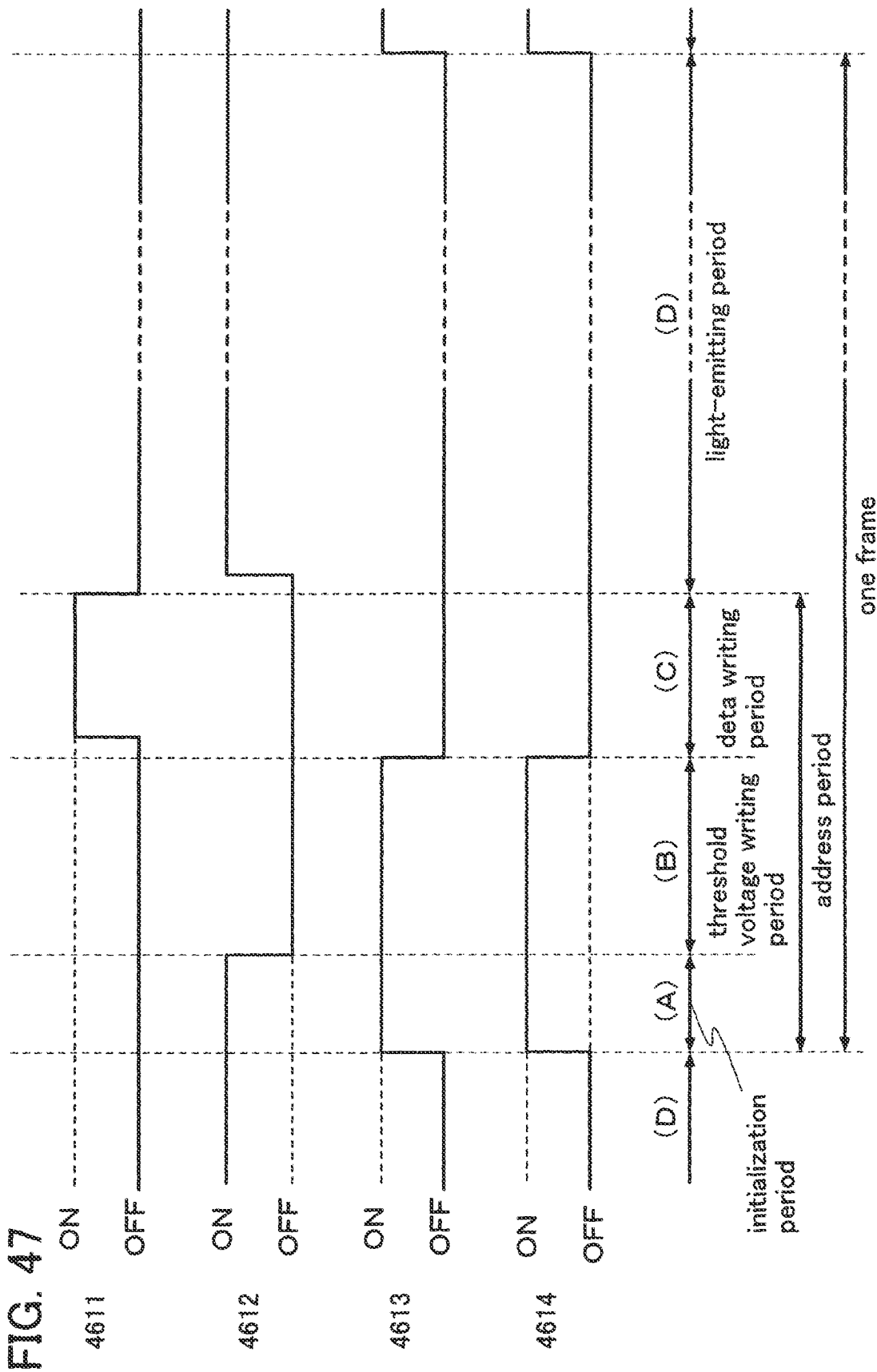

Initialization

Threshold voltage writing

Deta writing

Light-emitting

Initialization

Threshold voltage writing

Deta writing

Light-emitting

ELECTRONIC DEVICE, DISPLAY DEVICE, AND SEMICONDUCTOR DEVICE AND METHOD FOR DRIVING THE SAME

CROSS-REFERENCE TO RELATED APPLICATIONS

This application is a continuation of U.S. application Ser. No. 16/752,766, filed Jan. 27, 2020, now allowed, which is a continuation of U.S. application Ser. No. 15/351,688, filed Nov. 15, 2016, now U.S. Pat. No. 10,546,529, which is a continuation of U.S. application Ser. No. 14/454,763, filed Aug. 8, 2014, now abandoned, which is a continuation of U.S. application Ser. No. 11/877,325, filed Oct. 23, 2007, now U.S. Pat. No. 8,803,768, which claims the benefit of a foreign priority application filed in Japan as Serial No. 2006-291147 on Oct. 26, 2006, all of which are incorporated by reference.

BACKGROUND OF THE INVENTION

1. Field of the Invention

The present invention relates to a semiconductor device having a function for controlling current supplied to a load with a transistor, and relates to a display device including a pixel which is formed of a display element, luminance of which is changed in accordance with a signal, and a signal line driver circuit or scan line driver circuit which drives the pixel. In addition, the present invention relates to a driving method of such a semiconductor device and a display device. Further, the present invention relates to an electronic device having the display device in a display portion.

2. Description of the Related Art

In recent years, a self-luminous display device having a pixel formed by using a light-emitting element such as an electroluminescence (EL) element, i.e., a so-called to as light-emitting device has attracted attention. As a light-emitting element which is used for such a self-luminous display device, an organic light-emitting diode (OLED) and an EL element have attracted attention, and they have been used for an EL display or the like. Since these light-emitting elements emit light by themselves, an EL display or the like has advantages compared to a liquid crystal display such that it has higher pixel visibility, no backlight is needed, and response speed is higher. Note that luminance of a light-emitting element is often controlled by a current value flowing to the light-emitting element.

In addition, an active matrix display device in which a transistor which controls light emission of a light-emitting element is provided in each pixel has been developed. The active matrix display device has been expected to be put into practical use because not only it can realize high-definition display and large-screen display which are difficult to realize in a passive matrix display device, but also it can operate with less power consumption than the passive matrix display device.

FIG. 62 shows a pixel structure of a conventional active matrix display device (see Reference 1: Japanese Published Patent Application No. H08-234683). The pixel shown in FIG. 62 includes a thin film transistor (TFT) 11, a TFT 12, a capacitor 13, and a light-emitting element 14, and is connected to a signal line 15 and a scan line 16. Note that a power supply potential Vdd is supplied to one of a source electrode and a drain electrode of the TFT 12 and one electrode of the capacitor 13, and a ground potential is supplied to an opposite electrode of the light-emitting element 14.

At this time, in the case of using amorphous silicon for a semiconductor layer of the TFT 12 which controls a current value supplied to the light-emitting element 14, i.e., a driving TFT, the threshold voltage (Vth) fluctuates due to deterioration or the like. In that case, although the same potential is applied from the signal line 15 to different pixels, current flowing to the light-emitting element 14 is different in each pixel, and display luminance becomes ununiform depending on the pixels. Note that also in the case of using polysilicon for the semiconductor layer of the driving TFT, characteristics of the transistor deteriorate or vary.

In order to overcome this problem, an operating method using a pixel in FIG. 63 is proposed in Reference 2 (Reference 2: Japanese Published Patent Application No. 2004-295131). The pixel shown in FIG. 63 includes a transistor 21, a driving transistor 22 which controls a current value supplied to a light-emitting element 24, a capacitor 23, and the light-emitting element 24, and is connected to a signal line 25 and a scan line 26. Note that the driving transistor 22 is an NMOS transistor, and a ground potential is supplied to one of a source electrode and a drain electrode of the driving transistor 22 and Vca is supplied to an opposite electrode of the light-emitting element 24.

FIG. 64 shows a timing chart of operations of this pixel. In FIG. 64, one frame period is divided into an initialization period 31, a threshold voltage (Vth) writing period 32, a data writing period 33, and a light-emitting period 34. Note that one frame period corresponds to a period for displaying an image for one screen, and the initialization period, the threshold voltage (Vth) writing period, and the data writing period are collectively referred to as an address period.

First, the threshold voltage of the driving transistor 22 is written into the capacitor 23 in the threshold voltage writing period 32. After that, data voltage (Vdata) showing luminance of the pixel is written into the capacitor 23 and Vdata+Vth is stored in the capacitor 23 in the data writing period 33. Then, the driving transistor 22 is turned on in the light-emitting period 34, so that the light-emitting element 24 emits light with luminance specified by the data voltage by changing Vca. By performing such an operation, variations in luminance caused by fluctuations of the threshold voltage of the driving transistor 22 are reduced.

Reference 3 (Reference 3: Japanese Published Patent Application No. 2004-280059) also discloses that voltage of the sum of the threshold voltage of a driving TFT and a data potential corresponds to gate-source voltage of the driving TFT, so that current flowing to a light-emitting element does not change even when the threshold voltage of the TFT fluctuates.

As described above, in a display device, suppression of variations of a current value caused by variations in the threshold voltage of a driving TFT has been expected.

In each of the operating methods disclosed in Reference 2 and Reference 3, initialization, threshold voltage writing, and light emission are performed by changing a potential of Vca several times in each one frame period. In each pixel disclosed in Reference 2 and Reference 3, since one electrode of a light-emitting element to which Vca is supplied, i.e., an opposite electrode thereof is formed over the entire pixel region, the light-emitting element cannot emit light if there is even one pixel in which a data writing operation is performed other than initialization and threshold voltage writing. Therefore, as shown in FIG. 65, a ratio of a light-emitting period in one frame period (i.e., a duty ratio) becomes low.

When the duty ratio is low, the amount of current supplied to a light-emitting element and a driving transistor is needed to be increased, so that voltage applied to the light-emitting element becomes higher and power consumption also becomes higher. In addition, since the light-emitting element and the driving TFT easily deteriorate, screen burn-in is generated or higher power is needed to obtain luminance which is almost equal to luminance before deterioration.

In addition, since the opposite electrode is connected to all pixels, the light-emitting element functions as an element having large capacitance. Therefore, in order to change a potential of the opposite electrode, high power consumption is needed.

SUMMARY OF THE INVENTION

In view of the foregoing problems, it is an object of the present invention to provide a display device with low power consumption and high brightness. It is another object of the present invention to obtain a pixel structure, a semiconductor device, and a display device with little deviation from luminance specified by a data potential. Note that a target of the present invention is not limited to only a display device having a light-emitting element, and it is another object of the present invention to suppress variations of a current value caused by variations in the threshold voltage of a transistor.

In accordance with one aspect of the present invention, a pixel having a transistor which controls a current value supplied to a load, a first storage capacitor, a second storage capacitor, and first to fourth switches is included. After the threshold voltage of the transistor is held in the second storage capacitor, a potential in accordance with a video signal is input to the pixel. Voltage obtained by adding a potential in which the potential in accordance with the video signal and the first storage capacitor are capacitively divided to the threshold voltage is held in the second storage capacitor in this manner, so that variations of a current value caused by variations in the threshold voltage of the transistor are suppressed. Thus, desired current can be supplied to the load such as a light-emitting element. In addition, a display device with little deviation from luminance specified by the video signal can be provided.

In accordance with another aspect of the present invention, a semiconductor device includes a transistor, a storage capacitor, a first switch, a second switch, a third switch, and a fourth switch. One of a source electrode and a drain electrode of the transistor is electrically connected to a pixel electrode. The other of the source electrode and the drain electrode of the transistor is electrically connected to a first wiring through the second switch. The other of the source electrode and the drain electrode of the transistor is electrically connected to a gate electrode of the transistor through the third switch. The gate electrode of the transistor is electrically connected to a second wiring through the storage capacitor and the fourth switch. The gate electrode of the transistor is electrically connected to a third wiring through the storage capacitor and the first switch.

In accordance with another aspect of the present invention, a semiconductor device includes a transistor, a first storage capacitor, a second storage capacitor, a first switch, a second switch, a third switch, and a fourth switch. One of a source electrode and a drain electrode of the transistor is electrically connected to a pixel electrode. The one of the source electrode and the drain electrode of the transistor is electrically connected to a gate electrode of the transistor through the second storage capacitor. The other of the source electrode and the drain electrode of the transistor is electrically connected to a first wiring through the second switch. The other of the source electrode and the drain electrode of the transistor is electrically connected to the gate electrode of the transistor through the third switch. The gate electrode of the transistor is electrically connected to a second wiring through the first storage capacitor and the fourth switch. The gate electrode of the transistor is electrically connected to a third wiring through the first storage capacitor and the first switch.

In accordance with another aspect of the present invention, a semiconductor device includes a transistor, a first storage capacitor, a second storage capacitor, a first switch, a second switch, a third switch, a fourth switch, and a fifth switch. One of a source electrode and a drain electrode of the transistor is electrically connected to a pixel electrode. The one of the source electrode and the drain electrode of the transistor is electrically connected to a gate electrode of the transistor through the second storage capacitor. The one of the source electrode and the drain electrode of the transistor is electrically connected to a fourth wiring through the fifth switch. The other of the source electrode and the drain electrode of the transistor is electrically connected to a first wiring through the second switch. The other of the source electrode and the drain electrode of the transistor is electrically connected to the gate electrode of the transistor through the third switch. The gate electrode of the transistor is electrically connected to a second wiring through the first storage capacitor and the fourth switch. The gate electrode of the transistor is electrically connected to a third wiring through the first storage capacitor and the first switch.

In the above-described structure, the second wiring may be the same as a wiring which controls the first switch. In addition, the second wiring may be any one of scan lines each of which controls one of the first switch to the fourth switch in a previous row or the next row.

In accordance with another aspect of the present invention, a semiconductor device includes a transistor, a first storage capacitor, a second storage capacitor, a first switch, a second switch, a third switch, and a fourth switch. One of a source electrode and a drain electrode of the transistor is electrically connected to a pixel electrode. The one of the source electrode and the drain electrode of the transistor is electrically connected to a gate electrode of the transistor through the second storage capacitor. The other of the source electrode and the drain electrode of the transistor is electrically connected to a first wiring through the second switch. The other of the source electrode and the drain electrode of the transistor is electrically connected to the gate electrode of the transistor through the third switch. The gate electrode of the transistor is electrically connected to the first wiring through the first storage capacitor and the fourth switch. The gate electrode of the transistor is electrically connected to a third wiring through the first storage capacitor and the first switch.

In accordance with another aspect of the present invention, a semiconductor device includes a transistor, a first storage capacitor, a second storage capacitor, a first switch, a second switch, a third switch, and a rectifier. One of a source electrode and a drain electrode of the transistor is electrically connected to a pixel electrode. The one of the source electrode and the drain electrode of the transistor is electrically connected to a gate electrode of the transistor through the second storage capacitor. The other of the source electrode and the drain electrode of the transistor is electrically connected to a first wiring through the second switch. The other of the source electrode and the drain electrode of the transistor is electrically connected to the gate electrode of the transistor through the third switch. The gate electrode of the transistor is electrically connected to a second wiring through the first storage capacitor and the rectifier. The gate electrode of the transistor is electrically connected to a third wiring through the first storage capacitor and the first switch.

In accordance with another aspect of the present invention, a semiconductor device includes a transistor, a first storage capacitor, a second storage capacitor, a first switch, a second switch, a third switch, and a fourth switch. One of a source electrode and a drain electrode of the transistor is electrically connected to a pixel electrode. The one of the source electrode and the drain electrode of the transistor is electrically connected to a gate electrode of the transistor through the second storage capacitor. The other of the source electrode and the drain electrode of the transistor is electrically connected to a first wiring through the second switch. The other of the source electrode and the drain electrode of the transistor is electrically connected to the gate electrode of the transistor through the third switch. The gate electrode of the transistor is electrically connected to a third wiring through the first storage capacitor and the first switch. The fourth switch is electrically connected to the first storage capacitor in parallel and is electrically connected to the third wiring through the first switch.

The transistor may be an N-channel transistor. In addition, a semiconductor layer of the transistor may be formed of an amorphous semiconductor film. Further, the semiconductor layer of the transistor may be formed of amorphous silicon.

Alternatively, the semiconductor layer of the transistor may be a crystalline semiconductor film.

In the above-described invention, a potential of the first wiring may be higher than a value obtained by adding the threshold voltage of the transistor to a potential of the pixel electrode.

In addition, the transistor may be a P-channel transistor. In that case, in the above-described invention, a potential of the first wiring may be lower than a value obtained by subtracting the threshold voltage of the transistor from a potential of the pixel electrode.

In accordance with another aspect of the present invention, a semiconductor device includes a first storage capacitor, a transistor of which one of a source electrode and a drain electrode is electrically connected to a load, the other of the source electrode and the drain electrode is electrically connected to a first wiring, and a gate electrode is electrically connected to a second wiring through the first storage capacitor, a second storage capacitor which holds gate-source voltage of the transistor, a means for making the first storage capacitor hold first voltage and making the second storage capacitor hold second voltage, a means for discharging the second storage capacitor so that a voltage of the second storage capacitor becomes the threshold voltage of the transistor from the second voltage, and a means for supplying current which is set for the transistor to the load by inputting a potential in accordance with a video signal to the first storage capacitor from the second wiring.

The transistor may be an N-channel transistor. In addition, a semiconductor layer of the transistor may be formed of an amorphous semiconductor film. Further, the semiconductor layer of the transistor may be formed of amorphous silicon.

Alternatively, the semiconductor layer of the transistor may be a crystalline semiconductor film.

In addition, the transistor may be a P-channel transistor.

Further, in accordance with another aspect of the present invention, a display device including the above-described semiconductor device and an electronic device including the display device are included.

Note that various types of switches can be used as a switch shown in this specification. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used as a switch. Alternatively, a logic circuit combining such elements can be used as a switch.

In the case of using a transistor as a switch, polarity (a conductivity type) of the transistor is not particularly limited because it operates just as a switch. However, a transistor having polarity with a smaller off-current is preferably used. A transistor provided with an LDD region, a transistor with a multi-gate structure, and the like are given as examples of a transistor with a smaller off-current. In addition, an N-channel transistor is preferably used when a potential of a source electrode of the transistor which is operated as a switch is closer to low-potential-side power supply voltage (e.g., Vss, GND, or 0 V), while a P-channel transistor is preferably used when a potential of the source electrode is closer to high-potential-side power supply voltage (e.g., Vdd). The absolute value of gate-source voltage can be increased by operating the transistor in this manner, so that the transistor can more easily operate as a switch. Further, since a source follower operation is not often performed, reduction in output voltage can be prevented.

Note that a CMOS switch may be used by using both N-channel and P-channel transistors. By using a CMOS switch, output voltage can be easily controlled with respect to various input voltages, so that the switch can be operated appropriately. In addition, since a voltage amplitude value of a signal for turning on or off the switch can be made small, power consumption can also be reduced.

Note also that when a transistor is used as a switch, one of a source electrode and a drain electrode functions as an input terminal of the switch; the other of the source electrode and the drain electrode functions as an output terminal; and a gate electrode functions as a terminal for controlling electrical conduction of the switch. On the other hand, when a diode is used as a switch, the switch does not have a terminal for controlling electrical conduction in some cases. Therefore, when a diode is used as a switch, the number of wirings can be more reduced than the case of using a transistor as a switch because wirings for controlling terminals are not needed.

Note that in the present invention, description "be connected" is synonymous with description "be electrically connected". Accordingly, in structures disclosed in the present invention, another element which enables an electrical connection (e.g., a switch, a transistor, a capacitor, an inductor, a resistor, or a diode) may be interposed between elements having a predetermined connection relation, for example, a connection relation shown in drawings and texts. Needless to say, the elements may be arranged without interposing another element therebetween, and description "be electrically connected" includes the case where elements are directly connected.

Note that the load is not limited to a light-emitting element typified by an electroluminescence (EL) element, and a display medium, whose brightness, a color tone, polarized light, or the like is changed by supplying current therethrough can be employed as the load. Since it is only necessary that desired current be supplied to the load, a display medium, whose contrast changes by an electromagnetic action, such as an electron emitter, a liquid crystal element, electronic ink, an electrophoresis element, a grating light valve (GLV), a plasma display panel (PDP), or a digital micromirror device (DMD) can also be employed as the load, for example. In addition, a carbon nanotube can also be used for the electron emitter. Note that display devices using EL elements include an EL display; display devices using electron emitters include a field emission display (FED), an SED-type flat panel display (SED: Surface-conduction Electron-emitter Display), or the like; display devices using liquid crystal elements include a liquid crystal display, a transmissive liquid crystal display, a semi-transmissive liquid crystal display, and a reflective liquid crystal display; and display devices using electronic ink include electronic paper.

Note that a transistor is an element having at least three terminals of a gate electrode, a drain region, and a source region, and has a channel formation region between the drain region and the source region. Here, since the source region and the drain region of the transistor change depending on the structure, the operating conditions, or the like of the transistor, it is difficult to accurately define a range of the source region or the drain region. Therefore, when a connection relation of the transistor is described, as for a terminal of the drain region and a terminal of the source region, one of electrodes each of which is connected to the drain region or the source region is described as a first electrode and the other of the electrodes is described as a second electrode.

Note also that a transistor may be an element having at least three terminals of a base, an emitter, and a collector. One of the emitter and the collector corresponds to a first electrode and the other of the electrodes corresponds to a second electrode.

Note that in the present invention, various types of transistors can be used as a transistor without limiting to a certain type. For example, a thin film transistor (TFT) including a non-single crystalline semiconductor film typified by amorphous silicon, polycrystalline silicon, microcrystalline (also referred to as semi-amorphous) silicon, or the like can be used. In the case of using the TFT, there are various advantages. For example, since the TFT can be formed at temperature lower than that of the case of using single crystalline silicon, manufacturing cost can be reduced or a manufacturing device can be made large. Since the manufacturing device can be made large, the TFT can be formed using a large substrate and many display devices can be formed at the same time. Therefore, the TFT can be formed at lower cost. In addition, a substrate having low heat resistance can be used because of low manufacturing temperature, and for example, the TFT can be formed over a light-transmitting substrate such as a glass substrate.

Note that by using a catalyst (e.g., nickel) in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate as a pixel portion. Note also that a catalyst is not necessarily used.

In the case of using microcrystalline silicon, part of a gate driver circuit (e.g., a scan line driver circuit) and/or a source driver circuit (e.g., an analog switch) can be formed over the same substrate as a pixel portion.

In addition, a transistor can be formed by using a semiconductor substrate, an SOI substrate, or the like. In that case, a MOS transistor, a junction transistor, a bipolar transistor, or the like can be used as the transistor. Therefore, a transistor with few variations in characteristics, sizes, shapes, or the like, and having high current supply capacity can be formed. Thus, power consumption of a circuit can be reduced or a circuit can be highly integrated.

In addition, a transistor including a compound semiconductor or a oxide semiconductor such as ZnO, a-InGaZnO, SiGe, GaAs, IZO, ITO, or SnO, and a thin film transistor or the like obtained by thinning such a compound semiconductor or a oxide semiconductor can be used. Therefore, manufacturing temperature can be lowered and for example, such a transistor can be formed at room temperature. Accordingly, the transistor can be formed directly on a substrate having low heat resistance such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor or the like formed by using an inkjet method or a printing method can also be used. Accordingly, such a transistor can be formed at room temperature, can be formed at a low vacuum, or can be formed using a large substrate. In addition, since the transistor can be formed without using a mask (a reticle), a layout of the transistor can be easily changed. Further, since it is not necessary to use a resist, the number of steps is reduced to cut manufacturing cost. Furthermore, since a film is formed only in a necessary portion, a material is not wasted compared with the case in which etching is performed after the film is formed over the entire surface, so that the transistor can be formed at low cost.

Further, a transistor or the like including an organic semiconductor or a carbon nanotube can be used. Since such a transistor can also be formed using a flexible substrate, it can resist a shock. Furthermore, various transistors can be used without limiting to these transistors.

Moreover, a transistor can be formed using various types of substrates without limiting to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. In addition, after the transistor may be formed using one substrate, the transistor may be transferred to another substrate to arrange the transistor to another substrate. A single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. By using such a substrate, a transistor with excellent properties can be formed, heat resistivity can be improved, or reduction in weight can be achieved.

A structure of a transistor can be various modes without limiting to a certain structure. For example, a multi-gate structure having two or more gate electrodes may be used. When the multi-gate structure is used, a structure where a plurality of transistors are connected in series is provided because a structure where channel regions are connected in series is provided. By using such a multi-gate structure, off-current can be reduced and the withstand voltage of the transistor can be increased to improve reliability. In addition, by using the multi-gate structure, drain-source current does not fluctuate very much even if drain-source voltage fluctuates when the transistor operates in a saturation region, so that characteristics where a slope of voltage-current characteristics is flat can be obtained. By utilizing the characteristics where the slope of the voltage-current characteristics is flat, an ideal current source circuit or an active load having an extremely high resistance value can be realized. Accordingly, a differential circuit or a current mirror circuit having excellent properties can be realized. Further, a structure where gate electrodes are formed above and below a channel region may be used. By using the structure where gate electrodes are formed above and below the channel region, an effective channel region is enlarged, so that the amount of current flowing therethrough can be increased or a depletion layer can be easily formed to decrease an S value. When the gate electrodes are formed above and below the channel region, a structure where a plurality of transistors are connected in parallel is provided.

Further, a structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series may be used. In addition, a source electrode or a drain electrode may overlap with a channel region (or part of it). By using the structure where the source electrode or the drain electrode overlaps with the channel region (or part of it) in this manner, the case can be prevented in which electric charges are accumulated in part of the channel region, which would result in an unstable operation. Further, an LDD region may be provided. By providing the LDD region, off-current can be reduced or the withstand voltage of the transistor can be increased to improve reliability. Alternatively, drain-source current does not fluctuate very much even if drain-source voltage fluctuates when the transistor operates in the saturation region, so that characteristics where a slope of voltage-current characteristics is flat can be obtained.

Note that various types of transistors can be used for a transistor in the present invention and the transistor can be formed using various types of substrates. Accordingly, all of circuits which are necessary to realize a predetermined function may be formed using the same substrate. For example, all of the circuits which are necessary to realize the predetermined function may be formed using a glass substrate, a plastic substrate, a single crystalline substrate, or an SOI substrate. When all of the circuits which are necessary to realize the predetermined function are formed using the same substrate in this manner, the number of component parts can be reduced to cut cost and the number of connections to circuit components can be reduced to improve reliability. On the other hand, part of the circuits which are necessary to realize the predetermined function may be formed using one substrate and another part of the circuits which are necessary to realize the predetermined function may be formed using another substrate. That is, not all of the circuits which are necessary to realize the predetermined function are needed to be formed using the same substrate.

For example, part of the circuits which are necessary to realize the predetermined function may be formed with transistors using a glass substrate and another part of the circuits which are necessary to realize the predetermined function may be formed using a single crystalline substrate, so that an IC chip formed by a transistor using the single crystalline substrate may be connected to the glass substrate by COG (Chip On Glass) and the IC chip may be provided over the glass substrate. Alternatively, the IC chip may be connected to the glass substrate by TAB (Tape Automated Bonding) or a printed wiring board. When part of the circuits are formed using the same substrate in this manner, the number of the component parts can be reduced to cut cost and the number of connections to the circuit components can be reduced to improve reliability. In addition, for example, by forming a circuit in a portion with high driving voltage or a portion with high driving frequency, which consumes large power, using an IC chip formed using a single crystalline substrate instead of forming a circuit in such a portion using the same substrate, increase in power consumption can be prevented.

Note also that one pixel corresponds to one element whose brightness can be controlled in this specification. For example, one pixel corresponds to one color element and brightness is expressed with the one color element. Accordingly, in the case of a color display device having color elements of R (Red), G (Green), and B (Blue), a minimum unit of an image is formed of three pixels of an R pixel, a G pixel, and a B pixel. Note that the color elements are not limited to three colors, and color elements of more than three colors may be used or a color other than RGB may be added. For example, there are RGBW (W corresponds to white) and RGB plus one or more colors of yellow, cyan, magenta emerald green, vermilion, and the like. Further, a color similar to at least one of R, G, and B may be added to RGB. For example, R, G, B1, and B2 may be used. Although both B1 and B2 are blue, they have slightly different frequency. Similarly, R1, R2, G, and B, or R, G1, G2, and B may be used. By using such color elements, display which is closer to the real object can be performed and power consumption can be reduced. Alternatively, as another example, in the case of controlling brightness of one color element by using a plurality of regions, one region may correspond to one pixel. As n example, the case of performing area ratio gray scale display or the case of including a subpixel can be given. In such a case, a plurality of regions which control brightness are provided in each color element and gray scales are expressed with the whole regions. In this case, one region which controls brightness may correspond to one pixel. Thus, in that case, one color element includes a plurality of pixels. Alternatively, even when the plurality of regions which control brightness are provided in one color element, these regions may be collected as one pixel. Note that in that case, one color element includes one pixel. In the case where brightness is controlled in a plurality of regions in each color element, regions which contribute to display have different area dimensions depending on pixels in some cases. In addition, in the plurality of regions which control brightness in each color element, signals supplied to each of the plurality of regions may be slightly varied to widen a viewing angle. That is, potentials of pixel electrodes included in the plurality of regions provided in each color element are different from each other. Accordingly, voltage applied to liquid crystal molecules are varied depending on the pixel electrodes. Therefore, the viewing angles can be widened.

Note also that a semiconductor device corresponds to a device having a circuit including a semiconductor element (e.g., a transistor or a diode). The semiconductor device may correspond to any device which can function by utilizing semiconductor characteristics. Note that a display device corresponds to not only a display panel itself where a plurality of pixels including loads and a peripheral driven circuit for driving the pixels are formed over a substrate but also the display panel to which a flexible printed circuit (FPC) or a printed wiring board (PWB) is attached.

In the present invention, description that an object is formed "on" or formed "over" another object does not necessarily mean that the object is formed in direct contact with another object. The description includes the case where two objects are not in direct contact with each other, that is, the case where another object is interposed therebetween. Accordingly, for example, when it is described that a layer B is formed on (or over) a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed above another object, it does not necessarily mean that the object is in direct contact with another object, and another object may be interposed therebetween. Accordingly, for example, when it is described that a layer B is formed above a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed below or under another object, it includes both of the case where the objects are in direct contact with each other, and the case where the objects are not in contact with each other.

By using the present invention, variations of the current value caused by variations in the threshold voltage of a transistor can be suppressed. Therefore, desired current can be supplied to a load such as a light-emitting element. In particular, in the case of using a light-emitting element as a load, a display device with few variations in luminance and a high ratio of a light-emitting period in one frame period can be provided.

BRIEF DESCRIPTION OF THE DRAWINGS

In the accompanying drawings:

FIG. 2 is a timing chart showing operations of the pixel shown in FIG. 1;

FIG. 8 is a chart showing a writing operation of a display device shown in Embodiment Mode 1;

FIGS. 20A and 20B are partial sectional views each showing a pixel shown in Embodiment Mode 9;

FIGS. 21A and 21B are partial sectional views each showing a pixel shown in Embodiment Mode 9;

FIGS. 22A and 22B are partial sectional views each showing a pixel shown in Embodiment Mode 9;

FIGS. 25A and 25B are views each showing a display device shown in Embodiment Mode 11;

FIGS. 27A and 27B are views each showing a display device shown in Embodiment Mode 11;

FIG. 32 is a timing chart showing operations of the pixel shown in FIG. 31;

FIG. 47 is a timing chart showing operations of the pixel shown in FIG. 46;

DETAILED DESCRIPTION OF THE INVENTION

Figure 1:
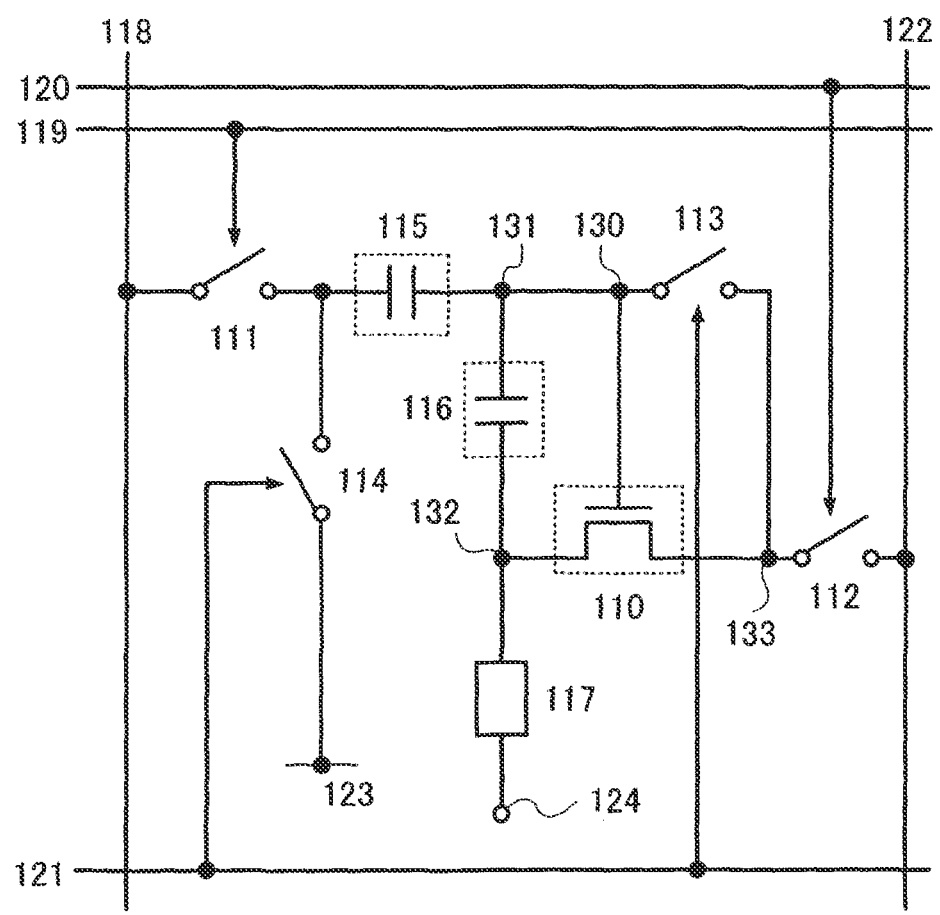
FIG. 1 is a diagram showing a pixel structure shown in Embodiment Mode 1.

Hereinafter, modes of the present invention are described. However, the present invention can be implemented in various different ways and it will be easily understood by those skilled in the art that various changes and modifications are possible. Unless such changes and modifications depart from the spirit and the scope of the present invention, they should be construed as being included therein. Therefore, the present invention should not be construed as being limited to the description of the modes. Note that in structures of the present invention described below, reference numerals showing the same portions are used in common among different drawings.

Embodiment Mode 1

A basic structure of a pixel of the present invention is described with reference to FIG. 1. The pixel shown in FIG. 1 includes a transistor 110, a first switch 111, a second switch 112, a third switch 113, a fourth switch 114, a first capacitor 115, a second capacitor 116, and a light-emitting element 117. Note that the pixel is connected to a signal line 118, a first scan line 119, a second scan line 120, a third scan line 121, a power supply line 122, and a potential supply line 123. In this embodiment mode, the transistor 110 is an N-channel transistor, and is turned on when gate-source voltage (Vgs) thereof exceeds the threshold voltage (Vth). In addition, a pixel electrode of the light-emitting element 117 functions as an anode and an opposite electrode 124 thereof functions as a cathode. Note that gate-source voltage of the transistor is described as Vgs; drain-source voltage of the transistor is described as Vds; the threshold voltage of the transistor is described as Vth; and voltages stored in the first capacitor 115 and the second capacitor 116 are described as Vc1 and Vc2, respectively. The power supply line 122, the potential supply line 123, and the signal line 118 are also referred to as a first wiring, a second wiring, and a third wiring, respectively. Further, the first scan line 119, the second scan line 120, and the third scan line 121 may be referred to as a fourth wiring, a fifth wiring, and a sixth wiring, respectively.

A first electrode (one of a source electrode and a drain electrode) of the transistor 110 is connected to the pixel electrode of the light-emitting element 117; a second electrode (the other of the source electrode and the drain electrode) of the transistor 110 is connected to the power supply line 122 through the second switch 112; and a gate electrode of the transistor 110 is connected to the power supply line 122 through the third switch 113 and the second switch 112. Note that the third switch 113 is connected between the gate electrode of the transistor 110 and the second switch 112.

Figure 55:
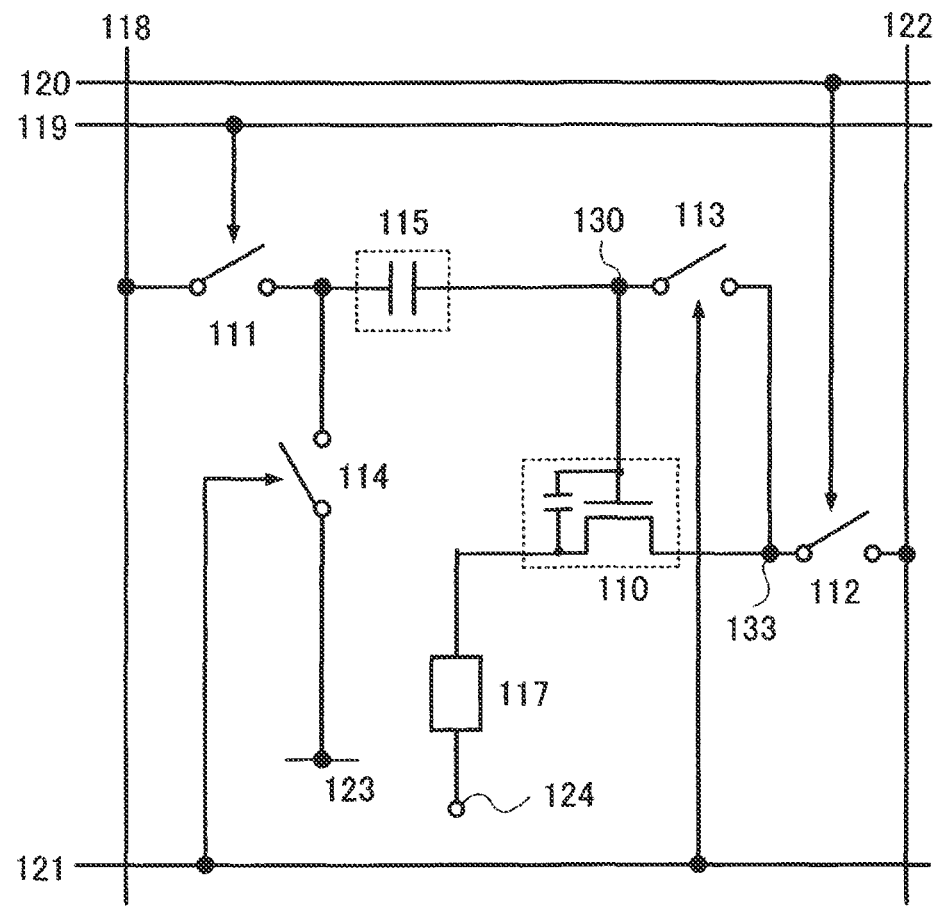
FIG. 55 is a diagram showing a pixel structure shown in Embodiment Mode 1.

In addition, when a connection point of the gate electrode of the transistor 110 and the third switch 113 is denoted by a node 130, the node 130 is connected to the signal line 118 through the first capacitor 115 and the first switch 111. That is, a first electrode of the first capacitor 115 is connected to the signal line 118 through the first switch 111, and a second electrode of the first capacitor 115 is connected to the gate electrode of the transistor 110. The first electrode of the first capacitor 115 is also connected to the potential supply line 123 through the fourth switch 114. The node 130 is also connected to the first electrode of the transistor 110 through the second capacitor 116. That is, a first electrode of the second capacitor 116 is connected to the gate electrode of the transistor 110, and a second electrode of the second capacitor 116 is connected to the first electrode of the transistor 110. Such a capacitor may be formed by sandwiching an insulating film with a wiring, a semiconductor layer, or an electrode, or the second capacitor 116 can be omitted by using gate capacitance of the transistor 110 in some cases as shown in FIG. 55. Such a means for holding voltage is referred to as a storage capacitor. Further, a connection point of the node 130 and a wiring to which the second electrode of the first capacitor 115 and the first electrode of the second capacitor 116 are connected is denoted by a node 131. A connection point of the first electrode of the transistor 110 and a wiring to which the second electrode of the second capacitor 116 and the pixel electrode of the light-emitting element 117 are connected is denoted by a node 132. A connection point of the second electrode of the transistor 110 and a wiring to which the second switch 112 and the third switch 113 are connected is denoted by a node 133.

By inputting signals to the first scan line 119, the second scan line 120, and the third scan line 121, on/off of the first switch 111, the second switch 112, the third switch 113, and the fourth switch 114 is controlled.

A signal in accordance with a gray scale level of the pixel which corresponds to a video signal, i.e., a potential in accordance with luminance data is input to the signal line 118.

Next, operations of the pixel shown in FIG. 1 are described with reference to a timing chart in FIG. 2, and FIGS. 3A to 3D. Note that in FIG. 2, one frame period which corresponds to a period for displaying an image for one screen is divided into an initialization period, a threshold voltage writing period, a data writing period, and a light-emitting period. In addition, the initialization period, the threshold voltage writing period, and the data writing period are collectively referred to as an address period. Although one frame period is not particularly limited, it is preferable that one frame period be 1/60 second or less so that a person viewing an image does not perceive a flicker.

A potential of V1 (V1 corresponds to a given number) is input to the opposite electrode 124 of the light-emitting element 117. When a potential difference which is at least necessary for the light-emitting element 117 to emit light is denoted by $V_{EL}$, a potential of V1+$V_{EL}$+Vth+α (α corresponds to a given positive number) is input to the power supply line 122. That is, a potential of the power supply line 122 may be any potential as long as it is equal to or higher than V1+$V_{EL}$+Vth+α. Although a potential of the potential supply line 123 is not particularly limited, the potential of the potential supply line 123 is preferably in a range of a potential input to a panel where the pixel is formed. Thus, it is not necessary to separately form a power source. Note that here, a potential of the potential supply line 123 is at V2.

Figure 3A:
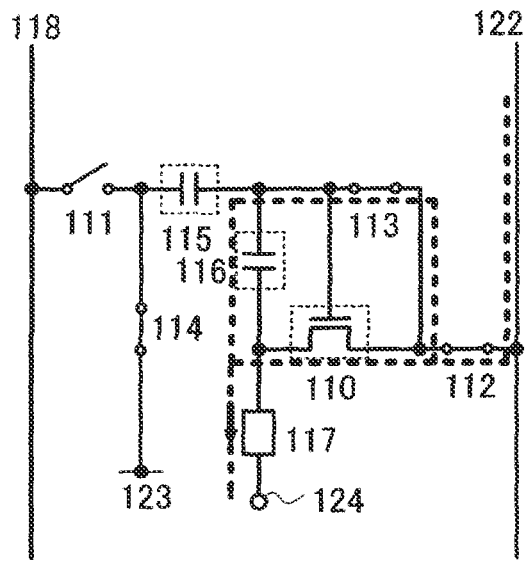
FIGS. 3A to 3D are diagrams each showing an operation of the pixel shown in FIG. 1.

First, in the initialization period shown in period A of FIG. 2 and FIG. 3A, the first switch 111 is turned off, and the second switch 112, the third switch 113, and the fourth switch 114 are turned on. At this time, the transistor 110 is conductive, V1+$V_{EL}$+Vth+α−V2 is held in the first capacitor 115, and Vth+α is held in the second capacitor 116. Note that in the initialization period, it is only necessary that predetermined voltage be held in the first capacitor 115 and voltage which is at least higher than Vth be held in the second capacitor 116.

Figure 3B:
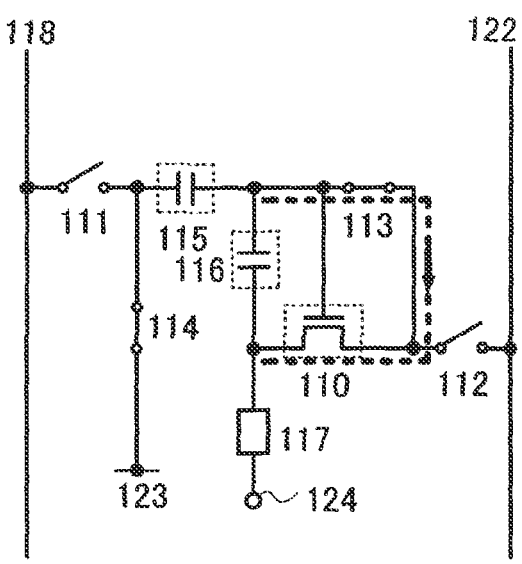

In the threshold voltage writing period shown in period B of FIG. 2 and FIG. 3B, the second switch 112 is turned off. Therefore, a potential of the first electrode, i.e., the source electrode of the transistor 110 rises gradually, and the transistor 110 is turned off when gate-source voltage Vgs of the transistor 110 reaches the threshold voltage (Vth). Thus, voltage Vc2 which is held in the second capacitor 116 is at approximately Vth.

Figure 3C:
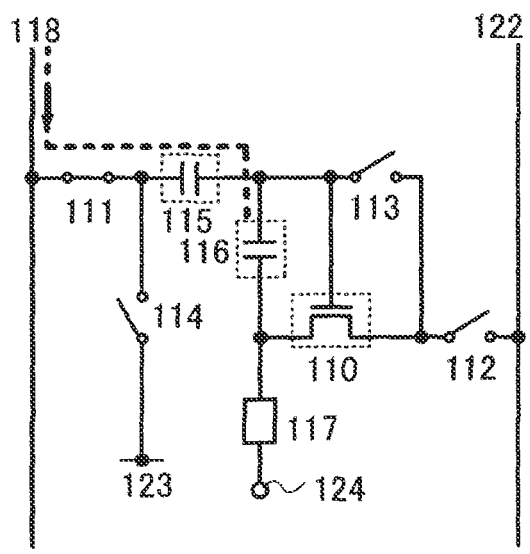

In the following data writing period shown in period C of FIG. 2 and FIG. 3C, the first switch 111 is turned on after the third switch 113 and the fourth switch 114 are turned off, and a potential in accordance with luminance data (V2+Vdata) is input from the signal line 118. At this time, the voltage Vc2 which is held in the second capacitor 116 can be represented by Formula 1 from C3>>C1, C2 when electrostatic capacitance of the first capacitor 115 is denoted by C1, electrostatic capacitance of the second capacitor 116 is denoted by C2, and electrostatic capacitance of the light-emitting element 117 is denoted by C3.

[Formula 1]

$$V_{C2} = Vth + Vdata \times \frac{C1}{C1+C2} \quad (1)$$

Note that although C1 and C2 are necessary when a potential supplied from the signal line 118 is determined, a relation therebetween is not particularly limited. Note that when C1>C2 is satisfied, power consumption can be reduced because amplitude of Vdata in accordance with changes in luminance can be reduced. On the other hand, when C2>C1 is satisfied, a change in Vc2 due to on/off of a surrounding switch or off-current can be suppressed. By these opposite advantageous effects, it is preferable that C1 and C2 be equal and a size of the first capacitor 115 be the same as that of the second capacitor 116.

Note also that when the light-emitting element 117 is controlled not to emit light in the following light-emitting period, it is only necessary to input a potential of Vdata≤0.

Figure 3D:
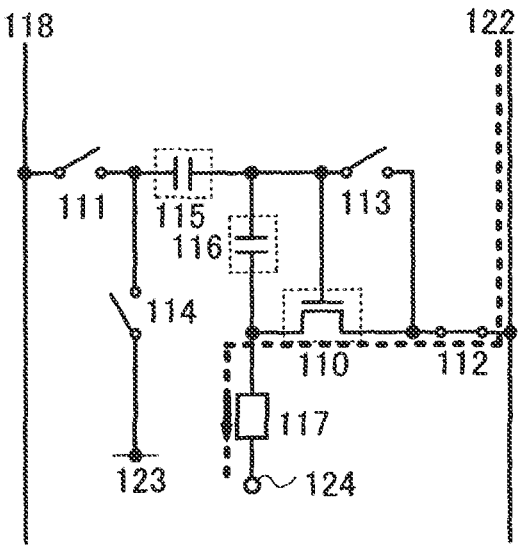

Next, in the light-emitting period shown in period D of FIG. 2 and FIG. 3D, the second switch 112 is turned on after the first switch 111 is turned off. At this time, gate-source voltage of the transistor 110 is Vgs=Vth+Vdata×(C1/(C1+C2)), and current in accordance with luminance data flows to the transistor 110 and the light-emitting element 117, so that the light-emitting element 117 emits light. Needless to say, as for the potential in accordance with luminance data input from the signal line 118, Vdata is determined taking into consideration that the gate-source voltage of the transistor 110 is at Vgs=Vth+Vdata×(C1/(C1+C2)).

Note that current I flowing to the light-emitting element 117 is represented by Formula 2 in the case of operating the transistor 110 in a saturation region.

[Formula 2]

$$\begin{aligned} I &= \frac{1}{2}\left(\frac{W}{L}\right)\mu Cox(Vgs - Vth)^2 \\ &= \frac{1}{2}\left(\frac{W}{L}\right)\mu Cox\left(Vth + Vdata \times \frac{C1}{C1+C2} - Vth\right)^2 \\ &= \frac{1}{2}\left(\frac{W}{L}\right)\mu Cox\left(Vdata \times \frac{C1}{C1+C2}\right)^2 \end{aligned} \quad (2)$$

In addition, the current I flowing to the light-emitting element 117 is represented by Formula 3 in the case of operating the transistor 110 in a linear region.

[Formula 3]

$$\begin{aligned} I &= \left(\frac{W}{L}\right)\mu Cox\left[(Vgs - Vth)Vds - \frac{1}{2}Vds^2\right] \\ &= \left(\frac{W}{L}\right)\mu Cox\left[\left(Vth + Vdata \times \frac{C1}{C1+C2} - Vth\right)Vds - \frac{1}{2}Vds^2\right] \\ &= \left(\frac{W}{L}\right)\mu Cox\left[\left(Vdata \times \frac{C1}{C1*C2}\right)Vds - \frac{1}{2}Vds^2\right] \end{aligned} \quad (3)$$

Here, W corresponds to a channel width of the transistor 110; L corresponds to a channel length of the transistor 110; μ corresponds to mobility of the transistor 110; and Cox corresponds to storage capacitance of the transistor 110.

According to Formula 2 and Formula 3, the current flowing to the light-emitting element 117 does not depend on the threshold voltage (Vth) of the transistor 110 in each of the case where the transistor 110 is operated in the saturation region and the case where the transistor 110 is operated in the linear region. Therefore, variations of a current value caused by variations in the threshold voltage of the transistor 110 are suppressed, so that the current in accordance with luminance data can be supplied to the light-emitting element 117.

As described above, variations in luminance caused by variations in the threshold voltage of the transistor 110 can be suppressed. In addition, since the potential of the opposite electrode 124 is fixed at a constant potential during the operation, power consumption can be reduced.

Further, in the case of operating the transistor 110 in the saturation region, variations in luminance caused by deterioration of the light-emitting element 117 can also be suppressed. Note that deterioration of the light-emitting element 117 is not limited to the case where current-voltage characteristics thereof are shifted in parallel compared with current-voltage characteristics before deterioration. For example, deterioration of the light-emitting element 117 also includes the case where a differential value is different from a differential value before deterioration when a slope of characteristics and characteristics are represented by curves. When the light-emitting element 117 deteriorates, $V_{EL}$ of the light-emitting element 117 is increased and the potential of the first electrode, i.e., the source electrode of the transistor 110 rises. At this time, the source electrode of the transistor 110 is connected to the second electrode of the second capacitor 116, and the gate electrode of the transistor 110 is connected to the first electrode of the second capacitor 116 and is in a floating state. Therefore, in accordance with a rise in the source potential, a gate potential of the transistor 110 rises by the same level. Thus, since Vgs of the transistor 110 does not change, current flowing to the transistor 110 and the light-emitting element 117 is not affected even if the light-emitting element 117 deteriorates. Note also that it can be seen also in Formula 2 that the current I flowing to the light-emitting element 117 does not depend on the source potential or a drain potential.

Therefore, in the case of operating the transistor 110 in the saturation region, variations in the current flowing to the transistor 110 caused by variations in the threshold voltage of the transistor 110 and deterioration of the light-emitting element 117 can be suppressed.

Note that in the case of operating the transistor 110 in the saturation region, as the channel length L is shorter, a larger amount of current easily flows when drain voltage is extremely increased by a breakdown.

Figure 4:
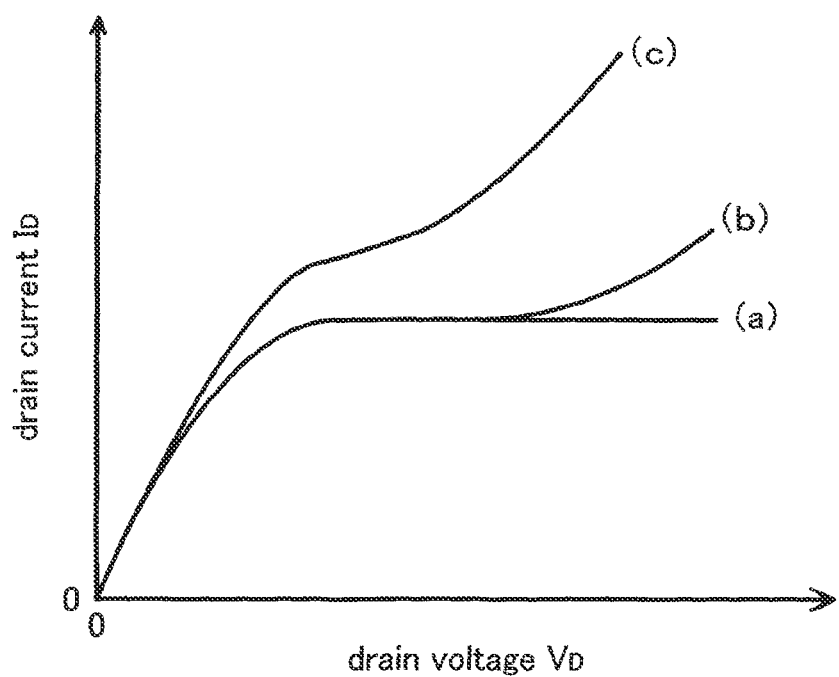
FIG. 4 is a model diagram of voltage-current characteristics in accordance with channel length modulation.

In addition, a pinch-off point moves to a source side when the drain voltage is increased to be higher than pinch-off voltage, and an effective channel length which substantially functions as a channel is decreased. Therefore, a current value is increased. Such a phenomenon is described as channel length modulation. Note that the pinch-off point corresponds to a boundary portion at which the channel disappears and thickness of the channel below the gate is 0. The pinch-off voltage corresponds to voltage when the pinch-off point is at a drain edge. This phenomenon easily occurs as the channel length L is shorter. For example, a model diagram of voltage-current characteristics in accordance with the channel length modulation is shown in FIG. 4. Note that as for the channel length of the transistors, (a)>(b)>(c) is satisfied in FIG. 4.

As described above, in the case of operating the transistor 110 in the saturation region, the current I with respect to drain-source voltage Vds is preferably as constant as possible. Therefore, the channel length L of the transistor 110 is preferably longer. For example, the channel length L of the transistor 110 is preferably larger than the channel width W thereof. In addition, the channel length L is preferably equal to or greater than 10 μm and equal to or less than 50 μm. More preferably, the channel length L is equal to or greater than 15 μm and equal to or less than 40 μm. Note that the channel length L and the channel width W are not limited to them.

Figure 5:
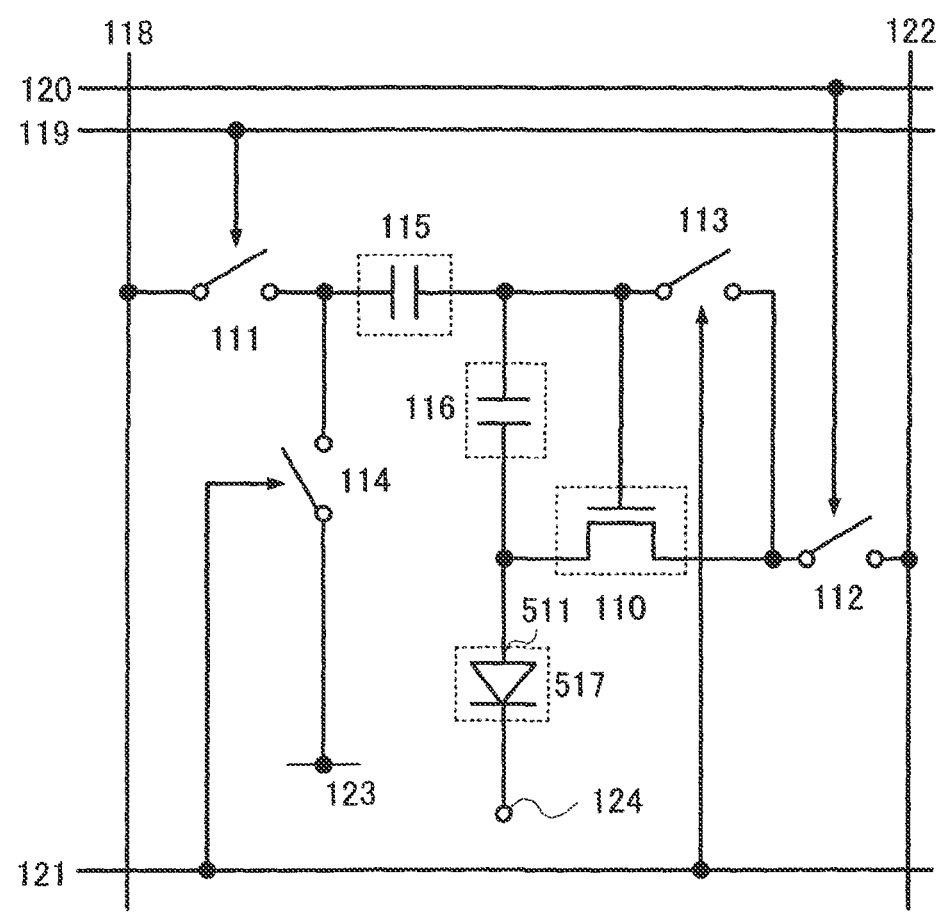
FIG. 5 is a diagram showing a pixel structure shown in Embodiment Mode 1.

Since variations of the current value caused by variations in the threshold voltage of the transistor can be suppressed as described above, a supply destination of current controlled by the transistor is not particularly limited in the present invention. Therefore, an EL element (an organic EL element, an inorganic EL element, or an EL element including both an organic material and an inorganic material) can be typically used for the light-emitting element 117 shown in FIG. 1. Alternatively, an electron emitter, a liquid crystal element, electronic ink, or the like can be used instead of the light-emitting element 117. FIG. 5 shows an example where an EL element 517 is used for the light-emitting element 117. Note that FIG. 5 shows a condition where current flows from a pixel electrode 511 to the opposite electrode 124.

Note that it is only necessary for the transistor 110 to have a function for controlling a current value supplied to the light-emitting element 117, so that various types of transistors can be used for the transistor 110 without particularly limiting. For example, a thin film transistor (a TFT) using a crystalline semiconductor film, a thin film transistor using a non-crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be used.

The first switch 111 selects timing for inputting a potential in accordance with luminance data, i.e., a video signal to the pixel from the signal line 118, and mainly changes voltage held in the first capacitor 115 and voltage held in the second capacitor 116, i.e., gate-source voltage of the transistor 110. The second switch 112 selects timing for supplying a predetermined potential to the second electrode of the transistor 110. Note that the predetermined potential is also supplied to the second electrode of the first capacitor 115 and the first electrode of the second capacitor 116 in some cases. The third switch 113 controls a connection between the gate electrode and the second electrode of the transistor 110. The fourth switch 114 selects timing for making the first capacitor 115 hold predetermined voltage every frame period, and controls whether to supply a predetermined potential to the first electrode of the first capacitor 115. Therefore, the first switch 111, the second switch 112, the third switch 113, and the fourth switch 114 are not particularly limited as long as they have above-described functions. For example, each of the first switch 111, the second switch 112, the third switch 113, and the fourth switch 114 may be a transistor, a diode, or a logic circuit combining them. Note that the first switch 111, the second switch 112, and the fourth switch 114 are not particularly needed as long as a signal or a potential can be supplied to the pixel at the above-described timing. Further, the third switch 113 is not particularly needed as long as the above-described function can be achieved.

Figure 43:
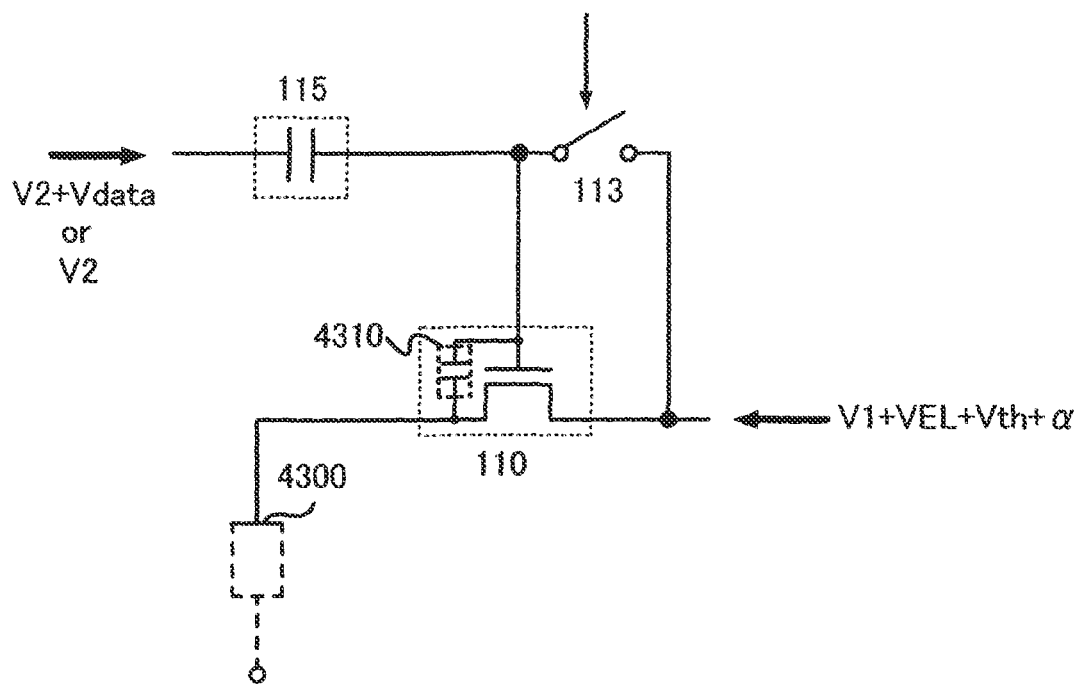
FIG. 43 is a diagram showing a pixel structure shown in Embodiment Mode 1.

For example, when the predetermined voltage can be held in the first capacitor 115 in the initialization period and the threshold voltage writing period and a signal in accordance with a gray scale level of the pixel can also be input to the pixel in the data writing period, it is not necessary to provide the first switch 111 and the fourth switch 114 in the pixel. In addition, when $V1+V_{EL}+Vth+\alpha$ ($\alpha>0$) can be supplied to the pixel in the initialization period and the light-emitting period, the second switch 112 is not particularly required to be provided as shown in FIG. 43. The pixel shown in FIG. 43 includes the transistor 110, the first capacitor 115, the third switch 113, and a pixel electrode 4300. The first electrode (one of the source electrode and the drain electrode) of the transistor 110 is connected to the pixel electrode 4300, and the gate electrode of the transistor 110 is connected to the second electrode of the transistor 110 through the third switch 113. The gate electrode of the transistor 110 is also connected to the second electrode of the first capacitor 115. Note that a signal in accordance with a gray scale level, i.e., a potential in accordance with luminance data (i.e., V2+Vdata) and a given potential for making the first capacitor 115 hold the predetermined voltage (i.e., V2) are supplied to the first electrode of the first capacitor 115 in a predetermined period. Note also that since gate capacitance 4310 of the transistor 110 is utilized as a storage capacitor, the second capacitor 116 in FIG. 1 is not particularly required to be provided. Variations of a current value caused by variations in the threshold voltage of the transistor 110 can be suppressed also in such a pixel by supplying a desired potential to each electrode similarly to the timing chart shown in FIG. 2. Thus, desired current can be supplied to the pixel electrode 4300. Needless to say, the second capacitor 116 in FIG. 1 can also be omitted by using the gate capacitance of the first transistor 110.

Figure 6:
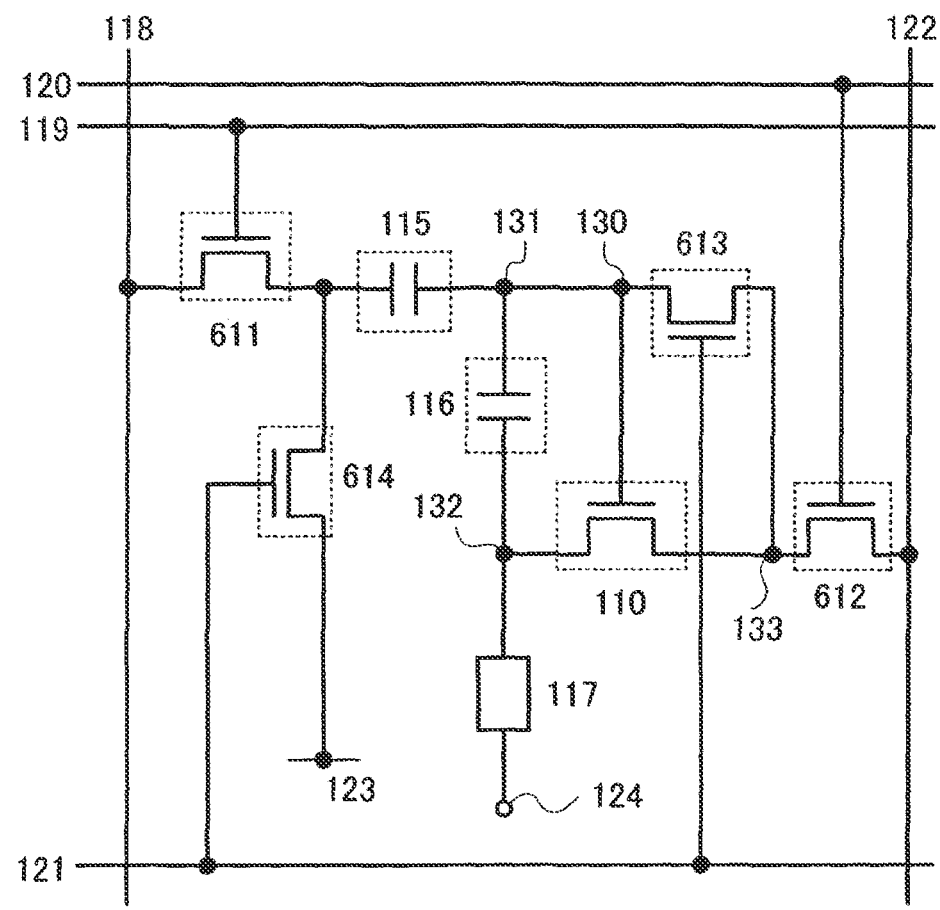
FIG. 6 is a diagram showing a pixel structure shown in Embodiment Mode 1.

Next, FIG. 6 shows the case where N-channel transistors are used for the first switch 111, the second switch 112, the third switch 113, and the fourth switch 114. Note that portions which are common to those in FIG. 1 are denoted by common reference numerals and the description is omitted.

A first switching transistor 611 corresponds to the first switch 111 in FIG. 1; a second switching transistor 612 corresponds to the second switch 112 in FIG. 1; a third switching transistor 613 corresponds to the third switch 113 in FIG. 1; and a fourth switching transistor 614 corresponds to the fourth switch 114 in FIG. 1. The channel length of the transistor 110 is preferably longer than that of any of the first switching transistor 611, the second switching transistor 612, the third switching transistor 613, and the fourth switching transistor 614.

A gate electrode of the first switching transistor 611 is connected to the first scan line 119; a first electrode of the first switching transistor 611 is connected to the signal line 118; and a second electrode of the first switching transistor 611 is connected to the first electrode of the first capacitor 115.

A gate electrode of the second switching transistor 612 is connected to the second scan line 120; a first electrode of the second switching transistor 612 is connected to the node 133; and a second electrode of the second switching transistor 612 is connected to the power supply line 122.

A gate electrode of the third switching transistor 613 is connected to the third scan line 121; a first electrode of the third switching transistor 613 is connected to the node 130; and a second electrode of the third switching transistor 613 is connected to the node 133.

A gate electrode of the fourth switching transistor 614 is connected to the third scan line 121; a first electrode of the fourth switching transistor 614 is connected to the first electrode of the first capacitor 115; and a second electrode of the fourth switching transistor 614 is connected to the potential supply line 123.

Each of the first to fourth switching transistors 611 to 614 is turned on when a signal input to each of the scan lines 119 to 121 is at an H level, and is turned off when the signal input to each of the scan lines 119 to 121 is at an L level.

Figure 44:
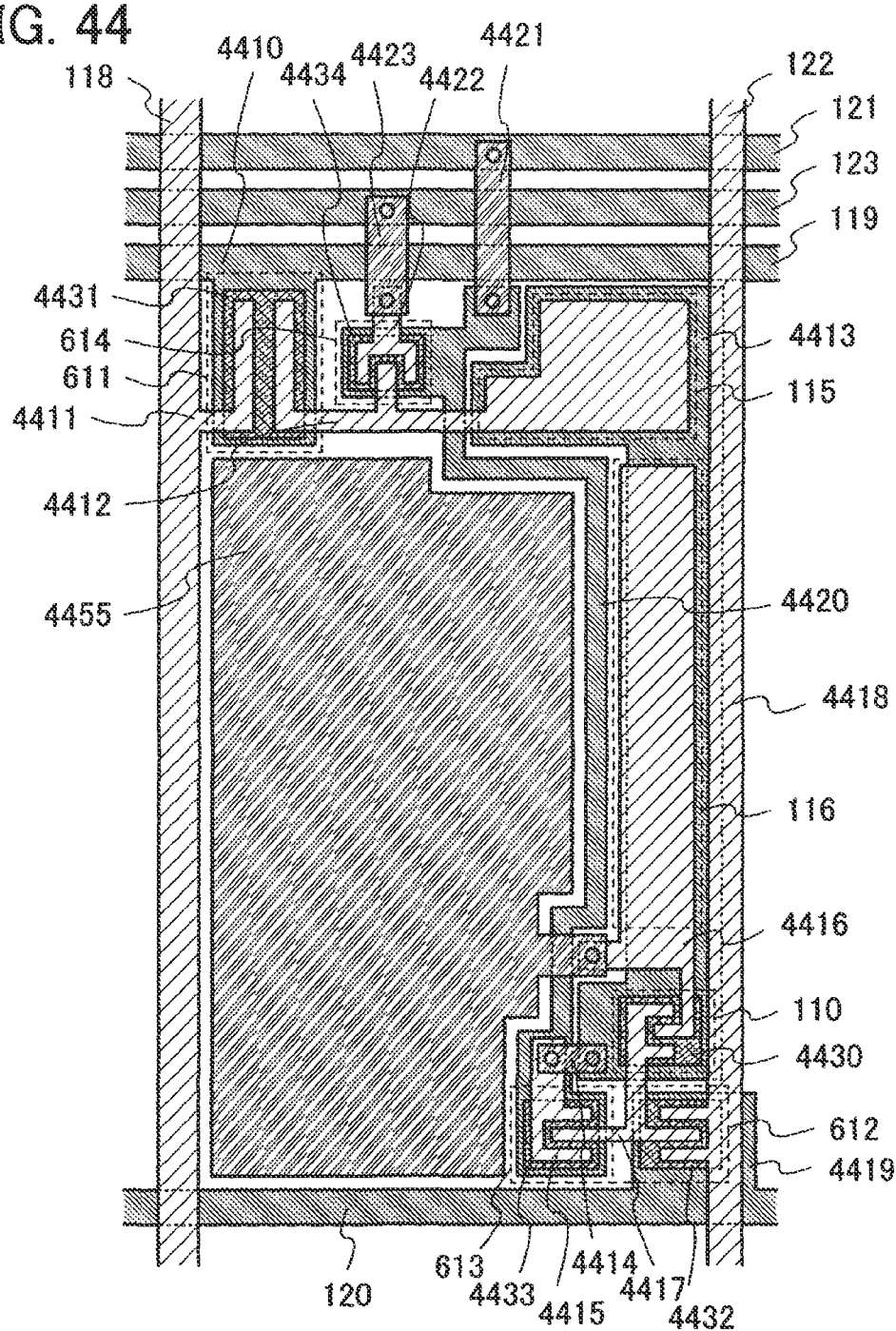
FIG. 44 is a top plan view showing a layout of the pixel shown in FIG. 6.

One mode of a layout of the pixel shown in FIG. 6 is shown in a top plan view of FIG. 44. Note that since structures of the transistors, the capacitors, the light-emitting element, and the like will be described in the following embodiment mode, only the layout is described here. A bottom-gate transistor of which a gate electrode is located below a semiconductor layer is used for each of the transistor 110 and the first to fourth switching transistors 611 to 614 which are shown in FIG. 44.

A conductive layer 4410 shown in FIG. 44 includes a portion which functions as the first scan line 119 and the gate electrode of the first switching transistor 611. A conductive layer 4411 includes a portion which functions as the signal line 118 and the first electrode of the first switching transistor 611. A conductive layer 4412 includes a portion which functions as the second electrode of the first switching transistor 611, the first electrode of the first capacitor 115, and the first electrode of the fourth switching transistor 614. A conductive layer 4413 includes a portion which functions as the second electrode of the first capacitor 115, the first electrode of the second capacitor 116, and the gate electrode of the transistor 110. Note that the conductive layer 4413 is connected to a conductive layer 4415 including a portion which functions as the first electrode of the third switching transistor 613 through a wiring 4414. A conductive layer 4416 includes a portion which functions as the second electrode of the second capacitor 116 and the first electrode of the transistor 110, and is connected to a pixel electrode 4455 of the light-emitting element through a contact hole. A conductive layer 4417 includes a portion which functions as the second electrode of the transistor 110, the second electrode of the third switching transistor 613, and the first electrode of the second switching transistor 612. A conductive layer 4418 includes a portion which functions as the power supply line 122 and the second electrode of the second switching transistor 612. A conductive layer 4419 includes a portion which functions as the second scan line 120 and the gate electrode of the second switching transistor 612. A conductive layer 4420 includes a portion which functions as the gate electrode of the third switching transistor 613 and the gate electrode of the fourth switching transistor 614, and is connected to the third scan line 121 through a wiring 4421. A conductive layer 4422 including a portion which functions as the second electrode of the fourth switching transistor 614 is connected to the potential supply line 123 through a wiring 4423.

Note that among each of the conductive layers, portions functioning as the gate electrode, the first electrode, and the second electrode of the first switching transistor 611 correspond to portions where the conductive layers having the gate electrode, the first electrode, and the second electrode of the first switching transistor 611 overlap with a semiconductor layer 4431. Portions functioning as the gate electrode, the first electrode, and the second electrode of the second switching transistor 612 correspond to portions where the conductive layers having the gate electrode, the first electrode, and the second electrode of the second switching transistor 612 overlap with a semiconductor layer 4432. In addition, among each of the conductive layers, portions functioning as the gate electrode, the first electrode, and the second electrode of the third switching transistor 613 correspond to portions where the conductive layers having the gate electrode, the first electrode, and the second electrode of the third switching transistor 613 overlap with a semiconductor layer 4433. Portions functioning as the gate electrode, the first electrode, and the second electrode of the fourth switching transistor 614 correspond to portions where the conductive layers having the gate electrode, the first electrode, and the second electrode of the fourth switching transistor 614 overlap with a semiconductor layer 4434. Similarly, in the transistor 110, portions functioning as the gate electrode, the first electrode, and the second electrode correspond to portions where the conductive layers having the gate electrode, the first electrode, and the second electrode overlap with a semiconductor layer 4430. Note also that the first capacitor 115 is formed in a portion where the conductive layer 4412 overlaps with the conductive layer 4413, and the second capacitor 116 is formed in a portion where the conductive layer 4413 overlaps with the conductive layer 4416.

Note that the conductive layer 4410, the conductive layer 4413, the conductive layer 4419, the conductive layer 4420, the third scan line 121, and the potential supply line 123 can be formed using the same material and the same layer. The semiconductor layer 4430, the semiconductor layer 4431, the semiconductor layer 4432, the semiconductor layer 4433, and the semiconductor layer 4434 can be formed using the same material and the same layer. The conductive layer 4411, the conductive layer 4412, the conductive layer 4415, the conductive layer 4416, the conductive layer 4417, the conductive layer 4418, and the conductive layer 4422 can be formed using the same material and the same layer. In addition, the wiring 4414, the wiring 4421, and the wiring 4423 can be formed using the same material and the same layer as the pixel electrode 4455.

In addition, when a structure in which one of the source electrode and the drain electrode surrounds the other of the source electrode and the drain electrode is used in each transistor except the first switching transistor 611, a channel width can be widened. Thus, it is more effective when an amorphous semiconductor layer with lower mobility than that of a crystalline semiconductor layer is used for a semiconductor layer of a transistor included in the pixel. Needless to say, the structure in which one of the source electrode and the drain electrode surrounds the other of the source electrode and the drain electrode may also be used for the first switching transistor 611.

Figure 45:
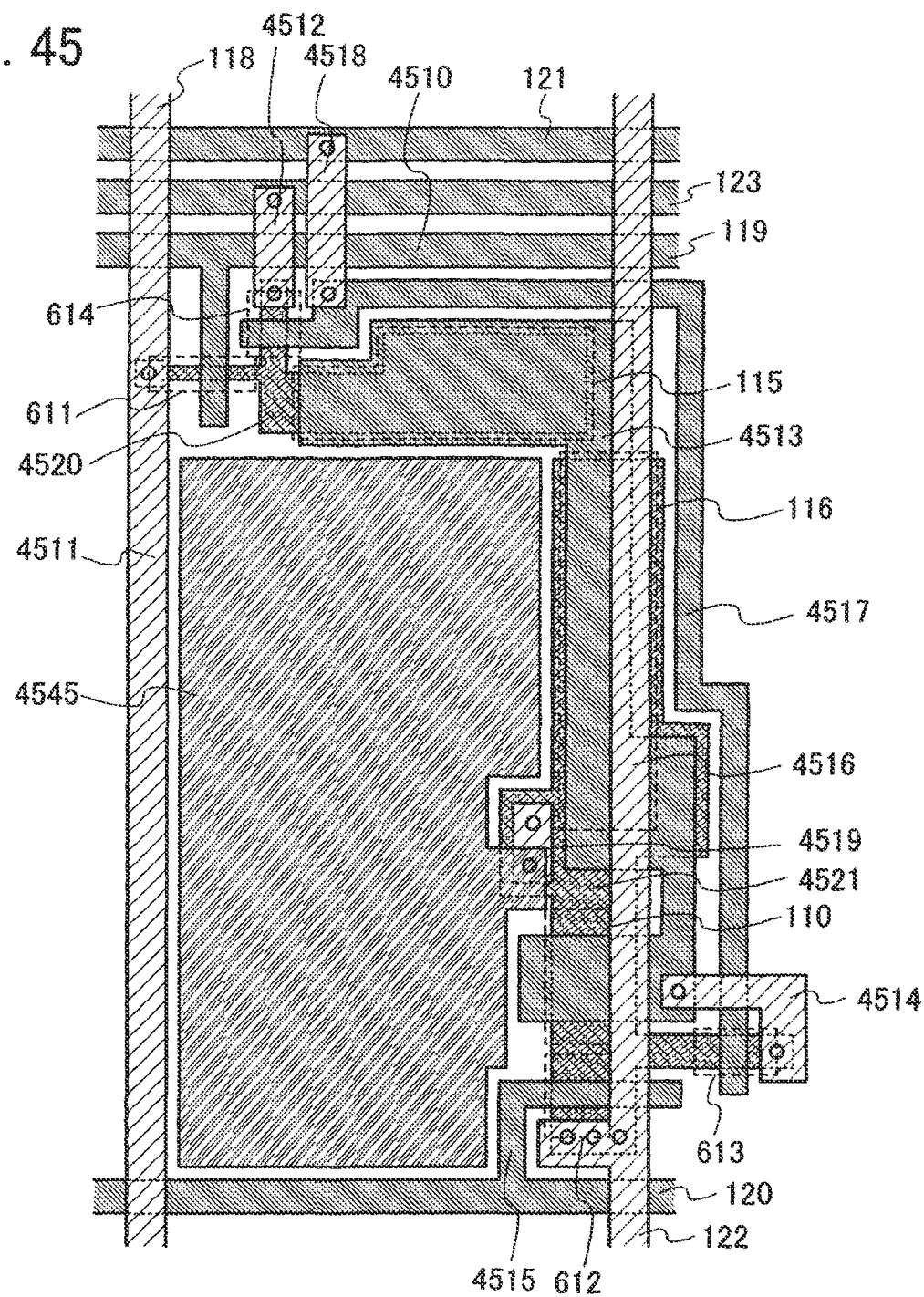
FIG. 45 is a top plan view showing a layout of the pixel shown in FIG. 6.

Next, one mode of a layout of the pixel shown in FIG. 6, which is different from that of FIG. 44, is shown in a top plan view of FIG. 45. A top-gate transistor such as a staggered transistor of which a gate electrode is located over a semiconductor layer is used for each of the transistor 110 and the first to fourth switching transistors 611 to 614 which are shown in FIG. 45.

A conductive layer 4510 shown in FIG. 45 includes a portion which functions as the first scan line 119 and a portion which functions as the gate electrode of the first switching transistor 611. A conductive layer 4511 includes a portion which functions as the signal line 118 and a portion which functions as the first electrode of the first switching transistor 611. A semiconductor film 4520 includes a portion which functions as the semiconductor layer and a portion which functions as the second electrode of the first switching transistor 611, a portion which functions as the first electrode and a portion which functions as the semiconductor layer of the fourth switching transistor 614, and a portion which functions as the first electrode of the first capacitor 115. Note that the semiconductor film 4520 is connected to the potential supply line 123 through a wiring 4512, and the wiring 4512 functions as the second electrode of the fourth switching transistor 614. A conductive layer 4513 includes a portion which functions as the second electrode of the first capacitor 115, the first electrode of the second capacitor 116, and the gate electrode of the transistor 110. Note that the conductive layer 4513 is connected to a semiconductor film 4521 through a wiring 4514 functioning as the first electrode of the third switching transistor 613. This semiconductor film 4521 includes a portion which functions as the semiconductor layer and a portion which functions as the second electrode of the third switching transistor 613, a portion which functions as the first electrode and a portion which functions as the semiconductor layer of the second switching transistor 612, a portion which functions as the first electrode, a portion which functions as the semiconductor layer, and a portion which functions as the second electrode of the transistor 110, and a portion which functions as the second electrode of the second capacitor 116. A conductive layer 4515 includes a portion which functions as the second scan line 120 and a portion which functions as the gate electrode of the second switching transistor 612. A conductive layer 4516 includes a portion which functions as the power supply line 122 and a portion which functions as the second electrode of the second switching transistor 612. A conductive layer 4517 includes a portion which functions as the gate electrode of the third switching transistor 613 and a portion which functions as the gate electrode of the fourth switching transistor 614, and is connected to the third scan line 121 through a wiring 4518. A pixel electrode 4545 of the light-emitting element is connected to the semiconductor film 4521 through a wiring 4519.

Note that the first capacitor 115 is formed in a portion where the semiconductor film 4520 overlaps with the conductive layer 4513, and the second capacitor 116 is formed in a portion where the semiconductor film 4521 overlaps with the conductive layer 4513.

Note that the conductive layer 4510, the conductive layer 4513, the conductive layer 4515, the conductive layer 4517, the third scan line 121, and the potential supply line 123 can be formed using the same material and the same layer. The semiconductor film 4520 and the semiconductor film 4521 can be formed using the same material and the same layer. In addition, the wiring 4512, the wiring 4514, the conductive layer 4516, and the wiring 4518 can be formed using the same material and the same layer as the conductive layer 4511.

Note also that the layout of the pixel is not limited to the above-described layout.

Variations of the current value caused by variations in the threshold voltage of the transistor 110 can be suppressed also in the pixel structure in FIG. 6 by an operating method which is similar to that of FIG. 1. Therefore, the current in accordance with luminance data can be supplied to the light-emitting element 117, so that variations in luminance can be suppressed. In the case of operating the transistor 110 in the saturation region, variations in luminance caused by deterioration of the light-emitting element 117 can also be suppressed.

Further, since the pixel can be formed by using only N-channel transistors, a manufacturing process can be simplified. In addition, an amorphous semiconductor, a semi-amorphous semiconductor, or the like can be used for the semiconductor layer of each transistor included in the pixel. For example, amorphous silicon (a-Si:H) can be given as an example of an amorphous semiconductor. By using such a semiconductor, the manufacturing process can be further simplified. Accordingly, manufacturing cost can be reduced and yield can be improved.

Note that since the first switching transistor 611, the second switching transistor 612, the third switching transistor 613, and the fourth switching transistor 614 is operated just as a switch, polarity (a conductivity type) of the transistors is not particularly limited. However, a transistor of polarity with smaller off-current is preferably used. A transistor provided with an LDD region, a transistor with a multi-gate structure, or the like is given as an example of a transistor with smaller off-current. In addition, a CMOS switch may be used by using both N-channel and P-channel transistors.

In addition, various connections of the switches can be used as long as operations which are similar to those of FIG. 1 are performed, so that the present invention is not limited to FIG. 1. As it can be seen from FIGS. 3A to 3D showing the operations of the pixel structure in FIG. 1, in the present invention, it is necessary to have electrical continuity in the initialization period, the threshold voltage writing period, data writing period, and the light-emitting period as shown by a solid line in each of FIGS. 53A to 53D. Therefore, any structure may be used as long as a switch or the like is provided so as to satisfy this and can be operated.

Figure 54:
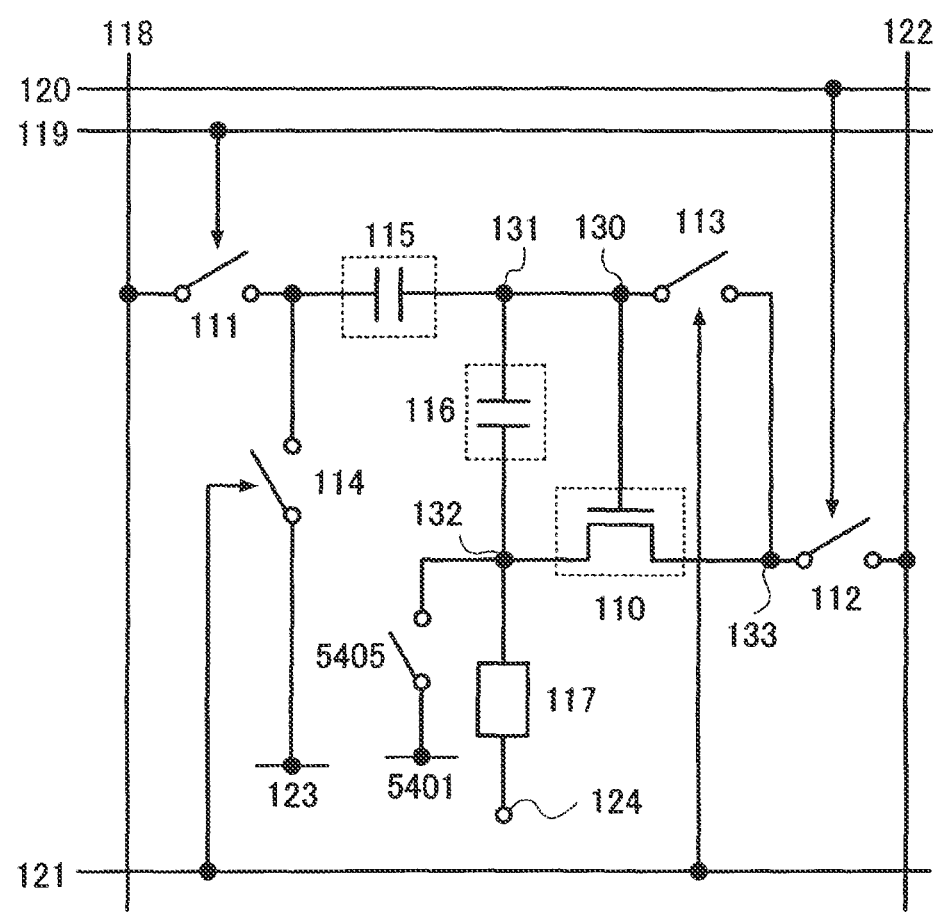
FIG. 54 is a diagram showing a pixel structure shown in Embodiment Mode 1.

Further, in the initialization period, since it is only necessary that predetermined voltage be held in the first capacitor 115 and voltage which is at least higher than the threshold voltage Vth be held in the second capacitor 116, the node 132 may be connected to a potential supply line 5401 through a fifth switch 5405 as shown in FIG. 54. The fifth switch 5405 is turned on only in the initialization period, and a scan line which controls on/off of the fifth switch 5405 is not shown in FIG. 54. Note that a potential of the potential supply line 5401 may be any potential as long as it is lower than V1+$V_{EL}$. The potential of the potential supply line 5401 is more preferably lower than or equal to V1. Since reverse bias voltage can be applied to the light-emitting element 117 by setting the potential of the potential supply line 5401 to be such a potential, a short-circuited portion in the light-emitting element can be insulated and deterioration in the light-emitting element can be suppressed. Thus, a life of the light-emitting element can be extended.

Next, a display device including the above-described pixel of the present invention is described with reference to FIG. 7.

The display device includes a signal line driver circuit 711, a scan line driver circuit 712, and a pixel portion 713. The pixel portion 713 includes a plurality of signal lines S1 to Sm and power supply lines P1_1 to Pm_1 which are extended from the signal line driver circuit 711 in a column direction; a plurality of first scan lines G1_1 to Gn_1, second scan lines G1_2 to Gn_2, third scan lines G1_3 to Gn_3, and potential supply lines P1_2 to Pn_2 which are extended from the scan line driver circuit 712 in a row direction; and a plurality of pixels 714 which are arranged in matrix corresponding to the signal lines S1 to Sm. Each pixel 714 is connected to a signal line Sj (any one of the signal lines S1 to Sm), a power supply line Pj_1, a first scan line Gi_1 (any one of the scan lines G1_1 to Gn_1), a second scan line Gi_2, a third scan line Gi_3, and a potential supply line Pi_2.

Note that the signal line Sj, the power supply line Pj_1, the first scan line the second scan line Gi_2, the third scan line Gi_3, and the potential supply line Pi_2 correspond to the signal line 118, the power supply line 122, the first scan line 119, the second scan line 120, the third scan line 121, and the potential supply line 123 in FIG. 1, respectively.

In response to a signal output from the scan line driver circuit 712, the operations shown in FIG. 2 are performed in each of pixels of one row as well as the row of the pixels to be operated is selected. Note that in the data writing period in FIG. 2, a video signal output from the signal line driver circuit 711 is written in each of the pixels in the selected row. At this time, a potential in accordance with luminance data of each pixel is input to each of the signal lines S1 to Sm.

As shown in FIG. 8, for example, when a data writing period in an i-th row is terminated, writing of a signal to pixels in an (i+1)th row is performed. Note that in order to show the data writing period in each row, FIG. 8 shows only the operation of the first switch 111 in FIG. 2 which can precisely show the data writing period in each row. Then, a pixel which terminates the data writing period in the i-th row proceeds to a light-emitting period and emits light in accordance with a signal written in the pixel.

Therefore, unless the data writing periods in the rows overlap, an initialization start period can be freely set in each row. In addition, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

In addition, since the threshold voltage writing period can also be set long, the threshold voltage of the transistor can be written in the capacitor more accurately. Therefore, reliability as a display device can be improved.

Figure 7:
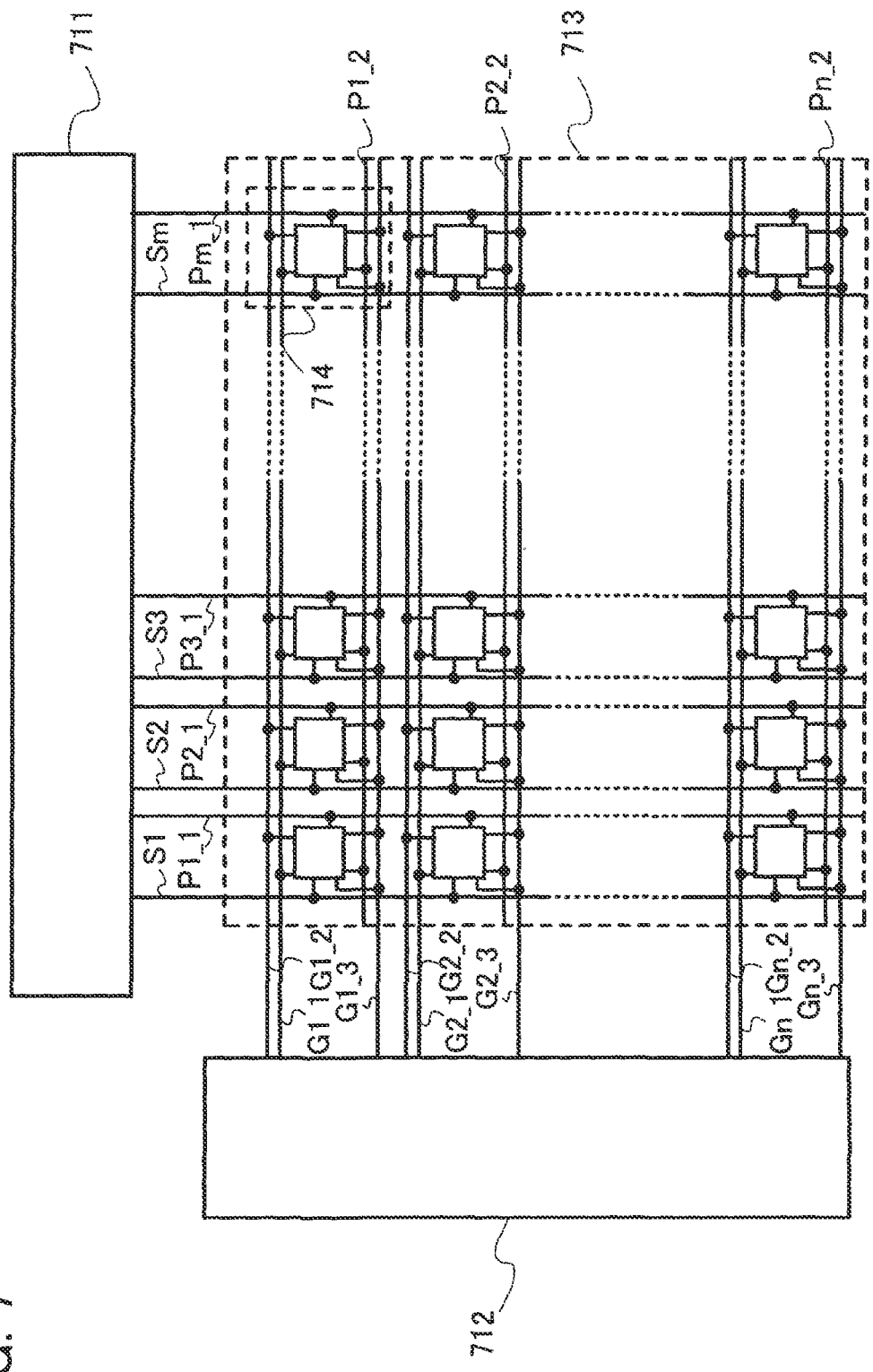
FIG. 7 is a diagram showing a display device shown in Embodiment Mode 1.

Note that the structure of the display device shown in FIG. 7 is only one example, and the present invention is not limited to this. For example, the potential supply lines P1_2 to Pn_2 are not needed to be arranged in parallel with the first scan lines G1_1 to Gn_1, and may be arranged in parallel with the signal lines S1 to Sm. In addition, the power supply lines P1_1 to Pm_1 are not needed to be arranged in parallel with the signal lines S1 to Sm, and may be arranged in parallel with the first scan lines G1_1 to Gn_1.

Although this embodiment mode describes the case in which on/off of the third switch 113 and the fourth switch 114 are controlled by using the same scan line, i.e., the third scan line 121, each switch may be controlled in accordance with the timing chart in FIG. 2 by using a different scan line.

Note that variations in the threshold voltage include not only a difference between the threshold voltage of each transistor of pixels, but also include fluctuation over time in the threshold voltage in the case of paying attention to one transistor. In addition, the difference between the threshold voltage of each transistor also includes a difference in transistor characteristics at the time of manufacturing each transistor. Note that the transistor here corresponds to a transistor having a function of supplying current to a load such as a light-emitting element.

Embodiment Mode 2

Figure 9A:
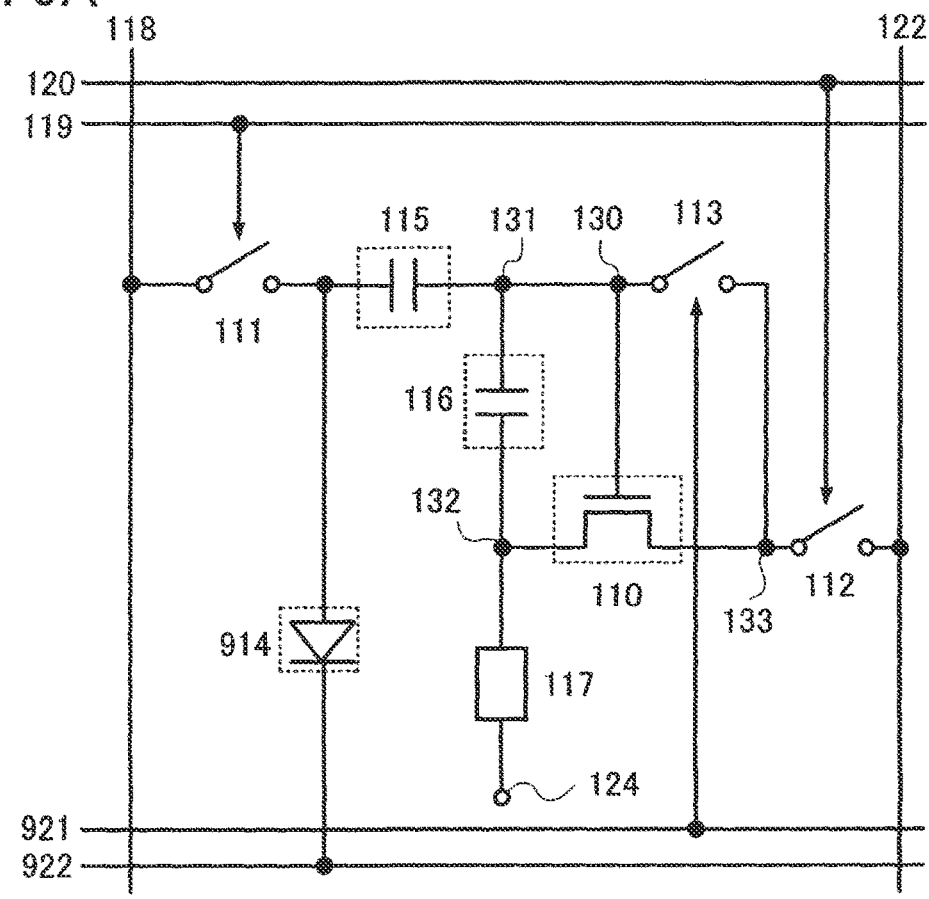
FIGS. 9A to 9F are diagrams each showing a pixel structure shown in Embodiment Mode 2.

In this embodiment mode, FIG. 9A shows a pixel having a structure which is different from that of Embodiment Mode 1. Note that portions which are similar to Embodiment Mode 1 are denoted by common reference numerals and detailed description of the same portions or portions having similar functions is omitted.

The pixel shown in FIG. 9A includes the transistor 110, the first switch 111, the second switch 112, the third switch 113, a rectifier 914, the first capacitor 115, the second capacitor 116, and the light-emitting element 117. Note that the pixel is connected to the signal line 118, the first scan line 119, the second scan line 120, a third scan line 921, a fourth scan line 922, and the power supply line 122. The pixel shown in FIG. 9A has a structure in which the rectifier 914 is used as the fourth switch 114 in FIG. 1, and the first electrode of the first capacitor 115 is connected to the fourth scan line 922 through the rectifier 914. That is, the rectifier 914 is connected so that current flows from the first electrode of the first capacitor 115 to the fourth scan line 922. Needless to say, as shown in Embodiment Mode 1, a transistor or the like may be used as each of the first switch 111, the second switch 112, and the fourth switch 114. In addition, a diode-connected transistor 954 in FIG. 9E, a diode-connected transistor 955 in FIG. 9F, or the like can be used as the rectifier 914 as well as a Schottky barrier diode 951 in FIG. 98, a PIN diode 952 in FIG. 9C, a PN diode 953 in FIG. 9D, or the like. Note that in each of the transistors 954 and 955, polarity of the transistor is necessary to be selected as appropriate depending on a direction of a current flow.

Current does not flow to the rectifier 914 when an H-level signal is input to the fourth scan line 922, and current flows to the rectifier 914 when an L-level signal is input to the fourth scan line 922. Therefore, in the case of operating the pixel in FIG. 9A similarly to the pixel shown in FIG. 1, an L-level signal is input to the fourth scan line 922 in the initialization period and the threshold voltage writing period and an H-level signal is input to the fourth scan line 922 in other periods. Note that since not only does current flows to the rectifier 914 but also the potential of the first electrode of the second capacitor 116 is necessary to be lowered to V2 when a potential in accordance with luminance data to be input to the pixel is (V2+Vdata) similarly to Embodiment Mode 1, a potential of the L-level signal is a potential obtained by subtracting the threshold voltage of the rectifier 914 in a forward direction from V2. Note that V2 is a given number and it is only necessary to input a potential of Vdata=0 when the light-emitting element 117 is controlled not to emit light in the light-emitting period. In addition, the H-level signal may be any signal which is larger than a value obtained by subtracting the threshold voltage of the rectifier 914 in the forward direction from V2 because it is only necessary that current should not flow to the rectifier 914 as described above.

Taking the aforementioned description into consideration, by performing operations which are similar to those of Embodiment Mode 1 also in the pixel structure in FIG. 9A, variations of a current value caused by variations in the threshold voltage of the transistor 110 can be suppressed. Therefore, current in accordance with luminance data can be supplied to the light-emitting element 117, so that variations in luminance can be suppressed. In addition, in the case of operating the transistor 110 in the saturation region, variations in luminance caused by deterioration of the light-emitting element 117 can also be suppressed.

In addition, the pixel shown in this embodiment mode can be applied to the display device in FIG. 7. Similarly to Embodiment Mode 1, unless the data writing periods in the rows overlap, an initialization start period can be freely set in each row. Further, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

In addition, since the threshold voltage writing period can also be set long, the threshold voltage of a transistor which controls a current value flowing to the light-emitting element can be written in the capacitor more accurately. Therefore, reliability as a display device can be improved.

This embodiment mode can be freely combined with any pixel structure shown in another embodiment mode in addition to the pixel structure in FIG. 1. That is, the rectifier 914 can also be applied to any pixel shown in another embodiment mode.

Embodiment Mode 3

Figure 10A:
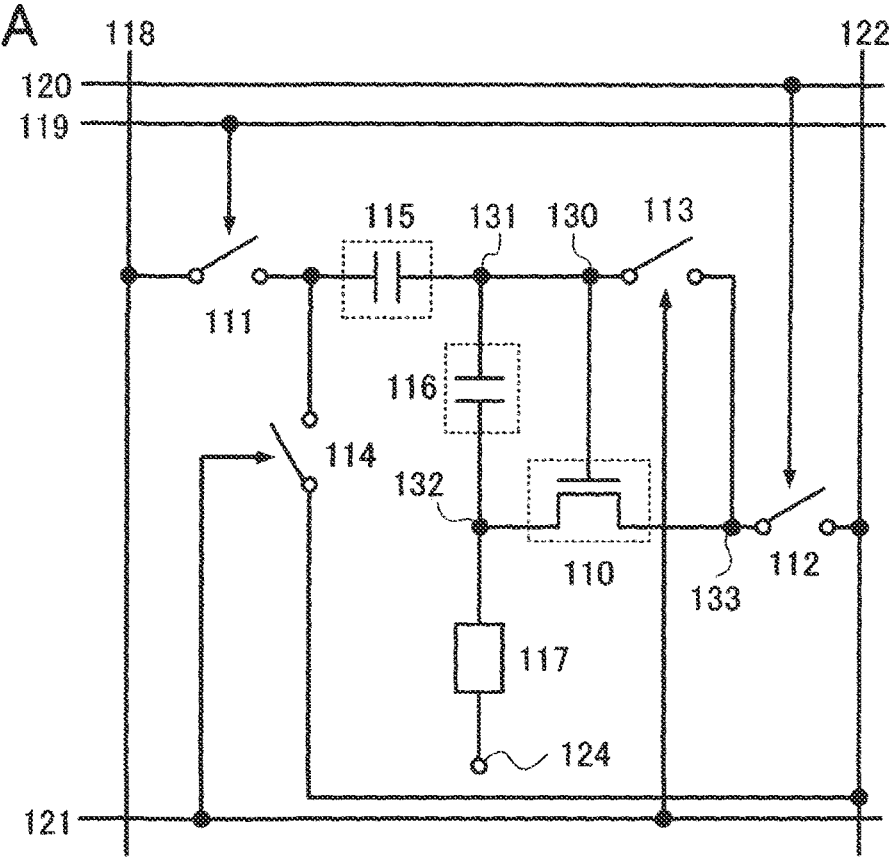
FIGS. 10A and 10B are diagrams each showing a pixel structure shown in Embodiment Mode 3.
Figure 10B:
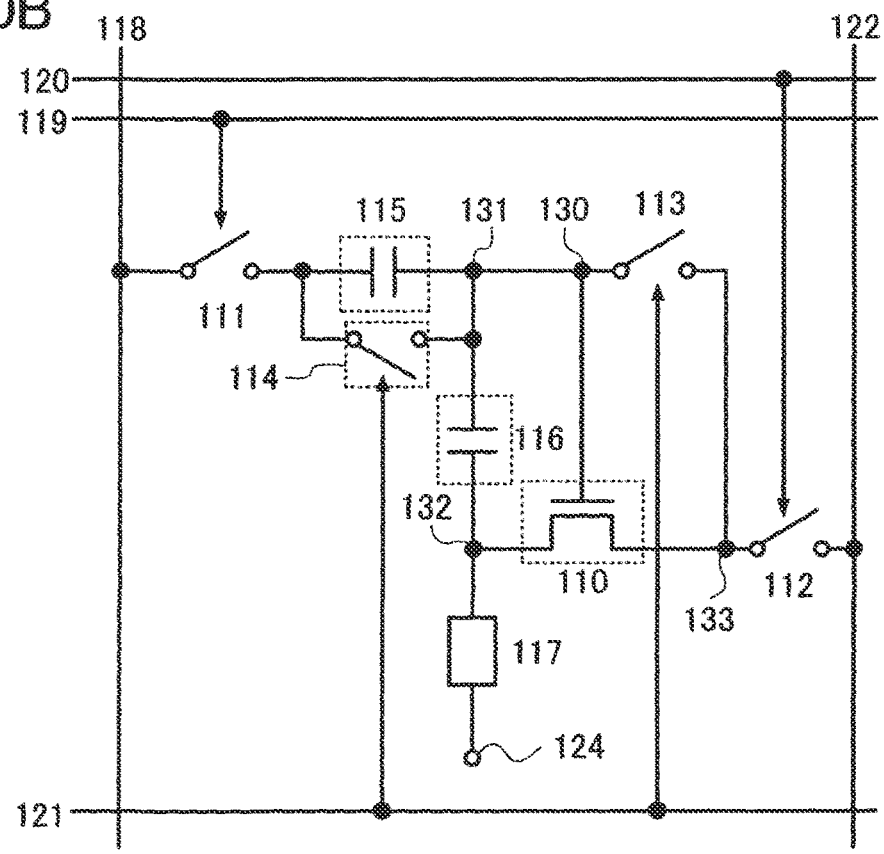
Figure 11:
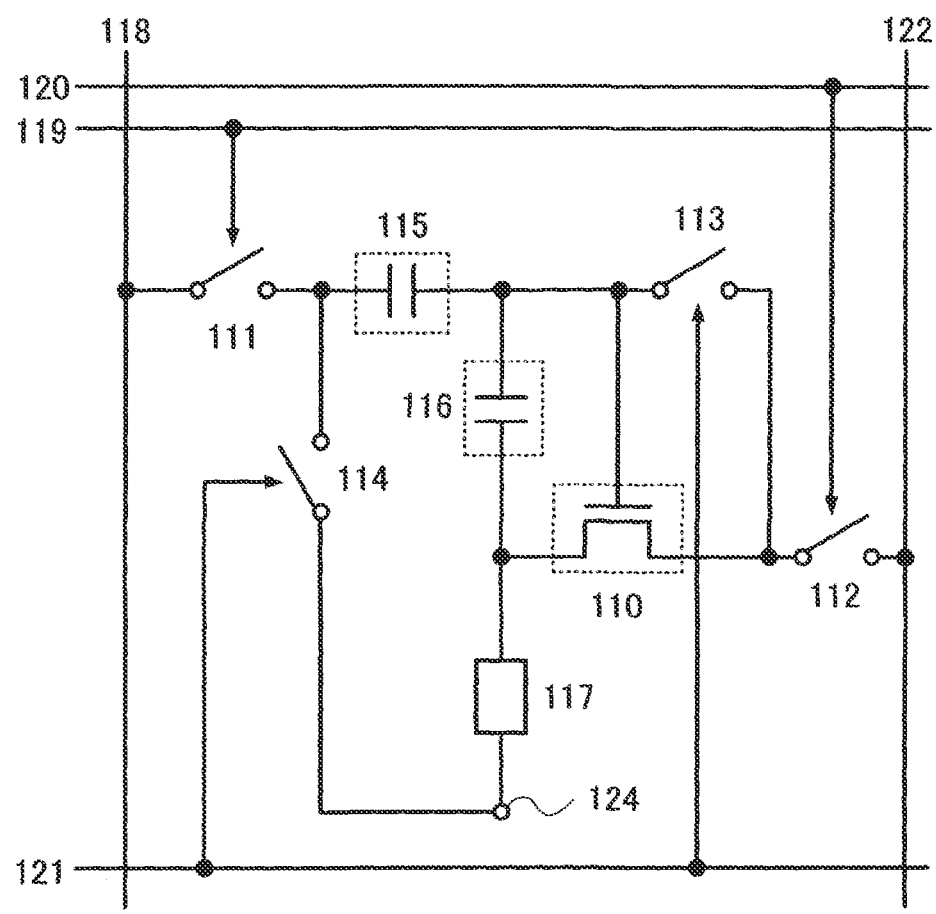
FIG. 11 is a diagram showing a pixel structure shown in Embodiment Mode 3.

In this embodiment mode, FIGS. 10A and 10B, and FIG. 11 each show a pixel having a structure which is different from those of Embodiment Modes 1 and 2. Specifically, a pixel having a structure in which another wiring is substituted for the potential supply line 123 shown in FIG. 1 is described. Note that such a structure can be used because it is only necessary to supply a given potential to the first electrode of the first capacitor 115. Note that portions which are similar to Embodiment Mode 1 are denoted by common reference numerals and detailed description of the same portions or portions having similar functions is omitted.

The pixel shown in FIG. 10A includes the transistor 110, the first switch 111, the second switch 112, the third switch 113, the fourth switch 114, the first capacitor 115, the second capacitor 116, and the light-emitting element 117. Note that the pixel is connected to the signal line 118, the first scan line 119, the second scan line 120, the third scan line 121, and the power supply line 122.

Although the first electrode of the first capacitor 115 is connected to the potential supply line 123 through the fourth switch 114 in the pixel in FIG. 1 shown in Embodiment Mode 1, the first electrode of the first capacitor 115 can be connected to the power supply line 122 in FIG. 10A. This is because the present invention is not limited to a structure where the first electrode of the first capacitor 115 is connected to the potential supply line 123 and it is only necessary that a potential be supplied to the first electrode of the first capacitor 115 so that predetermined voltage is held in the first capacitor 115 in the initialization period and the threshold voltage writing period. Thus, the power supply line 122 can be used instead of the potential supply line 123. By substituting the power supply line 122 for a wiring for supplying a potential to the first electrode of the first capacitor 115 in this manner, the number of wirings can be reduced, so that an aperture ratio can be improved.

In addition, as shown in FIG. 10B, the fourth switch 114 and the first capacitor 115 may be connected in parallel. That is, the first electrode of the first capacitor 115 may be connected to the node 131 through the fourth switch 114. In such a structure, a potential can be supplied to the first electrode of the first capacitor 115 so that the predetermined voltage is held in the first capacitor 115 in the initialization period and the threshold voltage writing period.

Further, as shown in the pixel in FIG. 11, the first electrode of the first capacitor 115 may be connected to the opposite electrode 124 of the light-emitting element 117 or a wiring for supplying a predetermined potential to the opposite electrode 124 through the fourth switch 114. That is, the predetermined potential supplied to the opposite electrode 124 may be used instead of a potential supplied from the potential supply line 123 in FIG. 1. As described above, the number of the wirings can be reduced and an aperture ratio can be improved.

In addition, a wiring which connects the first electrode of the first capacitor 115 and the opposite electrode 124 of the light-emitting element 117 is not only connected to the opposite electrode 124 but may be utilized as an auxiliary wiring in the opposite electrode 124 by being in contact with the opposite electrode 124 and being extended in parallel to the opposite electrode 124. Needless to say, the auxiliary wiring is not only in one pixel but may be over adjacent pixels or the whole pixel region. By using such an auxiliary wiring, resistance of the opposite electrode 124 can be reduced. Therefore, when the opposite electrode 124 is thinned, increase in a resistance value can be prevented. In particular, it is effective when a light-transmitting electrode is used for the opposite electrode 124. In addition, when the resistance value of the opposite electrode 124 increases, variation in luminance of the light-emitting element 117 caused by uneven potential distribution in the opposite electrode 124 due to a voltage drop can be suppressed. Thus, reliability can be further improved.

Note that by performing operations similar to those in Embodiment Mode 1 also in the pixel structures in FIGS. 10A and 10B, and FIG. 11, variations of the current value caused by variations in the threshold voltage of the transistor 110 can be suppressed. Therefore, current in accordance with luminance data can be supplied to the light-emitting element 117, so that variations in luminance can be suppressed. In addition, since the transistor 110 is operated with a potential of the opposite electrode fixed at a constant potential, power consumption can be reduced. Note that although an operation region of the transistor 110 is not particularly limited, variations in current flowing to the transistor 110 caused by deterioration of the light-emitting element 117 can be suppressed in the case of operating the transistor 110 in the saturation region.

Figure 12:
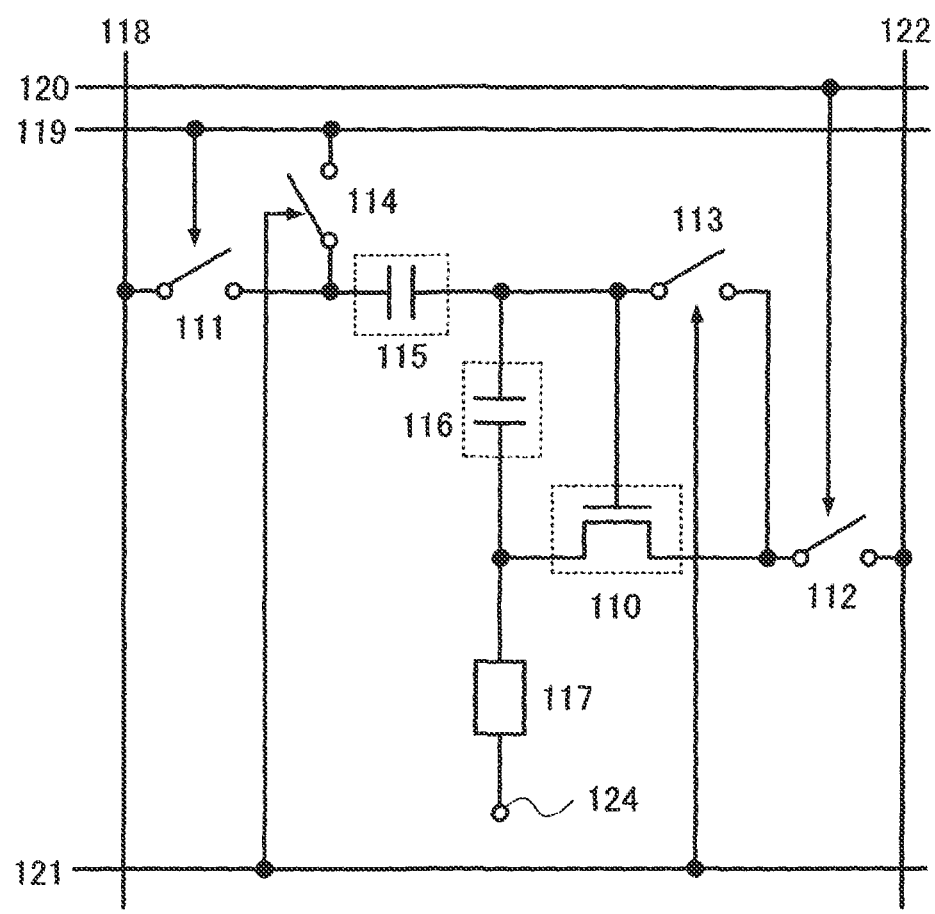
FIG. 12 is a diagram showing a pixel structure shown in Embodiment Mode 3.

Note that it is only necessary that the potential supply line 123 in FIG. 1 supply a given potential to the first electrode of the first capacitor 115 in the initialization period and the threshold voltage writing period and predetermined voltage is held in the first capacitor 115. Thus, a wiring which is used instead of the potential supply line 123 is not limited to the above-described wiring, and may be any wiring as long as a potential does not change in the initialization period and the threshold voltage writing period. For example, as shown in FIG. 12, the first scan line 119 or the third scan line 121 can be used. Note also that when the third scan line 121 is used, it is necessary to select a kind of the switches, paying attention to the fact that fourth switch 114 functions as the rectifier shown in Embodiment Mode 2 in some cases.

In addition, the pixel shown in this embodiment mode can be applied to the display device in FIG. 7. Similarly to Embodiment Mode 1, unless the data writing periods in the rows overlap, an initialization start period can be freely set in each row. Further, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

Further, since the threshold voltage writing period can also be set long, the threshold voltage of a transistor which controls a current value flowing to the light-emitting element can be written in the capacitor more accurately. Therefore, reliability as a display device can be improved.

This embodiment mode can be freely combined with any pixel structure shown in another embodiment mode, without limiting to the aforementioned description.

Embodiment Mode 4

In this embodiment mode, FIGS. 13 to 16 each show a pixel having a structure which is different from those of Embodiment Modes 1 to 3. Note that although description is made by paying attention to one pixel in Embodiment Mode 3, the number of wirings can be reduced by sharing a wiring connected to each pixel among pixels. In this case, if normal operation can be performed, various wirings can be shared among the pixels. For example, a wiring can be shared with the next pixel and this embodiment mode shows one example of such a case. Note that portions which are similar to Embodiment Mode 1 are denoted by common reference numerals and detailed description of the same portions or portions having similar functions is omitted.

Figure 13:
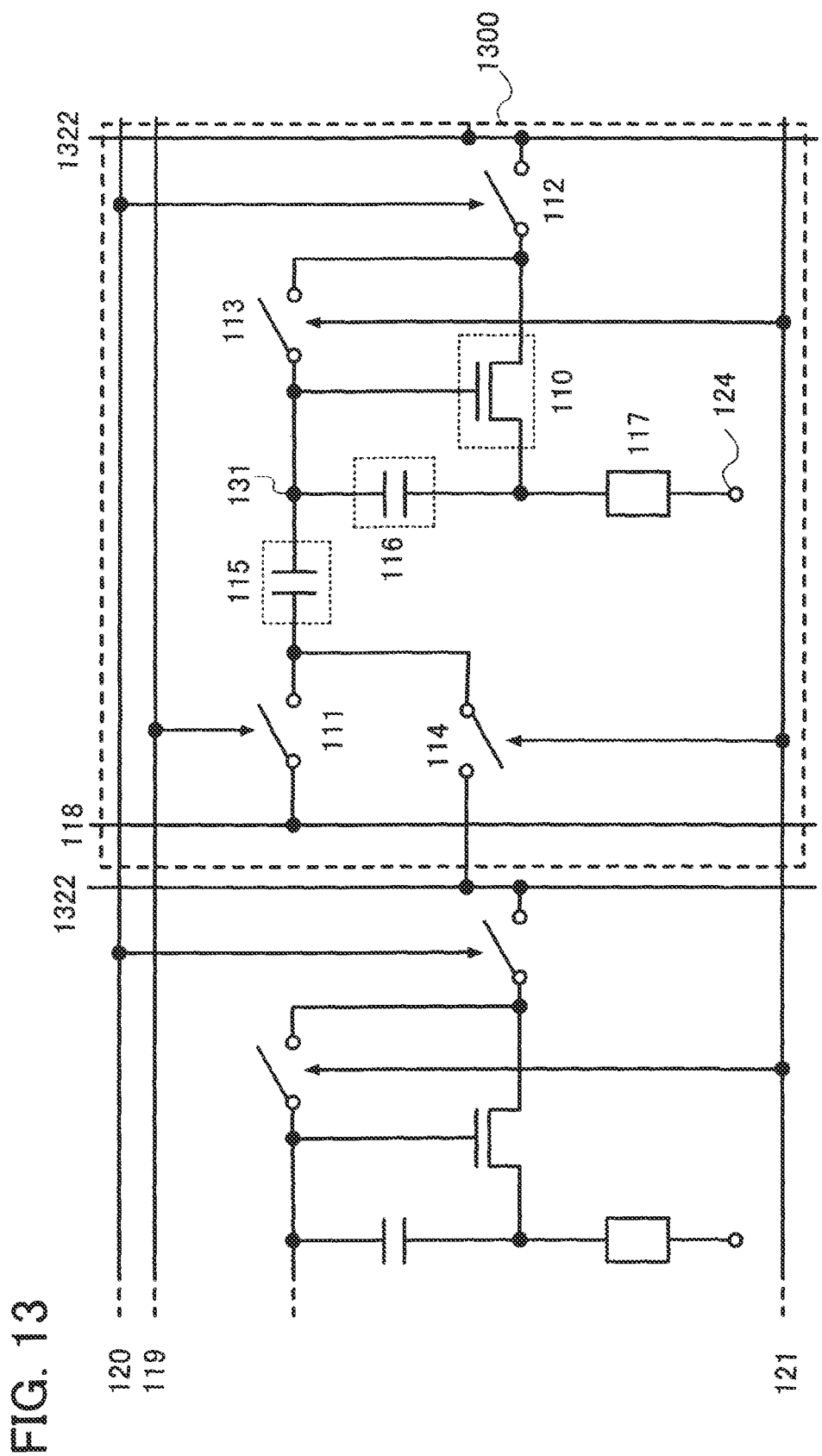
FIG. 13 is a diagram showing a pixel structure shown in Embodiment Mode 4.

A pixel 1300 shown in FIG. 13 includes the transistor 110, the first switch 111, the second switch 112, the third switch 113, the fourth switch 114, the first capacitor 115, the second capacitor 116, and the light-emitting element 117. Note that the pixel 1300 is connected to the signal line 118, a first scan line 119, the second scan line 120, the third scan line 121, and a power supply line 1322 in a previous column.

Although the first electrode of the first capacitor 115 is connected to the potential supply line 123 through the fourth switch 114 in the pixel in FIG. 1 shown in Embodiment Mode 1, the first electrode of the first capacitor 115 can be connected to the power supply line 1322 in the previous column in FIG. 13. This is because it is only necessary that a potential be supplied to the first electrode of the first capacitor 115 so that predetermined voltage is held in the first capacitor 115 in the initialization period and the threshold voltage writing period, without limiting to a structure where the first electrode of the first capacitor 115 is connected to the potential supply line 123. Thus, the power supply line 1322 in the previous column can be used instead of the potential supply line 123. The pixel 1300 shares the wiring with the pixel in the previous column in this manner, so that the number of wirings can be reduced and an aperture ratio can be improved.

Note that by performing operations similar to those in Embodiment Mode 1 also in the pixel structure in FIG. 13, variations of the current value caused by variations in the threshold voltage of the transistor 110 can be suppressed. Therefore, current in accordance with luminance data can be supplied to the light-emitting element 117, so that variations in luminance can be suppressed. In addition, since the transistor 110 is operated with a potential of the opposite electrode fixed at a constant potential, power consumption can be reduced. Note that although an operation region of the transistor 110 is not particularly limited, variations in current flowing to the transistor 110 caused by deterioration of the light-emitting element 117 can be suppressed in the case of operating the transistor 110 in the saturation region.

Figure 14:
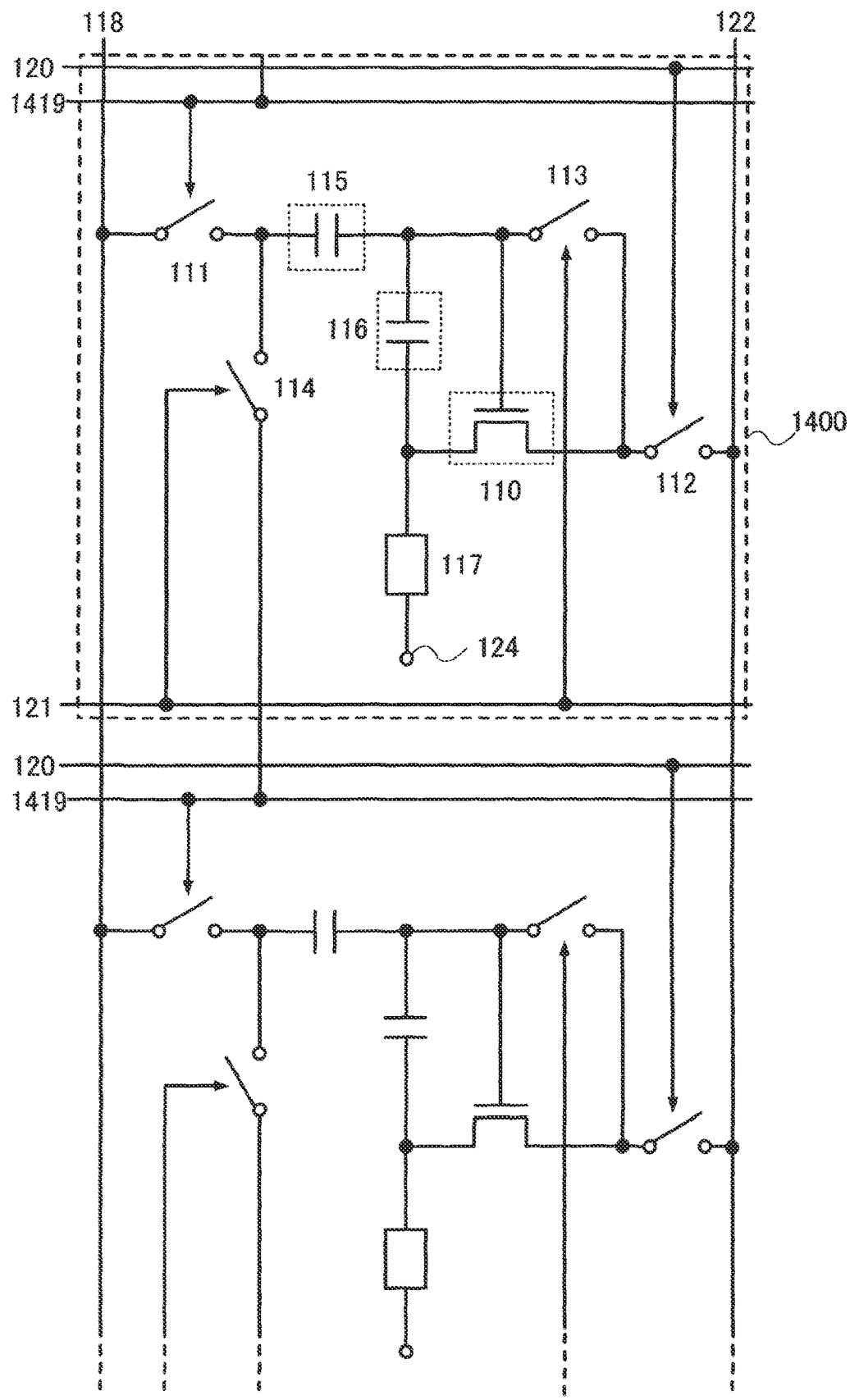
FIG. 14 is a diagram showing a pixel structure shown in Embodiment Mode 4.

In addition, as shown in a pixel 1400 in FIG. 14, the potential supply line 123 in FIG. 1 may be shared with a first scan line 1419 in the next row. Operations which are similar to those of Embodiment Mode 1 can be performed also in the pixel 1400. Note that it is necessary that operations be performed so that the initialization period and the threshold voltage writing period in a row of the pixel 1400 do not overlap with the data writing period in a row where the wiring is shared.

Figure 15:
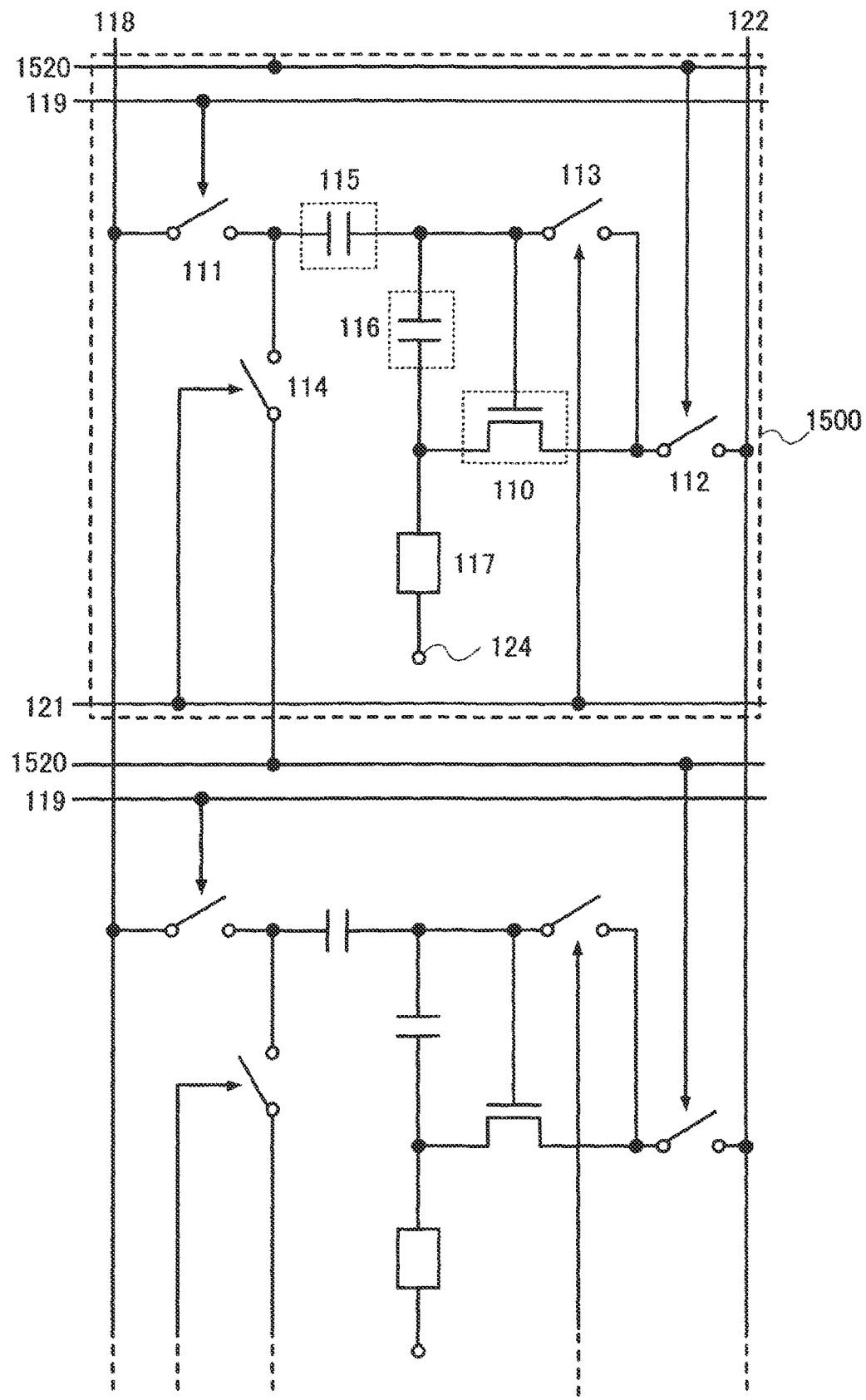
FIG. 15 is a diagram showing a pixel structure shown in Embodiment Mode 4.

In addition, as shown in a pixel 1500 in FIG. 15, the potential supply line 123 in FIG. 1 may be shared with a second scan line 1520 in the next row. Operations which are similar to those of Embodiment Mode 1 can be performed also in the pixel 1500. Note that it is necessary that operations be performed so that the initialization period and the threshold voltage writing period in a row of the pixel 1500 overlap with or do not absolutely overlap with the threshold voltage writing period and the data writing period in the row where the wiring is shared. That is, the potential supplied to the first electrode of the first capacitor 115 is used for a signal for turning on the second switch 112 or a signal for turning off the second switch 112.

Figure 16:
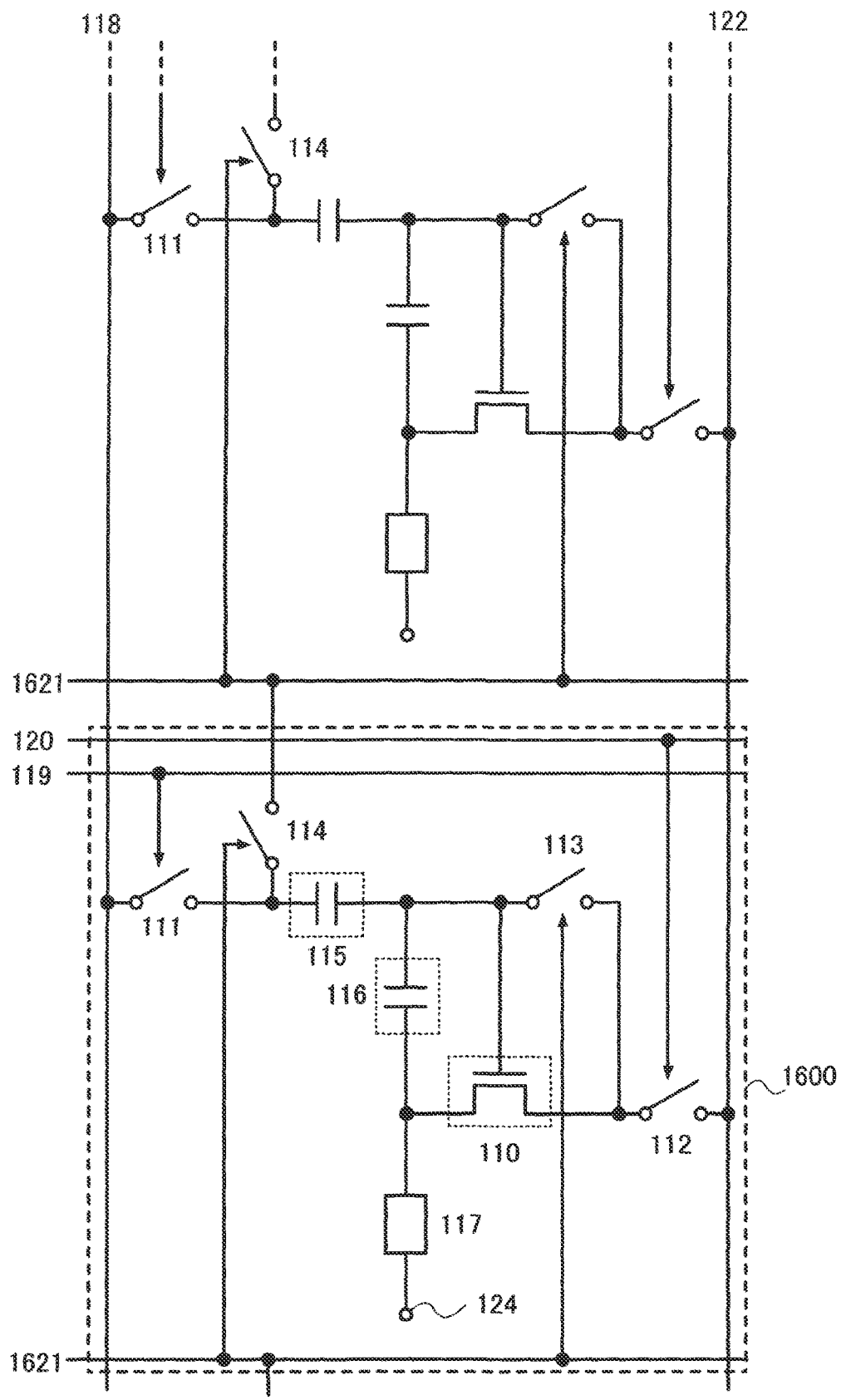
FIG. 16 is a diagram showing a pixel structure shown in Embodiment Mode 4.

In addition to the aforementioned description, as shown in FIG. 16, the potential supply line 123 in FIG. 1 may be shared with a third scan line 1621 in a previous row. Note that it is necessary that operations be performed so that the initialization period and the threshold voltage writing period in a row of a pixel 1600 do not to overlap with the threshold voltage writing period and the data writing period in a row where the wiring is shared.

Note that although in this embodiment mode, the case is described in which the potential supply line 123 in FIG. 1 is shared with the power supply line in the previous column or the scan line in the next row or the previous row, another wiring may be used as long as it is a wiring which can supply a potential to the first electrode of the first capacitor 115 so that the predetermined voltage is held in the first capacitor 115 in the initialization period and the threshold voltage writing period.

Further, pixel shown in this embodiment mode can be applied to the display device in FIG. 7. An initialization start period can be freely set in each row within a limitation of the operations in each pixel shown in FIGS. 13 to 16 and a range in which the data writing period in each row does not overlap. In addition, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

Further, since the threshold voltage writing period can also be set long, the threshold voltage of a transistor which controls a current value flowing to the light-emitting element can be written in the capacitor more accurately. Therefore, reliability as a display device can be improved.

This embodiment mode can be freely combined with any pixel structure shown in another embodiment mode, without limiting to the aforementioned description.

Embodiment Mode 5

Figure 29:
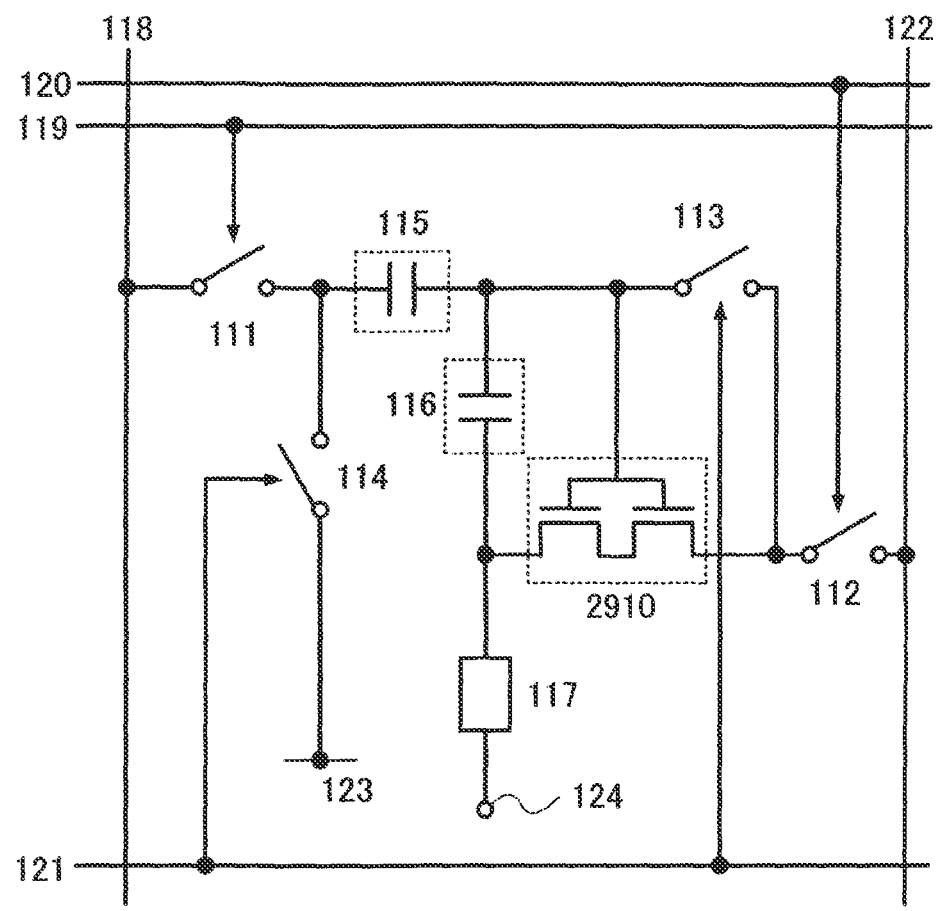
FIG. 29 is a diagram showing a pixel structure shown in Embodiment Mode 5.

In this embodiment mode, FIG. 29 shows a pixel having a structure which is different from that of Embodiment Mode 1. Note that portions which are similar to Embodiment Mode 1 are denoted by common reference numerals and detailed description of the same portions or portions having similar functions is omitted.

The pixel shown in FIG. 29 includes a transistor 2910, the first switch 111, the second switch 112, the third switch 113, the fourth switch 114, the first capacitor 115, the second capacitor 116, and the light-emitting element 117. Note that the pixel is connected to the signal line 118, the first scan line 119, the second scan line 120, the third scan line 121, the power supply line 122, and the potential supply line 123.

The transistor 2910 in this embodiment mode is a multi-gate transistor where two transistors are connected in series, and is provided in the same position as that of the transistor 110 in Embodiment Mode 1. Note that the number of transistors which are connected in series is not particularly limited.

By performing operations similar to those of the pixel in FIG. 1 in the pixel in FIG. 29, variations of a current value caused by variations in the threshold voltage of the transistor 2910 can be suppressed. Therefore, current in accordance with luminance data can be supplied to the light-emitting element 117, so that variations in luminance can be suppressed. In addition, since the transistor 2910 is operated with a potential of an opposite electrode fixed at a constant potential, power consumption can be reduced. Note that although an operation region of the transistor 2910 is not particularly limited, variations of the currents flowing to the transistor 2910 caused by deterioration of the light-emitting element 117 can be suppressed in the case of operating the transistor 2910 in the saturation region.

When channel widths of the two transistors connected in series are equal to each other, a channel length L of the transistor 2910 in this embodiment mode is equal to the sum of channel lengths of the two transistors. Therefore, a current value which is closer to a constant value can be easily obtained in the saturation region regardless of drain-source voltage Vds. In particular, the transistor 2910 is effective when it is difficult to form a transistor having a long channel length L Note that a connection portion of the two transistors functions as a resistor.

Note that it is only necessary for the transistor 2910 to have a function for controlling a current value supplied to the light-emitting element 117, and a type of the transistor 2910 is not particularly limited. Therefore, a thin film transistor (a TFT) using a crystalline semiconductor film, a thin film transistor using a non-crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be used.

In addition, in the pixel shown in FIG. 29, a transistor or the like can be used as each of the first switch 111, the second switch 112, the third switch 113, and the fourth switch 114, similarly to the pixel shown in FIG. 1, In addition, the pixel shown in this embodiment mode can be applied to the display device in FIG. 7. Similarly to Embodiment Mode 1, unless the data writing periods in the rows overlap, an initialization start period can be freely set in each row. Further, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

In addition, since the threshold voltage writing period can also be set long, the threshold voltage of a transistor which controls a current value flowing to the light-emitting element can be written in the capacitor more accurately. Therefore, reliability as a display device can be improved.

Figure 30:
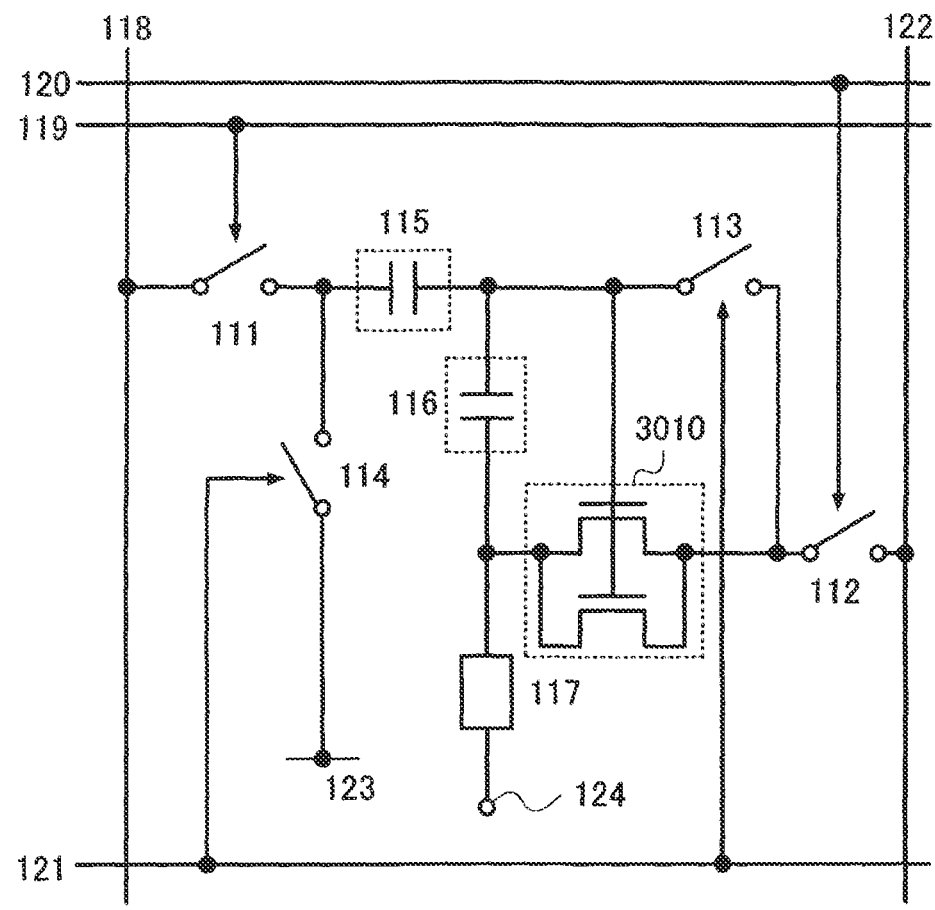
FIG. 30 is a diagram showing a pixel structure shown in Embodiment Mode 5.

Note that the transistor 2910 is not limited to a structure where transistors are connected in series, and may be a structure where transistors are connected in parallel like a transistor 3010 shown in FIG. 30. Larger current can be supplied to the light-emitting element 117 by using the transistor 3010. In addition, since transistor characteristics are averaged by using the two transistors connected in parallel, original variations in characteristics of the transistors included in the transistor 3010 can be further reduced. Therefore, when variations are reduced, variations of the current value caused by variations in the threshold voltage of the transistor can be suppressed more easily.

Further, each of the transistors connected in parallel shown in the transistor 3010 may be connected in series like the transistor 2910 shown in FIG. 29.

This embodiment mode can be freely combined with any pixel structure shown in another embodiment mode, without limiting to the aforementioned description. That is, the transistor 2910 or the transistor 3010 can be applied to any pixel structure shown in another embodiment mode.

Embodiment Mode 6

Figure 31:
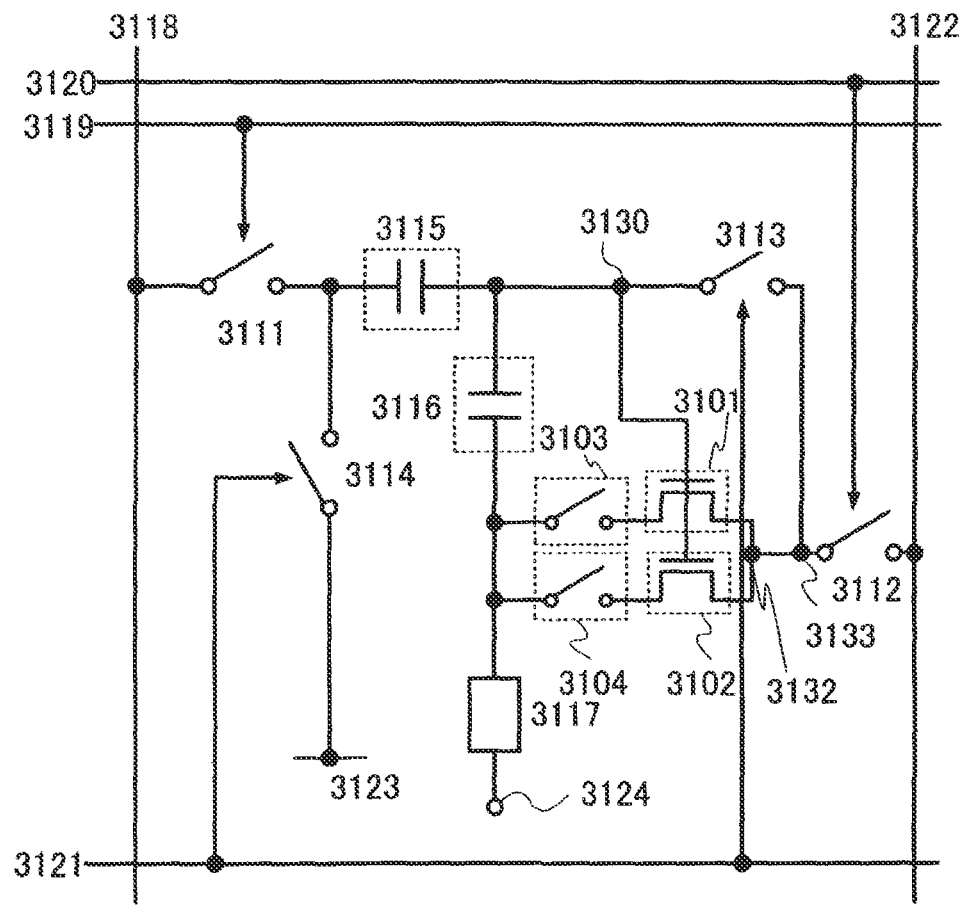
FIG. 31 is a diagram showing a pixel structure shown in Embodiment Mode 6.

In this embodiment mode, a pixel structure is described in which deterioration of transistors over time is averaged by switching transistors which control a current value supplied to a light-emitting element for each period in the pixel of the present invention, with reference to FIG. 31.

The pixel shown in FIG. 31 includes a first transistor 3101, a second transistor 3102, a first switch 3111, a second switch 3112, a third switch 3113, a fourth switch 3114, a fifth switch 3103, a sixth switch 3104, a first capacitor 3115, a second capacitor, 3116, and a light-emitting element 3117. Note that the pixel is connected to a signal line 3118, a first scan line 3119, a second scan line 3120, a third scan line 3121, a power supply line 3122, and a potential supply line 3123. Further, although not shown in FIG. 31, the pixel is connected to fourth and fifth scan lines which control on/off of the fifth switch 3103 and the sixth transistor 3104. In this embodiment mode, each of the first transistor 3101 and the second transistor 3102 is an N-channel transistor, and is turned on when gate-source voltage (Vgs) thereof exceeds the threshold voltage. In addition, a pixel electrode of the light-emitting element 3117 corresponds to an anode and an opposite electrode 3124 thereof corresponds to a cathode. Note that gate-source voltage of the transistor is described as Vgs; voltage stored in the first capacitor 3115 is described as Vc1; and voltage stored in the second capacitor 3116 is described as Vc2. Further, the threshold voltage of the first transistor 3101 is described as Vth1 and the threshold voltage of the second transistor 3102 is described as Vth2. The power supply line 3122, the potential supply line 3123, and the signal line 3118 are also referred to as a first wiring, a second wiring, and a third wiring, respectively.

A first electrode (one of a source electrode and a drain electrode) of the first transistor 3101 is connected to the pixel electrode of the light-emitting element 3117 through the fifth switch 3103, and a second electrode (the other of the source electrode and the drain electrode) of the first transistor 3101 is connected to the power supply line 3122 through the second switch 3112. In addition, a gate electrode of the first transistor 3101 is also connected to the power supply line 3122 through the third switch 3113 and the second switch 3112. Note that the third switch 3113 is connected between the gate electrode of the first transistor 3101 and the second switch 3112. In addition, a connection point of the second electrode of the first transistor 3101 and a wiring to which the second switch 3112 and the third switch 3113 are connected is denoted by a node 3133.

A first electrode (one of a source electrode and a drain electrode) of the second transistor 3102 is connected to the pixel electrode of the light-emitting element 3117 through the sixth switch 3104, and a second electrode (the other of the source electrode and the drain electrode) of the second transistor 3102 is connected to the second electrode of the first transistor 3101. In addition, if a connection point of the second electrode of the first transistor 3101 and the second electrode of the second transistor 3102 is denoted by a node 3132, the node 3132 is connected to the node 3133. Further, the gate electrode of the second transistor 3102 is connected to the node 3133 through the third switch 3113. Note that the gate electrode of the first transistor 3101 is connected to the gate electrode of the second transistor 3102.

In addition, when a connection point of the gate electrode of the first transistor 3101, the gate electrode of the second transistor 3102, and the third switch 3113 is denoted by a node 3130, the node 3130 is connected to the signal line 3118 through the first capacitor 3115 and the first switch 3111. That is, a first electrode of the first capacitor 3115 is connected to the signal line 3118 through the first switch 3111, and a second electrode of the first capacitor 3115 is connected to the gate electrode of the first transistor 3101 and the gate electrode of the second transistor 3102. The first electrode of the first capacitor 3115 is also connected to the potential supply line 3123 through the fourth switch 3114. The node 3130 is also connected to the pixel electrode of the light-emitting element 3117 through the second capacitor 3116. That is, a first electrode of the second capacitor 3116 is connected to the gate electrode of the first transistor 3101 and the gate electrode of the second transistor 3102, and a second electrode of the second capacitor 3116 is connected to the first electrode of the first transistor 3101 and the first electrode of the second transistor 3102 through the fifth switch 3103 and the sixth switch 3104, respectively. Such a capacitor may be formed by sandwiching an insulating film with a wiring, a semiconductor layer, or an electrode, or the second capacitor 3116 can be omitted by using gate capacitance of the first transistor 3101 and gate capacitance of the second transistor 3102 in some cases.

Note that by inputting signals into the first scan line 3119, the second scan line 3120, and the third scan lint 3121, on/off of the first switch 3111, the second switch 3112, the third switch 3113, and the fourth switch 3114 is controlled. As described above, scan lines which control on/off of the fifth switch 3103 and the sixth switch 3104 are omitted in FIG. 31.

A signal in accordance with a gray scale level of the pixel which corresponds to a video signal, i.e., a potential in accordance with luminance data is input to the signal line 3118.

Next, operations of the pixel shown in FIG. 31 are described with reference to a timing chart in FIG. 32. Note that in FIG. 32, one frame period which corresponds to a period for displaying an image for one screen is divided into an initialization period, a threshold voltage writing period, a data writing period, and a light-emitting period.

Note that a potential of V1 (V1 corresponds to a given number) is input to the opposite electrode 3124 of the light-emitting element 3117. In addition, when a potential difference which is at least necessary for the light-emitting element 3117 to emit light is denoted by $V_{EL}$, a potential of V1+$V_{EL}$+Vth+α (α corresponds to a given positive number) is input to the power supply line 3122. That is, the potential of the power supply line 3122 may be any potential as long as it is equal to or higher than V1+$V_{EL}$+Vth+α. Note also that Vth corresponds to a higher potential between Vth1 and Vth2. Although a potential of the potential supply line 3123 is not particularly limited, the potential of the potential supply line 3123 is preferably in a range of a potential input to a panel where a pixel is formed. Thus, it is not necessary to separately form a power source. Note that here, the potential of the potential supply line 3123 is at V2.

First, in the initialization period shown in period A of FIG. 32, the first switch 3111 and the sixth switch 3104 are turned off and the second switch 3112, the third switch 3113, the fourth switch 3114, and the fifth switch 3103 are turned on. At this time, the first transistor 3101 is conductive, V1+$V_{EL}$ Vth+α−V2 is held in the first capacitor 3115, and Vth+α is held in the second capacitor 3116. Note that in the initialization period, it is only necessary that predetermined voltage be held in the first capacitor 3115 and voltage which is at least higher than Vth1 be held in the second capacitor 3116.

In the threshold voltage writing period shown in period B of FIG. 32, the second switch 3112 is turned off. Therefore, a potential of the first electrode, i.e., the source electrode of the first transistor 3101 rises gradually, and the first transistor 3101 is turned off when gate-source voltage Vgs of the first transistor 3101 reaches the threshold voltage (Vth1). Thus, voltage Vc2 which is held in the second capacitor 3116 is at approximately Vth1.

In the following data writing period shown in period C of FIG. 32, the first switch 3111 is turned on after the third switch 3113 and the fourth switch 3114 are turned off, and a potential in accordance with luminance data (V2+Vdata) is input from the signal line 3118. At this time, voltage Vc2 which is held in the second capacitor 3116 is Vth1+Vdata×(C1/(C1+C2)) from C3>>C1, C2 when electrostatic capacitance of the first capacitor 3115 is denoted by C1, electrostatic capacitance of the second capacitor 3116 is denoted by C2, and electrostatic capacitance of the light-emitting element 3117 is denoted by C3.

Note that although C1 and C2 are necessary when a potential supplied from the signal line 3118 is determined, a relation therebetween is not particularly limited. Note that when C1>C2 is satisfied, power consumption can be reduced because amplitude of Vdata in accordance with changes in luminance can be reduced. On the other hand, when C2>C1 is satisfied, change in Vc2 due to on/off of a surrounding switch or off-current can be suppressed. By these opposite advantageous effects, it is preferable that C1 and C2 be equal and a size of the first capacitor 3115 be the same as that of the second capacitor 3116.

Note also that in the case where the light-emitting element 3117 is controlled not to emit light in the following light-emitting period, it is only necessary to input a potential of Vdata≤0.

Next, in the light-emitting period shown in period D of FIG. 32, the second switch 3112 is turned on after the first switch 3111 is turned off. At this time, the gate-source voltage Vgs of the first transistor 3101 is Vth1+Vdata×(C1/(C1+C2)) and current in accordance with luminance data flows to the first transistor 3101 and the light-emitting element 3117, so that the light-emitting element 3117 emits light.

By performing such an operation, current flowing to the light-emitting element 3117 does not depend on the threshold voltage (Vth1) of the first transistor 3101 in each of the case where the first transistor 3101 is operated in the saturation region and the case where the first transistor 3101 is operated in the linear region.

Further, in the initialization period of the next one frame period shown in period E of FIG. 32, the fifth switch 3103 is turned off and the third switch 3113, the fourth switch 3114, and the sixth switch 3104 are turned on. The second transistor 3102 is turned on, V1+$V_{EL}$ Vth+α−V2 is held in the first capacitor 3115, and Vth+a is held in the second capacitor 3116. Note that in the initialization period, it is only necessary that the predetermined voltage be held in the first capacitor 3115 and voltage which is at least higher than Vth2 be held in the second capacitor 3116.

Next, in the threshold voltage writing period shown in period F of FIG. 32, the second switch 3112 is turned off. Therefore, a potential of the first electrode, i.e., the source electrode of the second transistor 3102 rises gradually, and the second transistor 3102 is turned off when gate-source voltage Vgs of the second transistor 3102 reaches the threshold voltage (Vth2). Thus, the voltage held in the second capacitor 3116 is at approximately Vth2.

In the following data writing period shown in period G of FIG. 32, the first switch 3111 is turned on after the third switch 3113 and the fourth switch 3114 are turned off, and the potential in accordance with luminance data (V2+Vdata) is input from the signal line 3118. At this time, the voltage Vc2 which is held in the second capacitor 3116 is Vth2+Vdata×(C1/(C1+C2))

Next, in the light-emitting period shown in period H of FIG. 32, the second switch 3112 is turned on after the first switch 3111 is turned off. At this time, the gate-source voltage Vgs of the second transistor 3102 is Vth2+Vdata×(C1/(C1+C2)) and current in accordance with luminance data flows to the second transistor 3102 and the light-emitting element 3117, so that the light-emitting element 3117 emits light.

The current flowing to the light-emitting element 3117 does not depend on the threshold voltage (Vth2) of the second transistor 3102 in each of the case where the second transistor 3102 is operated in the saturation region and the case where the second transistor 3102 is operated in the linear region.

Therefore, in the case of controlling current supplied to the light-emitting element by using either the first transistor 3101 or the second transistor 3102, variations of the current value caused by variations in the threshold voltage of the transistor can be suppressed, so that the current in accordance with luminance data can be supplied to the light-emitting element 3117. Note that by switching the first transistor 3101 and the second transistor 3102, a load added to one transistor is reduced, so that fluctuation of the threshold voltage of the transistor over time can be decreased.

As described above, variations in luminance caused by variations in the threshold voltage of each of the first transistor 3101 and the second transistor 3102 can be suppressed. In addition, since the potential of the opposite electrode 3124 is fixed at a constant potential, power consumption can be reduced.

Further, in the case of operating the first transistor 3101 and the second transistor 3102 in the saturation region, variations in current flowing to each of the first transistor 3101 and the second transistor 3102 caused by deterioration of the light-emitting element 3117 can be suppressed.

Note that in the case of operating the first transistor 3101 and the second transistor 3102 in the saturation region, a channel length L of each transistor is preferably long.

Note that since variations of the current value caused by variations in the threshold voltage of the transistor can be suppressed, a supply destination of current controlled by the transistor is not particularly limited. Therefore, an EL element (an organic EL element, an inorganic EL element, or an EL element including both an organic material and an inorganic material) can be typically used as the light-emitting element 3117 shown in FIG. 31. Alternatively, an electron emitter, a liquid crystal element, electronic ink, or the like can be used instead of the light-emitting element 3117.

Note that it is only necessary for each of the first transistor 3101 and the second transistor 3102 to have a function for controlling a current value supplied to the light-emitting element 3117, and a type of each of the first transistor 3101 and the second transistor 3102 is not particularly limited. Therefore, a thin film transistor (a TFT) using a crystalline semiconductor film, a thin film transistor using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be used.

The first switch 3111 selects timing for inputting a potential in accordance with luminance data, i.e., a signal to the pixel from the signal line 3118, and mainly changes voltage held in the first capacitor 3115 and voltage held in the second capacitor 3116, i.e., gate-source voltage of the first transistor 3101 or the second transistor 3102. The second switch 3112 selects timing for supplying a predetermined potential to the second electrode of the first transistor 3101 or the second transistor 3102. Note that the predetermined potential is also supplied to the second electrode of the first capacitor 3115 and the first electrode of the second capacitor 3116 in some cases. The third switch 3113 controls a connection between the gate electrode of the first transistor 3101 or the second transistor 3102 and the second electrode of each transistor. The fourth switch 3114 selects timing for holding predetermined voltage in the first capacitor 3115 every frame period, and controls whether to supply a predetermined potential to the first electrode of the first capacitor 3115. Therefore, the first switch 3111, the second switch 3112, the third switch 3113, and the fourth switch 3114 are not particularly limited as long as they have above-described functions. For example, each of the first switch 3111, the second switch 3112, the third switch 3113, and the fourth switch 3114 may be a transistor, a diode, or a logic circuit combining them. Note that the first switch 3111, the second switch 3112, and the fourth switch 3114 are not particularly needed as long as a signal or a potential can be supplied to the pixel at the above-described timing. Further, the third switch 3113 is not particularly needed as long as the above-described function can be achieved.

For example, since the pixel can be formed by using only N-channel transistors when N-channel transistors are used for the first switch 3111, the second switch 3112, the third switch 3113, the fourth switch 3114, the fifth switch 3103, and the sixth switch 3104, a manufacturing process can be simplified. In addition, an amorphous semiconductor, a semi-amorphous semiconductor, or the like can be used for a semiconductor layer of each transistor included in the pixel. For example, amorphous silicon (a-Si:H) can be given as an example of an amorphous semiconductor. By using such a semiconductor, the manufacturing process can be further simplified. Accordingly, manufacturing cost can be reduced and yield can be improved.

Note that when a transistor is used for each of the first switch 3111, the second switch 3112, the third switch 3113, the fourth switch 3114, the fifth switch 3103, and the sixth switch 3104, polarity (a conductivity type) of each transistor is not particularly limited. However, a transistor of polarity with smaller off-current is preferably used.

Figure 37:
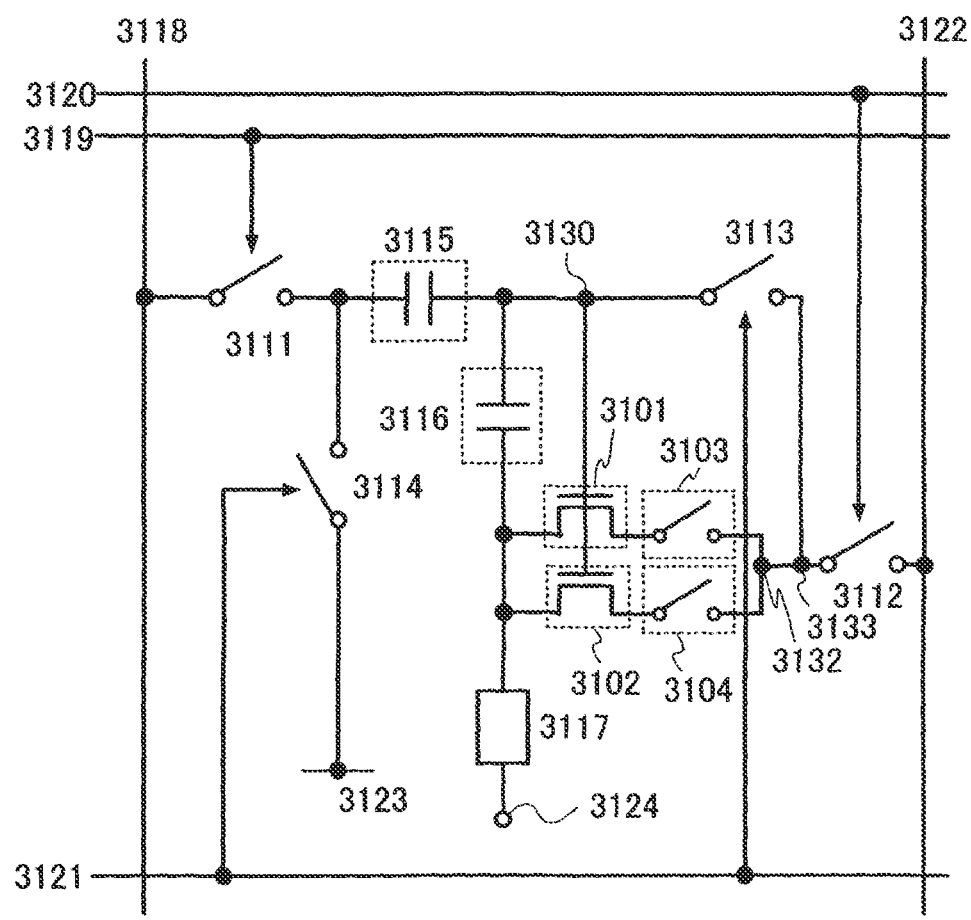
FIG. 37 is a diagram showing a pixel structure shown in Embodiment Mode 6.

In addition, the first transistor 3101 and the fifth switch 3103, and the second transistor 3102 and the sixth transistor 3104 may be switched as shown in FIG. 37. That is, the first electrodes of the first transistor 3101 and the second transistor 3102 are connected to the gate electrodes of the first transistor 3101 and the second transistor 3102 through the second capacitor 3116. Further, the second electrode of the first transistor 3101 is connected to the node 3132 through the fifth switch 3103, and the second electrode of the second transistor 3102 is connected to the node 3132 through the sixth switch 3104.

Furthermore, although FIGS. 31 and 37 show the cases where the number of sets arranged in parallel is two, using a transistor and a switch as one set, i.e., using the first transistor 3101 and the fifth switch 3103 as a set, and using the second transistor 3102 and the sixth switch 3104 as a set, the number of sets arranged in parallel is not particularly limited.

In addition, the pixel shown in this embodiment mode can be applied to the display device in FIG. 7. Similarly to Embodiment Mode 1, unless the data writing periods in the rows overlap, an initialization start period can be freely set in each row. Further, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

In addition, since the threshold voltage writing period can also be set long, the threshold voltage of a transistor which controls a current value flowing to the light-emitting element can be written in the capacitor more accurately. Therefore, reliability as a display device can be improved.

Note that also in this embodiment mode, a wiring in the same pixel may be substituted for the potential supply line 3123 as shown in Embodiment Mode 3 or the potential supply line 3123 may be shared with a wiring in another row as shown in Embodiment Mode 4. In addition, a multi-gate transistor where transistors are connected in series or a transistor where transistors are arranged in parallel may be used as each of the first transistor 3101 and the second transistor 3102. This embodiment mode is not limited to them, and can be applied to any pixel structure shown in Embodiment Modes 1 to 5.

Embodiment Mode 7

In this embodiment mode, a structure of a pixel which is different from that of Embodiment Mode 1 is shown. Note that portions which are similar to Embodiment Mode 1 are denoted by common reference numerals and detailed description of the same portions or portions having similar functions is omitted. Note that the portions are operated similarly to Embodiment Mode 1.

In this embodiment mode, a pixel structure which forcibly prevents current from flowing to the light-emitting element 117 is described. That is, it is an object of this embodiment mode to obtain a display device in which an afterimage is hardly seen and moving image characteristics are excellent by forcibly making a non light-emitting state.

Figure 38:
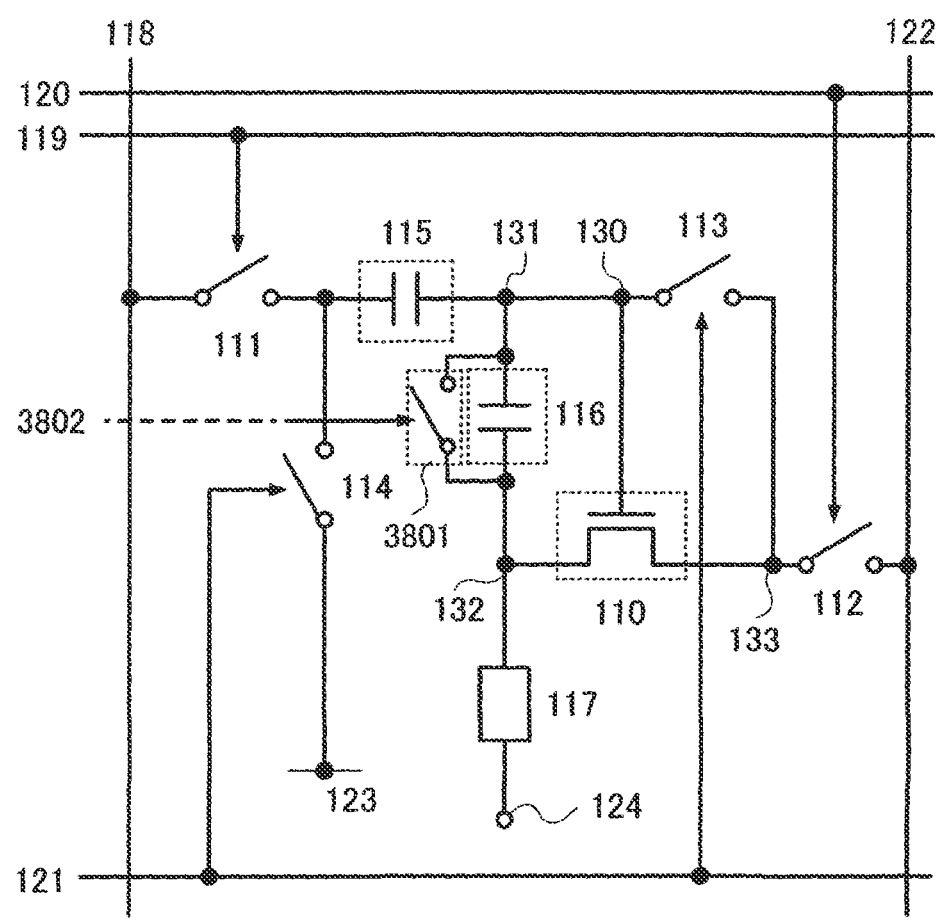
FIG. 38 is a diagram showing a pixel structure shown in Embodiment Mode 7.

One of such pixel structures is shown in FIG. 38. The pixel shown in FIG. 38 includes a fifth switch 3801 in addition to the transistor 110, the first switch 111, the second switch 112, the third switch 113, the fourth switch 114, the first capacitor 115, the second capacitor 116, and the light-emitting element 117. Note that the pixel is connected to a fourth scan line 3802 in addition to the signal line 118, the first scan line 119, the second scan line 120, the third scan line 121, the power supply line 122, and the potential supply line 123.

In FIG. 38, the fifth switch 3801 and the second capacitor 116 are connected in parallel. That is, when the fifth switch 3801 is turned on, the gate electrode and the first electrode of the transistor 110 are short-circuited. Thus, since the gate-source voltage of the transistor 110, which is held in the second capacitor 116, can be set to 0V, the transistor 110 is turned off, so that the light-emitting element 117 can be made not to emit light. Note that on/off of the fifth switch 3801 is controlled by scanning pixels every row with a signal input to the fourth scan line 3802.

By such an operation, a signal written in the pixel is erased. Thus, an erase period in which the light-emitting element is forcibly made in a non light-emitting state until the next initialization period can be provided. That is, black data is inserted. Therefore, an afterimage is hardly seen and moving image characteristics can be improved.

Meanwhile, as a driving method of a display device for expressing a gray scale, there are an analog gray scale method and a digital gray scale method. The analog gray scale method includes a method which controls emission intensity of a light-emitting element in an analog manner and a method which controls light-emitting time of a light-emitting element in an analog manner. In the analog gray scale method, the method which controls emission intensity of a light-emitting element in an analog manner is often used. On the other hand, in the digital gray scale method, a gray scale is expressed by controlling on/off of a light-emitting element in a digital manner. In the case of the digital gray scale method, there is an advantage of high noise resistance because data processing can be performed with a digital signal; however, since the digital driving method has only two states of a light-emitting state and a non light-emitting state, the digital driving method can only display two gray scale levels by itself. Therefore, multi-gray scale display has been realized by combining with another method. As a technique for multi-gray scale display, there are an area ratio gray scale method in which light-emitting areas of pixels are weighted and selected to perform gray scale display and a time ratio gray scale method in which light-emitting time is weighted and selected to perform gray scale display.

Figure 39:
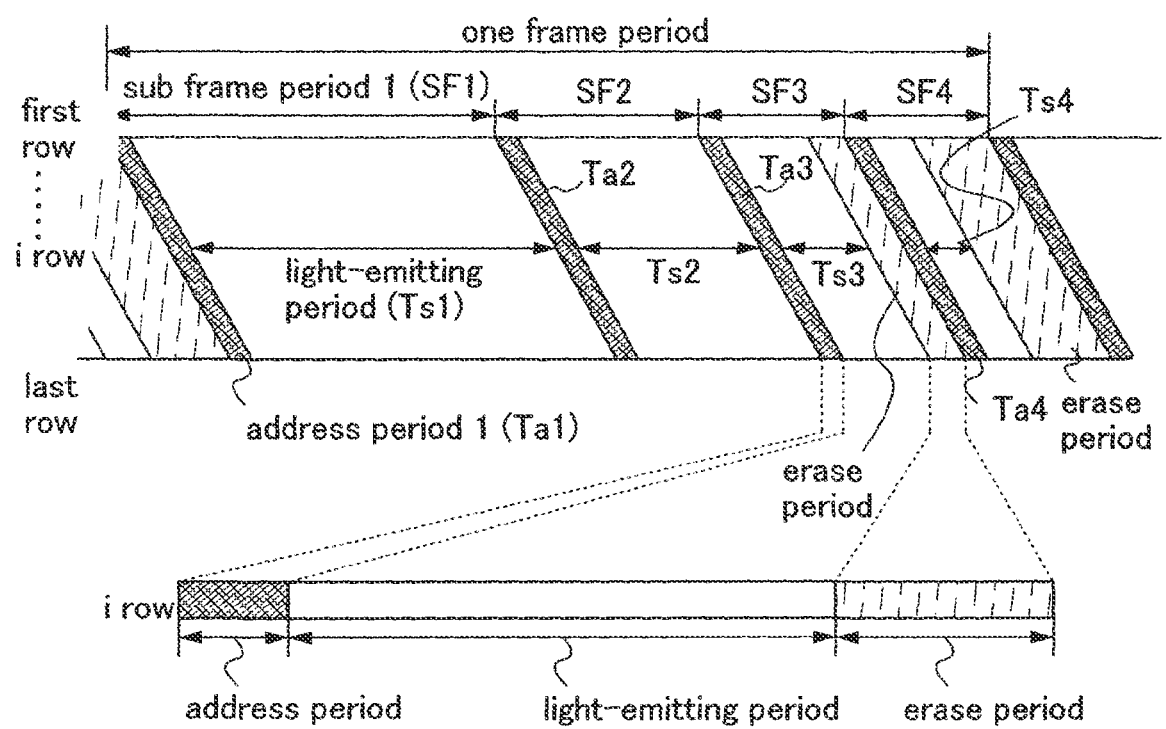
FIG. 39 is a chart showing a driving method in which a digital gray scale method and a time ratio gray scale method are combined.

In the case of combining the digital gray scale method and the time ratio gray scale method, one frame period is divided into a plurality of subframe periods (SFn) as shown in FIG. 39. Each subframe period includes an address period (Ta) having an initialization period, a threshold voltage writing period, and a data writing period, and a light-emitting period (Ts). Note that the number of the subframe periods which are provided in one frame period corresponds to the number of display bits n. In addition, in one frame period, a ratio of a length of light-emitting periods in respective subframe periods is set to satisfy $2^{(a-1)}:2^{(a-2)}: \ldots :2:1$, light-emission or non light-emission of a light-emitting element in each light-emitting period is selected, and thus, gray scales are expressed by utilizing difference in total light-emitting time in one frame period in which the light-emitting element emits light. In one frame period, luminance is high when the total light-emitting time is long, and luminance is low when the total light-emitting time is short. Note that FIG. 39 shows an example of a 4-bit gray scale, in which one frame period is divided into four subframe periods and $2^4=16$ gray scales can be expressed by a combination of light-emitting periods. Note that gray scales can be expressed even when a ratio of a length of the light-emitting periods is not a power-of-two ratio. Further, one subframe period may further be divided.

Note that in the case of realizing multi-gray scale display by using the time ratio gray scale method as described above, a length of the light-emitting period of a low-order bit is short. Therefore, when a data writing operation of the next subframe period is started immediately after termination of the light-emitting period, the data writing operation overlaps with the data writing operation of a previous subframe period, so that normal operation cannot be performed. Therefore, by providing the above-described erase period in the subframe period, light emission having a shorter length than a data writing period which is necessary for all rows can be expressed. That is, the light-emitting period can be freely set.

The present invention is particularly effective in the analog gray scale method. Further, it is effective to provide an erase period also in a method combining the digital gray scale method and the time ratio gray scale method because a light emitting period can be freely set.

In addition, the erase period may be provided by interrupting a current path from the power supply line 122 to the pixel electrode of the light-emitting element 117 through the transistor 110. For example, the erase period may be provided by providing another switch in the current path from the power supply line 122 to the pixel electrode of the light-emitting element 117 through the transistor 110 and turning off the switch by scanning pixels every row.

Figure 40:
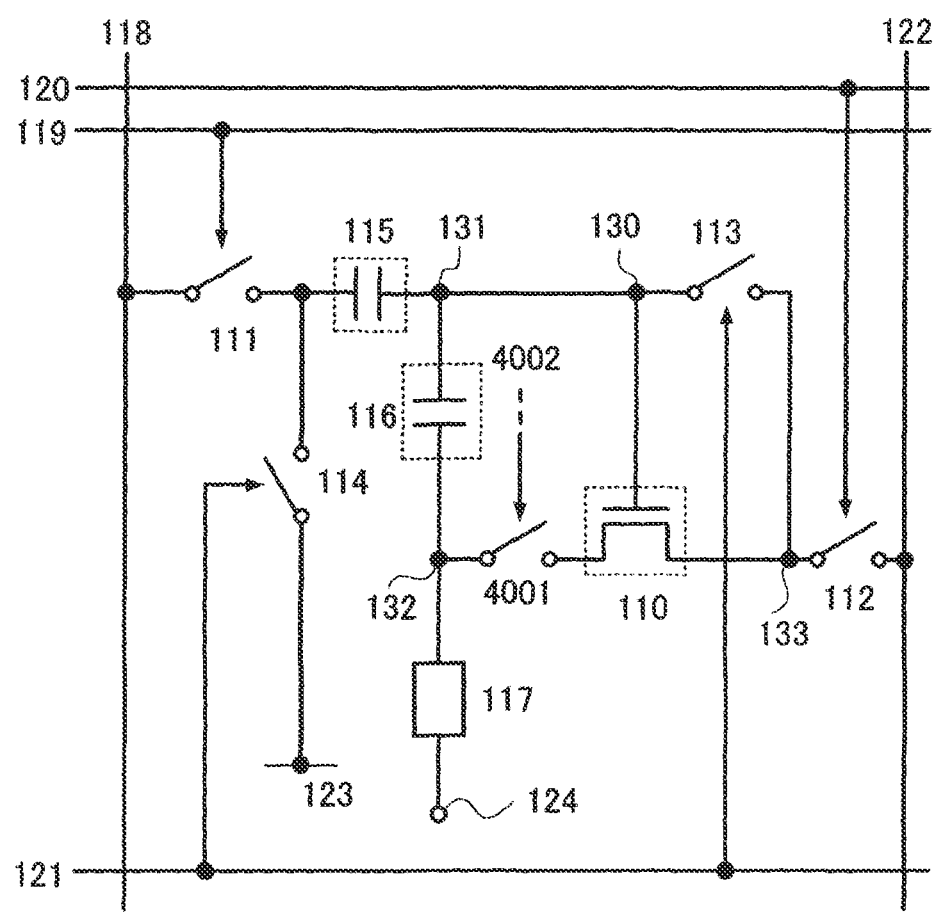
FIG. 40 is a diagram showing a pixel structure shown in Embodiment Mode 7.

One of such structures is shown in FIG. 40. In the structure of FIG. 40, a fifth switch 4001 is connected between the first electrode of the transistor 110 and the node 132 in addition to the pixel structure of FIG. 1. On/off of the fifth switch 4001 is controlled by a signal input to a fourth scan line 4002. By turning off this fifth switch 4001, the erase period can be provided.

Figure 41:
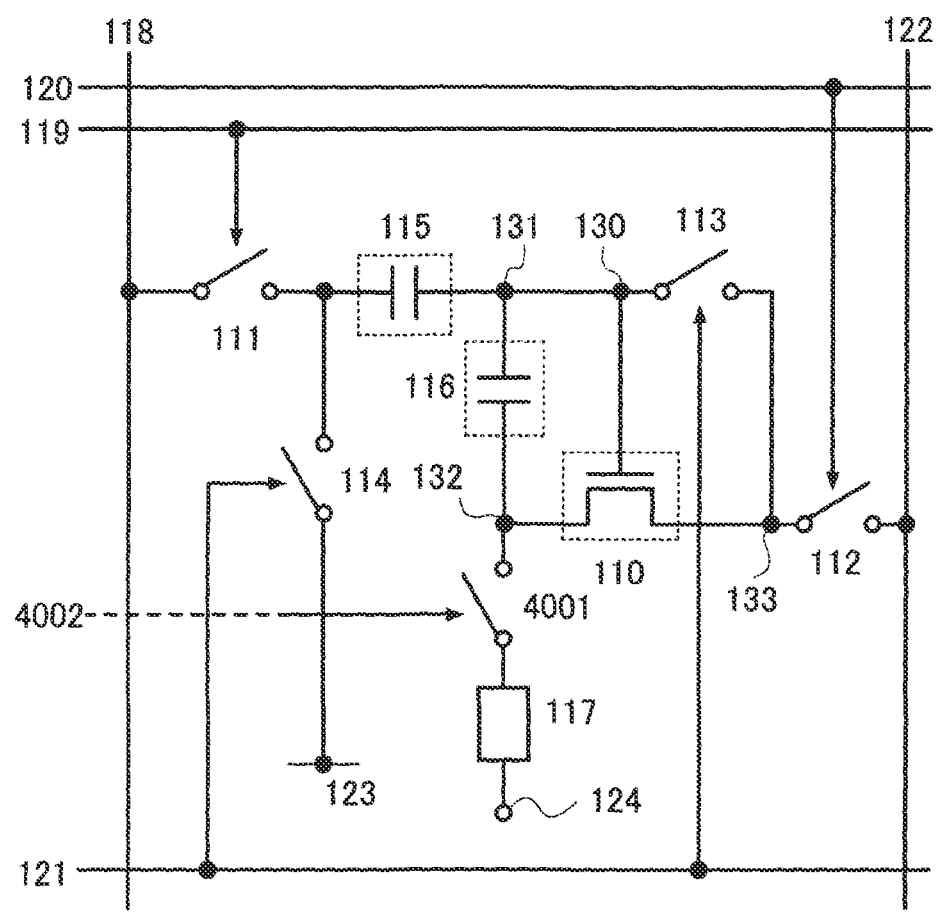
FIG. 41 is a diagram showing a pixel structure shown in Embodiment Mode 7.

Alternatively, by connecting the fifth switch 4001 between the second electrode of the transistor 110 and the node 133, or by connecting the fifth switch 4001 between the pixel electrode of the light-emitting element 117 and the node 132 as shown in FIG. 41, the erase period may be provided.

Needless to say, in the pixel in FIG. 1, by turning off the second switch 112 and interrupting the current path from the power supply line 122 to the light-emitting element 117, the erase period may be provided without providing another switch.

Figure 42:
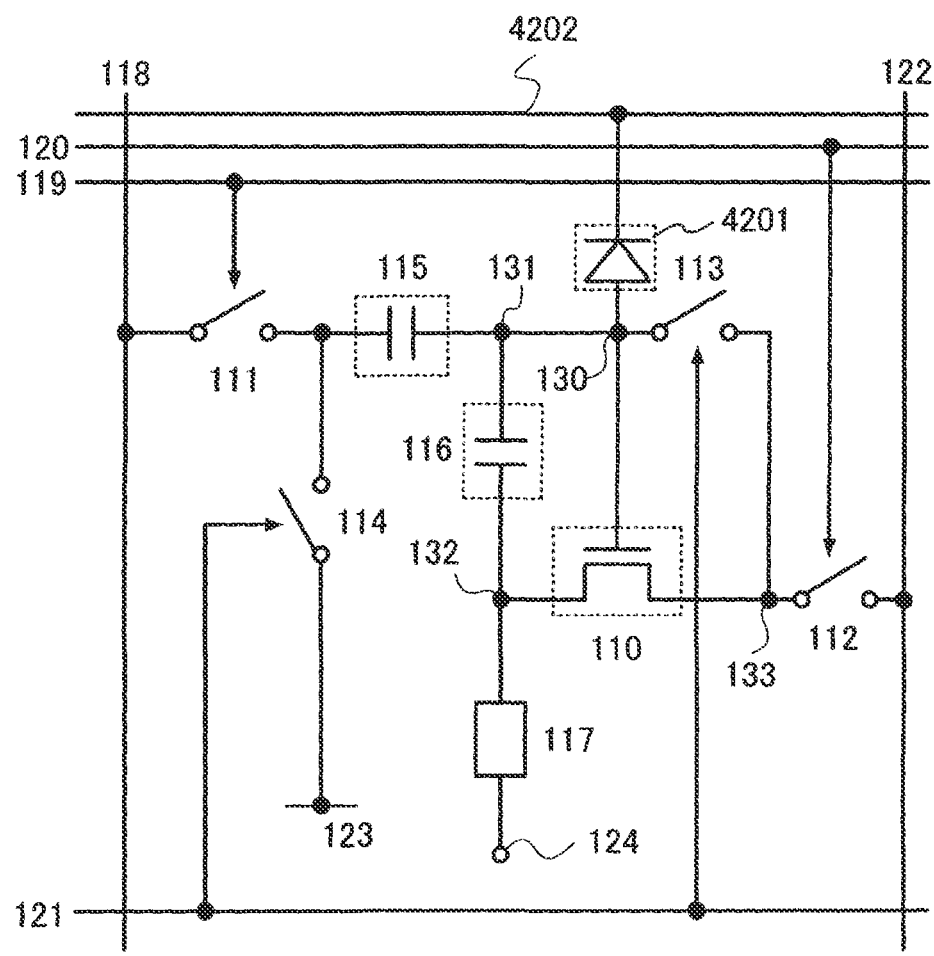
FIG. 42 is a diagram showing a pixel structure shown in Embodiment Mode 7.

By changing a potential of the gate electrode of the transistor 110, the erase period can be forcibly provided. One of such structures is shown in FIG. 42. In the structure of FIG. 42, a rectifier 4201 is included in addition to the pixel structure of FIG. 1, and the gate electrode of the transistor 110 and a fourth scan line 4202 are connected through the rectifier 4201. Note that when the transistor 110 is an N-channel transistor, the rectifier 4201 is connected so that current flows from the gate electrode of the transistor 110 to the fourth scan line 4202. An L-level signal is input to the fourth scan line 4202 only when the transistor 110 is forcibly turned off, and otherwise an H-level signal is input to the fourth scan line 4202. Current does not flow to the rectifier 4201 when the fourth scan line 4202 is at an H level, and current flows from the gate electrode of the transistor 110 to the fourth scan line 4202 when the fourth scan line 4202 is at an L level. The current flows to the fourth scan line 4202 in this manner, so that the gate-source voltage of the transistor 110 is lowered equal to or lower than the threshold voltage (Vth) and the transistor 110 is forcibly turned off. Note also that it is necessary to determine an L-level potential taking into consideration that the potential of the gate electrode of the transistor 110 is not equal to or lower than a potential in which the threshold voltage of the rectifier 4201 in a forward direction is added to the L-level potential.

Figure 9B:
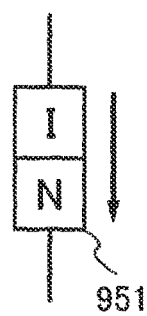
Figure 9C:
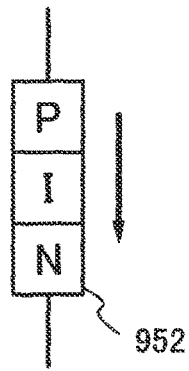
Figure 9D:
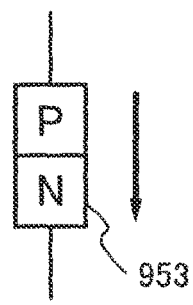
Figure 9E:
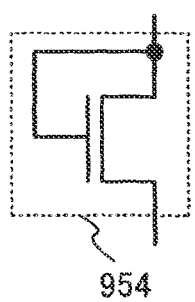
Figure 9F:
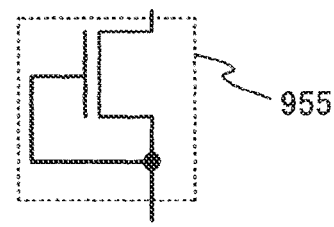

Note that as for the rectifier 4201, the diode-connected transistor in FIG. 9E, the diode-connected transistor in FIG. 9F, or the like can be used as well as the Schottky barrier diode in FIG. 9B, the PIN diode in FIG. 9C, the PN diode in FIG. 9D.

Note that the pixel structure is not particularly limited to the above-described structure as long as a means for forcibly making a non light-emitting state is included in the pixel structure because an afterimage can be hardly seen by black data insertion.

The switch or the like for providing the erase period shown in this embodiment mode is not only applied to the above-described pixel structure in FIG. 1 but also can be applied to any pixel structure shown in another embodiment mode.

Without providing such a switch, the initialization period can also function as the erase period by setting the initialization period to be long. Thus, moving image characteristics can also be improved by setting a length of a period in which black data is to be performed in order to make an afterimage be hardly seen to be equal to that of the initialization period when any of the pixels described in Embodiment Modes 1 to 6 is operated. Note that as described above, the erase period can be provided by turning off the second switch. Further, black data may be inserted by equalizing the potential of the power supply line 122 to the potential of the opposite electrode 124 in the light-emitting period.

Note that the pixel described in this embodiment mode can be applied to the display device described in Embodiment Mode 1. As described above, a display device with few variations in luminance and excellent moving image characteristics can be obtained.

Embodiment Mode 8

Figure 46:
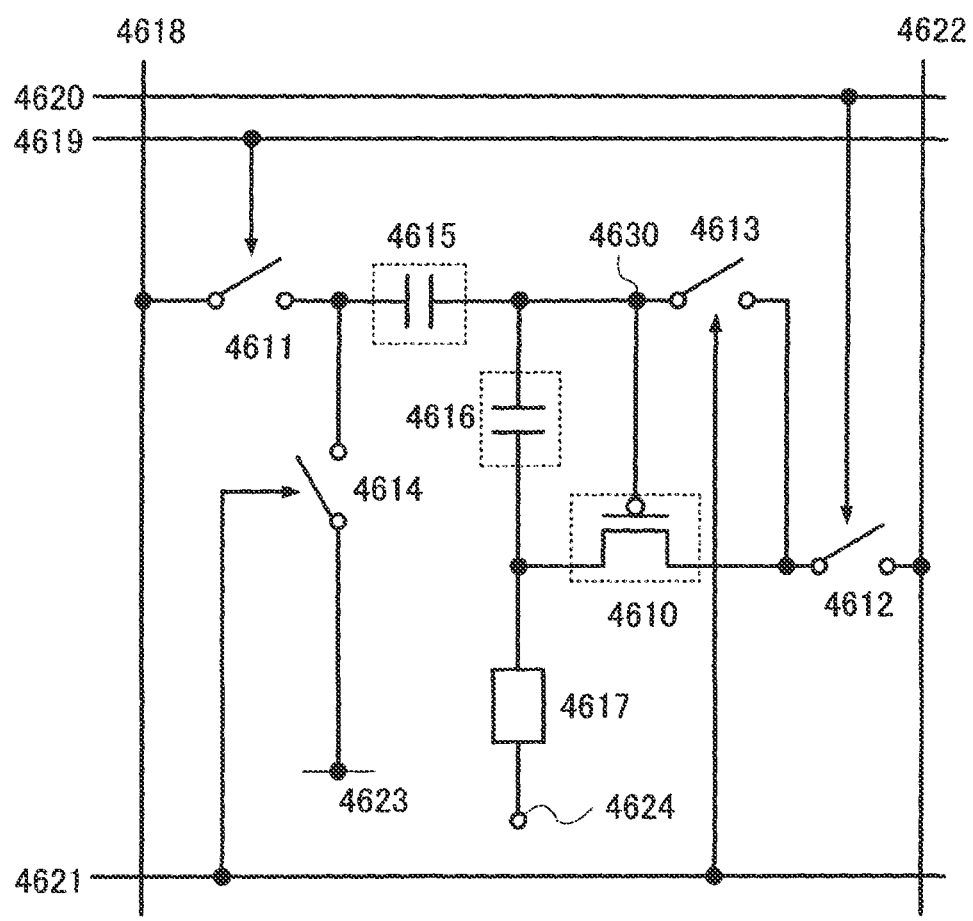
FIG. 46 is a diagram showing a pixel structure shown in Embodiment Mode 8.

In this embodiment mode, the case is described in which a P-channel transistor is used as a transistor which controls a current value supplied to a light-emitting element, with reference to FIG. 46.

The pixel shown in FIG. 46 includes a transistor 4610, a first switch 4611, a second switch 4612, a third switch 4613, a fourth switch 4614, a first capacitor 4615, a second capacitor 4616, and a light-emitting element 4617. Note that the pixel is connected to a signal line 4618, a first scan line 4619, a second scan line 4620, a third scan line 4621, a power supply line 4622, and a potential supply line 4623. In this embodiment mode, the transistor 4610 is a P-channel transistor, and is turned on when the absolute value of gate-source voltage (|Vgs|) thereof exceeds the threshold voltage (|Vth|) (i.e., when Vgs becomes lower than Vth). In addition, a pixel electrode of the light-emitting element 4617 functions as a cathode and an opposite electrode 4624 thereof functions as an anode. Note that the absolute value of the gate-source voltage of the transistor is described as |Vgs|; the absolute value of the threshold voltage of the transistor is described as |Vth|; voltage stored in the first capacitor 4615 is described as Vc1; and voltage stored in the second capacitor 4616 is described as Vc2. The power supply line 4622, the potential supply line 4623, and the signal line 4618 are also referred to as a first wiring, a second wiring, and a third wiring, respectively. Further, the first scan line 4619, the second scan line 4620, and the third scan line 4621 may also be referred to as a fourth wiring, a fifth wiring, and a sixth wiring, respectively.

A first electrode (one of a source electrode and a drain electrode) of the transistor 4610 is connected to the pixel electrode of the light-emitting element 4617; a second electrode (the other of the source electrode and the drain electrode) of the transistor 4610 is connected to the power supply line 4622 through the second switch 4612; and a gate electrode of the transistor 4610 is connected to the power supply line 4622 through the third switch 4613 and the second switch 4612. Note that the third switch 4613 is connected between the gate electrode of the transistor 4610 and the second switch 4612.

In addition, when a connection point of the gate electrode of the transistor 4610 and the third switch 4613 is denoted by a node 4630, the node 4630 is connected to the signal line 4618 through the first capacitor 4615 and the first switch 4611. That is, a first electrode of the first capacitor 4615 is connected to the signal line 4618 through the first switch 4611, and a second electrode of the first capacitor 4615 is connected to the gate electrode of the transistor 4610. The first electrode of the first capacitor 4615 is also connected to the potential supply line 4623 through the fourth switch 4614. The node 4630 is also connected to the first electrode of the transistor 4610 through the second capacitor 4616. That is, a first electrode of the second capacitor 4616 is connected to the gate electrode of the transistor 4610, and a second electrode of the second capacitor 4616 is connected to the first electrode of the transistor 4610. Such a capacitor may be formed by sandwiching an insulating film with a wiring, a semiconductor layer, or an electrode, or the second capacitor 4616 can be omitted by using gate capacitance of the transistor 4610 in some cases.

By inputting signals to the first scan line 4619, the second scan line 4620, and the third scan line 4621, on/off of the first switch 4611, the second switch 4612, the third switch 4613, and the fourth switch 4614 is controlled.

A signal in accordance with a gray scale level of the pixel which corresponds to a video signal, i.e., a potential in accordance with luminance data is input to the signal line 4818.

Next, operations of the pixel shown in FIG. 46 are described with reference to a timing chart in FIG. 47, and FIGS. 48A to 48D. Note that in FIG. 47, one frame period which corresponds to a period for displaying an image for one screen is divided into an initialization period, a threshold voltage writing period, a data writing period, and a light-emitting period. In addition, the initialization period, the threshold voltage (Vth) writing period, and the data writing period are collectively referred to as an address period. Although one frame period is not particularly limited, it is preferable that one frame period be 1/60 second or less so that a person viewing an image does not perceive a flicker.

Note that a potential of V1 (V1 corresponds to a given number) Is Input to the opposite electrode 4624 of the light-emitting element 4617. In addition, when a potential difference which is at least necessary for the light-emitting element 4617 to emit light is denoted by $V_{EL}$, a potential of $V1-V_{EL}-|Vth|-\alpha$ ($\alpha$ corresponds to a given positive number) is input to the power supply line 4622. That is, the potential of the power supply line 4622 may be any potential as long as it is equal to or lower than $V1-V_{EL}-|Vth|-\alpha$. Although a potential of the potential supply line 4623 is not particularly limited, the potential of the potential supply line 4623 is preferably in a range of a potential input to a panel where the pixel is formed. Thus, it is not necessary to separately form a power source. Note that here, the potential of the potential supply line 4623 is at V2.

Figure 48A:
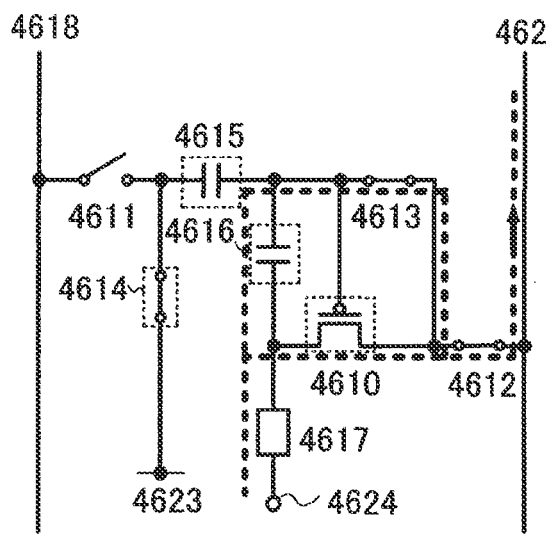
FIGS. 48A to 48D are diagrams each showing an operation of the pixel shown in FIG. 46.

First, in the initialization period shown in period A of FIG. 47 and FIG. 48A, the first switch 4611 is turned off and the second switch 4612, the third switch 4613, and the fourth switch 4614 are turned on. At this time, the transistor 4610 is conductive, V1−V$_{EL}$−|Vth|−α−V2 is held in the first capacitor 4615, and |Vth|+α is held in the second capacitor 4616. Note that in the initialization period, it is only necessary that predetermined voltage be held in the first capacitor 4615 and voltage having the absolute value which is at least higher than |Vth| be held in the second capacitor 4616.

Figure 48B:
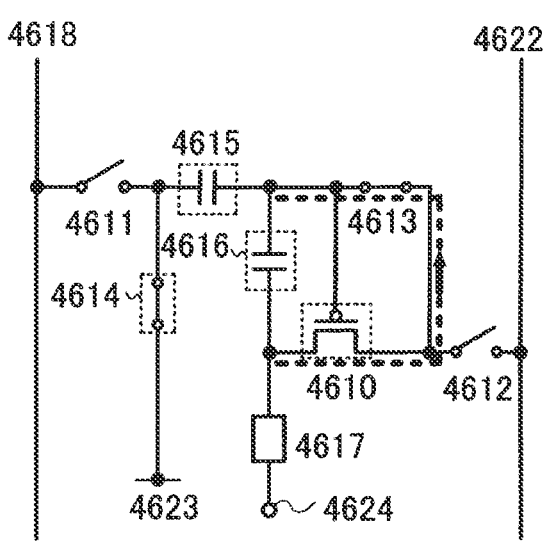

In the threshold voltage writing period shown in period B of FIGS. 47 and 48B, the second switch 4612 is turned off. Therefore, a potential of the gate electrode of the transistor 4610 rises gradually, and the transistor 4610 is turned off when gate-source voltage Vgs of the transistor 4610 reaches the threshold voltage |Vth|. Accordingly, the voltage Vc2 which is held in the second capacitor 4616 is at approximately |Vth|.

Figure 48C:
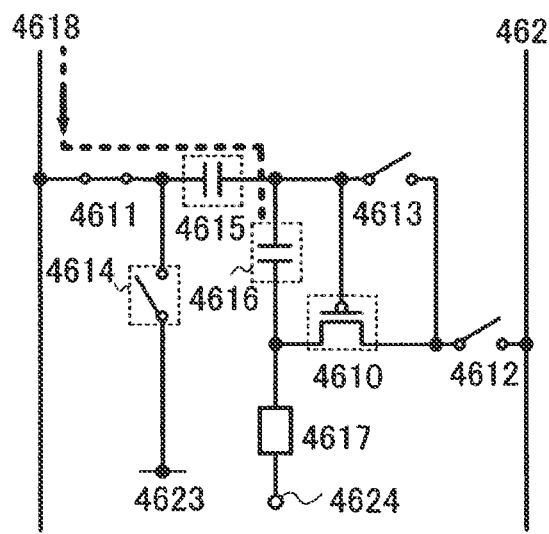

In the following data writing period shown in period C of FIGS. 47 and 48C, the first switch 4611 is turned on after the third switch 4613 and the fourth switch 4614 are turned off, and a potential in accordance with luminance data (V2−Vdata) is input from the signal line 4618. At this time, the voltage Vc2 which is held in the second capacitor 4616 can be represented by Formula 4 from C3>>C1, C2 when electrostatic capacitance of the first capacitor 4615 is denoted by C1, electrostatic capacitance of the second capacitor 4616 is denoted by C2, and electrostatic capacitance of the light-emitting element 4617 is denoted by C3.

[Formula 4]

$$Vc2 = \left| -|Vth| - Vdata \times \frac{C1}{C1+C2} \right| \qquad (4)$$

Note that although C1 and C2 are necessary when a potential supplied from the signal line 4618 is determined, a relation therebetween is not particularly limited. Note that when C1>C2 is satisfied, power consumption can be reduced because amplitude of Vdata in accordance with changes in luminance can be reduced. On the other hand, when C2>C1 is satisfied, a change in Vc2 due to on/off of a surrounding switch or off-current can be suppressed. By these opposite advantageous effects, it is preferable that C1 and C2 be equal and a size of the first capacitor 4615 be the same as that of the second capacitor 4616.

Note that when the light-emitting element 4617 is controlled not to emit light in the following light-emitting period, it is only necessary to input a potential of Vdata≤0.

Figure 48D:
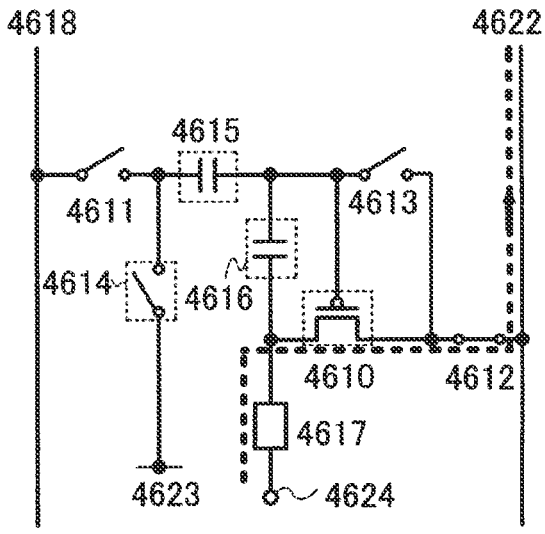

Next, in the light-emitting period shown in period D of FIG. 47 and FIG. 48D, the second switch 4612 is turned on after the first switch 4611 is turned off. At this time, the gate-source voltage of the transistor 4610 is Vgs=−|Vth|−Vdata×(C1/(C1+C2)), and current in accordance with luminance data flows to the transistor 4610 and the light-emitting element 4617, so that the light-emitting element 4617 emits light. Needless to say, as for the potential in accordance with luminance data input from the signal line 4618, it is necessary that Vdata be determined taking into consideration that the gate-source voltage of the transistor 4610 is at Vgs=−|Vth|−Vdata×(C1/(C1+C2)).

Note that current I flowing to the light-emitting element 4617 is represented by Formula 5 In the case of operating the transistor 4610 in a saturation region.

[Formula 5]

$$I = \frac{1}{2}\left(\frac{W}{L}\right)\mu Cox(Vgs - Vth)^2 \qquad (5)$$

$$= \frac{1}{2}\left(\frac{W}{L}\right)\mu Cox\left(-|Vth| - Vdata \times \frac{C1}{C1+C2} - Vth\right)^2$$

Since the transistor 4610 is a P-channel transistor, Vth<0 is satisfied. Therefore, Formula 5 can be transformed to Formula 6.

[Formula 6]

$$I = \frac{1}{2}\left(\frac{W}{L}\right)\mu Cox\left(-Vdata \times \frac{C1}{C1+C2}\right)^2 \qquad (6)$$

In addition, in the case of operating the transistor 4610 in a linear region, the current I flowing to the light-emitting element 4617 is represented by Formula 7.

[Formula 7]

$$I = \left(\frac{W}{L}\right)\mu Cox\left[(Vgs - Vth)Vds - \frac{1}{2}Vds^2\right] \qquad (7)$$

$$= \left(\frac{W}{L}\right)\mu Cox\left[\left(-|Vth| - Vdata \times \frac{C1}{C1+C2} - Vth\right)Vds - \frac{1}{2}Vds^2\right]$$

Since Vth<0 is satisfied, Formula 7 can be transformed to Formula 8.

[Formula 8]

$$I = \left(\frac{W}{L}\right)\mu Cox\left[\left(-Vdata \times \frac{C1}{C1+C2}\right)Vds - \frac{1}{2}Vds^2\right] \qquad (8)$$

Here, W corresponds to a channel width of the transistor 4610; L corresponds to a channel length of the transistor 4610; μ corresponds to mobility of the transistor 4610; and Cox corresponds to storage capacitance of the transistor 4610.

According to Formula 6 and Formula 8, the current flowing to the light-emitting element 4617 does not depend on the threshold voltage (Vth) of the transistor 4610 in each of the case where the transistor 4610 is operated in the saturation region and the case where the transistor 4610 is operated in the linear region. Therefore, variations of a current value caused by variations in the threshold voltage of the transistor 4610 are suppressed, so that the current in accordance with luminance data can be supplied to the light-emitting element 4617.

As described above, variations in luminance caused by variations in the threshold voltage of the transistor 4610 can be suppressed. In addition, since the potential of the opposite electrode 4624 is fixed at a constant potential, power consumption can be reduced.

Further, in the case of operating the transistor 4610 in the saturation region, variations in luminance caused by deterioration of the light-emitting element 4617 can also be reduced. When the light-emitting element 4617 deteriorates, $V_{EL}$ of the light-emitting element 4617 is increased and a potential of the first electrode, i.e., the source electrode of the transistor 4610 decreases. At this time, the source electrode of the transistor 4610 is connected to the second electrode of the second capacitor 4616, and the gate electrode of the transistor 4610 is connected to the first electrode of the second capacitor 4616 and is in a floating state. Therefore, in accordance with a decrease in the source potential, a gate potential of the transistor 4610 decreases by the same level. Accordingly, since Vgs of the transistor 4610 does not change, current flowing to the transistor 4610 and the light-emitting element 4617 is not affected even if the light-emitting element 4617 deteriorates. Note that it can be seen in Formula 6 that the current I flowing to the light-emitting element 4617 does not depend on the source potential or a drain potential.

Therefore, in the case of operating the transistor 4610 in the saturation region, variations in the current flowing to the transistor 4610 caused by variations in the threshold voltage of the transistor 4610 and deterioration of the light-emitting element 4617 can be suppressed.

Note that in the case of operating the transistor 4610 in the saturation region, the channel length L of the transistor 4610 is preferably long in order to suppress increase in the amount of current caused by a breakdown or channel length modulation.

Figure 49:
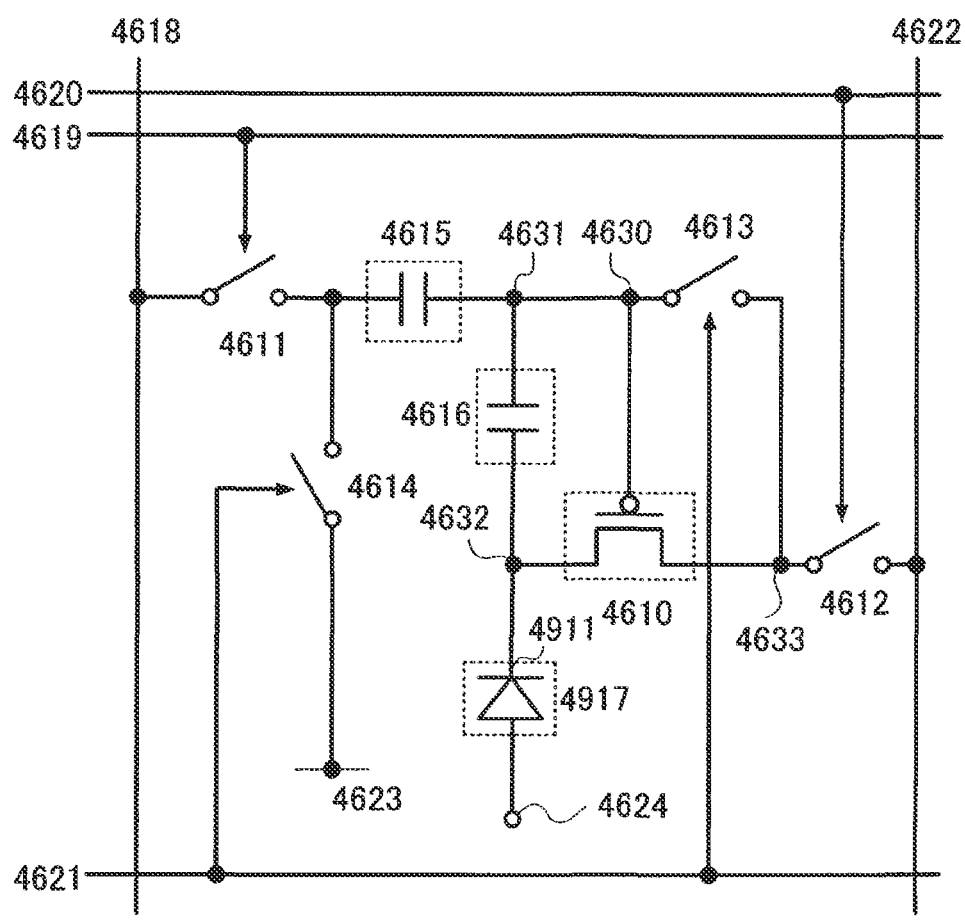
FIG. 49 is a diagram showing a pixel structure shown in Embodiment Mode 8.

Note that since variations of the current value caused by variations in the threshold voltage of the transistor can be suppressed as described above, a supply destination of current controlled by the transistor is not particularly limited. Therefore, an EL element (an organic EL element, an inorganic EL element, or an EL element including both an organic material and an inorganic material) can be typically used for the light-emitting element 4617 shown in FIG. 46. Alternatively, an electron emitter, a liquid crystal element, electronic ink, or the like can be used instead of the light-emitting element 4617. FIG. 49 shows an example where an EL element 4917 is used for the light-emitting element 4617. Note also that FIG. 49 shows the case where current flows from opposite electrode 4624 to a pixel electrode 4911.

Note that it is only necessary for the transistor 4610 to have a function for controlling a current value supplied to the light-emitting element 4617, and a type of the transistor 4610 is not limited. Therefore, a thin film transistor (a TFT) using a crystalline semiconductor film, a thin film transistor using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be used.

The first switch 4611 selects timing for inputting a potential in accordance with luminance data, i.e., a signal to the pixel from the signal line 4618, and mainly changes voltage held in the first capacitor 4615 and voltage held in the second capacitor 4616, i.e., gate-source voltage of the transistor 4610. The second switch 4612 selects timing for supplying a predetermined potential to the second electrode of the transistor 4610. Note that the predetermined potential is also supplied to the second electrode of the first capacitor 4615 and the first electrode of the second capacitor 4616 in some cases. The third switch 4613 controls a connection between the gate electrode and the second electrode of the transistor 4610. The fourth switch 4614 selects timing for holding predetermined voltage in the first capacitor 4615 every frame period, and controls whether to supply a predetermined potential to the first electrode of the first capacitor 4615. Therefore, the first switch 4611, the second switch 4612, the third switch 4613, and the fourth switch 4614 are not particularly limited as long as they have above-described functions. For example, each of the first switch 4611, the second switch 4612, the third switch 4613, and the fourth switch 4614 may be a transistor, a diode, or a logic circuit combining them. Note that the first switch 4611, the second switch 4612, and the fourth switch 4614 are not particularly needed as long as a signal or a potential can be supplied to the pixel at the above-described timing. Further, the third switch 4613 is not particularly needed as long as the above-described function can be achieved.

Note that polarity (a conductivity type) of each transistor is not particularly limited. However, a transistor of polarity with smaller off-current is preferably used. A transistor provided with an LDD region, a transistor with a multi-gate structure, or the like is given as an example of a transistor with smaller off-current. In addition, a CMOS switch may be used by using both N-channel and P-channel transistors.

For example, in the case where P-channel transistors are used as the first switch 4611, the second switch 4612, the third switch 4613, and the fourth switch 4614, L-level signals are input to scan lines which control on/off of respective switches in order to turn on the switches, and H-level signals are input to the scan lines in order to turn off the switches. Further, since the pixel can be formed by using only P-channel transistors, a manufacturing process can be simplified.

In addition, the pixel shown in this embodiment mode can be applied to the display device in FIG. 7. Similarly to Embodiment Mode 1, unless the data writing periods in the rows overlap, an initialization start period can be freely set in each row. Further, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

In addition, since the threshold voltage writing period can also be set long, the threshold voltage of a transistor which controls a current value flowing to the light-emitting element can be written in the capacitor more accurately. Therefore, reliability as a display device can be improved.

Note that this embodiment mode can be freely combined with any pixel structure shown in another embodiment mode. For example, a rectifier may be used for the fourth switch 4614 similarly to Embodiment Mode 2, or another wiring may be substituted for the potential supply line 4623 as in Embodiment Modes 3 and 4. In addition, the transistor 4610 can have any structure of the transistors shown in Embodiment Modes 5 and 6. Further, the structures and the operations shown in Embodiment Mode 7 can be used. The present invention is not limited to them, and the transistor 4610 described in this embodiment mode can be applied to any pixel shown in another embodiment mode.

Figure 50:
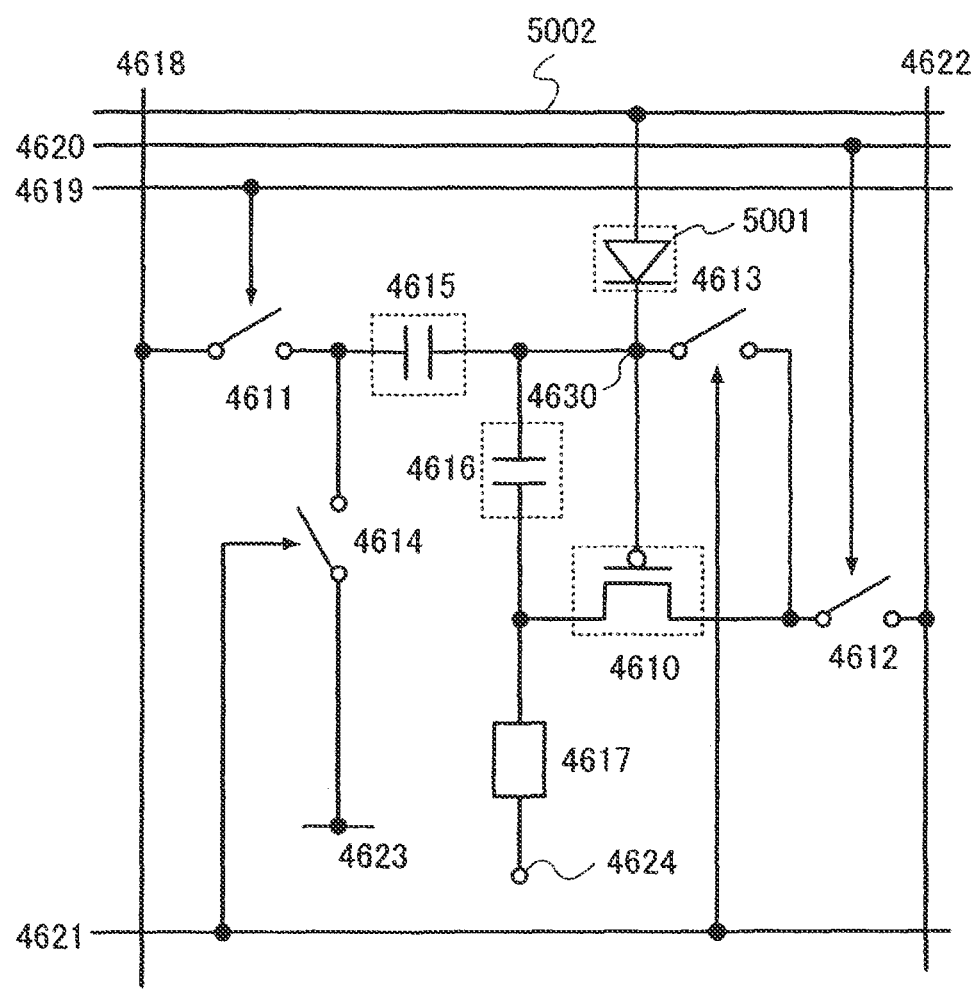
FIG. 50 is a diagram showing a pixel structure shown in Embodiment Mode 8.

Note that it is necessary that direction of current flowing to the rectifier be varied depending on polarity of a transistor which controls current flowing to the light-emitting element. For example, the case in which the rectifier is used in order to provide the erase period is described with reference to FIG. 50.

When the transistor 4610 is a P-channel transistor, a rectifier 5001 is connected so that current flows from a fourth scan line 5002 to the node 4630. An H-level signal is input to the fourth scan line 5002 only when the transistor 4610 is forcibly turned off, and otherwise an L-level signal is input to the fourth scan line 5002. Current does not flow to the rectifier 5001 when the fourth scan line 5002 is at an L level, and current flows from the fourth scan line 5002 to the node 4630 when the fourth scan line 5002 is at an H level. The current flows to the node 4630 in this manner, so that a gate potential of the transistor 4610 is raised to set the gate-source voltage of the transistor 4610 to be equal to or lower than the threshold voltage (|Vth|) and the transistor 4610 is forcibly turned off. By performing such operations, an afterimage is hardly seen by black data insertion and moving image characteristics can be improved.

Embodiment Mode 9

In this embodiment mode, one mode of a partial sectional view of the pixel of the present invention is described with reference to FIG. 17. Note that a transistor shown in the partial sectional view in this embodiment mode is a transistor having a function of controlling a current value supplied to a light-emitting element.

First, a base film 1712 is formed over a substrate 1711 having an insulating surface. As the substrate 1711 having the insulating surface, an insulating substrate such as a glass substrate, a quartz substrate, a plastic substrate (e.g., polyimide, acryl, polyethylene terephthalate, polycarbonate, polyarylate, or polyethersulfone), or a ceramic substrate; or a metal substrate (e.g., tantalum, tungsten, or molybdenum), a semiconductor substrate, or the like on a surface of which an insulating film is formed, can be used. Note that it is necessary to use a substrate which can resist at least heat generated during processes.

The base film 1712 is formed of a single layer or a plurality of layers including two or more layers of an insulating film such as a silicon oxide film, a silicon nitride film, or a silicon oxynitride ($SiO_xN_y$) film. Note that the base film 1712 may be formed by sputtering, CVD, or the like. Although the base film 1712 is a single layer in this embodiment mode, it is needless to say that the base film 1712 may be a plurality of layers including two or more layers.

Next, a transistor 1713 is formed over the base film 1712. The transistor 1713 at least includes a semiconductor layer 1714, a gate insulating film 1715 formed over the semiconductor layer 1714, and a gate electrode 1716 formed over the semiconductor layer 1714 with the gate insulating film 1715 interposed therebetween. The semiconductor layer 1714 includes a source region and a drain region.

The semiconductor layer 1714 can be formed of a film having an amorphous semiconductor including silicon, silicon germanium (SiGe), or the like as a main component as well as amorphous silicon (a-Si:H), a semi-amorphous semiconductor in which an amorphous state and a crystalline state are mixed, or a microcrystalline semiconductor in which crystal grains of 0.5 nm to 20 nm can be observed in an amorphous semiconductor, or a crystalline semiconductor film of polysilicon (p-Si:H) or the like. Note that a microcrystalline state in which crystal grains of 0.5 nm to 20 nm can be observed is referred to as a microcrystal. For example, when an amorphous semiconductor film is used for the semiconductor layer 1714, it may be formed by sputtering, CVD, or the like. When a crystalline semiconductor film is used for the semiconductor layer 1714, it may be formed by, for example, forming an amorphous semiconductor film and then crystallizing it. If necessary, in order to control the threshold voltage of the transistor, a slight amount of an impurity element (e.g., phosphorus, arsenic, or boron) may be included in the semiconductor layer 1714 in addition to the above main component.

Next, the gate insulating film 1715 is formed so as to cover the semiconductor layer 1714. The gate insulating film 1715 is formed of a single layer or a plurality of layers using, for example, silicon oxide, silicon nitride, silicon nitride oxide, or the like. CVD, sputtering, or the like can be used as a film formation method of the gate insulating film 1715.

Subsequently, the gate electrode 1716 is formed above the semiconductor layer 1714 with the gate insulating film 1715 interposed therebetween. The gate electrode 1716 may be formed of a single layer or may be formed by stacking a plurality of metal films. Note that the gate electrode can be formed of a metal element selected from tantalum (Ta), tungsten (W), titanium (Ti), molybdenum (Mo), aluminum (Al), copper (Cu), chromium (Cr), or niobium (Nb), or an alloy or a compound material including the element as a main component. For example, the gate electrode may be formed of a first conductive film using tantalum nitride and a second conductive film using tungsten (W).

Next, an impurity which imparts n-type or p-type conductivity is selectively added to the semiconductor layer 171/1 by using the gate electrode 1716 or a resist which is formed into a desired shape as a mask. In this manner, a channel formation region and an impurity region (including a source region, a drain region, a GOLD region, and an LDD region) are formed in the semiconductor layer 1714. In addition, the transistor 1713 can be formed as either an N-channel transistor or a P-channel transistor depending on the conductivity type of the impurity element to be added.

Figure 17:
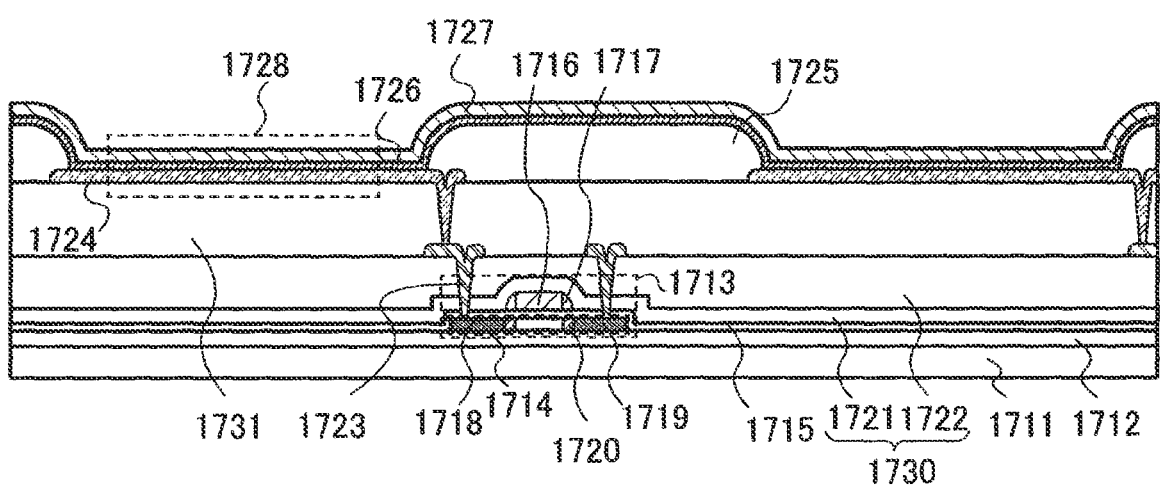
FIG. 17 is a partial sectional view showing a pixel shown in Embodiment Mode 9.

Note that in order to form an LDD region 1720 in a self-aligned manner in FIG. 17, a silicon compound, such as a silicon oxide film, a silicon nitride film, or a silicon oxynitride film is formed so as to cover the gate electrode 1716, and then is etched back to form a sidewall 1717. After that, an impurity which imparts conductivity is added to the semiconductor layer 1714, so that the source region 1718, the drain region 1719, and the LDD region 1720 can be formed. Therefore, the LDD region 1720 is located below the sidewall 1717. Note that since the sidewall 1717 which is provided to form the LDD region 1720 in a self-aligned manner, it is not necessarily provided. Note that phosphorus, arsenic, boron, or the like is used as the impurity which imparts conductivity.

Next, a first interlayer insulating film 1730 is formed by stacking a first insulating film 1721 and a second insulating film 1722 so as to cover the gate electrode 1716. As each of the first insulating film 1721 and the second insulating film 1722, an inorganic insulating film such as a silicon oxide film, a silicon nitride film, or a silicon oxynitride ($SiO_xN_y$) film, or an organic resin film (a photosensitive or non-photosensitive organic resin film) with a low dielectric constant can be used. Alternatively, a film including siloxane may be used. Note that siloxane is a material in which a skeleton structure is formed by a bond of silicon (Si) and oxygen (O), and an organic group (e.g., an alkyl group or aromatic hydrocarbon) is used as a substituent. Alternatively, a fluoro group may also be included as the substituent.

Note that insulating films formed of the same material may be used as the first insulating film 1721 and the second insulating film 1722. In this embodiment mode, although the first interlayer insulating film 1730 has a stacked-layer structure of two layers, it may be a single layer or have a stacked-layer structure of three or more layers.

Note that the first insulating film 1721 and the second insulating film 1722 may be formed by sputtering, CVD, spin coating, or the like, and may be formed by coating when an organic resin film or a film including siloxane is used.

After that, source and drain electrodes 1723 are formed over the first interlayer insulating film 1730. Note that the source and drain electrodes 1723 are connected to the source region 1718 and the drain region 1719 respectively through contact holes.

Note that each of the source and drain electrodes 1723 can be formed of a metal such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), barium (Ba), or neodymium (Nd), an alloy thereof, metal nitride thereof, or a stacked-layer film thereof.

Next, a second interlayer insulating film 1731 is formed so as to cover the source and drain electrodes 1723. As the second interlayer insulating film 1731, an inorganic insulating film, a resin film, or a stacked layer thereof can be used. As the inorganic insulating film, a silicon nitride film, a silicon oxide film, a silicon oxynitride film, or a stacked-layer film thereof can be used. For the resin film, polyimide, polyamide, acryl, polyimide amide, epoxy, or the like can be used.

A pixel electrode 1724 is formed over the second interlayer insulating film 1731. Next, an insulator 1725 is formed so as to cover an end of the pixel electrode 1724. The insulator 1725 is preferably formed to have a curved surface with curvature at an upper end or a lower end thereof in order to favorably form a layer 1726 including a light-emitting substance later. For example, when positive photosensitive acryl is used as a material of the insulator 1725, the insulator 1725 is preferably formed to have a curved surface with a curvature radius (0.2 µm to 3 µm) only at the upper end thereof. Both a negative photosensitive material which becomes insoluble in an etchant by light irradiation and a positive photosensitive material which becomes soluble in an etchant by light irradiation can be used for the insulator 1725. Further, an inorganic material such as silicon oxide or silicon oxynitride can be used as a material of the insulator 1725 as well as an organic material.

Next, the layer 1726 including a light-emitting substance and an opposite electrode 1727 are formed over the pixel electrode 1724 and the insulator 1725.

Note that a light-emitting element 1728 is formed in a region where the layer 1726 including a light-emitting substance is sandwiched between the pixel electrode 1724 and the opposite electrode 1727.

Figure 18A:
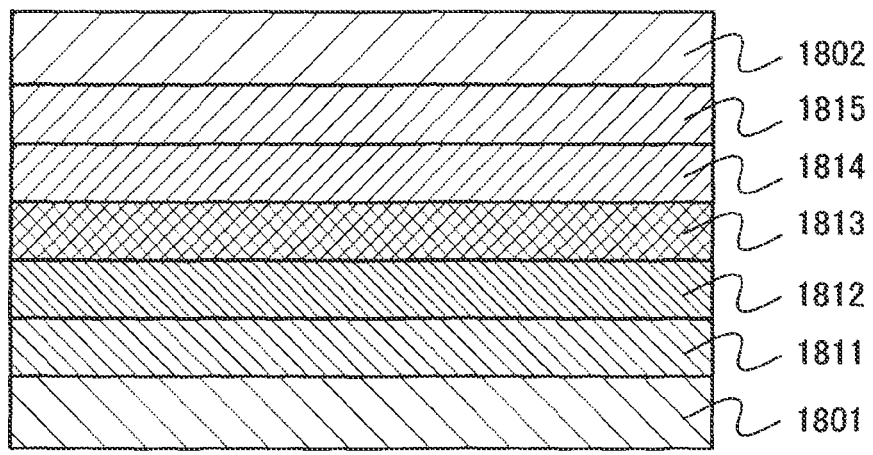
FIGS. 18A and 18B are views each showing a light-emitting element shown in Embodiment Mode 9.

Next, detail of the light-emitting element 1728 is described with reference to FIGS. 18A and 18B. Note that the pixel electrode 1724 and the opposite electrode 1727 in FIG. 17 correspond to a pixel electrode 1801 and an opposite electrode 1802 in FIGS. 18A and 18B, respectively. In FIG. 18A, the pixel electrode corresponds to an anode and the opposite electrode corresponds to a cathode.

As shown in FIG. 18A, a hole injection layer 1811, a hole transport layer 1812, 30, an electron transport layer 1814, an electron injection layer 1815, and the like are provided in addition to a light-emitting layer 1813 between the pixel electrode 1801 and the opposite electrode 1802. These layers are stacked so that holes are injected from a pixel electrode 1801 side and electrons are injected from an opposite electrode 1802 side when voltage is applied such that a potential of the pixel electrode 1801 is higher than that of the opposite electrode 1802.

In such a light-emitting element, the holes injected from the pixel electrode 1801 and the electrons injected from the opposite electrode 1802 are recombined in the light-emitting layer 1813 to excite the light-emitting substance. Then, light emission occurs when the excited light-emitting substance returns to a ground state. Note that any substance which can provide luminescence (electroluminescence) can be used as the light-emitting substance.

There is no particular limitation on the substance forming the light-emitting layer 1813, and the light-emitting layer may be formed of only a light-emitting substance. However, when concentration quenching occurs, the light-emitting layer is preferably a layer in which a light-emitting substance is mixed so as to be dispersed into a layer of a substance (a host material) having a larger energy gap than the light-emitting substance, thereby preventing concentration quenching of the light-emitting substance. Note that the energy gap refers to an energy difference between the lowest unoccupied molecular orbital (LUMO) level and the highest occupied molecular orbital (HOMO) level.

In addition, there is no particular limitation on the light-emitting substance, and any substance which can emit light with a desired emission wavelength may be used. For example, in order to obtain red light emission, a substance which exhibits light emission having a peak of an emission spectrum at 600 nm to 680 nm can be used, such as 4-dicyanomethylene-2-isopropyl-6-[2-(1,1,7,7-tetramethyl-julolidine-9-yl)ethenyl]-4H-pyran (abbr.: DCJTI), 4-dicyano-methylene-2-methyl-6-[2-(1,1,7,7-tetramethyljulolidine-9-yl)ethenyl]-4H-pyran (abbr.: DOT), 4-dicyanomethylene-2-tert-butyl-6-[2-(1,1,7,7-tetramethyljulolidine-9-yl) ethenyl]-4H-pyran (abbr.: DCJTB), periflanthene, or 2,5-dicyano-1,4-bis[2-(10-methoxy-1,1,7,7-tetramethyljulolidine-9-yl)ethenyl]benzene. In order to obtain green light emission, a substance which exhibits light emission having a peak of an emission spectrum at 500 nm to 550 nm can be used, such as N,N'-dimethylquinacridon (abbr.: DMQd), coumarin 6, coumarin 545T, tris(8-quinolinolato)aluminum (abbr.: Alq), or N,N'-diphenylquinacridon (DPQd). In order to obtain blue light emission, a substance which exhibits light emission having a peak of an emission spectrum at 420 nm to 500 nm can be used, such as 9,10-bis(2-naphthyl)-tert-butylanthracene (abbr.: t-BuDNA), 9,9'-bianthryl, 9,10-diphenylanthracene (abbr.: DPA), 9,10-bis(2-naphthyl)anthracene (abbr.: DNA), bis(2-methyl-8-quinolinolato)-4-phenylphenolato-gallium (abbr.: BGaq), or bis(2-methyl-8-quinolinolato)-4-phenylphenolato-aluminum (abbr.: BAlq).

There is also no particular limitation on the substance which is used for dispersing the light-emitting substance, and for example, an anthracene derivative such as 9,10-di (2-naphthyl)-2-tert-butylanthracene (abbr.: t-BuDNA), a carbazole derivative such as 4,4'-bis(N-carbazolyl)biphenyl (abbr.: CBP), a metal complex such as bis[2-(2-hydroxyphenyl)pyridinato]zinc (abbr.: $Znpp_2$) or bis[2-(2-hydroxyphenyl)benzoxazolato]zinc (abbr.: ZnBOX), or the like can be used.

Although an anode material forming the pixel electrode 1801 is not particularly limited, it is preferable to use a metal, an alloy, an electrically conductive compound, a mixture thereof, or the like having a high work function (a work function of 4.0 eV or higher). As a specific example of such an anode material, oxide of a metal material such as indium tin oxide (abbr.: ITO), ITO including silicon oxide (abbr.: ITSO), or indium zinc oxide (abbr.: IZO) formed by using a target in which indium oxide is mixed with zinc oxide (ZnO) at 2 wt % to 20 wt % can be given. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be given.

On the other hand, as a substance forming the opposite electrode 1802, a metal, an alloy, a conductive compound, a mixture thereof, or the like having a low work function (a work function of 3.8 eV or less) can be used. As a specific example of such a cathode material, an element belonging to Group 1 or 2 of the periodic table, that is, an alkali metal such as lithium (Li) or cesium (Cs), an alkaline earth metal such as magnesium (Mg), calcium (Ca), or strontium (Sr), or an alloy including them (Mg:Ag, Al:Li) can be given. In addition, by providing a layer having excellent electron injection properties between the opposite electrode 1802 and the light-emitting layer 1813 so as to be stacked with the opposite electrode, various conductive materials including the materials described as the material of the pixel electrode 1801 such as Al, Ag, ITO, or ITO including silicon oxide can be used for the opposite electrode 1802 regardless of the value of the work function. Further, a similar effect can be obtained by using a material particularly having an excellent electron injecting function for forming the electron injection layer 1815 described later.

Note that in order to extract light emission to outside, it is preferable that one or both of the pixel electrode 1801 and the opposite electrode 1802 be a light-transmitting electrode formed of ITO or the like or an electrode formed with a thickness of several to several tens nm so as to be able to transmit visible light.

The hole transport layer 1812 is provided between the pixel electrode 1801 and the light-emitting layer 1813 as shown in FIG. 18A. The hole transport layer is a layer having a function of transporting holes injected from the pixel electrode 1801 to the light-emitting layer 1813. By providing the hole transport layer 1812 to separate the pixel electrode 1801 and the light-emitting layer 1813 from each other as described above, light emission can be prevented from being quenched due to metal.

Note that the hole transport layer 1812 is preferably formed using a substance having high hole transport properties, and in particular, a substance having a hole mobility of $1\times10^4$ cm$^2$/Vs or more is preferably used. Note that the substance having high hole transport properties refers to a substance having a higher mobility of holes than electrons. As specific examples of a substance capable of forming the hole transport layer 1812, there are 4,4'-bis[N-(1-naphthyl)-N-phenylamino]biphenyl (abbr.: NPB), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 4,4'-bis{N-[4-(N,N-di-m-tolylamino)phenyl]-N-phenylamino}biphenyl (abbr.: DNTPD), 1,3,5-tris[N,N-di(m-tolyl)amino]benzene (abbr.: m-MTDAB), 4,4',4"-tris(N-carbazolyl)triphenylamine (abbr.: TCTA), phthalocyanine (abbr.: H$_2$Pc), copper phthalocyanine (abbr.: CuPc), vanadyl phthalocyanine (abbr.: VOPc), and the like. In addition, the hole transport layer 1812 may be a layer having a multi-layer structure which is formed by combining two or more layers formed of any of the above-described substances.

Further, the electron transport layer 1814 may be provided between the opposite electrode 1802 and the light-emitting layer 1813 as shown in FIG. 18A. Here, the electron transport layer is a layer having a function of transporting electrons injected from the opposite electrode 1802 to the light-emitting layer 1813. By providing the electron transport layer 1814 to separate the opposite electrode 1802 and the light-emitting layer 1813 from each other as described above, light emission can be prevented from being quenched due to metal of the electrode material.

There is no particular limitation on the material of the electron transport layer 1814, and the electron transport layer 1814 can be formed using a metal complex having a quinoline skeleton or a benzoquinoline skeleton such as tris(8-quinolinolato)aluminum (abbr.: Alq), tris(4-methyl-8-quinolinolato)aluminum (abbr.: Almq$_3$), bis(10-hydroxybenzo[h]-quinolinato)beryllium (abbr.: BeBq$_2$), or bis(2-methyl-8-quinolinolato)-4-phenylphenolato-aluminum (abbr.: BAlq), or the like. Further, the electron transport layer 1814 may also be formed using a metal complex having an oxazole ligand or a thiazole ligand such as bis[2-(2-hydroxyphenyl)-benzoxazolato]zinc (abbr.: Zn(BOX)$_2$) or bis[2-(2-hydroxyphenyl)-benzothiazolato]zinc (abbr.: Zn(BTZ)$_2$), or the like. Further alternatively, the electron transport layer 1814 may be formed using 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl] benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like. The electron transport layer 1814 is preferably formed using a substance having a higher mobility of electrons than holes as described above. In addition, the electron transport layer 1814 is preferably formed using a substance having an electron mobility of $1\times10^{-6}$ cm$^2$/Vs or more. Note that the electron transport layer 1814 may have a multi-layer structure which is formed by combining two or more layers formed of any of the above-described substances.

Further, the hole injection layer 1811 may be provided between the pixel electrode 1801 and the hole transport layer 1812 as shown in FIG. 18A. Here, the hole injection layer refers to a layer having a function of promoting hole injection from the electrode functioning as the anode to the hole transport layer 1812.

There is no particular limitation on the material of the hole injection layer 1811, and the hole injection layer 1811 can be formed using metal oxide such as molybdenum oxide, vanadium oxide, ruthenium oxide, tungsten oxide, or manganese oxide. Further, the hole injection layer 1811 can also be formed using a phthalocyanine-based compound such as phthalocyanine (abbr.: H$_2$Pc) or copper phthalocyanine (CuPc), an aromatic amine-based compound such as 4,4-bis(N-(4-(N,N-di-m-tolylamino)phenyl)-N-phenylamino)biphenyl (abbr.: DNTPD), a high molecule such as a polyethylene dioxythiophene/polystyrene sulfonate aqueous solution (PEDOT/PSS), or the like.

Further, a mixture of the above-described metal oxide and a substance having high hole transport properties may be provided between the pixel electrode 1801 and the hole transport layer 1812. Such a layer does not cause a rise in driving voltage even when it is thickened; therefore, optical design using a micro cavity effect or a light interference effect can be conducted by adjusting the thickness of the layer. Therefore, a high-quality light-emitting element with excellent color purity and few changes in color that are dependent on viewing angles can be manufactured. In addition, the film thickness of such a layer can be controlled so as to prevent short circuit between the pixel electrode 1801 and the opposite electrode 1802 that would occur due to irregularities generated at the film formation on the surface of the pixel electrode 1801 or due to minute residues remaining on the electrode surface.

Further, the electron injection layer 1815 may be provided between the opposite electrode 1802 and the electron transport layer 1814 as shown in FIG. 18A. Here, the electron injection layer is a layer having a function of promoting electron injection from the electrode functioning as the cathode to the electron transport layer 1814. Note that when the electron transport layer is not particularly provided, electron injection to the light-emitting layer may be helped by providing the electron injection layer between the electrode functioning as the cathode and the light-emitting layer.

There is no particular limitation on the material of the electron injection layer 1815, and the electron injection layer 1815 can be formed using a compound of alkali metal or alkaline earth metal, such as lithium fluoride (LiF), cesium fluoride (CsF), or calcium fluoride ($CaF_2$). Further, the electron injection layer 1815 can also be formed using a mixture of a substance having high electron transport properties such as Alq or 4,4-bis(5-methylbenzoxazol-2-yl)stilbene (HzOs), and alkali metal or alkaline earth metal such as magnesium or lithium.

Note that each of the hole injection layer 1811, the hole transport layer 1812, the light-emitting layer 1813, the electron transport layer 1814, and the electron injection layer 1815 may be formed by any of an evaporation method, an ink-jet method, a coating method, and the like. In addition, each of the pixel electrode 1801 and the opposite electrode 1802 may be formed by any of a sputtering method, an evaporation method, and the like.

Figure 18B:
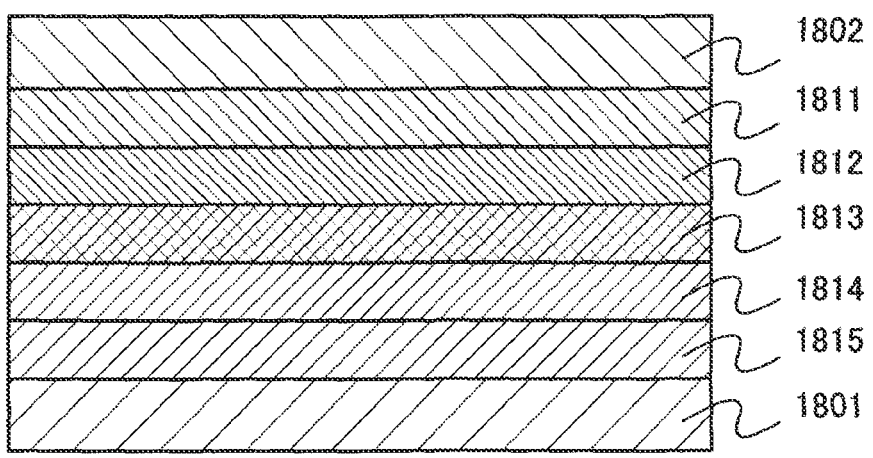

The layer structure of the light-emitting element is not limited to the one shown in FIG. 18A; the light-emitting element may be formed sequentially from an electrode functioning as a cathode as shown in FIG. 18B. That is, the pixel electrode 1801 may be formed as a cathode, and then the electron injection layer 1815, the electron transport layer 1814, the light-emitting layer 1813, the hole transport layer 1812, the hole injection layer 1811, and the opposite electrode 1802 may be stacked sequentially over the pixel electrode 1801. Note that the opposite electrode 1802 functions as an anode.

Although the light-emitting element having a single light-emitting layer is described here, the light-emitting element may include a plurality of light-emitting layers. By providing a plurality of light-emitting layers so that light emissions from the light-emitting layers are mixed, white light can be obtained. For example, in the case of a light-emitting element including two light-emitting layers, it is preferable to provide a spacing layer, or a layer which generates holes and a layer which generates electrons between a first light-emitting layer and a second light-emitting layer. By using this structure, the light emitted to outside is visually mixed and perceived as white light. Thus, white light can be obtained.

Light emission is extracted to outside through one or both of the pixel electrode 1724 and the opposite electrode 1727 in FIG. 17. Therefore, one or both of the pixel electrode 1724 and the opposite electrode 1727 is/are formed of a light-transmitting substance.

Figure 19A:
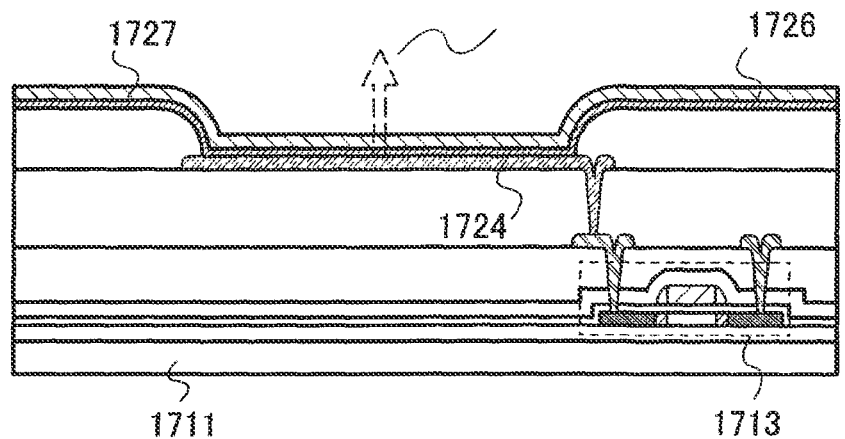
FIGS. 19A to 19C are views each showing an extraction direction of light shown in Embodiment Mode 9.
Figure 19B:
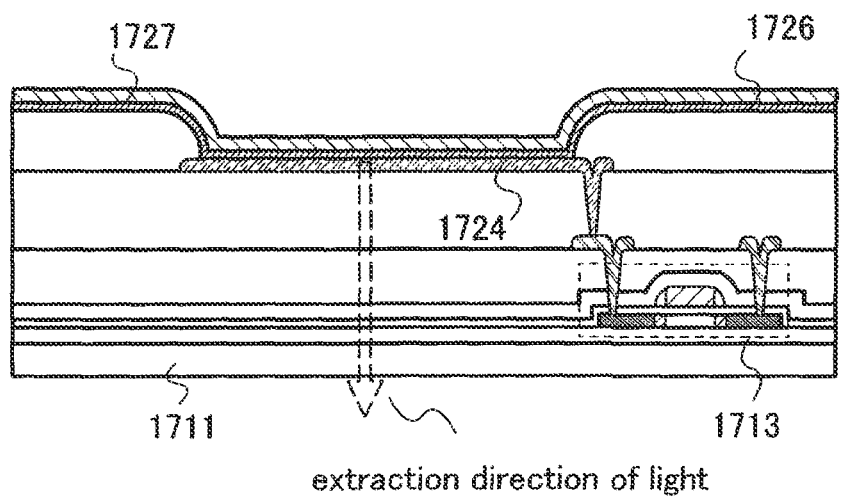
Figure 19C:
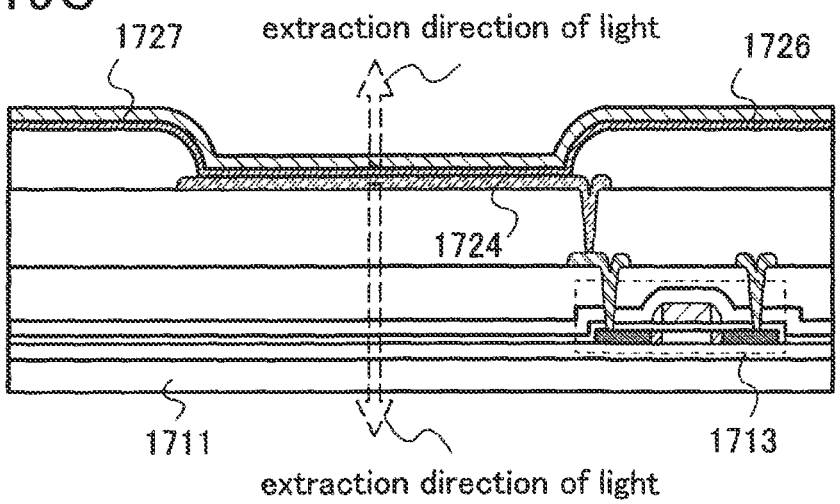

When only the opposite electrode 1727 is formed of a light-transmitting substance, light emission is extracted from a side opposite to the substrate through the opposite electrode 1727 as shown in FIG. 19A. When only the pixel electrode 1724 is formed of a light-transmitting substance, light emission is extracted from the substrate side through the pixel electrode 1724 as shown in FIG. 19B. When both of the pixel electrode 1724 and the opposite electrode 1727 are formed of light-transmitting substances, light emission is extracted from both of the substrate side and the opposite side thereof through the pixel electrode 1724 and the opposite electrode 1727 as shown in FIG. 19C.

The material of each wiring or electrode is not limited to the above-described materials, and one element or a plurality of elements selected from a group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), and tin (Sn), a compound or an alloy material including one element or a plurality of elements selected from the above ones (e.g., indium tin oxide (ITO), indium zinc oxide (IZO), ITO including silicon oxide (ITSO), zinc oxide (ZnO), aluminum-neodymium (Al—Nd), or magnesium-silver (Mg—Ag)), a substance combining any of the above-described compounds, or the like can be used. Further, a compound of silicon and any of the above-described elements (silicide) (e.g., aluminum silicon, molybdenum silicon, or nickel silicide) or a compound of nitrogen (e.g., titanium nitride, tantalum nitride, or molybdenum nitride) can also be used. Note that silicon (Si) may include an N-type impurity (e.g., phosphorus) or a P-type impurity (e.g., boron) at a high concentration. By including the impurity, the conductivity is improved, so that silicon can be utilized as a wiring or an electrode more easily. Note that any of single crystalline silicon, polycrystalline silicon (polysilicon), and amorphous silicon can be used as silicon. Resistance can be reduced in the case of using single crystalline silicon or polycrystalline silicon, and it becomes possible to manufacture through a simple manufacturing process in the case of using amorphous silicon.

Further, in the case of using aluminum or silver, signal delay can be reduced because of its high conductivity. In addition, since it is easy to be etched, patterning can be easily performed and microfabrication can be performed. Further, also in the case of using copper, signal delay can be reduced because of its high conductivity. In the case of using molybdenum, a problem such as a material defect does not occur in the manufacturing process even if molybdenum is in contact with an oxide semiconductor such as ITO or IZO, or silicon. In addition, patterning or etching can be performed easily and heat resistance is high, which is preferable. In the case of using titanium also, a problem such as a material defect does not occur in the manufacturing process even if titanium is in contact with an oxide semiconductor such as ITO or IZO or silicon, and heat resistance is high, which is preferable. Further, tungsten or neodymium is also preferable because of its high heat resistance. Note that when neodymium is combined with aluminum to be an alloy, heat resistance is improved and a hillock of aluminum can be suppressed. Further, silicon can be formed at the same time as a semiconductor layer included in a transistor, and has high heat resistance. Further, indium tin oxide (ITO), indium zinc oxide (IZO), ITO including silicon oxide (ITSO), zinc oxide (ZnO), or silicon (Si) each having light-transmitting properties is particularly preferable when it is used for a portion though which light is transmitted, and for example, it can be used for a pixel electrode or a common electrode.

Note that the wiring or the electrode is not limited to have a single-layer structure formed by using any of the above-described materials, and may have a multi-layer structure.

For example, in the case of using a single layer structure, the manufacturing process can be simplified and cost can be reduced. In the case of using a multi-layer structure, advantages of the materials can be utilized while disadvantages thereof can be decreased, thereby a wiring or an electrode which is superior in performance can be formed. For example, by using a structure in which a low resistance material (e.g., aluminum) is included in part of the multi-layer structure, resistance of the wiring can be reduced. Further, by using a structure in which a high heat resistance material is included in the multi-layer structure (e.g., a stacked-layer structure in which a low heat resistance material having an advantage is sandwiched using a high heat resistance material), high heat resistance can be obtained and the advantage which is not utilized in a single layer can be utilized. Therefore, for example, it is preferable to use a wiring or an electrode having a structure in which a layer including aluminum is sandwiched using a layer including molybdenum or titanium.

Note that when a wiring or an electrode has a portion which is directly in contact with a wiring or an electrode formed of another material, they may have an adverse effect on each other. For example, one material is mixed into the other material to change properties of both the materials, thereby, for example, an original purpose cannot be achieved or a problem occurs at the time of manufacturing so that normal manufacturing cannot be performed. In this case, such a problem can be solved by sandwiching or covering one layer by another layer. For example, when indium tin oxide (ITO) and aluminum are in contact with each other, titanium or molybdenum is preferably sandwiched therebetween. Similarly, also when silicon and aluminum are made to be in contact with each other, titanium or molybdenum is preferably sandwiched therebetween.

Next, a transistor having a staggered structure using an amorphous semiconductor film for a semiconductor layer of the transistor 1713 is described. Partial sectional views of a pixel are shown in FIGS. 20A and 20B. Note that in each of FIGS. 20A and 20B, in addition to a transistor having a staggered structure, a capacitor included in a pixel is described.

As shown in FIGS. 20A and 20B, a base film 2012 is formed over a substrate 2011. Further, a pixel electrode 2013 is formed over the base film 2012. In addition, a first electrode 2014 is formed of the same material in the same layer as the pixel electrode 2013.

Further, a wiring 2015 and a wiring 2016 are formed over the base film 2012, and an end of the pixel electrode 2013 is covered with the wiring 2015. An N-type semiconductor layer 2017 and an N-type semiconductor layer 2018 each having N-type conductivity are formed over the wiring 2015 and the wiring 2016. In addition, a semiconductor layer 2019 is formed over the base film 2012 between the wiring 2015 and the wiring 2016. Part of the semiconductor layer 2019 is extended so as to overlap with the N-type semiconductor layer 2017 and the N-type semiconductor layer 2018. Note that this semiconductor layer is formed of an amorphous semiconductor such as amorphous silicon (a-Si:H). Note that a semi-amorphous semiconductor, a microcrystalline semiconductor, or the like may be used without limiting to an amorphous semiconductor. In addition, a gate insulating film 2020 is formed over the semiconductor layer 2019. An insulating film 2021 formed of the same material in the same layer as the gate insulating film 2020 is also formed over the first electrode 2014.

Furthermore, a gate electrode 2022 is formed over the gate insulating film 2020; thus, a transistor 2025 is formed.

In addition, a second electrode 2023 formed of the same material in the same layer as the gate electrode 2022 is formed over the first electrode 2014 with the insulating film 2021 interposed therebetween, and a capacitor 2024 is formed in which the insulating film 2021 is sandwiched between the first electrode 2014 and the second electrode 2023. An interlayer insulating film 2026 is formed so as to cover the end of the pixel electrode 2013, the transistor 2025, and the capacitor 2024.

A layer 2027 including a light-emitting substance and an opposite electrode 2028 are formed over the interlayer insulating film 2026 and the pixel electrode 2013 located in an opening of the interlayer insulating film 2026, and a light-emitting element 2029 is formed in a region where the layer 2027 including a light-emitting substance is sandwiched between the pixel electrode 2013 and the opposite electrode 2028.

The first electrode 2014 shown in FIG. 20A may be formed of the same material in the same layer as the wirings 2015 and 2016 as shown in FIG. 20B, and a capacitor 2031 may be formed in which the insulating film 2021 is sandwiched between a first electrode 2030 and the second electrode 2023. Although an N-channel transistor is used as the transistor 2025 in FIGS. 20A and 20B, a P-channel transistor may also be used.

Materials of the substrate 2011, the base film 2012, the pixel electrode 2013, the gate insulating film 2020, the gate electrode 2022, the interlayer insulating film 2026, the layer 2027 including a light-emitting substance, and the opposite electrode 2028 may be similar to those of the substrate 1711, the base film 1712, the pixel electrode 1724, the gate insulating film 1715, the gate electrode 1716, the interlayer insulating films 1730 and 1731, the layer 1726 including a light-emitting substance, and the opposite electrode 1727 shown in FIG. 17, respectively. The wirings 2015 and 2016 may be formed by using a material similar to those of the source and drain electrodes 1723 in FIG. 17.

Next, as another structure of a transistor using an amorphous semiconductor film as a semiconductor layer, FIGS. 21A and 21B are partial sectional views of a pixel having a transistor with a structure in which a gate electrode is sandwiched between a substrate and a semiconductor layer, i.e., a bottom-gate transistor of which a gate electrode is located below a semiconductor layer.

A base film 2112 is formed over a substrate 2111. A gate electrode 2113 is formed over the base film 2112. In addition, a first electrode 2114 is formed of the same material in the same layer as the gate electrode 2113. As a material of the gate electrode 2113, polycrystalline silicon to which phosphorus is added or suicide which is a compound of metal and silicon may be used as well as the material used for the gate electrode 1716 shown in FIG. 17.

A gate insulating film 2115 is formed so as to cover the gate electrode 2113 and the first electrode 2114.

A semiconductor layer 2116 is formed over the gate insulating film 2115. A semiconductor layer 2117 formed of the same material in the same layer as the semiconductor layer 2116 is formed over the first electrode 2114. Note that this semiconductor layer is formed of an amorphous semiconductor such as amorphous silicon (a-Si:H). Alternatively, a semi-amorphous semiconductor, a microcrystalline semiconductor, or the like may be used without limiting to this.

An N-type semiconductor layer 2118 and an N-type semiconductor layer 2119 having N-type conductivity are formed over the semiconductor layer 2116, and an N-type semiconductor layer 2120 is formed over the semiconductor layer 2117.

A wiring 2121 and a wiring 2122 are formed over the N-type semiconductor layer 2118 and the N-type semiconductor layer 2119; thus a transistor 2129 is formed. A conductive layer 2123 formed of the same material in the same layer as the wiring 2121 and the wiring 2122 is formed over the N-type semiconductor layer 2120, and a second electrode includes the conductive layer 2123, the N-type semiconductor layer 2120, and the semiconductor layer 2117. Note that a capacitor 2130 is formed with a structure in which the gate insulating film 2115 is sandwiched between the second electrode and the first electrode 2114.

One end of the wiring 2121 is extended, and a pixel electrode 2124 is formed in contact with the top portion of the extended wiring 2121.

An insulator 2125 is formed so as to cover an end of the pixel electrode 2124, the transistor 2129, and the capacitor 2130.

A layer 2126 including a light-emitting substance and an opposite electrode 2127 are formed over the pixel electrode 2124 and the insulator 2125, and a light-emitting element 2128 is formed in a region where the layer 2126 including a light-emitting substance is sandwiched between the pixel electrode 2124 and the opposite electrode 2127.

The semiconductor layer 2117 and the N-type semiconductor layer 2120 which serve as part of the second electrode of the capacitor 2130 do not particularly need to be provided. In other words, a capacitor may be formed with a structure in which the conductive layer 2123 is used as the second electrode and the gate insulating film 2115 is sandwiched between the first electrode 2114 and the conductive layer 2123.

Although an N-channel transistor is used as the transistor 2129, a P-channel transistor may also be used.

Note that by forming the pixel electrode 2124 before the wiring 2121 is formed in FIG. 21A, a capacitor 2132 having a structure in which the gate insulating film 2115 is sandwiched between the first electrode 2114 and a second electrode 2131 formed of the same material in the same layer as the pixel electrode 2124 may be formed as shown in FIG. 21B.

Although the description is made on a channel-etch type inversely staggered transistor, needless to say, a channel protective type transistor may also be formed. Next, the case of a channel protective type transistor is described with reference to FIGS. 22A and 22B. Note that portions which are similar to FIGS. 21A and 21B are denoted by common reference numerals in FIGS. 22A and 22B.

A channel protective type transistor 2201 shown in FIG. 22A is different from the channel-etch type transistor 2129 shown in FIG. 21A in that an insulator 2202 serving as an etching mask is provided over a region for forming a channel in the semiconductor layer 2116.

Similarly, the channel protective type transistor 2201 shown in FIG. 22B is different from the channel-etch type transistor 2129 shown in FIG. 21B in that the insulator 2202 serving as an etching mask is provided over a region for forming a channel in the semiconductor layer 2116.

Manufacturing cost can be reduced by using an amorphous semiconductor film for a semiconductor layer of a transistor included in the pixel of the present invention. Note that the materials described with reference to FIG. 17 can be used as respective materials.

Further, structures of a transistor and a capacitor are not limited to those described above, and transistors and capacitors having various structures can be used.

Further, a crystalline semiconductor film of polysilicon (p-Si:H) or the like may also be used for a semiconductor layer of a transistor, as well as a semiconductor film of an amorphous semiconductor such as amorphous silicon (a-Si: H), a semi-amorphous semiconductor, a microcrystalline semiconductor, or the like.

Figure 23:
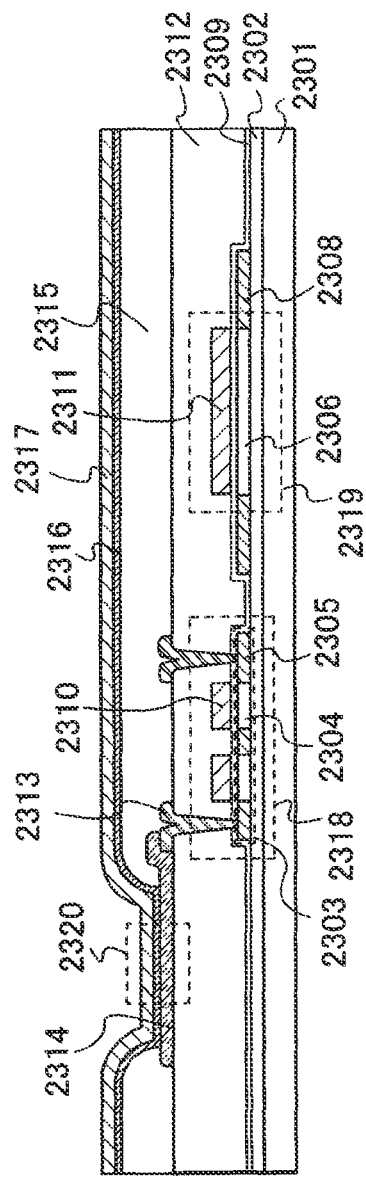
FIG. 23 is a partial sectional view showing a pixel shown in Embodiment Mode 9.

FIG. 23 is a partial sectional view of a pixel including a transistor using a crystalline semiconductor film for a semiconductor layer, and is described below. Note that a transistor 2318 shown in FIG. 23 is the multi-gate transistor shown in FIG. 29.

As shown in FIG. 23, a base film 2302 is formed over a substrate 2301, and a semiconductor layer 2303 is formed thereover. Note that the semiconductor layer 2303 is formed by patterning a crystalline semiconductor film into a desired shape.

An example of a manufacturing method of the crystalline semiconductor film is described below. First, an amorphous silicon film is formed over the substrate 2301 by sputtering, CVD, or the like. Then, the formed amorphous silicon film is crystallized using a thermal crystallization method, a laser crystallization method, a thermal crystallization method using a catalytic element such as nickel, or the like, so that a crystalline semiconductor film is obtained. Note that crystallization may also be performed by a combination of these crystallization methods.

A film to which crystallization is performed is not limited to an amorphous semiconductor film such as an amorphous silicon film, and a semiconductor film of a semi-amorphous semiconductor, a microcrystalline semiconductor, or the like may be used. Further, a compound semiconductor film having an amorphous structure such as an amorphous silicon germanium film may also be used.

In the case of forming the crystalline semiconductor film by a thermal crystallization method, a heating furnace, laser irradiation, RTA (Rapid Thermal Annealing), or a combination thereof can be used.

In the case of forming the crystalline semiconductor film by a laser crystallization method, a continuous wave laser beam (a CW laser beam) or a pulsed laser beam can be used. As a laser beam that can be used here, a laser beam emitted from one or more kinds of the following can be used: a gas laser such as an Ar laser, a Kr laser, or an excimer laser; a laser using, as a medium, single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. A crystal having a large grain diameter can be obtained by irradiation with the fundamental wave of the above laser beam or the second harmonic to the fourth harmonic of the laser beam. For example, the second harmonic (532 nm) or the third harmonic (355 nm) of a Nd:YVO$_4$ laser (the fundamental wave: 1064 nm) can be used. At this time, the energy density of the laser is required to be approximately 0.01 MW/cm$^2$ to 100 MW/cm$^2$ (preferably, 0.1 MW/cm$^2$ to 10 MW/cm$^2$). The scanning rate is set to approximately 10 cm/sec to 2000 cm/sec for irradiation.

Note that continuous wave oscillation can be performed with a laser using, as a medium, single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser. Further, it can be pulsed at a repetition rate of 10 MHz or more by performing Q-switch operation, mode locking, or the like. When the laser beam is pulsed at a repetition rate of 10 MHz or more, the semiconductor film is irradiated with the next pulsed laser after being melted by the preceding laser before being solidified. Therefore, unlike the case of using a pulsed laser having a low repetition rate, the interface between solid phase and liquid phase can be moved continuously in the semiconductor film, so that crystal grains grown continuously in the scanning direction can be obtained.

In the case of forming a crystalline semiconductor film by a thermal crystallization method using a catalytic element such as nickel, it is preferable to perform gettering treatment for removing the catalytic element such as nickel after the crystallization.

By the above-described crystallization, a crystallized region is formed partially in the amorphous semiconductor film. This partly crystallized crystalline semiconductor film is patterned into a desired shape, thereby forming an island-shaped semiconductor film. This semiconductor film is used for the semiconductor layer 2303 of the transistor.

The crystalline semiconductor layer is used for a channel formation region 2304 and an impurity region 2305 serving as a source region or a drain region of the transistor 2318 and also for a semiconductor layer 2306 and an impurity region 2308 serving as a lower electrode of a capacitor 2319. Note that the impurity region 2308 does not particularly need to be provided. Channel doping may be performed to the channel formation region 2304 and the semiconductor layer 2306.

Next, a gate insulating film 2309 is formed over the semiconductor layer 2303 and the lower electrode of the capacitor 2319. Further, a gate electrode 2310 is formed over the semiconductor layer 2303 with the gate insulating film 2309 interposed therebetween, and an upper electrode 2311 formed of the same material in the same layer as the gate electrode 2310 is formed over the semiconductor layer 2306 of the capacitor 2319 with the gate insulating film 2309 interposed therebetween. In this manner, the transistor 2318 and the capacitor 2319 are manufactured.

Next, an interlayer insulating film 2312 is formed so as to cover the transistor 2318 and the capacitor 2319, and a wiring 2313 is formed over the interlayer insulating film 2312 so as to be in contact with the impurity region 2305 through a contact hole. Then, a pixel electrode 2314 is formed in contact with the wiring 2313 over the interlayer insulating film 2312, and an insulator 2315 is formed so as to cover an end of the pixel electrode 2314 and the wiring 2313. Further, a layer 2316 including a light-emitting substance and an opposite electrode 2317 are formed over the pixel electrode 2314, and a light-emitting element 2320 is formed in a region where the layer 2316 including a light-emitting substance is sandwiched between the pixel electrode 2314 and the opposite electrode 2317.

Figure 24:
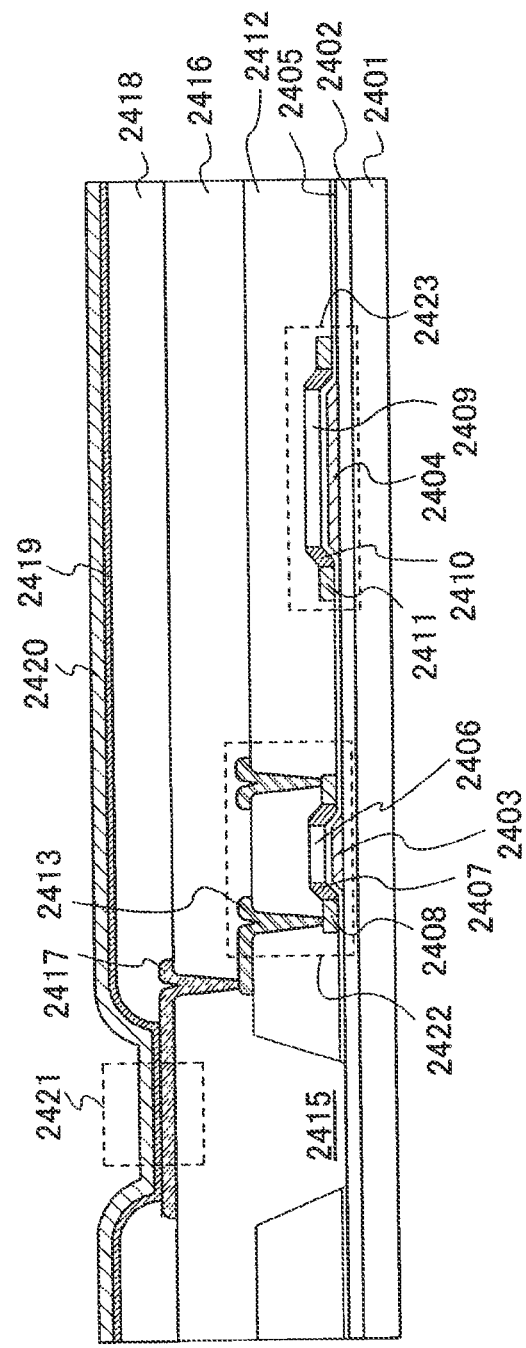
FIG. 24 is a partial sectional view showing a pixel shown in Embodiment Mode 9.

A partial cross section of a pixel including a bottom-gate transistor using a crystalline semiconductor film of polysilicon (p-Si:H) or the like for a semiconductor layer is shown in FIG. 24.

A base film 2402 is formed over a substrate 2401, and a gate electrode 2403 is formed thereover. In addition, a first electrode 2404 of a capacitor 2423 is formed of the same material in the same layer as the gate electrode 2403.

Note that a gate insulating film 2405 is formed so as to cover the gate electrode 2403 and the first electrode 2404.

A semiconductor layer is formed over the gate insulating film 2405. Note that the semiconductor layer is formed by crystallizing a semiconductor film of an amorphous semiconductor, a semi-amorphous semiconductor, a microcrystalline semiconductor, or the like by using a thermal crystallization method, a laser crystallization method, a thermal crystallization method using a catalytic element such as nickel, or the like and patterning into a desired shape.

Note that the channel formation region 2406, an LDD region 2407, and an impurity region 2408 serving as a source region or a drain region of a transistor 2422, and a region 2409, impurity regions 2410 and 2411 serving as a second electrode of the capacitor 2423 are formed using such a semiconductor layer. Note that the impurity regions 2410 and 2411 are not particularly required to be provided. In addition, an impurity may be added to the channel formation region 2406 and the region 2409.

Note that the capacitor 2423 has a structure in which the gate insulating film 2405 is sandwiched between the first electrode 2404 and the second electrode including the region 2409 and the like formed of the semiconductor layer.

Next, a first interlayer insulating film 2412 is formed so as to cover the semiconductor layer, and a wiring 2413 is formed over the first interlayer insulating film 2412 so as to be in contact with the impurity region 2408 through a contact hole.

An opening 2415 is formed in the first interlayer insulating film 2412. A second interlayer insulating film 2416 is formed so as to cover the transistor 2422, the capacitor 2423, and the opening 2415, and a pixel electrode 2417 is formed over the second interlayer insulating film 2416 so as to be connected to the wiring 2413 through a contact hole. In addition, an insulator 2418 is formed so as to cover an end of the pixel electrode 2417. Then, a layer 2419 including a light-emitting substance and an opposite electrode 2420 are formed over the pixel electrode 2417, and a light-emitting element 2421 is formed in a region where the layer 2419 including a light-emitting substance is sandwiched between the pixel electrode 2417 and the opposite electrode 2420. Note that the opening 2415 is located below the light-emitting element 2421. That is, since the first interlayer insulating film 2412 has the opening 2415, transmittance can be increased when light emission from the light-emitting element 2421 is extracted from the substrate side.

By using a crystalline semiconductor film for the semiconductor layer of the transistor included in the pixel of the present invention, the scan line driver circuit 712 and the signal line driver circuit 711 in FIG. 7 can be easily formed over the same substrate as the pixel portion 711, for example.

Note that the structure of the transistor using the crystalline semiconductor film for the semiconductor layer is also not limited to that described above, and various structures can be used. The same can be said for a capacitor. In this embodiment mode, the materials in FIG. 17 can be used as appropriate unless stated otherwise.

The transistor described in this embodiment mode can be used as the transistor of controlling a current value supplied to the light-emitting element in each pixel described in Embodiment Modes 1 to 8. Therefore, variations of the current value caused by variations in the threshold voltage of the transistor can be suppressed by operating the pixel as the described manner in any of Embodiment Modes 1 to 8. Accordingly, current in accordance with luminance data can be supplied to a light-emitting element, so that variations in luminance can be suppressed. In addition, since operation is performed with the potential of the opposite electrode fixed, power consumption can be reduced.

Further, by applying such a pixel to the display device shown in FIG. 7, since each pixel can emit light except in its address period, a ratio of a light-emitting period in one frame period (i.e., a duty ratio) can be extremely raised and can also be approximately 100%. Thus, a display device with few variations in luminance and a high duty ratio can be obtained.

In addition, since the threshold voltage writing period can be set long, the threshold voltage of the transistor of controlling a current value supplied to the light-emitting element can be written in the capacitor more accurately. Therefore, reliability as a display device can be improved.

Embodiment Mode 10

In this embodiment mode, an element having a structure which is different from the light-emitting element described in Embodiment Mode 9 is described.

A light-emitting element utilizing electroluminescence is distinguished by whether a light-emitting material is an organic compound or an inorganic compound. In general, the former is referred to as an organic EL element, and the latter is referred to as an inorganic EL element.

The inorganic EL element is classified into a dispersion type inorganic EL element and a thin-film type inorganic EL element, depending on its element structure. The former and the latter are different in that the former has a light-emitting layer where particles of a light-emitting material are dispersed in a binder whereas the latter has a light-emitting layer formed of a thin film of a light-emitting material. However, the former and the latter have in common that electrons accelerated by a high electric field are required. Note that as a mechanism of light emission that is obtained, there are donor-acceptor recombination type light emission that utilizes a donor level and an acceptor level, and localized type light emission that utilizes inner-shell electron transition of a metal ion. In general, in many cases, a dispersion type inorganic EL element has donor-acceptor recombination type light emission, and a thin-film type inorganic EL element has localized type light emission.

The light-emitting material used in this embodiment mode includes at least a host material and an impurity element to be a light-emission center (also referred to as a light-emitting substance). By changing an impurity element that is included, light emission of various colors can be obtained. As a manufacturing method of the light-emitting material, various methods such as a solid phase method and a liquid phase method (a coprecipitation method) can be used. Further, an evaporative decomposition method, a double decomposition method, a method by heat decomposition reaction of a precursor, a reversed micelle method, a method in which such a method is combined with high temperature baking, a liquid phase method such as a lyophilization method, or the like can also be used.

A solid phase method is a method in which a host material, and an impurity element or a compound including an impurity element are weighed, mixed in a mortar, heated in an electric furnace, and baked to be reacted, thereby including the impurity element in the host material. The baking temperature is preferably 700° C. to 1500° C. This is because the solid reaction does not progress when the temperature is too low, whereas the host material is decomposed when the temperature is too high. The baking may be performed in a powder state; however, it is preferable to perform the baking in a pellet state. Although the baking has to be performed at a comparatively high temperature, the solid phase method is easy; thus, the solid phase method is suitable for mass production with high productivity.

A liquid phase method (a coprecipitation method) is a method in which a host material or a compound including a host material is reacted with an impurity element or a compound including an impurity element in a solution, dried, and then baked. Particles of a light-emitting material are distributed uniformly, and the reaction can progress even when the grain size is small and the baking temperature is low.

As a host material used for a light-emitting material, hydrosulfide, oxide, or nitride can be used. As hydrosulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used. Further, zinc selenide (ZnSe), zinc telluride (ZnTe), or the like can also be used, and a ternary mixed crystal such as calcium sulfide-gallium ($CaGa_2S_4$), strontium sulfide-gallium ($SrGa_2S_4$), or barium sulfide-gallium ($BaGa_2S_4$) may also be used.

As a light-emission center of localized type light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as charge compensation.

On the other hand, as a light-emission center of donor-acceptor recombination type light emission, a light-emitting material including a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case of synthesizing the light-emitting material of donor-acceptor recombination type light emission by a solid phase method, a host material, the first impurity element or a compound including the first impurity element, and the second impurity element or a compound including the second impurity element are each measured, mixed in a mortar, heated in an electric furnace, and baked. As the host material, any of the above described host materials can be used. As the first impurity element or the compound including the first impurity element, for example, fluorine (F), chlorine (Cl), aluminum sulfide ($Al_2S_3$), or the like can be used. As the second impurity element or the compound including the second impurity element, for example, copper (Cu), silver (Ag), copper sulfide ($Cu_2S$), silver sulfide ($Ag_2S$), or the like can be used. The baking temperature is preferably 700° C. to 1500° C. This is because the solid reaction does not progress when the temperature is too low, whereas the host material is decomposed when the temperature is too high. Note that although the baking may be performed in a powder state, it is preferable to perform the baking in a pellet state.

As the impurity element in the case of utilizing solid reaction, the compound including the first impurity element and the second impurity element may be combined. In this case, since the impurity element is easily diffused and solid reaction progresses easily, a uniform light-emitting material can be obtained. Further, since an unnecessary impurity element does not enter, a light-emitting material having high purity can be obtained. As the compound including the first impurity element and the second impurity element, for example, copper chloride (CuCl), silver chloride (AgCl), or the like can be used.

Note that the concentration of these impurity elements may be 0.01 to 10 atom % with respect to the host material, and is preferably 0.05 to 5 atom %.

In the case of a thin-film type inorganic EL element, a light-emitting layer is a layer including the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transport low-pressure CVD method, an atomic layer epitaxy method (ALE), or the like.

Figure 51A:
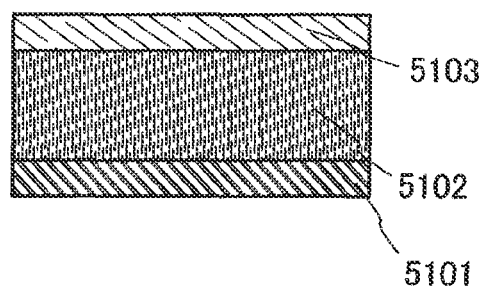
FIGS. 51A to 51C are views each showing a light-emitting element shown in Embodiment Mode 10.
Figure 51B:
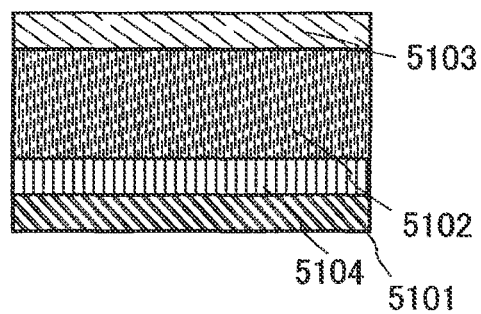
Figure 51C:
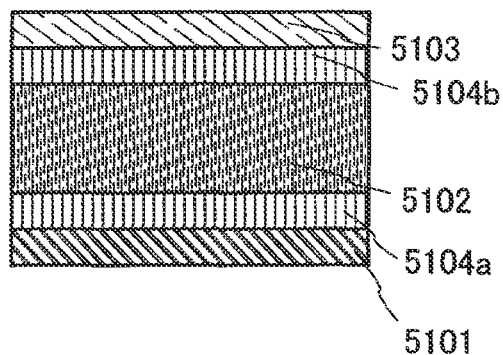

FIGS. 51A to 51C each show an example of a thin-film type inorganic EL element that can be used as a light-emitting element. In FIGS. 51A to 51C, each light-emitting element includes a first electrode 5101, a light-emitting layer 5102, and a second electrode 5103.

The light-emitting elements shown in FIGS. 51B and 51C each have a structure where an insulating layer is provided between the electrode and the light-emitting layer in the light-emitting element of FIG. 51A. The light-emitting element shown in FIG. 51B has an insulating layer 5104 between the first electrode 5101 and the light-emitting layer 5102. The light-emitting element shown in FIG. 51C includes an insulating layer 5104a between the first electrode 5101 and the light-emitting layer 5102, and an insulating layer 5104b between the second electrode 5103 and the light-emitting layer 5102. In this manner, the insulating layer may be provided between the light-emitting layer and one electrode of a pair of electrodes that sandwiches the light-emitting layer, or may be provided between the light-emitting layer and the first electrode and between the light-emitting layer and the second electrode. Moreover, the insulating layer may be a single layer or a stacked layer including a plurality of layers.

In addition, although the insulating layer 5104 is provided so as to be in contact with the first electrode 5101 in FIG. 51B, the insulating layer 5104 may be provided so as to be in contact with the second electrode 5103 by reversing the order of the insulating layer and the light-emitting layer.

In the case of a dispersion type inorganic EL element, a light-emitting layer film where particles of a light-emitting material are dispersed in a binder is formed. When particles with desired grain sizes cannot be obtained adequately by a manufacturing method of a light-emitting material, processing into a particle state may be performed by being crushed with a mortar or the like. The binder refers to a substance for fixing a light-emitting material in a particle state in a dispersed state to keep a shape as a light-emitting layer. The light-emitting material is uniformly dispersed and fixed in the light-emitting layer by the binder.

In the case of a dispersion type inorganic EL element, as a forming method of a light-emitting layer, a droplet-discharging method which can selectively form a light-emitting layer, a printing method (e.g., screen printing or offset printing), a coating method such as a spin coating method, a dipping method, a dispenser method, or the like can be used. There are no particular limitations on the film thickness of the light-emitting layer; however, a film thickness of 10 nm to 1000 nm is preferable. In addition, in the light-emitting layer including a light-emitting material and a binder, a ratio of the light-emitting material is preferably set to be equal to or more than 50 wt % and equal to or less than 80 wt %.

Figure 52A:
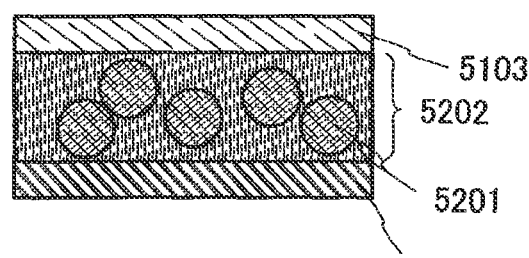
FIGS. 52A to 52C are views each showing a light-emitting element shown in Embodiment Mode 10.
Figure 52B:
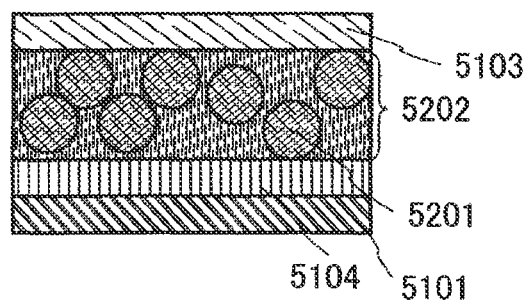
Figure 52C:
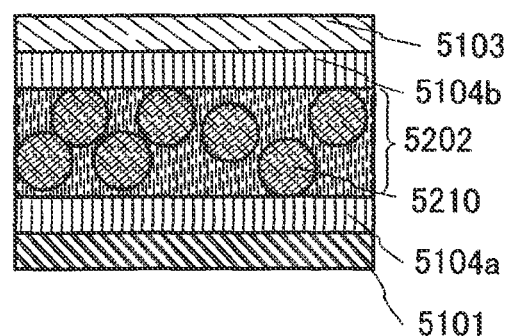
Figure 53A:
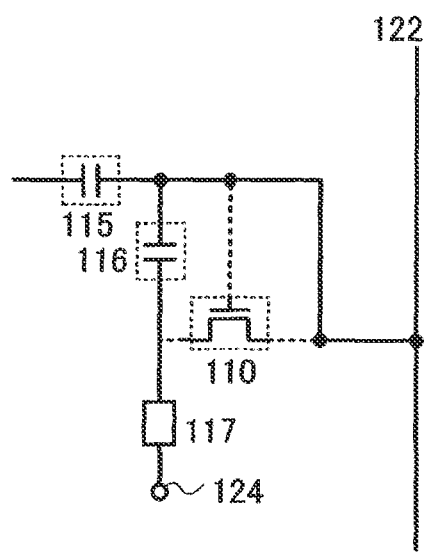
FIGS. 53A to 53D are diagrams each showing an operation of a pixel shown in Embodiment Mode 1.
Figure 53B:
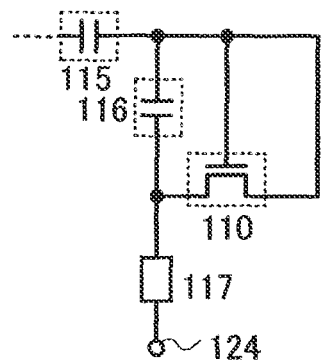
Figure 53C:
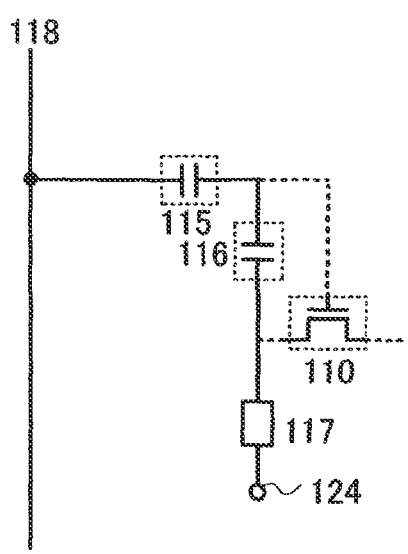
Figure 53D:
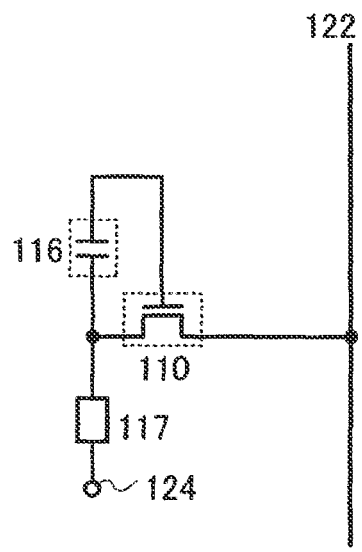

FIGS. 52A to 52C each show an example of a dispersion type inorganic EL element that can be used as a light-emitting element. In FIG. 52A, the light-emitting element has a stacked-layer structure of the first electrode 5101, a light-emitting layer 5202, and the second electrode 5103, where a light-emitting material 5201 held by a binder is included in the light-emitting layer 5202.

As the binder that can be used in this embodiment mode, an organic material or an inorganic material can be used, or a mixed material of an organic material and an inorganic material may also be used. As the organic material, a resin such as a polymer, polyethylene, polypropylene, a polystyrene-based resin, a silicone resin, an epoxy resin, or vinylidene fluoride having a comparatively high dielectric constant like a cyanoethyl cellulose-based resin can be used. In addition, a heat-resistant high molecule such as aromatic polyamide or polybenzimidazole, or a siloxane resin may be used. A siloxane resin corresponds to a resin including a Si—O—Si bond. Siloxane is composed of a skeleton structure formed by a bond of silicon (Si) and oxygen (O). As a substituent thereof, an organic group including at least hydrogen (e.g., an alkyl group or aryl group) is used. Alternatively, a fluoro group may be used as the substituent. Further alternatively, an organic group including at least hydrogen and a fluoro group may be used as the substituent. Further, a vinyl resin such as polyvinyl alcohol or polyvinyl butyral, or a resin material such as a phenol resin, a novolac resin, an acrylic resin, a melamine resin, a urethane resin, an oxazole resin (polybenzoxazole) may be used as the organic material as well as the above-described materials. A dielectric constant can also be controlled by mixing these resins with microparticles having a high dielectric constant such as barium titanate ($BaTiO_3$) or strontium titanate ($SrTiO_3$) as appropriate.

As the inorganic material included in the binder, a material selected from silicon oxide, silicon nitride, silicon including oxygen and nitrogen, aluminum nitride (AlN), aluminum including oxygen and nitrogen or aluminum oxide ($Al_2O_3$), titanium oxide, $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), zinc sulfide (ZnS) and other substances including an inorganic material can be used. By mixing the organic material with an inorganic material having a high dielectric constant (by adding or the like), a dielectric constant of a light-emitting layer including a light-emitting material and a binder can be controlled more and can be further increased.

In a manufacturing process, the light-emitting material is dispersed in a solution including a binder. As a solvent of the solution including a binder that can be used in this embodiment mode, it is preferable to select such a solvent that dissolves a binder material and that can make a solution with the viscosity of which is appropriate for a method for forming the light-emitting layer (various wet processes) and a desired film thickness. An organic solvent or the like can be used and, for example, when a siloxane resin is used as the binder, propylene glycolmonomethyl ether, propylene glycolmonomethyl ether acetate (also referred to as POMEA), 3-methoxy-3-methyl-1-butanol (also referred to as MMB), or the like can be used.

The light-emitting elements shown in FIGS. 52B and 52C each have a structure where an insulating layer is provided between the electrode and the light-emitting layer of the light-emitting element of FIG. 52A. The light-emitting element shown in FIG. 52B has the insulating layer 5104 between the first electrode 5101 and the light-emitting layer 5202. The light-emitting element shown in FIG. 52C has the insulating layer 5104*a* between the first electrode 5101 and the light-emitting layer 5202, and the insulating layer 5104*b* between the second electrode 5103 and the light-emitting layer 5202. In this manner, the insulating layer may be provided between the light-emitting layer and one electrode of a pair of electrodes that sandwiches the light-emitting layer, or may be provided between the light-emitting layer and the first electrode 5101 and between the light-emitting layer and the second electrode 5103. Moreover, the insulating layer may be a single layer or a stacked layer including a plurality of layers.

In addition, although the insulating layer 5104 is provided so as to be in contact with the first electrode 5101 in FIG. 52B, the insulating layer 5104 may be provided so as to be in contact with the second electrode 5103 by reversing the order of the insulating layer and the light-emitting layer.

Although the insulating layers 5104, 5104*a* and 5104*b* in FIGS. 51B, 51C, 52B, and 52C are not particularly limited, such insulating layers preferably have high dielectric strength and dense film qualities, and more preferably have high dielectric constants. For example, silicon oxide, yttrium oxide ($Y_2O_3$), titanium oxide, aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked-layer film of two kinds or more thereof can be used. These insulating films can be formed by sputtering, evaporation, CVD, or the like. In addition, the insulating layers may be formed by dispersing particles of these insulating materials in the binder. The binder material may be formed with the same material and by the same method as the binder included in the light-emitting layer. A film thickness of such an insulating layer is not particularly limited, and a film thickness of 10 nm to 1000 nm is preferable.

For the first electrode 5101 and the second electrode 5103, a metal, an alloy, a conductive compound, a mixture thereof, or the like can be used. For example, each material can be selected as appropriate from the materials used for the pixel electrode 1801 and the opposite electrode 1802 described in Embodiment Mode 9.

Note that the light-emitting element described in this embodiment mode can emits light when voltage is applied between the pair of electrodes which sandwiches the light-emitting layer, namely to the first electrode 5101 and the second electrode 5103.

An inorganic EL element thus obtained can be used as the light-emitting element in Embodiment Mode 9, and can be combined freely with the other embodiment modes.

Embodiment Mode 11

In this embodiment mode, one mode of a display device of the present invention is described with reference to FIGS. 25A and 25B.

FIG. 25A is a top plan view showing a display device, and FIG. 25B is an A-A' line cross sectional view (cross sectional view taken along a line A-A') of FIG. 25A. The display device includes a signal line driver circuit 2501, a pixel portion 2502, a first scan line driver circuit 2503, and a second scan line driver circuit 2506 over a substrate 2510, which are indicated by dotted lines in the drawing. Note that they are sealed using a sealing substrate 2504 and a sealant 2505.

Note that a wiring 2508 is a wiring for transmitting signals to be input to the first scan line driver circuit 2503, the second scan line driver circuit 2506, and the signal line driver circuit 2501 and receives a video signal, a clock signal, a start signal, and the like through an FPC (Flexible Printed Circuit) 2509 that serves as an external input terminal. IC chips (semiconductor chips provided with a memory circuit, a buffer circuit, and the like) 2518 and 2519 are mounted on a connection portion of the FPC 2509 and the display device by COG (Chip On Glass) or the like. Note that although only the FPC is shown here, a printed wiring hoard (PWB) may also be attached to the FPC. The display device of the present invention includes not only a main body of a display device but also a display device with an FPC or a PWB attached thereto. In addition, it also includes a display device on which an IC chip or the like is mounted.

A cross-sectional structure is described with reference to FIG. 25B. Although the pixel portion 2502 and its peripheral driver circuits (the first scan line driver circuit 2503, the second scan line driver circuit 2506, and the signal line driver circuit 2501) are formed over the substrate 2510, only the signal line driver circuit 2501 and the pixel portion 2502 are shown here.

Note that the signal line driver circuit 2501 includes transistors with the same conductivity type such as N-channel transistors 2520 and 2521. It is needless to say that only P-channel transistors may be used or a CMOS circuit may be formed using both an N-channel transistor and a P-channel transistor. Although this embodiment mode describes a display panel in which the peripheral driver circuits are formed over the same substrate as the pixel portion, the present invention is not limited to this. All or part of the peripheral driver circuits may be formed on an IC chip or the like and mounted by COG or the like.

The pixel described in any of Embodiment Modes 1 to 8 is used for the pixel portion 2502. Note that a transistor 2511 which functions as a switch, a transistor 2512 which controls a current value supplied to a light-emitting element, and a light-emitting element 2528 are shown in FIG. 25B. Note that a first electrode of the transistor 2512 is connected to a pixel electrode 2513 of the light-emitting element 2528. In addition, an insulator 2514 is formed so as to cover an end of the pixel electrode 2513. Here, the insulator 2514 is formed using a positive photosensitive acrylic resin film.

The insulator 2514 is formed so that an upper end or a lower end thereof has a curved surface with a curvature in a cross section in order to obtain excellent coverage. For example, in the case of using positive photosensitive acrylic as a material of the insulator 2514, the insulator 2514 is preferably formed to have a curved surface with a curvature radius (0.2 µm to 3 µm) only at the upper end. Either a negative resist which becomes insoluble in an etchant by light irradiation or a positive resist which becomes soluble in an etchant by light irradiation can be used as the insulator 2514. Further, an inorganic material such as silicon oxide or silicon oxynitride can be used as a material of the insulator 2514 as well as an organic material.

A layer 2516 including a light-emitting substance and an opposite electrode 2517 are formed over the pixel electrode 2513. As for the layer 2516 including a light-emitting substance, as long as at least a light-emitting layer is provided, there is no particular limitation on layers other than the light-emitting layer and they can be selected as appropriate.

By attaching the sealing substrate 2504 to the substrate 2510 using the sealant 2505, a structure is obtained in which the light-emitting element 2528 is provided in the space 2507 surrounded by the substrate 2510, the sealing substrate 2504, and the sealant 2505. Note that there is also a case where the space 2507 is filled with the sealant 2505 other than an inert gas (e.g., nitrogen or argon).

Note that an epoxy-based resin is preferably used as the sealant 2505. The material preferably allows as little moisture and oxygen as possible to penetrate. As the sealing substrate 2504, a plastic substrate formed of FRP (Fiberglass-Reinforced Plastics), PVF (polyvinyl fluoride), polyester, acrylic, or the like can be used as well as a glass substrate or a quartz substrate.

Variations in luminance among pixels or fluctuation in luminance of a pixel over time can be suppressed by using and operating any of the pixels described in Embodiment Modes 1 to 8 in the pixel portion 2502, and thus a high quality display device with a higher duty ratio can be obtained. In addition, power consumption can be reduced in the present invention because operation is performed with the potential of the opposite electrode fixed.

By forming the signal line driver circuit 2501, the pixel portion 2502, the first scan line driver circuit 2503, and the second scan line driver circuit 2506 over the same substrate as shown in FIGS. 25A and 25B, cost of the display device can be reduced. In addition, when transistors with the same conductivity type are used for the signal line driver circuit 2501, the pixel portion 2502, the first scan line driver circuit 2503, and the second scan line driver circuit 2506 a manufacturing process can be simplified, so that further cost reduction can be achieved.

In this manner, the display device of the present invention can be obtained. Note that the above-described structure is one example and a structure of the display device of the present invention is not limited to this.

Figure 26A:
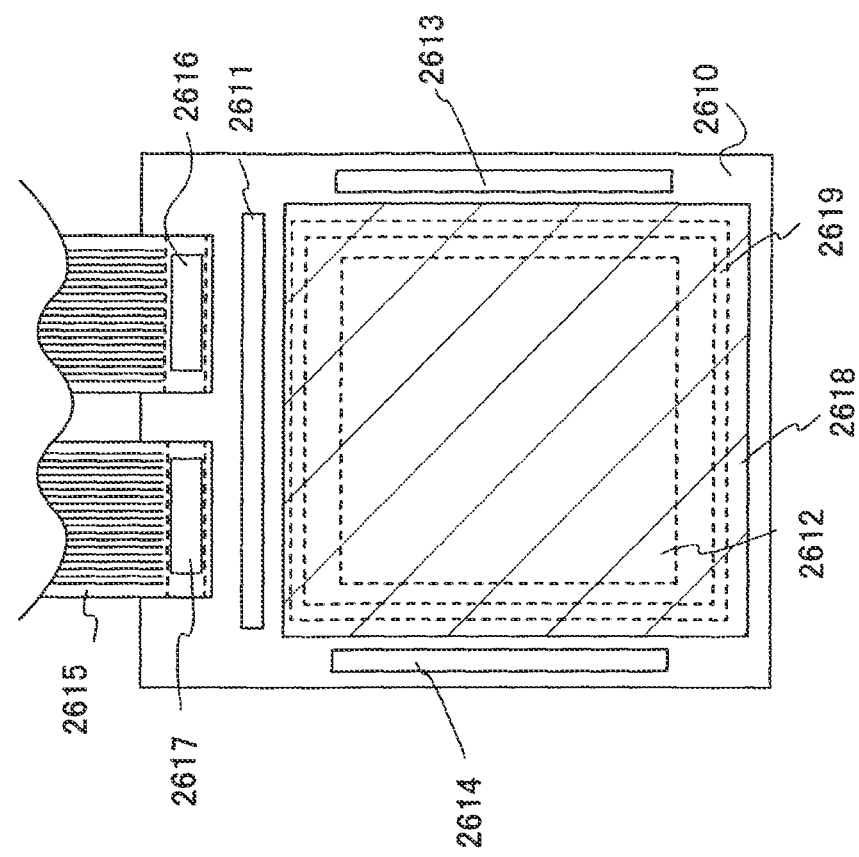
FIGS. 26A and 26B are views each showing a display device shown in Embodiment Mode 11.

Note that as the structure of the display device, there may be a structure in which a signal line driver circuit 2601 is formed on an IC chip and the IC chip is mounted on a display device by COG or the like as shown in FIG. 26A. Note that a substrate 2600, a pixel portion 2602, a first scan line driver circuit 2603, a second scan line driver circuit 2604, an FPC 2605, an IC chip 2606, an IC chip 2607, a sealing substrate 2608, and a sealant 2609 of FIG. 26A correspond to the substrate 2510, the pixel portion 2502, the first scan line driver circuit 2503, the second scan line driver circuit 2506, the FPC 2509, the IC chip 2518, the IC chip 2519, the sealing substrate 2504, and the sealant 2505 in FIG. 25A, respectively.

That is, only a signal line driver circuit of which high speed operation is required is formed on an IC chip by using a CMOS or the like to reduce power consumption. In addition, higher-speed operation and lower power consumption can be achieved by using a semiconductor chip formed of a silicon wafer or the like as the IC chip.

Note that cost reduction can be achieved by forming the first scan line driver circuit 2603 and the second scan line driver circuit 2604 over the same substrate as the pixel portion 2602. In addition, further cost reduction can be achieved by forming the first scan line driver circuit 2603, the second scan line driver circuit 2604, and the pixel portion 2602 using transistors with the same conductivity type. At this time, decrease in output potential can be prevented by using boot trap circuits for the first scan line driver circuit 2603 and the second scan line driver circuit 2604. In addition, in the case of using amorphous silicon for semiconductor layers of transistors included in the first scan line driver circuit 2603 and the second scan line driver circuit 2604, since the threshold voltage of each transistor fluctuates due to deterioration, it is preferable to provide a function to correct the fluctuation.

Variations in luminance among pixels or fluctuation in luminance of a pixel over time can be suppressed by using and operating any of the pixels described in Embodiment Modes 1 to 8 also in the pixel portion 2602, and thus a high quality display device with a higher duty ratio can be obtained. In addition, power consumption can be reduced in the present invention because operation is performed with the potential of the opposite electrode fixed. In addition, a substrate area can be used efficiently by mounting an IC chip provided with a functional circuit (a memory or a buffer) on a connection portion of the FPC 2605 and the substrate 2600.

Figure 26B:
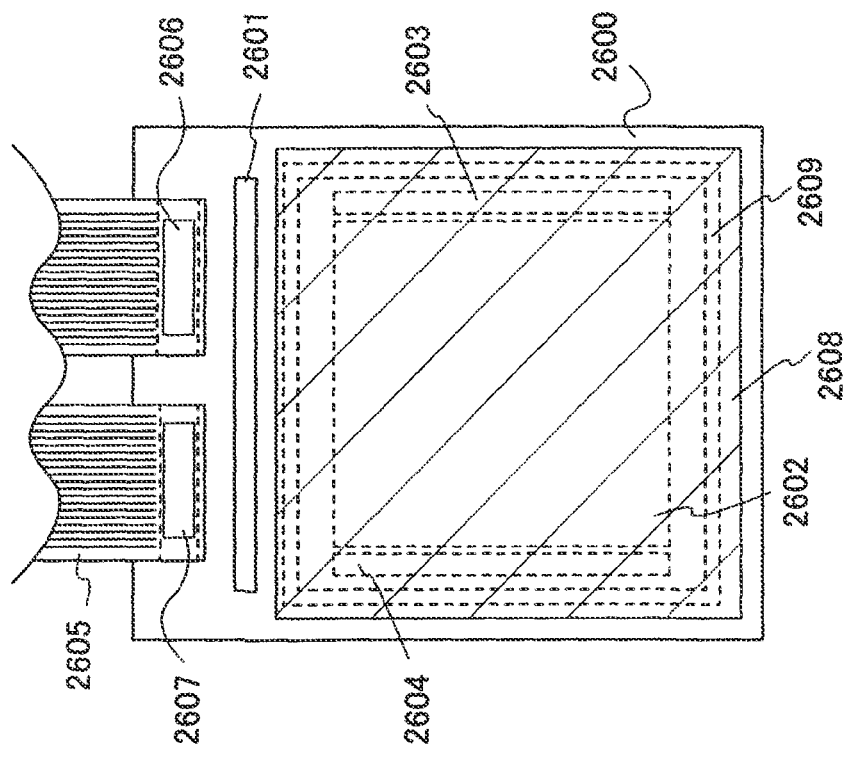

Further, a structure may also be used in which a signal line driver circuit 2611, a first scan line driver circuit 2613, and a second scan line driver circuit 2614 corresponding to the signal line driver circuit 2501, the first scan line driver circuit 2503, and the second scan line driver circuit 2506 of FIG. 25A respectively are formed on IC chips and the IC chips are mounted on a display device by COG or the like as shown in FIG. 26B. Note that a substrate 2610, a pixel portion 2612, an FPC 2615, an IC chip 2616, an IC chip 2617, a sealing substrate 2618, and a sealant 2619 of FIG. 26B correspond to the substrate 2510, the pixel portion 2502, the FPC 2509, the IC chip 2518, the IC chip 2519, the sealing substrate 2504, and the sealant 2505 of FIG. 25A, respectively.

Further, cost reduction can be achieved by using an amorphous semiconductor film, e.g., an amorphous silicon (a-Si:H) film for a semiconductor layer of a transistor of the pixel portion 2612. Further, a large display panel can also be manufactured.

Further, each of the signal line driver circuit, the first scan line driver circuit, and the second scan line driver circuit is not necessarily provided in a row direction and a column direction of pixels. For example, as shown in FIG. 27A, a peripheral driver circuit 2701 formed on an IC chip may have functions of the first scan line driver circuit 2613, the second scan line driver circuit 2614, and the signal line driver circuit 2611 shown in FIG. 26B. Note that a substrate 2700, a pixel portion 2702, an FPC 2704, an IC chip 2705, an IC chip 2706, a sealing substrate 2707, and a sealant 2708 of FIG. 27A correspond to the substrate 2510, the pixel portion 2502, the FPC 2509, the IC chip 2518, the IC chip 2519, the sealing substrate 2504, and the sealant 2505 of FIG. 25A, respectively.

Note that a schematic diagram illustrating the connection of wirings of the display device of FIG. 27A is shown in FIG. 27B. A substrate 2710, a peripheral driver circuit 2711, a pixel portion 2712, an FPC 2713, and an FPC 2714 are shown in FIG. 27B.

The FPC 2713 and the FPC 2714 input signals and power supply potentials from outside to the peripheral driver circuit 2711. Then, an output from the peripheral driver circuit 2711 is input to wirings in row and column directions connected to pixels included in the pixel portion 2712.

Figure 28:
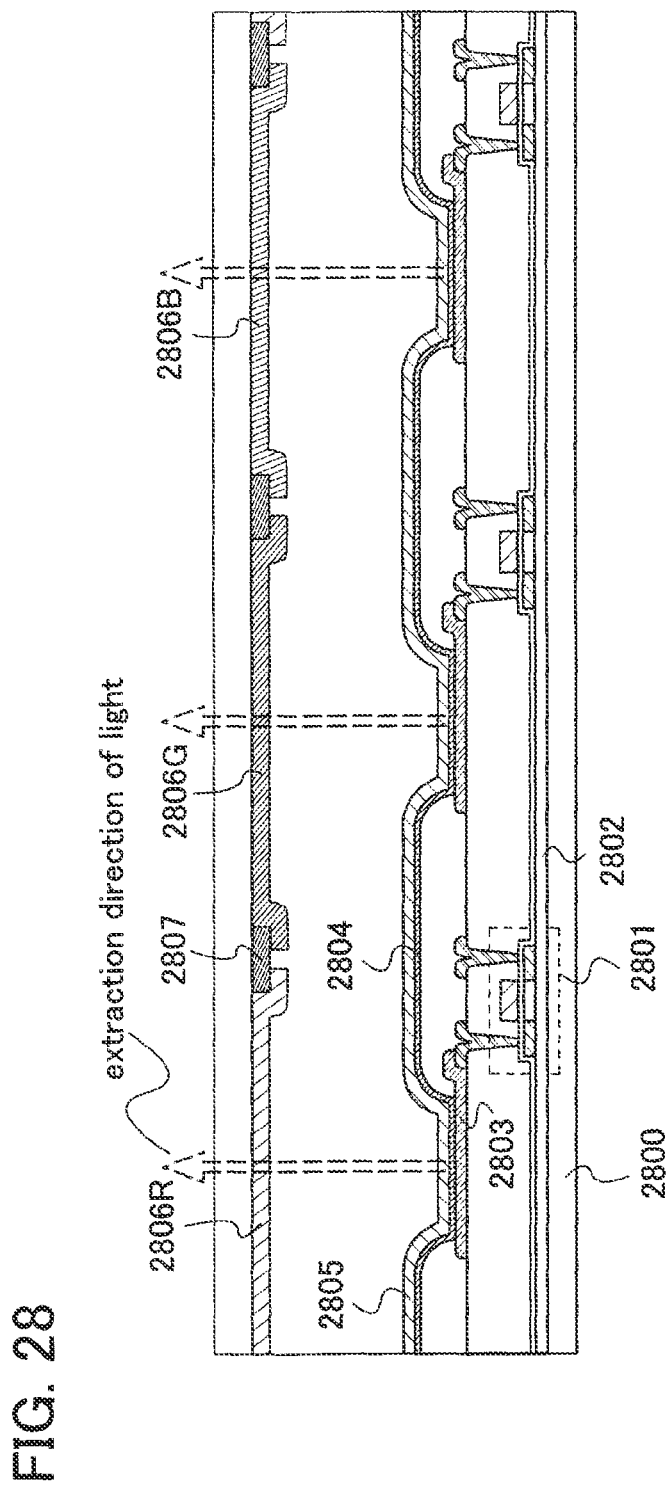
FIG. 28 is a partial sectional view showing a pixel shown in Embodiment Mode 11.

Further, in the case of using a white light-emitting element as the light-emitting element, full color display can be realized by providing the sealing substrate with color filters. The present invention can also be applied to such a display device. FIG. 28 shows one example of a partial sectional view of a pixel portion.

As shown in FIG. 28, a base film 2802 is formed over a substrate 2800; a transistor 2801 which controls a current value supplied to a light-emitting element is formed thereover; and a pixel electrode 2803 is formed in contact with a first electrode of the transistor 2801. A layer 2804 including a light-emitting substance and an opposite electrode 2805 are formed thereover.

Note that a portion where the layer 2804 including a light-emitting substance is sandwiched between the pixel electrode 2803 and the opposite electrode 2805 serves as the light-emitting element. Note that white light is emitted in FIG. 28. A red color filter 2806R, a green color filter 28064 and a blue color filter 2806B are provided above the light-emitting elements to achieve full-color display. In addition, a black matrix (also referred to as a BM) 2807 is provided to separate these color filters.

The display device of this embodiment mode can be combined with the structure described in Embodiment Mode 9 or 10 as appropriate as well as those in Embodiment Modes 1 to 8. In addition, the structure of the display device is not limited to that described above, and the present invention can also be applied to a display device having another structure.

Embodiment Mode 12

The display device of the present invention can be applied to various electronic devices. Specifically, it can be applied to a display portion of an electronic device. Note that examples of the electronic devices are as follows: a camera such as a video camera or a digital camera, a goggle type display, a navigation system, an audio-reproducing device (e.g., car audio or an audio component), a computer, a game machine, a portable information terminal (e.g., a mobile computer, a mobile phone, a mobile game machine, or an electronic book), an image-reproducing device having a recording medium (specifically, a device for reproducing a content of a recording medium such as a digital versatile disc (DVD) and having a display for displaying a reproduced image), and the like.

Figure 33A:
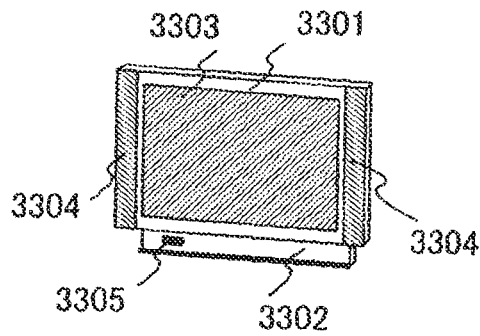
FIGS. 33A to 33H are diagrams showing electronic devices to which the present invention can be applied.

FIG. 33A shows a display which includes a housing 3301, a support 3302, a display portion 3303, a speaker portion 3304, a video input terminal 3305, and the like.

Note that the pixel described in any of Embodiment Modes 1 to 8 is used for the display portion 3303. By using the present invention, variations in luminance among pixels or fluctuation in luminance of a pixel over time can be suppressed and a display including a high quality display portion with a higher duty ratio can be obtained. Further, power consumption can be reduced in the present invention because operation is performed with the potential of an opposite electrode fixed. Note that the display includes in its category all display devices used for displaying information, e.g., for a personal computer, for TV broadcast reception, or for advertisement display.

Note that while needs for increase in display size have been increasing, an increase in price associated with the increase in display size has become an issue. Therefore, it is an issue to reduce manufacturing cost as much as possible and set the price of a high-quality product as low as possible.

Since the pixel of the present invention can be manufactured using transistors with the same conductivity type, the number of steps can be reduced and manufacturing cost can be reduced. Moreover, a process can be simplified and further cost reduction can be achieved by using an amorphous semiconductor, e.g., amorphous silicon (a-Si:H) for a semiconductor layer of each transistor included in the pixel. In this case, a driver circuit at the periphery of a pixel portion is preferably formed on an IC chip and the IC chip is mounted on a display panel by COG (Chip On Glass) or the like. Note that a signal line driver circuit with high operation speed may be formed on an IC chip, and a scan line driver circuit with relatively low operation speed may be formed using a circuit including transistors with the same conductivity type over the same substrate as the pixel portion.

Figure 33B:
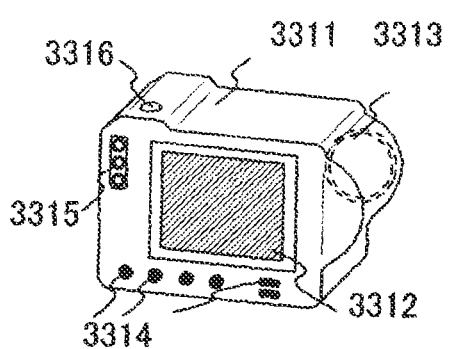

FIG. 33B shows a camera which includes a main body 3311, a display portion 3312, an image receiving portion 3313, operation keys 3314, an external connection port 3315, a shutter button 3316, and the like.

Note that the pixel described in any of Embodiment Modes 1 to 8 is used for the display portion 3312. By using the present invention, variations in luminance among pixels or fluctuation in luminance of a pixel over time can be suppressed, and a camera including a high quality display portion with a higher duty ratio can be obtained. Further, power consumption can be reduced in the present invention because an operation is performed with the potential of the opposite electrode fixed.

In addition, competitive manufacturing of a digital camera or the like has been intensified along with improvement in performance. Therefore, it is important to set the price of a high-performance product as low as possible.

Since the pixel of the present invention can be manufactured using transistors with the same conductivity type, the number of steps can be reduced and manufacturing cost can be reduced. Further, a process can be simplified and further cost reduction can be achieved by using an amorphous semiconductor, e.g., amorphous silicon (a-Si:H) for a semiconductor layer of each transistor included in the pixel. In this case, a driver circuit at the periphery of a pixel portion is preferably formed on an IC chip and the IC chip is mounted on a display panel by COG or the like. Note that a signal line driver circuit with high operation speed may be formed on an IC chip, and a scan line driver circuit with relatively low operation speed may be formed using a circuit including transistors with the same conductivity type over the same substrate as the pixel portion.

Figure 33C:
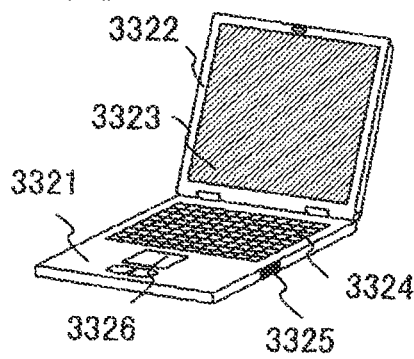

FIG. 33C shows a computer which includes a main body 3321, a housing 3322, a display portion 3323, a keyboard 3324, an external connection port 3325, a pointing device 3326, and the like. Note that the pixel described in any of Embodiment Modes 1 to 8 is used for the display portion 3323. By using the present invention, variations in luminance among pixels or fluctuation in luminance of a pixel over time can be suppressed and a computer including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

Figure 33D:
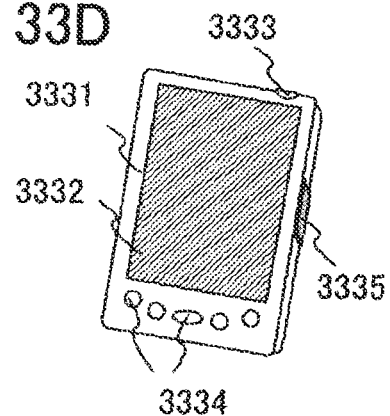

FIG. 33D shows a mobile computer which includes a main body 3331, a display portion 3332, a switch 3333, operation keys 3334, an infrared port 3335, and the like. Note that the pixel described in any of Embodiment Modes 1 to 6 is used for the display portion 3332. By using the present invention, variations in luminance among pixels or fluctuation in luminance of a pixel over time can be suppressed and a mobile computer including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

Figure 33E:
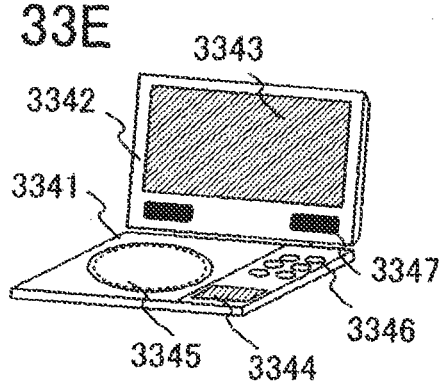

FIG. 33E shows a portable image reproducing device provided with a recording medium (specifically, a DVD player) which includes a main body 3341, a housing 3342, a display portion A 3343, a display portion B 3344, a recording medium (e.g., DVD) reading portion 3345, operation keys 3346, a speaker portion 3347, and the like. The display portion A 3343 mainly displays image information, and the display portion B 3344 mainly displays character information. Note that the pixel described in any of Embodiment Modes 1 to 8 is used for the display portion A 3343 and the display portion B 3344. By using the present invention, variations in luminance among pixels or fluctuation in luminance of a pixel over time can be suppressed and an image reproducing device including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

Figure 33F:
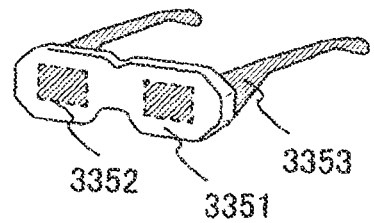

FIG. 33F shows a goggle type display which includes a main body 3351, a display portion 3352, an arm portion 3353, and the like. Note that the pixel described in any of Embodiment Modes 1 to 8 is used for the display portion 3352. By using the present invention, variations in luminance among pixels or fluctuation in luminance of a pixel over time can be suppressed and a goggle type display including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

Figure 33G:
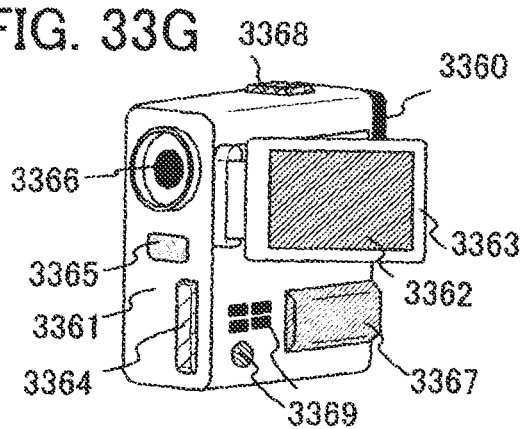

FIG. 33G shows a video camera which includes a main body 3361, a display portion 3362, a housing 3363, an external connection port 3364, a remote control receiving portion 3365, an image receiving portion 3366, a battery 3367, an audio input portion 3368, operation keys 3369, an eye piece portion 3360, and the like. Note that the pixel described in any of Embodiment Modes 1 to 8 is used for the display portion 3362. By using the present invention, variations in luminance among pixels or fluctuation in luminance of a pixel over time can be suppressed and a video camera including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

Figure 33H:
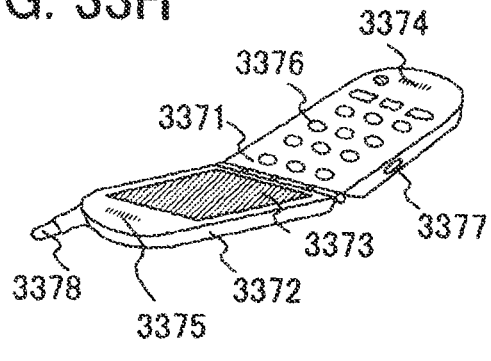

FIG. 33H shows a mobile phone which includes a main body 3371, a housing 3372, a display portion 3373, an audio input portion 3374, an audio output portion 3375, operation keys 3376, an external connection port 3377, an antenna 3378, and the like. Note that the pixel described in any of Embodiment Modes 1 to 8 is used for the display portion 3373. By using the present invention, variations in luminance among pixels or fluctuation in luminance of a pixel over time can be suppressed and a mobile phone including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

As described above, the present invention can be applied to any electronic device.

Embodiment Mode 13

Figure 34:
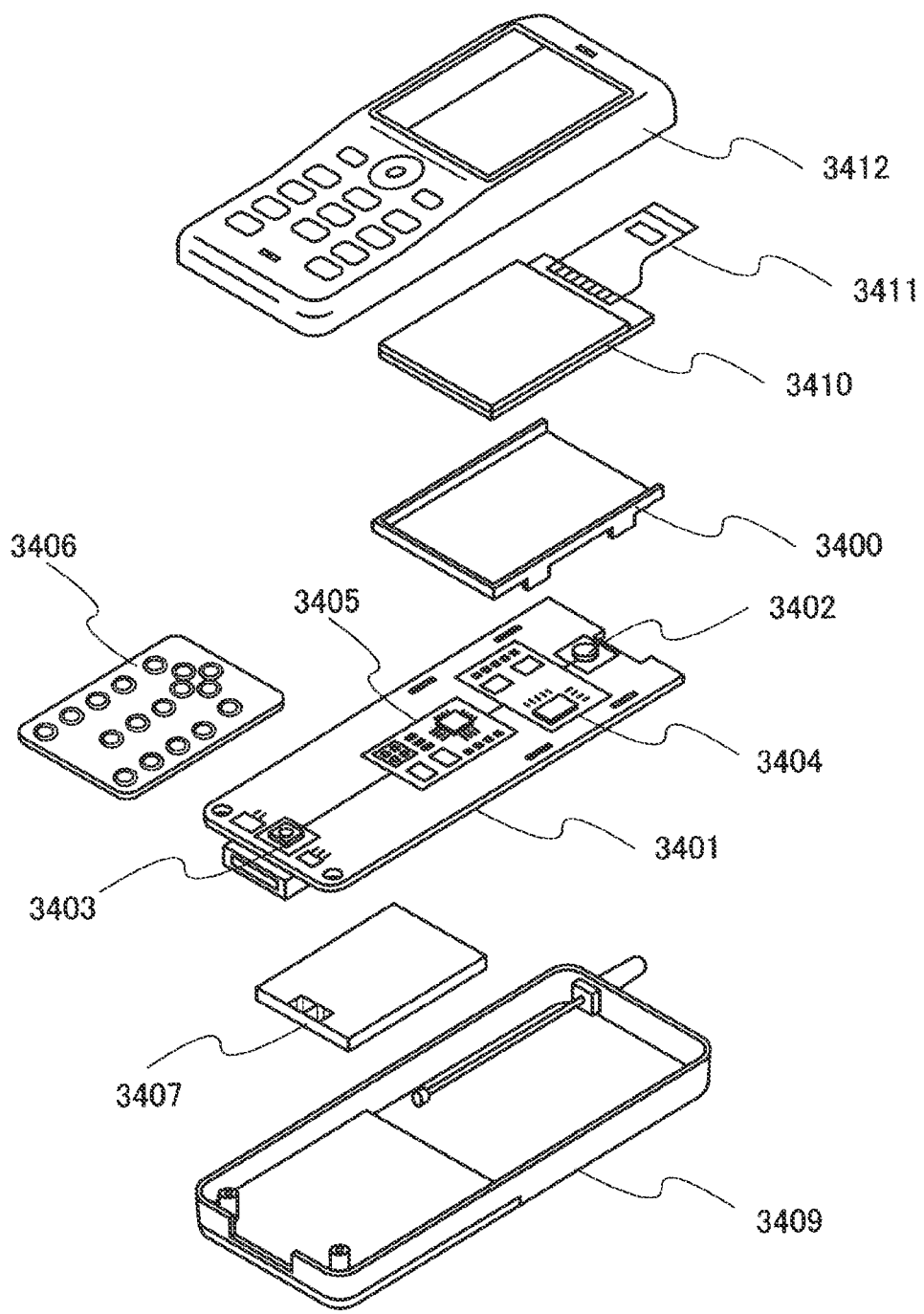
FIG. 34 is a view showing a structural example of a mobile phone.

In this embodiment mode, a structural example of a mobile phone including the display device of the present invention in a display portion is described with reference to FIG. 34.

A display panel 3410 is incorporated in a housing 3400 so as to be detachable. A shape and a size of the housing 3400 can be changed as appropriate in accordance with a size of the display panel 3410. The housing 3400 to which the display panel 3410 is fixed is fitted into a printed circuit board 3401 and assembled as a module.

The display panel 3410 is connected to the printed circuit board 3401 through an FPC 3411. The printed circuit board 3401 is provided with a speaker 3402, a microphone 3403, a transmitting/receiving circuit 3404, and a signal processing circuit 3405 including a CPU, a controller, and the like. Such a module, an input unit 3406, and a buttery 3407 are combined and stored in a housing 3409 and a housing 3412. Note that a pixel portion of the display panel 3410 is arranged so as to be seen from a window formed in the housing 3412.

In the display panel 3410, the pixel portion and part of peripheral driver circuits (a driver circuit having a low operation frequency among a plurality of driver circuits) may be formed using transistors over a substrate, and another peripheral driver circuit (a driver circuit having a high operation frequency among the plurality of driver circuits) may be formed on an IC chip. The IC chip may be mounted on the display panel 3410 by COG (Chip On Glass). The IC chip may alternatively be connected to a glass substrate by using TAB (Tape Automated Bonding) or a printed circuit board. Further, all of the peripheral driver circuits may be formed on an IC chip and the IC chip may be mounted on the display panel by COG or the like.

Note that the pixel described in any of Embodiment Modes 1 to 8 is used for the pixel portion. By using the present invention, variations in luminance among pixels or fluctuation in luminance of a pixel over time can be suppressed and the display panel 3410 including a high quality display portion with a higher duty ratio can be obtained. Note also that power consumption can be reduced in the present invention because operation is performed with the potential of the opposite electrode fixed. Further, cost reduction can be achieved by using transistors with the same conductivity type, as transistors included in the pixel portion or using an amorphous semiconductor film for semiconductor layers of the transistors.

The structure of the mobile phone described in this embodiment mode is just one example, and the display device of the present invention can be applied not only to the mobile phone having the above-described structure but also to mobile phones having various kinds of structures.

Embodiment Mode 14

In this embodiment mode, an EL module obtained by combining a display panel and a circuit board is described with reference to FIGS. 35 and 36.

Figure 35:
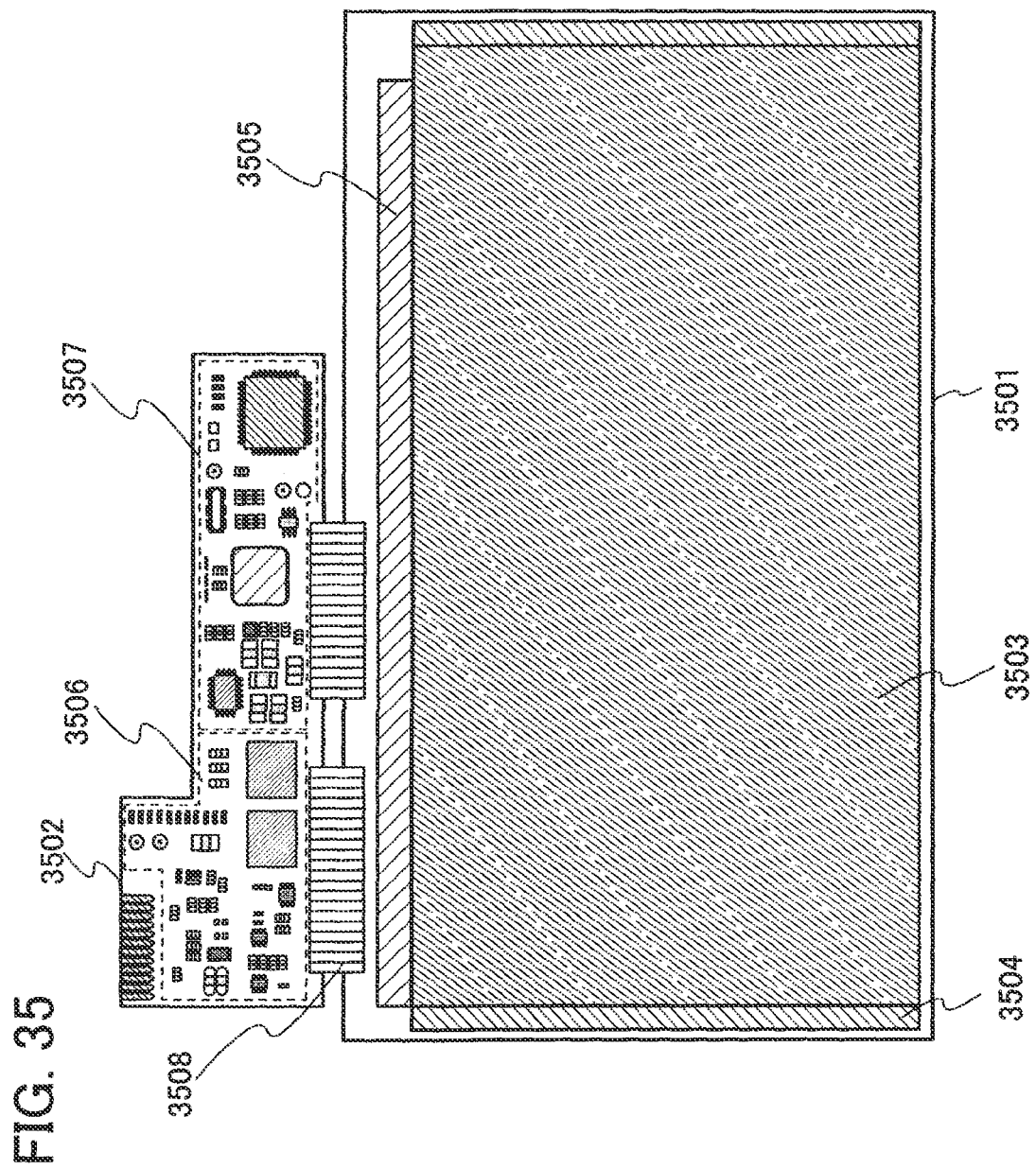
FIG. 35 is a view showing an example of an EL module.
Figure 36:
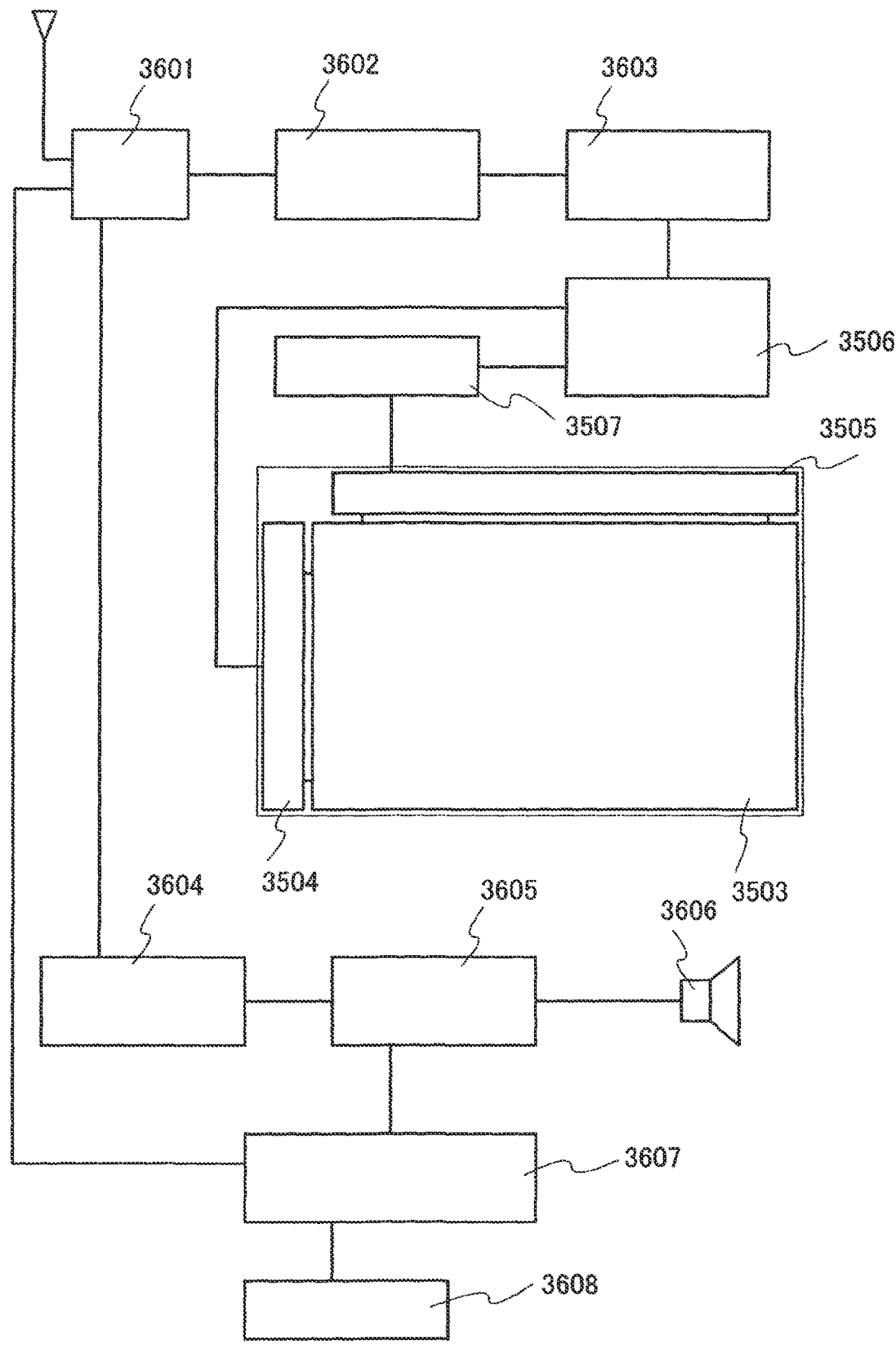
FIG. 36 is a block diagram showing a main structure of an EL television receiver.

As shown in FIG. 35, a display panel 3501 includes a pixel portion 3503, a scan line driver circuit 3504, and a signal line driver circuit 3505. Over a circuit board 3502, for example, a control circuit 3506, a signal dividing circuit 3507, and the like are formed. Note that the display panel 3501 and the circuit board 3502 are connected to each other by a connection wiring 3508. As the connection wiring 3508, an FPC or the like can be used.

In the display panel 3501, the pixel portion and part of peripheral driver circuits (a driver circuit having a low operation frequency among a plurality of driver circuits) may be formed using transistors over a substrate, and another peripheral driver circuit (a driver circuit having a high operation frequency among the plurality of driver circuits) may be formed on an IC chip. The IC chip may be mounted on the display panel 3501 by COG (Chip On Glass). The IC chip may alternatively be connected to a glass substrate by using TAB (Tape Automated Bonding) or a printed circuit board. Further, all of the peripheral driver circuits may be formed on an IC chip and the IC chip may be mounted on the display panel by COG or the like.

Note that the pixel described in any of Embodiment Modes 1 to 8 is used for the pixel portion. By using the present invention, variations in luminance among pixels or fluctuation in luminance of a pixel over time can be suppressed and the high quality display panel 3501 with a higher duty ratio can be obtained. Note also that power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors.

An EL TV receiver can be completed with such an EL module. FIG. 36 is a block diagram showing a main structure of an EL TV receiver. A tuner 3601 receives a video signal and an audio signal. The video signal is processed by a video signal amplifier circuit 3602, a video signal processing circuit 3603 for converting a signal output from the video signal amplifier circuit 3602 into a color signal corresponding to each color of red, green, and blue, and a control circuit 3506 for converting the video signal into a signal which meets input specifications of a driver circuit. The control circuit 3506 outputs signals to a scan line side and a signal line side. In the case of performing a digital drive, a structure can be used in which the signal dividing circuit 3507 is provided on the signal line side to supply an input digital signal divided into m pieces.

The audio signal among the signals received by the tuner 3601 is transmitted to an audio signal amplifier circuit 3604, and an output of the audio signal amplifier circuit 3604 is supplied to a speaker 3606 through an audio signal processing circuit 3605. A control circuit 3607 receives control information of a receiving station (reception frequency) or sound volume from an input portion 3608, and transmits signals to the tuner 3601 and the audio signal processing circuit 3605.

For example, by incorporating the EL module in FIG. 35 into the housing 3301 of FIG. 33A described in Embodiment Mode 12, a TV receiver can be completed.

Needless to say, the present invention is not limited to the TV receiver, and can be applied to various uses particularly as a large display medium such as an information display board at a train station, an airport, or the like, or an advertisement display board on the street, as well as a monitor of a personal computer.

Embodiment Mode 15

In this embodiment mode, an application of the display device in accordance with the present invention is described.

Figure 56:
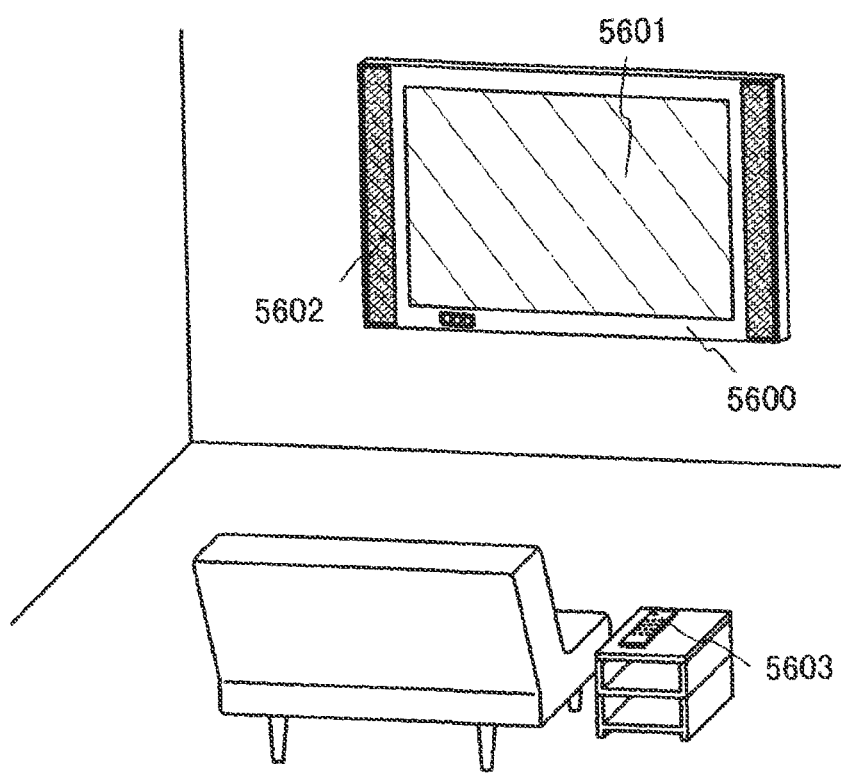
FIG. 56 is a view showing an application of a display device in accordance with the present invention.

FIG. 56 shows an example in which the display device in accordance with the present invention is incorporated in a structure. FIG. 56 shows a structure which includes a housing 5600, a display panel 5601, a speaker portion 5602, and the like. Note that a reference numeral 5603 denotes a remote controller for operating the display panel 5601.

The pixel described in any of Embodiment Modes 1 to 8 is used for the display panel 5601. By using the present invention, variations in luminance among pixels or fluctuation in luminance of a pixel over time can be suppressed and the high quality display panel with a higher duty ratio can be obtained. Further, power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors.

Since the display device shown in FIG. 56 is incorporated in the structure, the display device shown in FIG. 56 can be provided without requiring a wide space.

Figure 57:
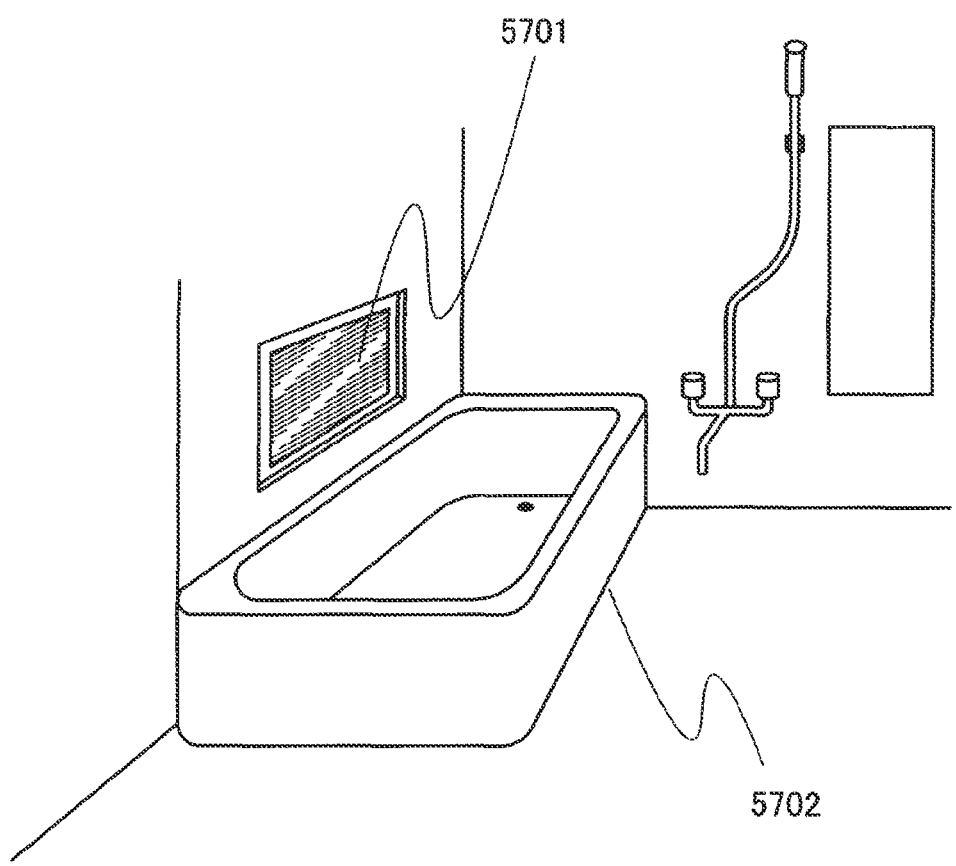
FIG. 57 is a view showing an application of a display device in accordance with the present invention.

FIG. 57 shows another example in which the display device in accordance with the present invention is incorporated in a structure. A display panel 5701 is incorporated in a prefabricated bath unit 5702, so that a bather can view the display panel 5701 while taking a bath. Information can be displayed on the display panel 5701 by an operation of the bather. Therefore, the display panel 5701 can be used for advertisement or an amusement means.

The pixel described in any of Embodiment Modes 1 to 8 is used for the display panel 5701. By using the present invention, variations in luminance among pixels or fluctuation in luminance of a pixel over time can be suppressed and the high quality display panel with a higher duty ratio can be obtained. Further, power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors.

The position for providing the display device in accordance with the present invention is not limited to a sidewall of the prefabricated bath unit 5702 shown in FIG. 57, and the display device in accordance with the present invention can be incorporated in various places. For example, the display device in accordance with the present invention can be incorporated in part of a mirror or the bathtub itself. In addition, a shape of the display device may be a shape in accordance with the mirror or the bathtub.

Figure 58:
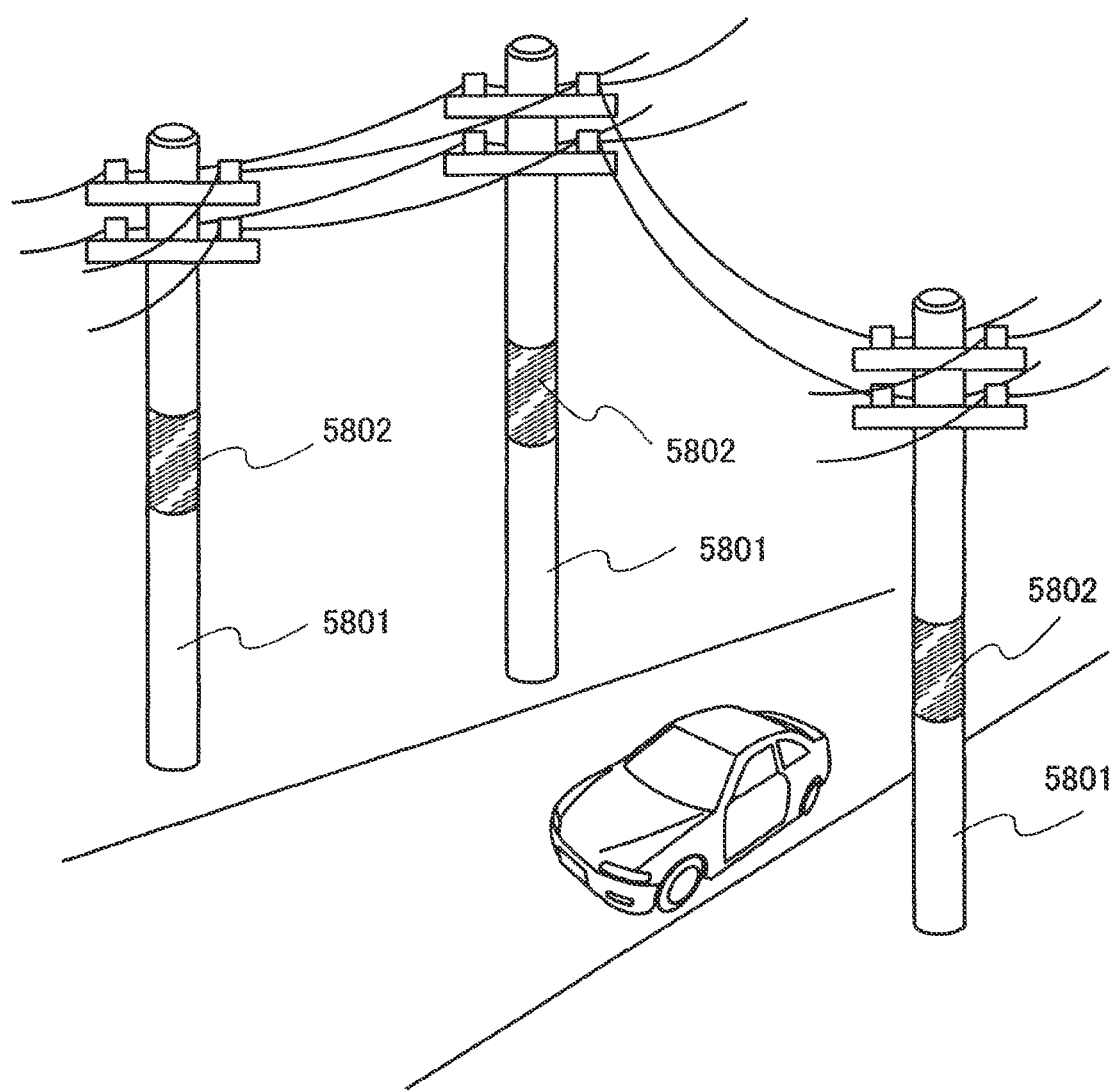
FIG. 58 is a view showing an application of a display device in accordance with the present invention.

FIG. 58 shows another example in which the display device in accordance with the present invention is incorporated in a structure. In FIG. 58, display panels 5802 are curved in accordance with curved surfaces of columnar objects 5801. Here, the columnar objects 5801 are described as telephone poles.

The display panels 5802 shown in FIG. 58 are provided at a position higher than a human eye level. When the display panels 5802 are provided for structures standing outside together in large numbers such as telephone poles, it is possible to provide information to the unspecified number of viewers through the display panels 5802. Therefore, the display panels are suitable for advertisement. Since the display panels 5802 can easily display the same images by control from outside and can easily switch images instantly, extremely effective information display and advertising effects can be expected. In addition, by providing self-luminous display elements in the display panels 5802, the display panels 5802 can be effectively used as highly visible display media even at night. Further, by providing the display panels 5802 for the telephone poles, power supply means of the display panels 5802 can be easily secured. In an emergency such as a disaster, the display panels 5802 can be means for quickly transmitting precise information to victims.

The pixel described in any of Embodiment Modes 1 to 8 is used for each of the display panels 5802. By using the present invention, variations in luminance among pixels or fluctuation in luminance of a pixel over time can be suppressed and the high quality display panel with a higher duty ratio can be obtained. Further, power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors. Alternatively, an organic transistor provided over a film substrate may be used.

Note that although this embodiment describes the wall, the prefabricated bath unit, and the columnar object as examples of the structure in which the display device in accordance with the present invention is incorporated, the display device in accordance with the present invention can be provided for various structures.

Next, an example is described in which the display device in accordance with the present invention is incorporated in a moving object.

Figure 59:
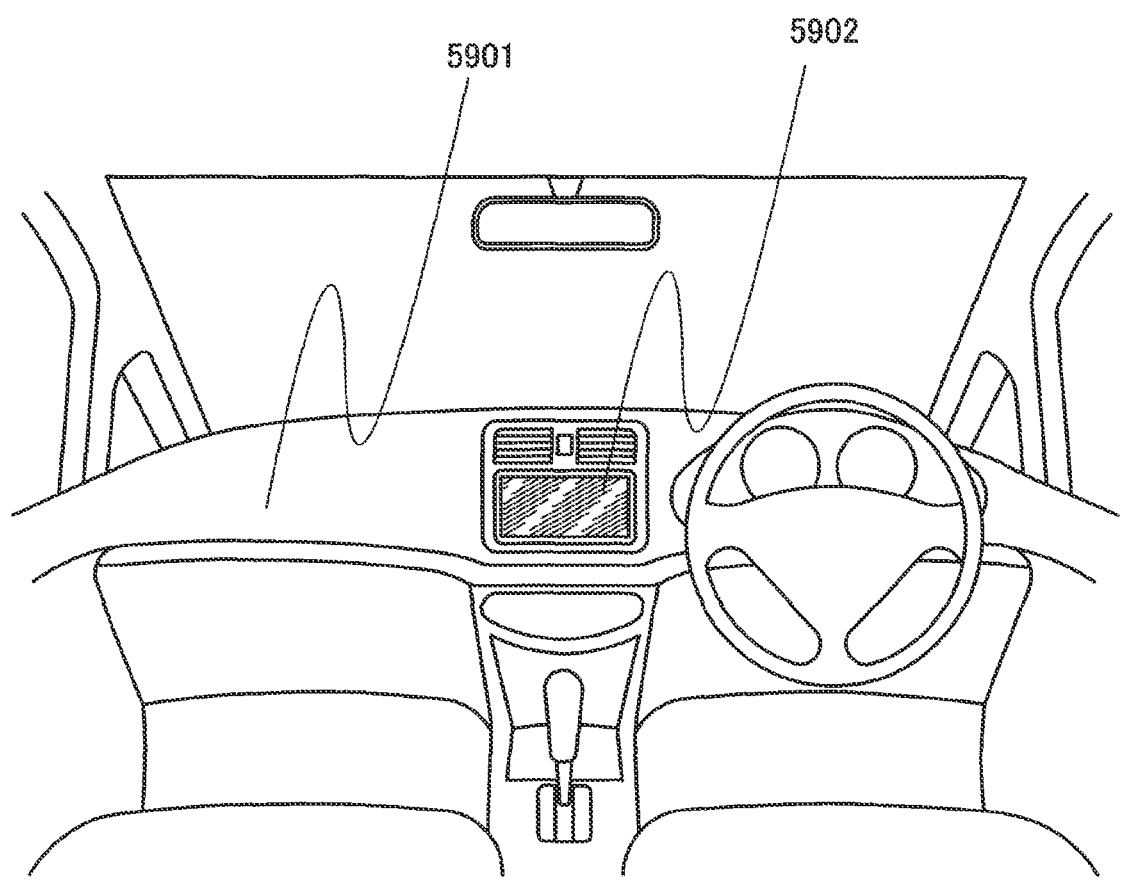
FIG. 59 is a view showing an application of a display device in accordance with the present invention.

FIG. 59 shows an example in which the display device in accordance with the present invention is incorporated in a car. A display panel 5902 is incorporated in a car body 5901 of the car and can display information on an operation of the car or information input from inside or outside of the car on an on-demand basis. In addition, the display panel 5902 may have a navigation function.

The pixel described in any of Embodiment Modes 1 to 8 is used for the display panel 5902. By using the present invention, variations in luminance among pixels or fluctuation in luminance of a pixel over time can be suppressed and the high quality display panel with a higher duty ratio can be obtained. Further, power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors.

Note that the display device in accordance with the present invention can be provided in not only the car body 5901 shown in FIG. 59 but also in various positions. For example, the display device in accordance with the present invention may be incorporated in a glass window, a door, a steering wheel, a shift lever, a seat, a room mirror, or the like. At this time, a shape of the display panel 5902 may be a shape in accordance with a shape of an object in which the display panel 5902 is provided.

Figure 60A:
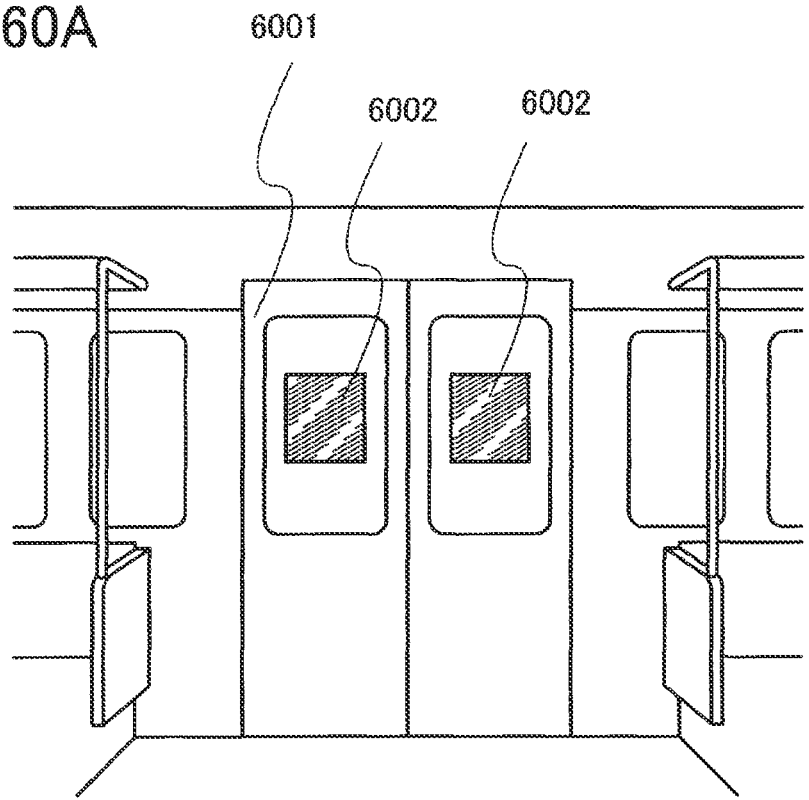
FIGS. 60A and 60B are views each showing an application of a display device in accordance with the present invention.
Figure 60B:
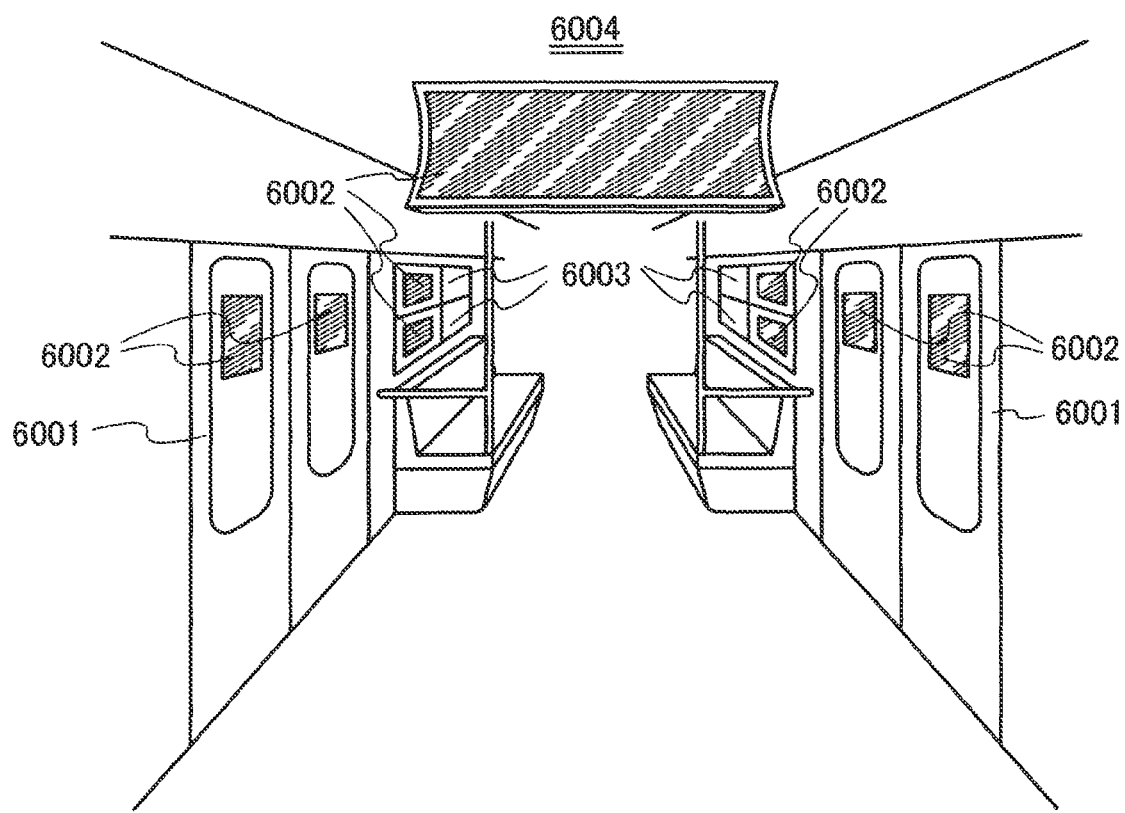

FIGS. 60A and 60B each show an example in which the display device in accordance with the present invention is incorporated in a train car.

FIG. 60A shows an example in which display panels 6002 are provided for glasses of a door 6001 of the train car. The display panels 6002 have an advantage over conventional paper-based advertisement that labor cost which is necessary for switching advertisement is not needed. In addition, since the display panels 6002 can instantly switch images displayed on a display portion by external signals, images on the display panel can be switched as the type of train passenger changes in accordance with different time periods. By changing images instantly in this manner, a more effective advertising effect can be expected.

FIG. 60B shows an example in which display panels 6002 are provided for glass windows 6003 and a ceiling 6004 as well as the glasses of the doors 6001 of the train ear. Since the display device in accordance with the present invention can be easily provided in a position in which the display device is conventionally difficult to be provided, an effective advertisement effect can be obtained. In addition, since the display device in accordance with the present invention can instantly switch images displayed on the display portion by external signals, cost and time generated in advertisement switching can be reduced and more flexible advertisement operation and information transmission can be performed.

The pixel described in any of Embodiment Modes 1 to 8 is used for each of the display panels 6002 shown in FIGS. 60A and 60B. By using the present invention, variations in luminance among pixels or fluctuation in luminance of a pixel over time can be suppressed and the high quality display panel with a higher duty ratio can be obtained. Further, power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors.

Note that the display device in accordance with the present invention can be provided in various positions without limiting to the aforementioned description. For example, the display device in accordance with the present invention may be incorporated in a hand strap, a seat, a handrail, a floor, or the like. At this time, a shape of the display panel 6002 may be a shape in accordance with a shape of an object in which the display panel 6002 is provided.

Figure 61A:
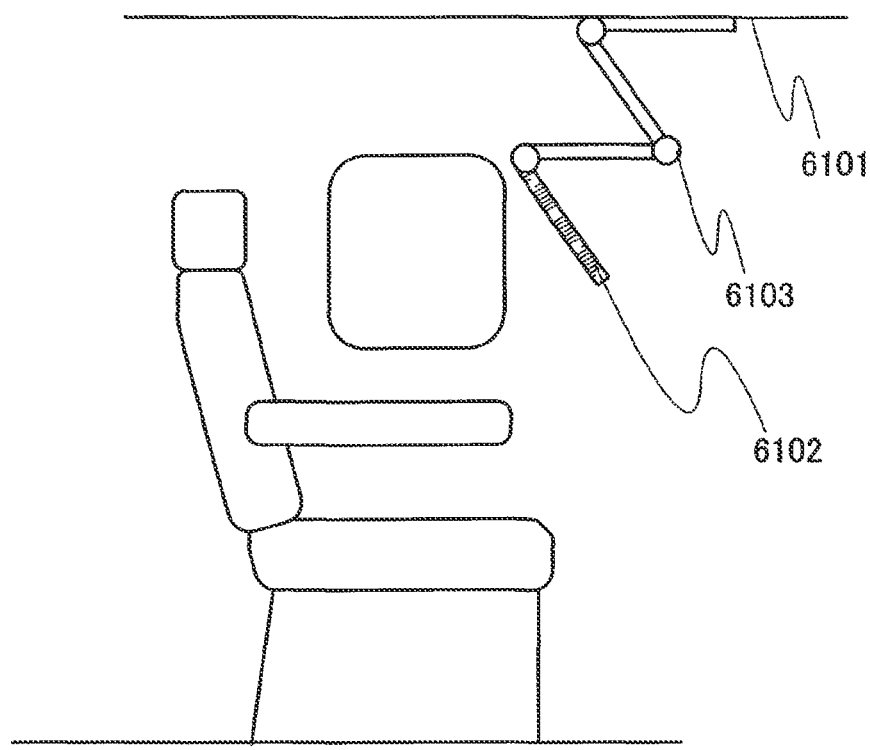
FIGS. 61A and 61B are views each showing an application of a display device in accordance with the present invention.
Figure 61B:
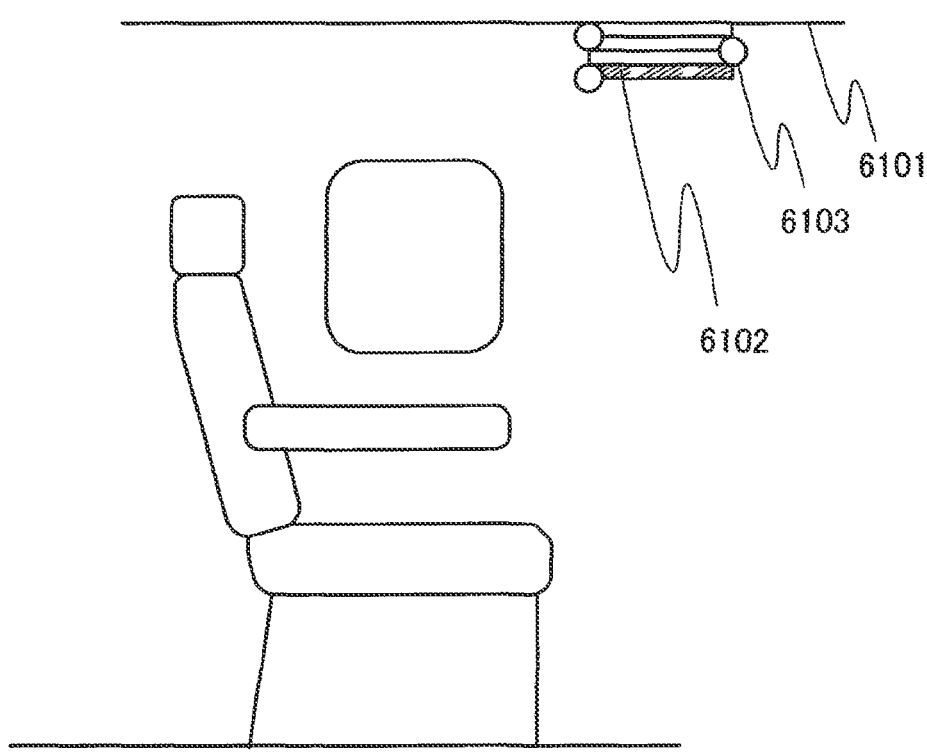
Figure 62:
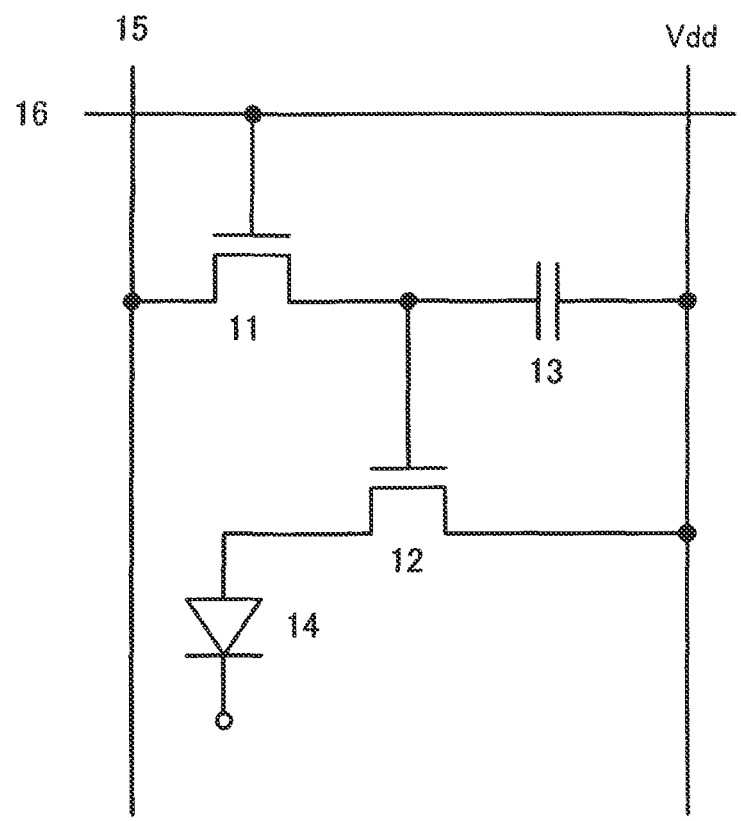
FIG. 62 is a diagram showing a pixel structure of a conventional technique.
Figure 63:
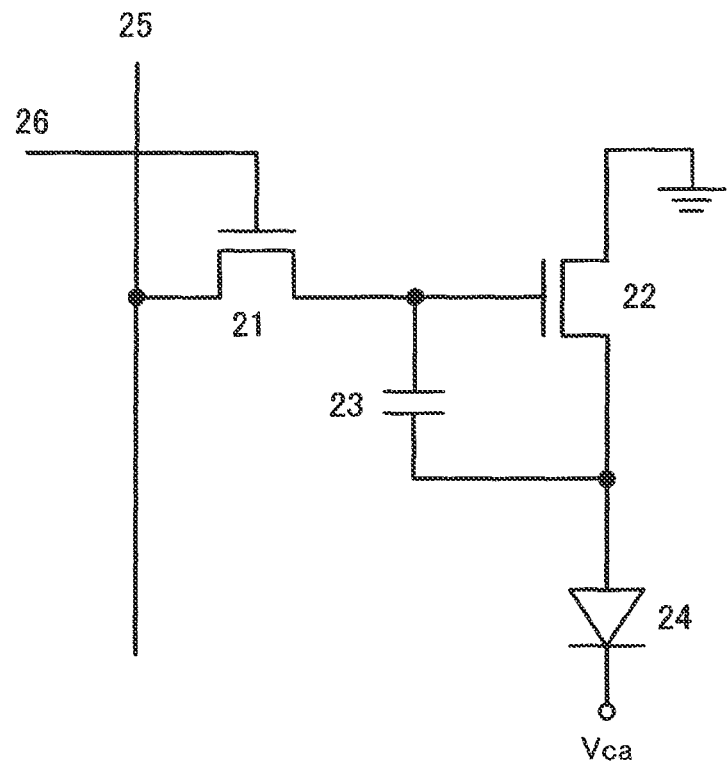
FIG. 63 is a diagram showing a pixel structure of a conventional technique.
Figure 64:
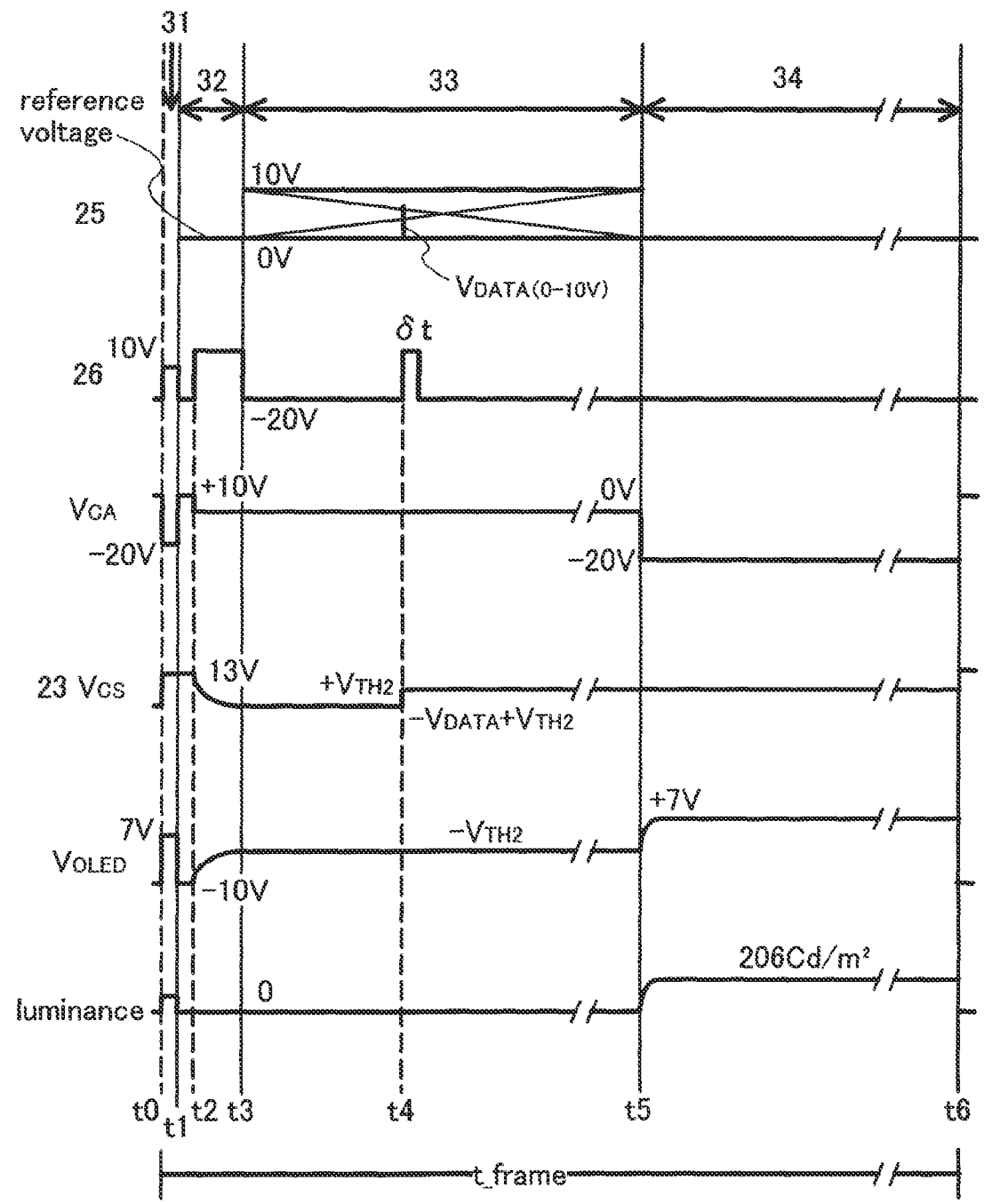
FIG. 64 is a timing chart for operating a pixel shown in a conventional technique.
Figure 65:
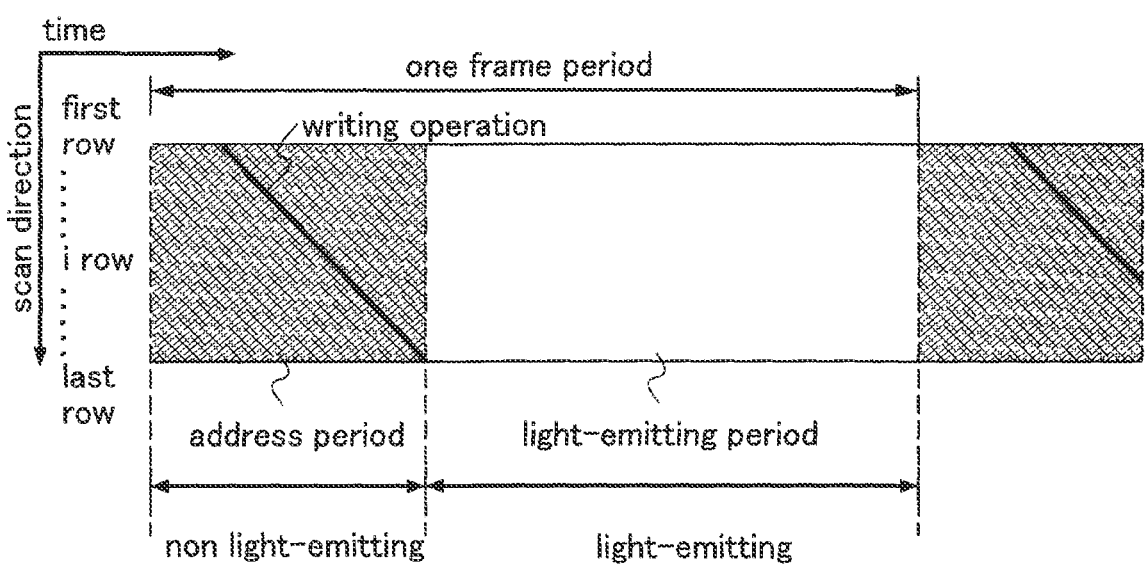
FIG. 65 is a chart showing a ratio of a light-emitting period in one frame period in the case of using a conventional technique.

FIGS. 61A and 61B each show an example in which the display device in accordance with the present invention is incorporated in a passenger airplane.

FIG. 61A shows a shape in use when a display panel 6102 is provided to a ceiling 6101 above a seat of the passenger airplane. The display panel 6102 is incorporated in the ceiling 6101 through a hinge portion 6103, and a passenger can view the display panel 6102 at a desired position by a telescopic motion of the hinge portion 6103. Information can be displayed on the display panel 6102 by an operation of the passenger. Therefore, the display panel 6102 can be used for advertisement or an amusement means. In addition, by storing the display panel 6102 on the ceiling 6101 by folding the hinge portion 6103 as shown in FIG. 61B, safety during takeoff and landing can be secured. Note that the display panel 6102 can also be utilized as a medium a guide light by lighting display elements of the display panel 6102 in an emergency.

The pixel described in any of Embodiment Modes 1 to 8 is used for each of the display panel 6102 shown in FIGS. 61A and 61B. By using the present invention, variations in luminance among pixels or fluctuation in luminance of a pixel over time can be suppressed and the high quality display panel with a higher duty ratio can be obtained. Further, power consumption can be reduced in the present invention because an operation is performed with the potential of an opposite electrode fixed. Further, cost reduction can be achieved by using transistors with the same conductivity type, as transistors included in the pixel portion or using an amorphous semiconductor film for semiconductor layers of the transistors.

Note that the display device in accordance with the present invention can be incorporated in not only the ceiling 6101 shown in FIGS. 61A and 61B but also in various positions. For example, the display device in accordance with the present invention may be incorporated in a seat, a table, an armrest, a window, or the like. In addition, a large display panel which can be viewed simultaneously by a large number of people may be provided in a wall of an airframe. At this time, a shape of the display panel 6102 may be a shape in accordance with a shape of an object in which the display panel 6102 is provided.

Although this embodiment mode describes the train car body, the car body, and the airplane body as examples of moving objects, the present invention is not limited to them, and can be applied to a motorbike, a four-wheeled vehicle (including n car, a bus, and the like), a train (including a monorail, a railroad, and the like), a vessel, and the like. In addition, since display on display panels in a moving object can be switched instantly by external signals, the display device in accordance with the present invention can be used for an advertisement display board for an unspecified number of customers, or an information display board in an emergency by providing the display device in accordance with the present invention in the moving object.

The display device of this embodiment mode can be combined with not only the structure described in any of Embodiment Modes 1 to 8 but also the structure described in Embodiment Mode 9 or 10 as appropriate. Note that the structure of the display device is not limited to the above-described structure.

This application is based on Japanese Patent Application serial No. 2006-291147 filed in Japan Patent Office on Oct. 26, 2006, the entire contents of which are hereby incorporated by reference.

What is claimed is:

1. A display device comprising:
    a pixel comprising:
        a first transistor;
        a second transistor;
        a third transistor;
        a first capacitor; and
        a light-emitting element; and
    a power supply line,
    wherein one of a source and a drain of the first transistor is electrically connected to the light-emitting element,
    wherein the other of the source and the drain of the first transistor is electrically connected to one of a source and a drain of the second transistor,
    wherein the other of the source and the drain of the second transistor is electrically connected to the power supply line,
    wherein one of a source and a drain of the third transistor is electrically connected to a gate of the first transistor,
    wherein the other of the source and the drain of the third transistor is electrically connected to the other of the source and the drain of the first transistor,
    wherein a first electrode of the first capacitor is electrically connected to the gate of the first transistor,
    wherein a second electrode of the first capacitor is electrically connected to the light-emitting element,
    wherein a semiconductor film comprises a first part comprising a channel formation region of the first transistor, a second part comprising a channel formation region of the second transistor and a third part connecting the first part with the second part,
    wherein the power supply line comprises a first part overlapping the third part of the semiconductor film and a second part having a larger width than the first part of the power supply line,
    wherein the power supply line is electrically connected to the semiconductor film through a contact hole, and
    wherein second part of the power supply line overlaps the contact hole.

2. The display device according to claim 1,
    wherein the one of the source and the drain of the first transistor is directly connected to the light-emitting element.

3. The display device according to claim 1, further comprising a second capacitor electrically connected to the first electrode of the first capacitor.

4. The display device according to claim 1,
    wherein the semiconductor film comprises the second electrode of the first capacitor.

5. A display device comprising:
    a pixel comprising:
        a first transistor;
        a second transistor;
        a third transistor;
        a first capacitor; and
        a light-emitting element; and
    a power supply line extending in a first direction,
    wherein one of a source and a drain of the first transistor is electrically connected to the light-emitting element,
    wherein the other of the source and the drain of the first transistor is electrically connected to one of a source and a drain of the second transistor,
    wherein the other of the source and the drain of the second transistor is electrically connected to the power supply line,
    wherein one of a source and a drain of the third transistor is electrically connected to a gate of the first transistor,
    wherein the other of the source and the drain of the third transistor is electrically connected to the other of the source and the drain of the first transistor,
    wherein a first electrode of the first capacitor is electrically connected to the gate of the first transistor,
    wherein a second electrode of the first capacitor is electrically connected to the light-emitting element,
    wherein a channel length direction of the second transistor is parallel to the first direction,
    wherein a channel length direction of the third transistor is not parallel to the first direction,
    wherein a semiconductor film comprises a first part comprising a channel formation region of the first transistor, a second part comprising a channel formation region of the second transistor and a third part connecting the first part with the second part,
    wherein the power supply line comprises a first part overlapping the third part of the semiconductor film and a second part having a larger width than the first part of the power supply line,
    wherein the power supply line is electrically connected to the semiconductor film through a contact hole, and
    wherein second part of the power supply line overlaps the contact hole.

6. The display device according to claim 5,
wherein the one of the source and the drain of the first transistor is directly connected to the light-emitting element.

7. The display device according to claim 5, further comprising a second capacitor electrically connected to the first electrode of the first capacitor.

8. The display device according to claim 5,
wherein the semiconductor film comprises the second electrode of the first capacitor.

9. The display device according to claim 5,
wherein a channel length direction of the first transistor is parallel to the first direction.

10. A display device comprising:
a pixel comprising:
a first transistor;
a second transistor;
a third transistor;
a first capacitor; and
a light-emitting element; and
a power supply line,
wherein the third transistor comprises a channel formation region comprising an oxide semiconductor,
wherein one of a source and a drain of the first transistor is electrically connected to the light-emitting element,
wherein the other of the source and the drain of the first transistor is electrically connected to one of a source and a drain of the second transistor,
wherein the other of the source and the drain of the second transistor is electrically connected to the power supply line,
wherein one of a source and a drain of the third transistor is electrically connected to a gate of the first transistor,
wherein the other of the source and the drain of the third transistor is electrically connected to the other of the source and the drain of the first transistor,
wherein a first electrode of the first capacitor is electrically connected to the gate of the first transistor,
wherein a second electrode of the first capacitor is electrically connected to the light-emitting element,
wherein a semiconductor film comprises a first part comprising a channel formation region of the first transistor, a second part comprising a channel formation region of the second transistor and a third part connecting the first part with the second part,
wherein the power supply line comprises a first part overlapping the third part of the semiconductor film and a second part having a larger width than the first part of the power supply line,
wherein the power supply line is electrically connected to the semiconductor film through a contact hole, and
wherein second part of the power supply line overlaps the contact hole.

11. The display device according to claim 10,
wherein the one of the source and the drain of the first transistor is directly connected to the light-emitting element.

12. The display device according to claim 10, further comprising a second capacitor electrically connected to the first electrode of the first capacitor.

13. The display device according to claim 10,
wherein the semiconductor film comprises the second electrode of the first capacitor.

* * * * *